United States Patent
Gray et al.

(10) Patent No.: US 12,092,695 B2
(45) Date of Patent: *Sep. 17, 2024

(54) BATTERY ADAPTED AND CONFIGURABLE IMPEDANCE CIRCUIT

(71) Applicant: SIGMASENSE, LLC., Wilmington, DE (US)

(72) Inventors: Patrick Troy Gray, Cedar Park, TX (US); Gerald Dale Morrison, Redmond, WA (US); Michael Frederick David Olley, Scottsdale, AZ (US); Daniel Keith Van Ostrand, Leander, TX (US); Richard Stuart Seger, Jr., Belton, TX (US)

(73) Assignee: SIGMASENSE, LLC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/142,622

(22) Filed: May 3, 2023

(65) Prior Publication Data

US 2023/0273261 A1 Aug. 31, 2023

Related U.S. Application Data

(63) Continuation of application No. 17/706,832, filed on Mar. 29, 2022, now Pat. No. 11,709,204, which is a
(Continued)

(51) Int. Cl.
*G01R 31/367* (2019.01)
*G01R 31/371* (2019.01)
(Continued)

(52) U.S. Cl.
CPC ......... *G01R 31/367* (2019.01); *G01R 31/382* (2019.01); *G01R 31/371* (2019.01); *G01R 31/392* (2019.01)

(58) Field of Classification Search
CPC .. G01R 31/367; G01R 31/382; G01R 31/371; G01R 31/392; G01R 31/389;
(Continued)

(56) References Cited

U.S. PATENT DOCUMENTS 4,321,523 A  3/1982 Hammel
5,437,178 A  8/1995 Esin et al.
(Continued)

FOREIGN PATENT DOCUMENTS

CN  104536627 A  4/2015
CN  107771273 A  3/2018
EP  2284637 A1  2/2011

OTHER PUBLICATIONS

P. Slepski *, K. Darowicki, K. Andrearczyk, "On-line measurement of cell impedance during charging and discharging process", Jun. 30, 2008, Journal of Electroanalytical Chemistry 633 (2009) 121-126 (Year: 2009).

(Continued)

*Primary Examiner* — Manish S Shah
*Assistant Examiner* — Michael J Singletary
(74) *Attorney, Agent, or Firm* — Garlick & Markison; Timothy W. Markison; Shayne X. Short

(57) ABSTRACT

A battery characterization system includes a drive-sense circuit (DSC), memory that stores operational instructions, and processing module(s) operably coupled to the DSC and the memory. Based on a reference signal, the DSC generates a charge signal, which includes an AC (alternating current) component, and provides the charge signal to a terminal of a battery via a single line and simultaneously to senses the charge signal via the single line to detect an electrical characteristic of the battery based on a response of the battery. The DSC generates a digital signal representative of the electrical characteristic of the battery. The processing
(Continued)

module(s), based on the operational instructions, generate the reference signal to include a frequency sweep of the AC component of the charge signal (e.g., different frequencies at different times or multiple frequencies simultaneously) and processes the digital signal to characterize the battery across the different respective frequencies and generate spectrum analysis (SA) information of the battery.

20 Claims, 62 Drawing Sheets

Related U.S. Application Data continuation of application No. 17/462,510, filed on Aug. 31, 2021, now Pat. No. 11,493,559, which is a continuation of application No. 16/427,935, filed on May 31, 2019, now Pat. No. 11,131,714.

(51) Int. Cl.
*G01R 31/382* (2019.01)
*G01R 31/392* (2019.01)

(58) Field of Classification Search
CPC .. G01R 19/0038; G01R 19/25; G01R 23/005; G01R 31/396; H02J 7/0047; Y02E 60/10
See application file for complete search history.

(56) References Cited

U.S. PATENT DOCUMENTS

| | | | |
|---|---|---|---|
| 6,133,712 A | 10/2000 | Yeon | |
| 6,218,972 B1 | 4/2001 | Groshong | |
| 6,665,013 B1 | 12/2003 | Fossum et al. | |
| 7,476,233 B1 | 1/2009 | Wiener et al. | |
| 7,528,755 B2 | 5/2009 | Hammerschmidt | |
| 8,031,094 B2 | 10/2011 | Hotelling | |
| 8,089,289 B1 | 1/2012 | Kremin et al. | |
| 8,279,180 B2 | 10/2012 | Hotelling et al. | |
| 8,547,114 B2 | 10/2013 | Kremin | |
| 8,625,726 B2 | 1/2014 | Kuan | |
| 9,201,547 B2 | 12/2015 | Elias | |
| 2003/0052657 A1 | 3/2003 | Koernle et al. | |
| 2004/0036620 A1 | 2/2004 | Herrmann et al. | |
| 2005/0235758 A1 | 10/2005 | Kowal et al. | |
| 2011/0063154 A1 | 3/2011 | Hotelling et al. | |
| 2011/0298745 A1 | 12/2011 | Souchkov | |
| 2013/0278447 A1 | 10/2013 | Kremin | |
| 2014/0211516 A1 | 7/2014 | Kung et al. | |
| 2016/0188049 A1 | 6/2016 | Yang et al. | |
| 2017/0200994 A1 | 7/2017 | Kim | |
| 2017/0219660 A1 | 8/2017 | Christensen | |
| 2017/0242502 A1 | 8/2017 | Gray et al. | |
| 2017/0302088 A1 | 10/2017 | Tkachenko | |
| 2018/0157354 A1 | 6/2018 | Blondin et al. | |
| 2018/0275824 A1 | 9/2018 | Li | |
| 2021/0055805 A1 | 2/2021 | Seger, Jr. | |

OTHER PUBLICATIONS

Baker; How delta-sigma ADCs work, Part 1; Analog Applications Journal; Oct. 1, 2011; 6 pgs.

Brian Pisani, Digital Filter Types in Delta-Sigma ADCs, Application Report SBAA230, May 2017, pp. 1-8, Texas Instruments Incorporated, Dallas, Texas.

Diplom-Ingenieur (FH) Reinhold Koch, M. Sc, "On-line Electrochemical Impedance Spectroscopy for Lithium-Ion Battery Systems", Vorsitzender: Prof. Dr.-Ing. Hans-Georg Herzog, Prufende/-r der Dissertation: 1. Prof. Dr.-Ing. Andreas Jossen, 2. Prof. Dr.-Ing. Olfa Kanoun (TU Chemnitz), Die Dissertation . . . (Year: 2017).

International Searching Authority; International Search Report and Written Opinion; International Application No. PCT/US2020/034492; Aug. 6, 2020; 14 pgs.

M. Abedi Varnosfaderani and D. Strickland, "A Comparison of Online Electrochemical Spectroscopy Impedance Estimation of Batteries," in IEEE Access, vol. 6, pp. 23668-23677, 2018, doi: 10.1109/ACCESS.2018.2808412. (Year: 2018).

M.A. Varnosfaderani and D. Strickland, "Online impedance spectroscopy estimation of a de-de converter connected battery using a switched capacitor-based balancing circuit," in The Journal of Engineering, vol. 2019, No. 7, pp. 4681-4685, 7 2019, doi: 10.1049/joe.2018.8069. (Year: 2019).

European Patent Office; Extended European Search Report; Application No. 19853507.2; Jun. 13, 2023; 7 pgs.

communication system 10 computing device 12 computing device 14 computing device 18

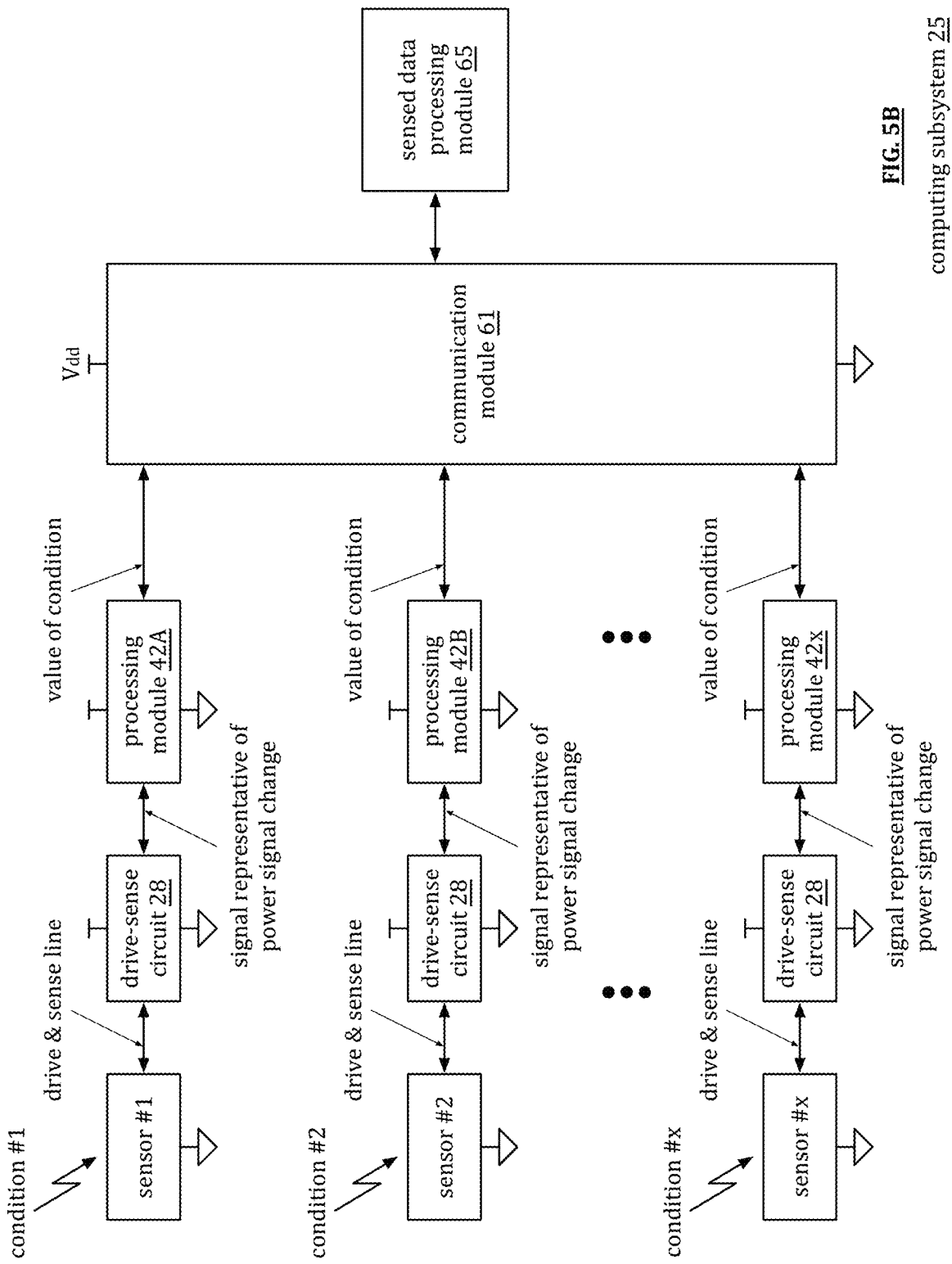

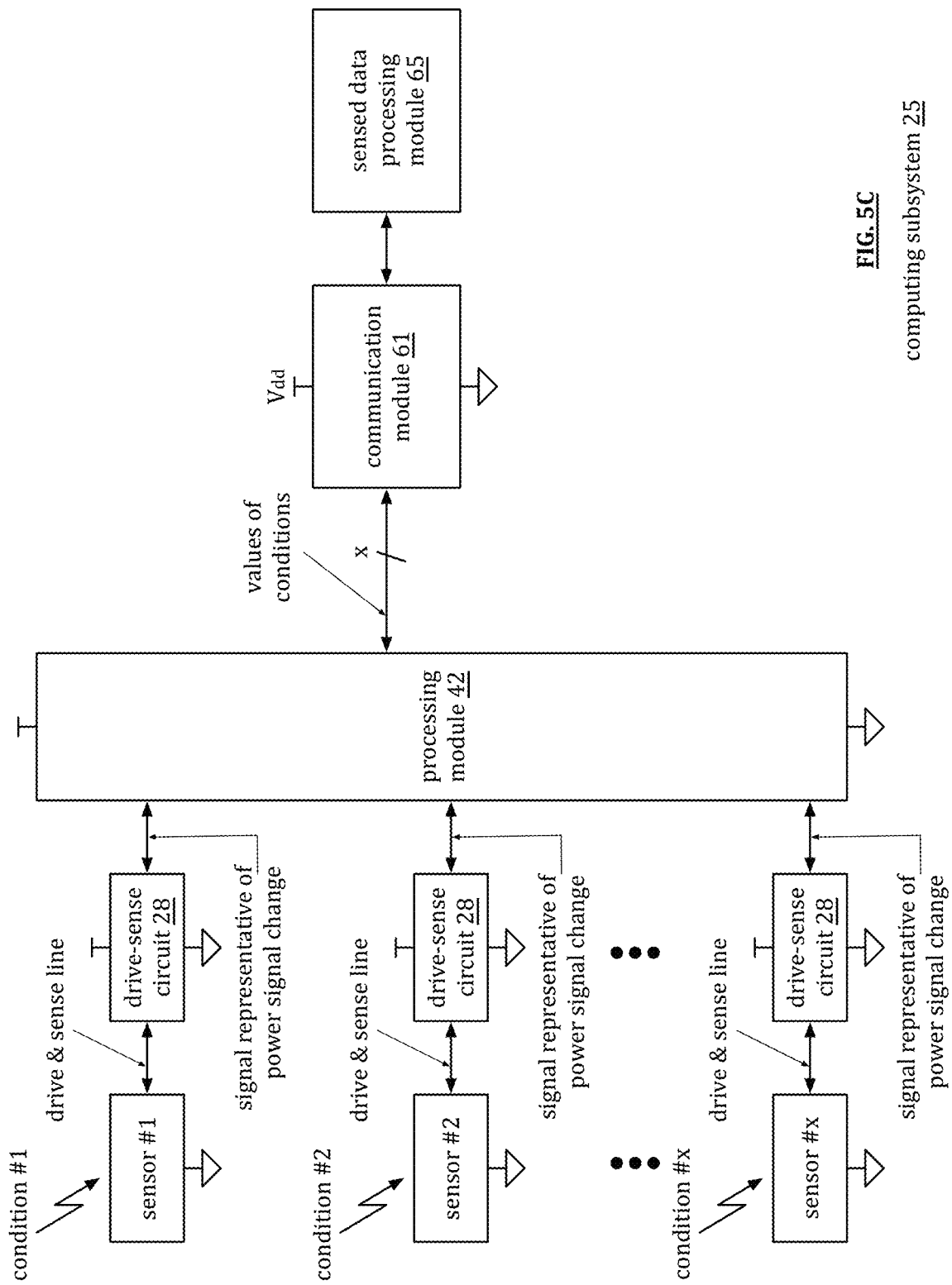

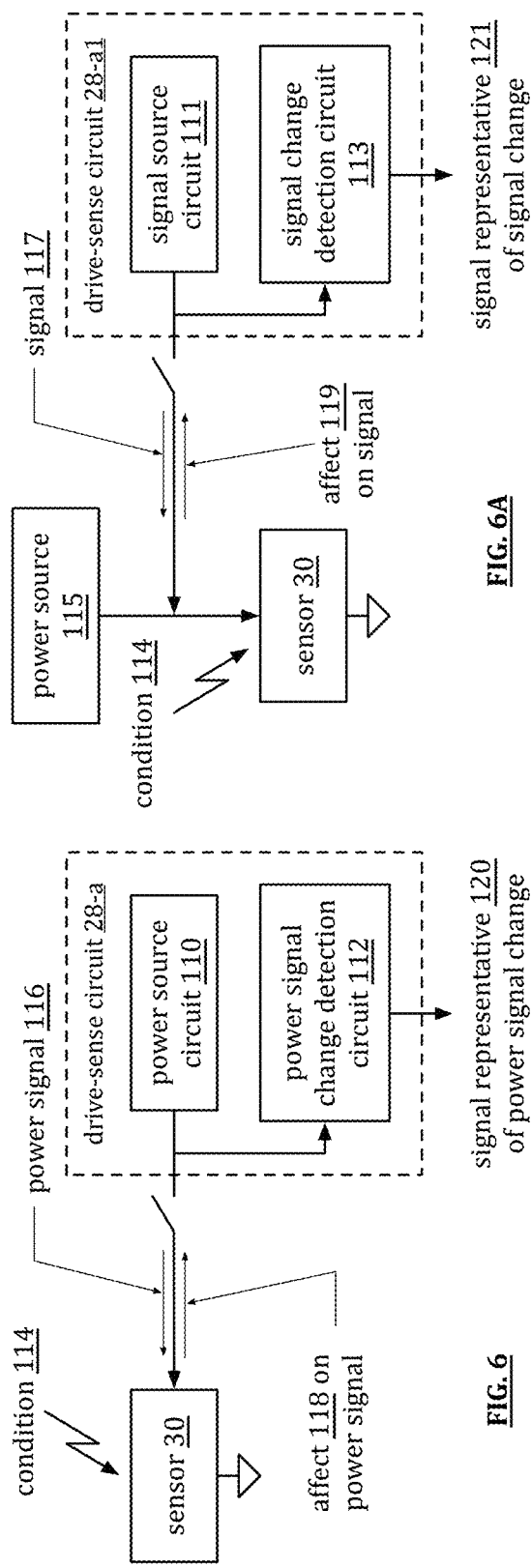
FIG. 6A
FIG. 6
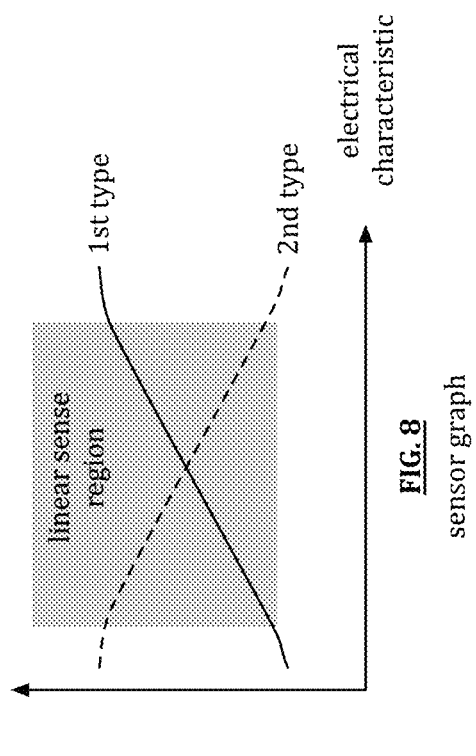
FIG. 8
sensor graph
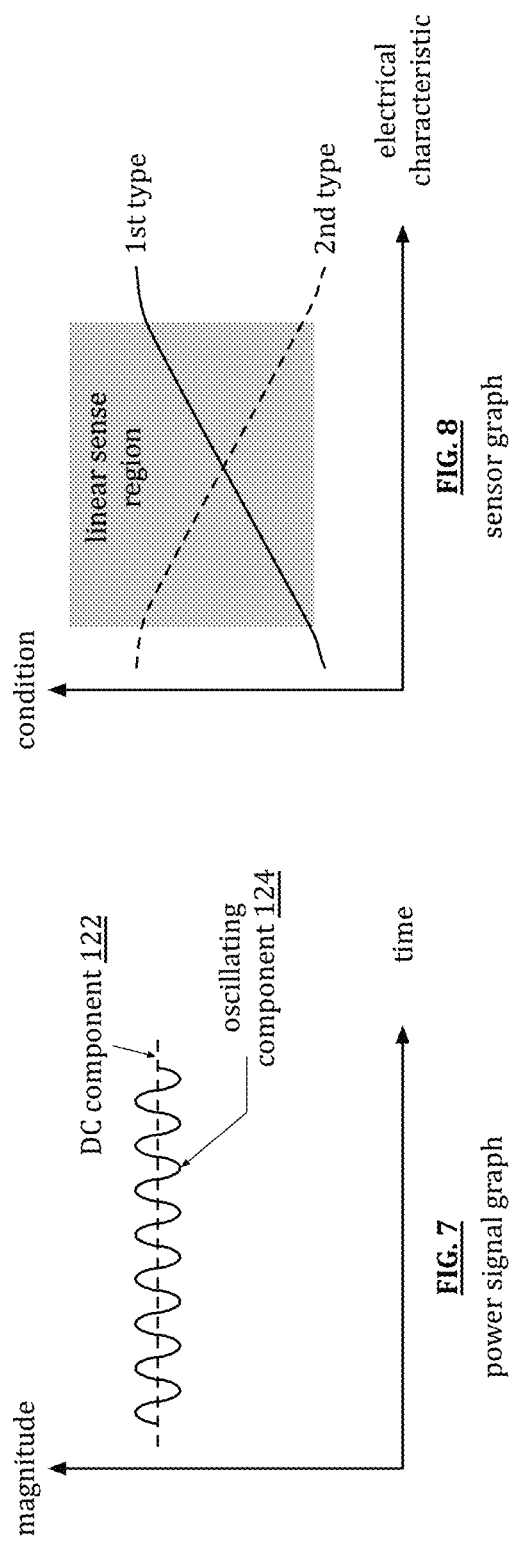
FIG. 7
power signal graph

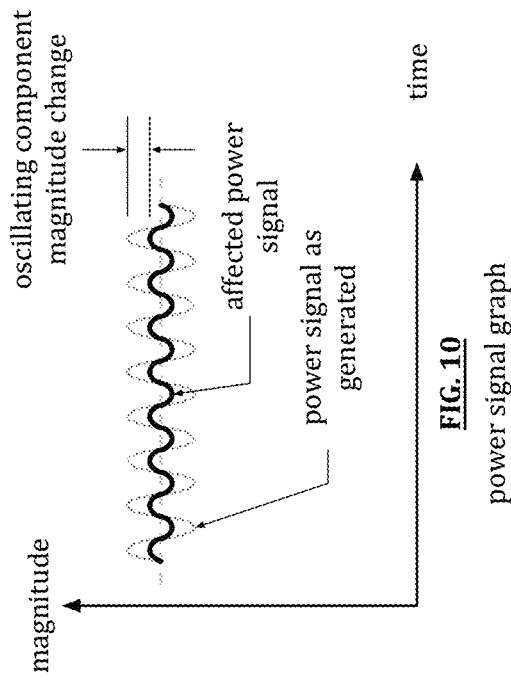
FIG. 10
power signal graph
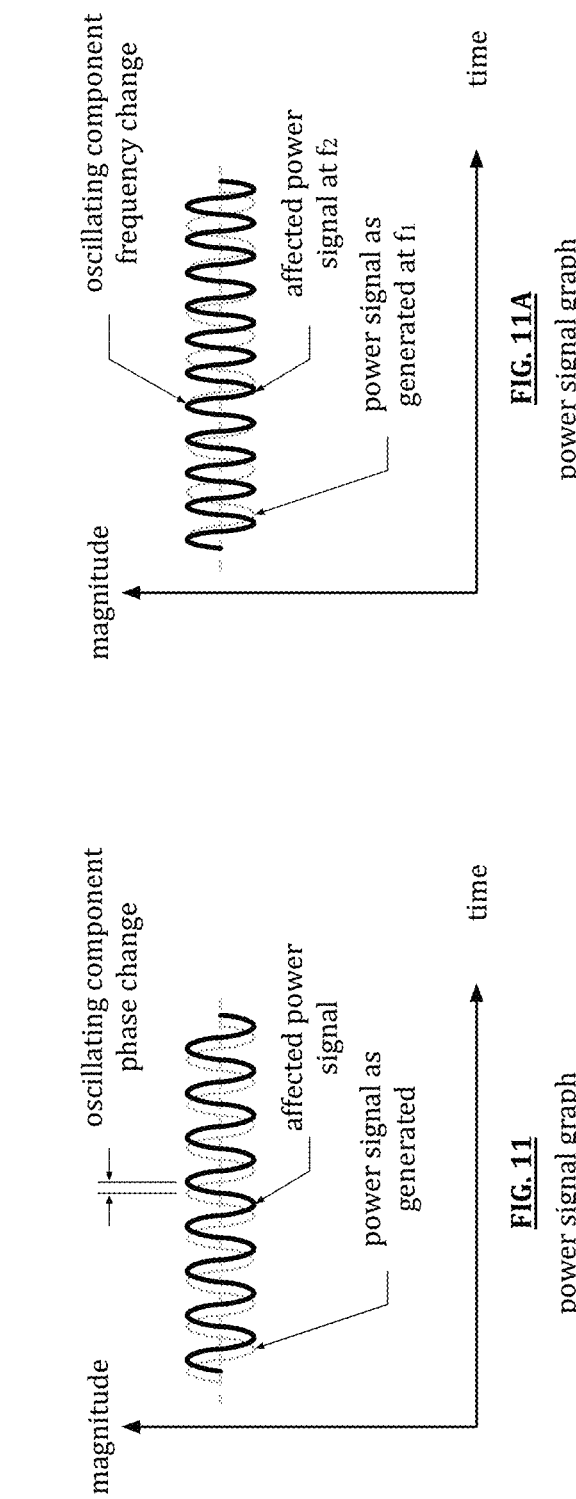
FIG. 11A
power signal graph
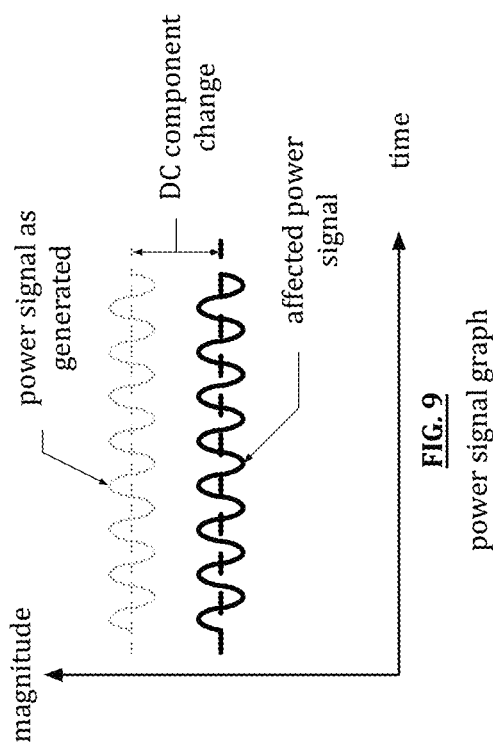
FIG. 9
power signal graph
FIG. 11
power signal graph

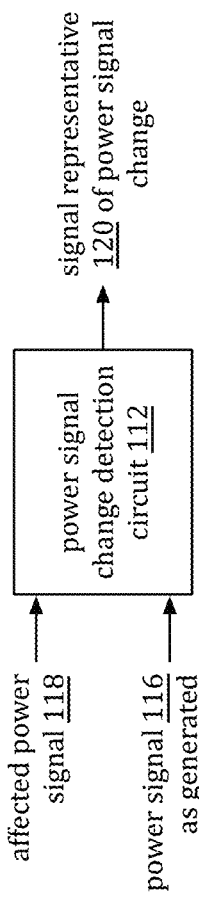
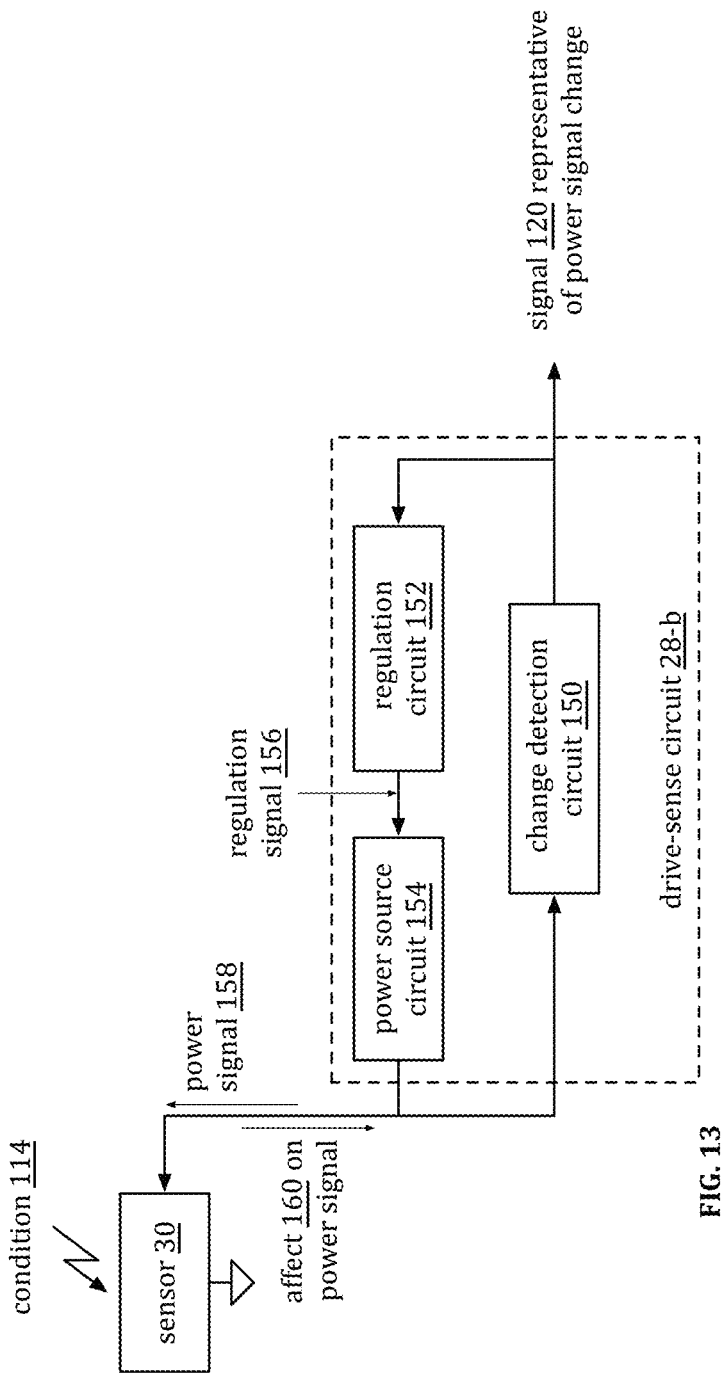

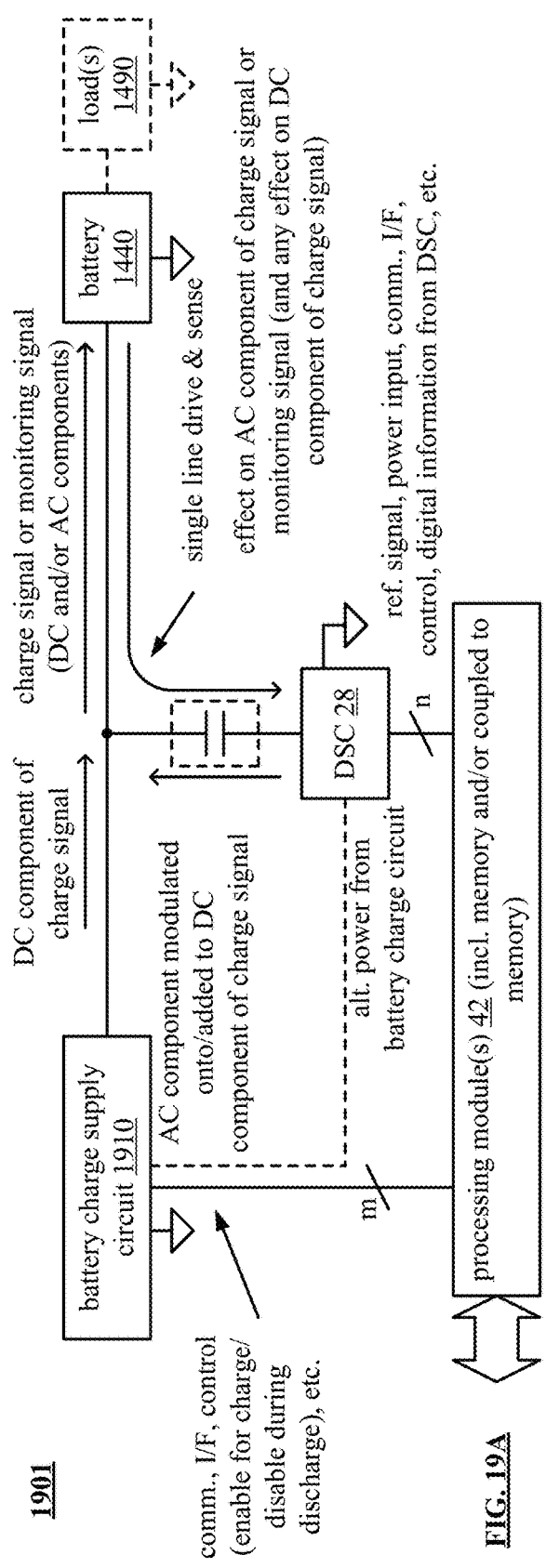
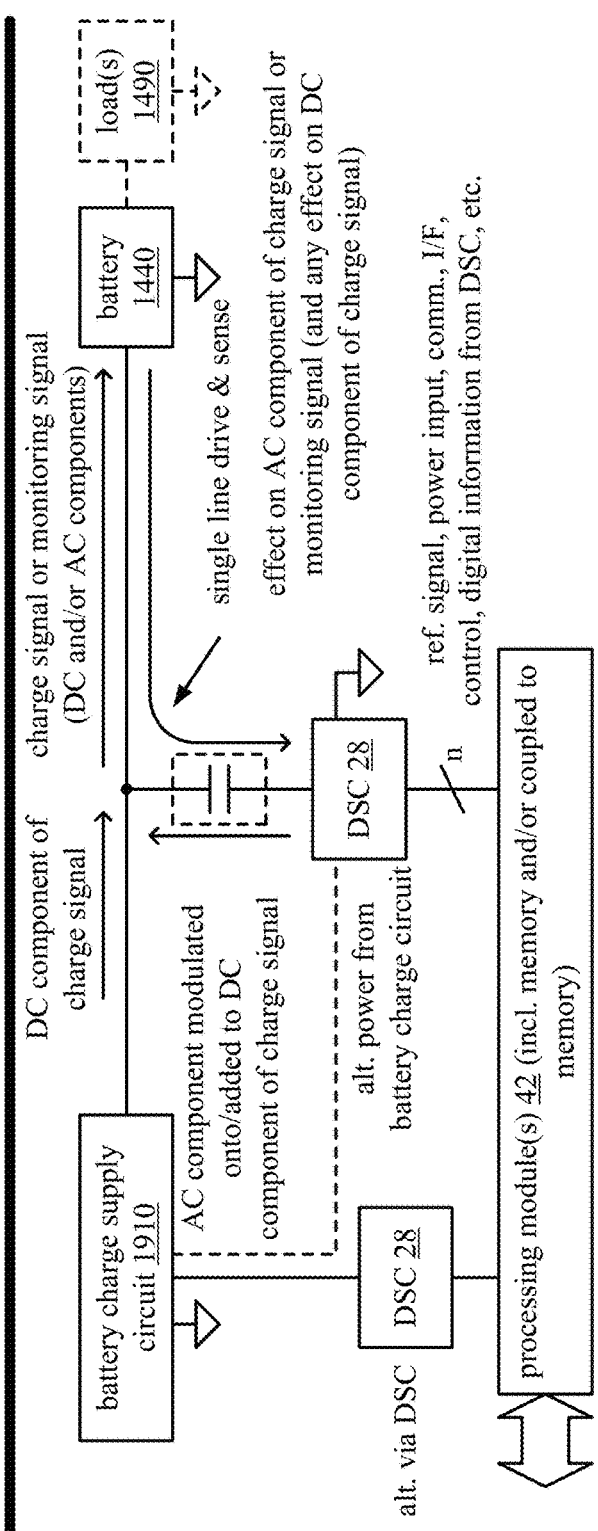
FIG. 19A
FIG. 19B

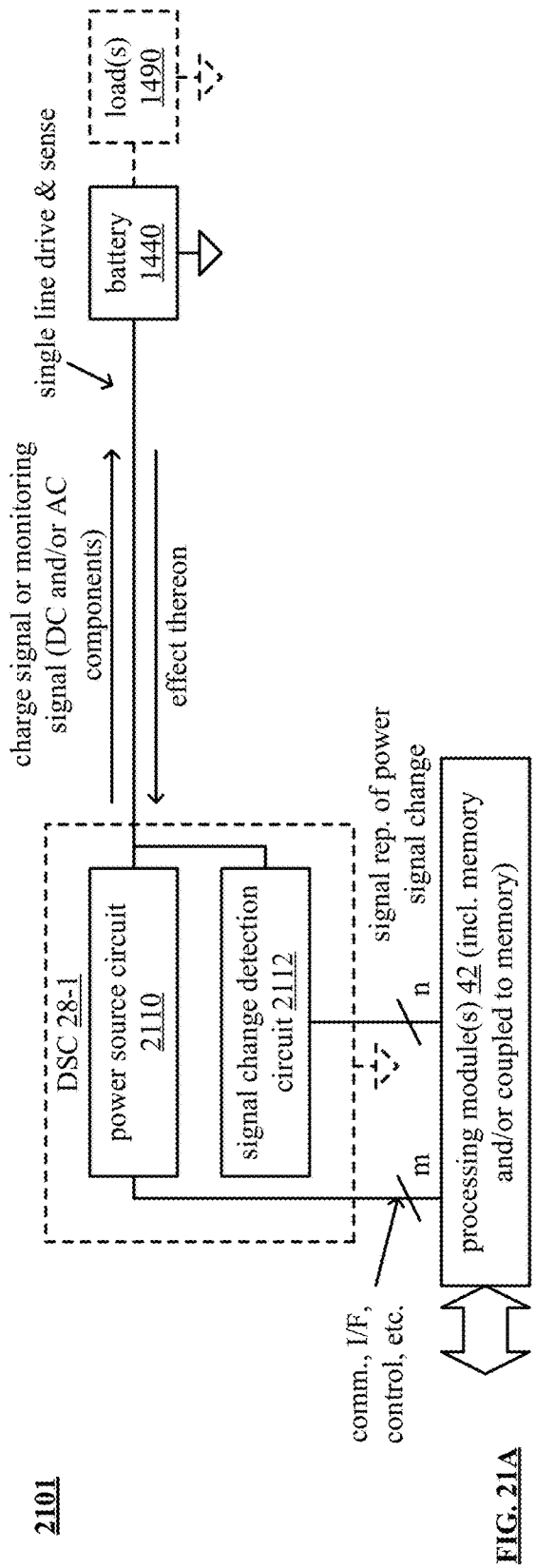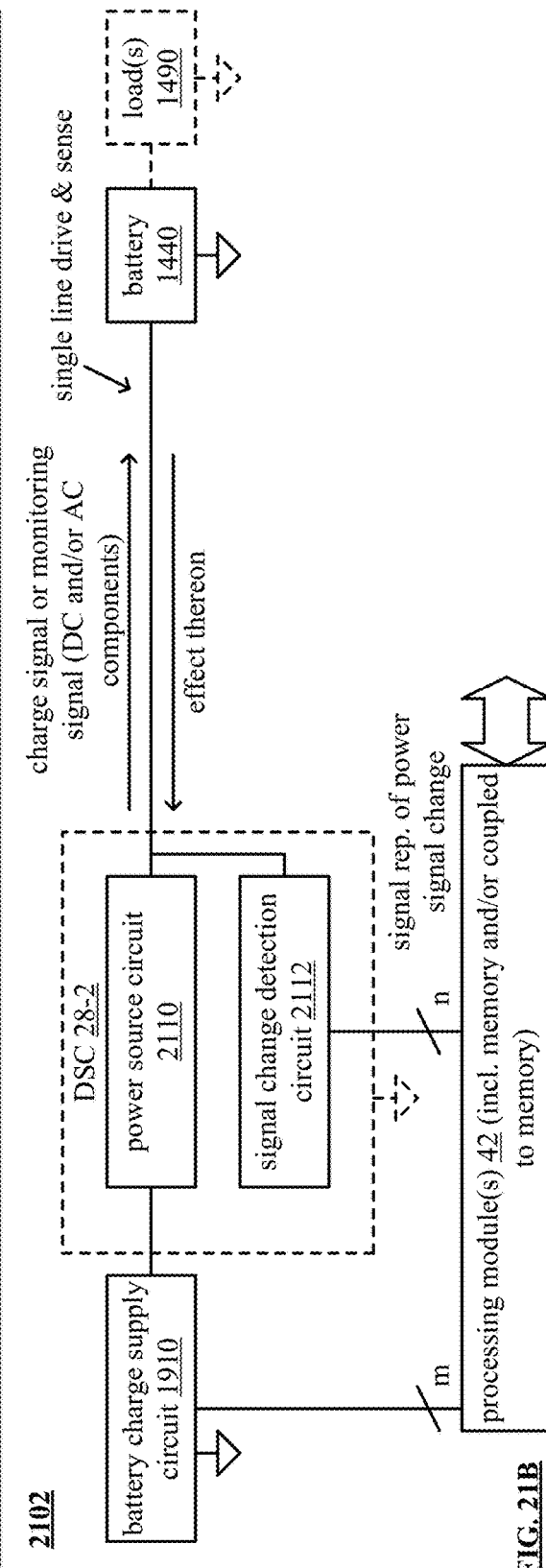

2402

$Vbatt(t) = Voc - Ibatt \times (Rs + Rp) + (Ibatt \times Rp - Vp(t=0))exp((-t/(Rp \times Cp)))$

2401

$Vbatt = Voc - Rs \times Ibatt$ as $Rs \uparrow$, then for same $Voc$, $Vbatt \downarrow$

3401 start/continue

↓ generating, within a DSC and based on a reference signal, a charge signal that includes an AC component and a DC component 3410

↓ providing a charge signal (e.g., from a DSC) to a positive terminal of a battery via a single line and simultaneously sensing the charge signal via the single line (e.g., including detection of an electrical characteristic of the battery that is based on a response of the battery to the charge signal) 3420

↓ generating a digital signal representative of the electrical characteristic of the battery that is based on the response of the battery to the charge signal 3430

↓ processing the digital signal representative of the electrical characteristic of the battery that is based on the response of the battery to the charge signal to determine the electrical characteristic of the battery 3340

↓ end/continue

FIG. 34B

3402 start/continue

↓ generating, within a DSC and based on a reference signal, a monitoring signal that includes an AC component 3411

↓ providing a monitoring signal (e.g., from a DSC) to a positive terminal of a battery via a single line and simultaneously sensing the monitoring signal via the single line (e.g., including detection of an electrical characteristic of the battery that is based on a response of the battery to the monitoring signal) 3421

↓ generating a digital signal representative of the electrical characteristic of the battery that is based on the response of the battery to the monitoring signal 3431

↓ processing the digital signal representative of the electrical characteristic of the battery that is based on the response of the battery to the monitoring signal to determine the electrical characteristic of the battery 3341

↓ end/continue

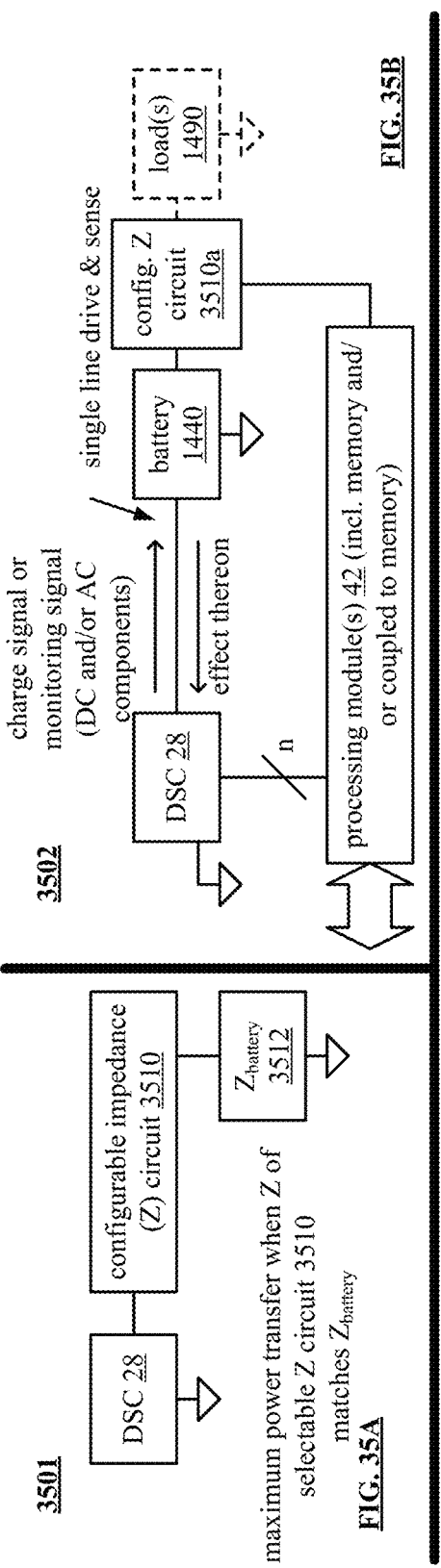
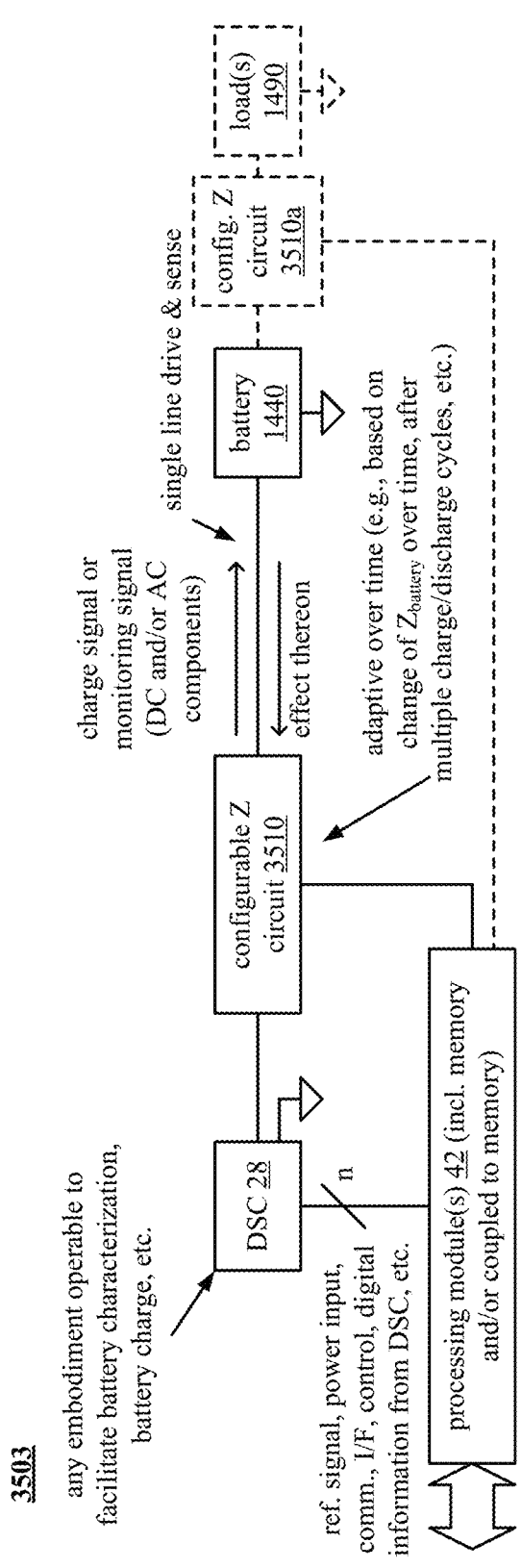
FIG. 35A
FIG. 35B
FIG. 35C examples of Zs within a configurable Z circuit

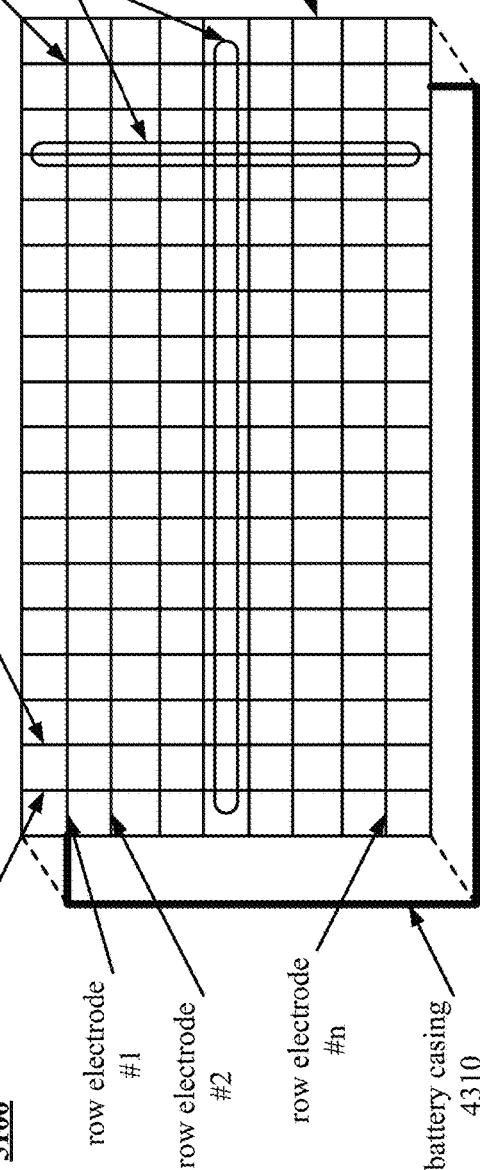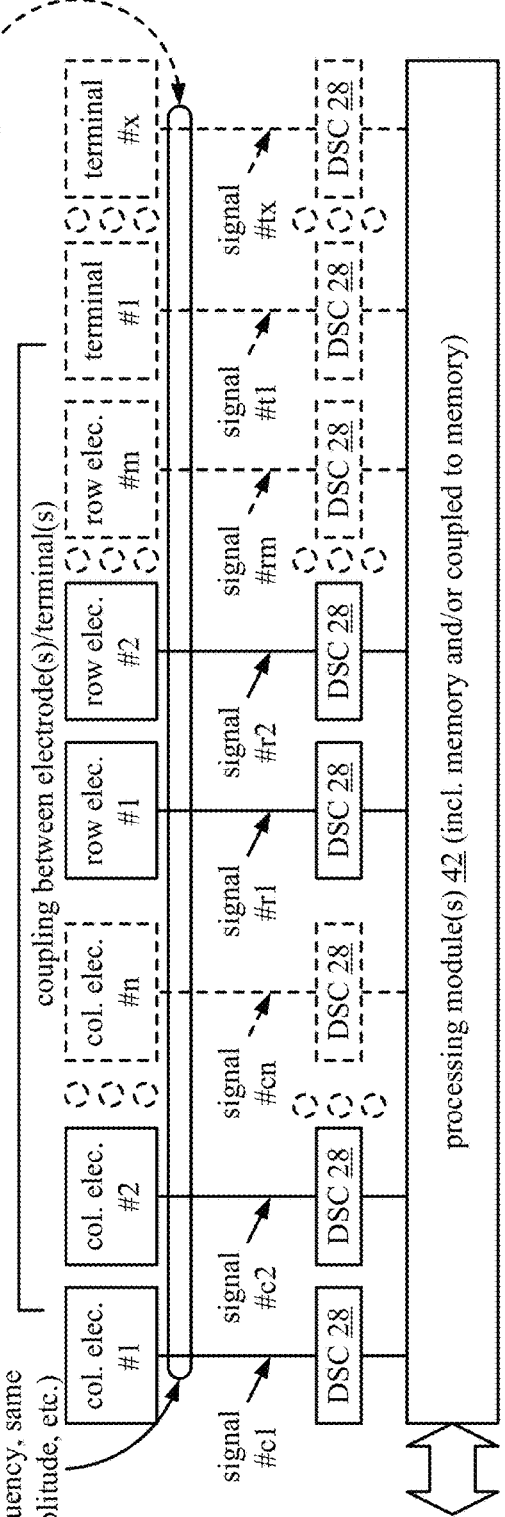
FIG. 51 cross-sections of various electrode patterns

BATTERY ADAPTED AND CONFIGURABLE IMPEDANCE CIRCUIT

CROSS REFERENCE TO RELATED PATENTS

The present U.S. Utility patent application claims priority pursuant to 35 U.S.C. § 120 as a continuation of U.S. Utility application Ser. No. 17/706,832, entitled "Battery adapted and configurable impedance circuit," filed Mar. 29, 2022, which claims priority pursuant to 35 U.S.C. § 120 as a continuation of U.S. Utility application Ser. No. 17/462,510, entitled "Battery monitoring and characterization during charging," filed Aug. 31, 2021, now issued as U.S. Pat. No. 11,493,559 on Nov. 8, 2022, which claims priority pursuant to 35 U.S.C. § 120 as a continuation of U.S. Utility application Ser. No. 16/427,935, entitled "Battery monitoring and characterization during charging," filed May 31, 2019, now issued as U.S. Pat. No. 11,131,714 on Sep. 28, 2021, all of which are hereby incorporated herein by reference in their entirety and made part of the present U.S. Utility patent application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to data communication systems and more particularly to sensed data collection and/or communication.

Description of Related Art

Sensors are used in a wide variety of applications ranging from in-home automation, to industrial systems, to health care, to transportation, and so on. For example, sensors are placed in bodies, automobiles, airplanes, boats, ships, trucks, motorcycles, cell phones, televisions, touch-screens, industrial plants, appliances, motors, checkout counters, etc. for the variety of applications.

In general, a sensor converts a physical quantity into an electrical or optical signal. For example, a sensor converts a physical phenomenon, such as a biological condition, a chemical condition, an electric condition, an electromagnetic condition, a temperature, a magnetic condition, mechanical motion (position, velocity, acceleration, force, pressure), an optical condition, and/or a radioactivity condition, into an electrical signal.

A sensor includes a transducer, which functions to convert one form of energy (e.g., force) into another form of energy (e.g., electrical signal). There are a variety of transducers to support the various applications of sensors. For example, a transducer is capacitor, a piezoelectric transducer, a piezoresistive transducer, a thermal transducer, a thermal-couple, a photoconductive transducer such as a photoresistor, a photodiode, and/or phototransistor.

A sensor circuit is coupled to a sensor to provide the sensor with power and to receive the signal representing the physical phenomenon from the sensor. The sensor circuit includes at least three electrical connections to the sensor: one for a power supply; another for a common voltage reference (e.g., ground); and a third for receiving the signal representing the physical phenomenon. The signal representing the physical phenomenon will vary from the power supply voltage to ground as the physical phenomenon changes from one extreme to another (for the range of sensing the physical phenomenon).

The sensor circuits provide the received sensor signals to one or more computing devices for processing. A computing device is known to communicate data, process data, and/or store data. The computing device may be a cellular phone, a laptop, a tablet, a personal computer (PC), a work station, a video game device, a server, and/or a data center that support millions of web searches, stock trades, or on-line purchases every hour.

The computing device processes the sensor signals for a variety of applications. For example, the computing device processes sensor signals to determine temperatures of a variety of items in a refrigerated truck during transit. As another example, the computing device processes the sensor signals to determine a touch on a touch screen. As yet another example, the computing device processes the sensor signals to determine various data points in a production line of a product.

BRIEF DESCRIPTION OF THE SEVERAL VIEWS OF THE DRAWING(S)

FIG. 5B is a schematic block diagram of another embodiment of a computing subsystem in accordance with the present invention;

FIG. 5C is a schematic block diagram of another embodiment of a computing subsystem in accordance with the present invention;

FIG. 6 is a schematic block diagram of a drive center circuit in accordance with the present invention;

FIG. 6A is a schematic block diagram of another embodiment of a drive sense circuit in accordance with the present invention;

FIG. 7 is an example of a power signal graph in accordance with the present invention;

FIG. 8 is an example of a sensor graph in accordance with the present invention;

FIG. 9 is a schematic block diagram of another example of a power signal graph in accordance with the present invention;

FIG. 10 is a schematic block diagram of another example of a power signal graph in accordance with the present invention;

FIG. 11 is a schematic block diagram of another example of a power signal graph in accordance with the present invention;

FIG. 11A is a schematic block diagram of another example of a power signal graph in accordance with the present invention;

FIG. 12 is a schematic block diagram of an embodiment of a power signal change detection circuit in accordance with the present invention;

FIG. 13 is a schematic block diagram of another embodiment of a drive-sense circuit in accordance with the present invention;

FIG. 19A is a schematic block diagram of an embodiment of a DSC that is interactive with battery charge supply circuit and a battery in accordance with the present invention;

FIG. 19B is a schematic block diagram of another embodiment of a DSC that is interactive with battery charge supply circuit and a battery in accordance with the present invention;

FIG. 21A is a schematic block diagram of another embodiment of a DSC that is interactive with a battery in accordance with the present invention;

FIG. 21B is a schematic block diagram of another embodiment of a DSC that is interactive with battery charge supply circuit and a battery in accordance with the present invention;

FIG. 25 is a schematic block diagram of another embodiment of a DSC that is interactive with a battery in accordance with the present invention;

FIG. 34A is a schematic block diagram of another embodiment of a method for execution by one or more devices in accordance with the present invention;

FIG. 34B is a schematic block diagram of another embodiment of a method for execution by one or more devices in accordance with the present invention;

FIG. 35A is a schematic block diagram of an embodiment of a DSC that is interactive with a battery via a configurable impedance (Z) circuit in accordance with the present invention;

FIG. 35B is a schematic block diagram of another embodiment of a DSC that is interactive with a battery via a configurable impedance (Z) circuit in accordance with the present invention;

FIG. 35C is a schematic block diagram of another embodiment of a DSC that is interactive with a battery via a configurable impedance (Z) circuit in accordance with the present invention;

FIG. 51 is a schematic block diagram of another embodiment of a sheath including integrated electrodes adapted for mounting to one or more surfaces of a battery for use in battery monitoring and characterization in conjunction with DSCs in accordance with the present invention;

Figure 62:
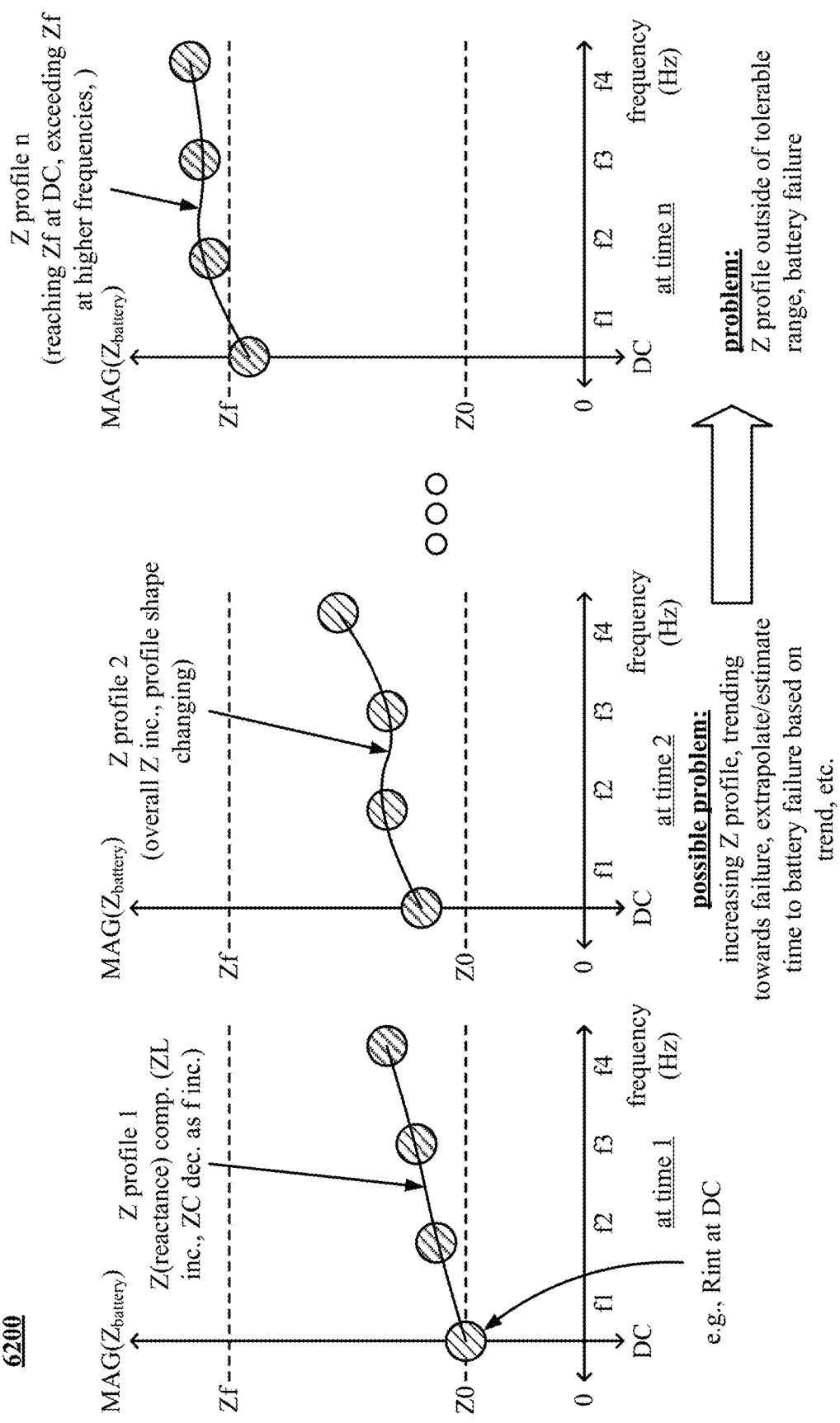
Figure 63:
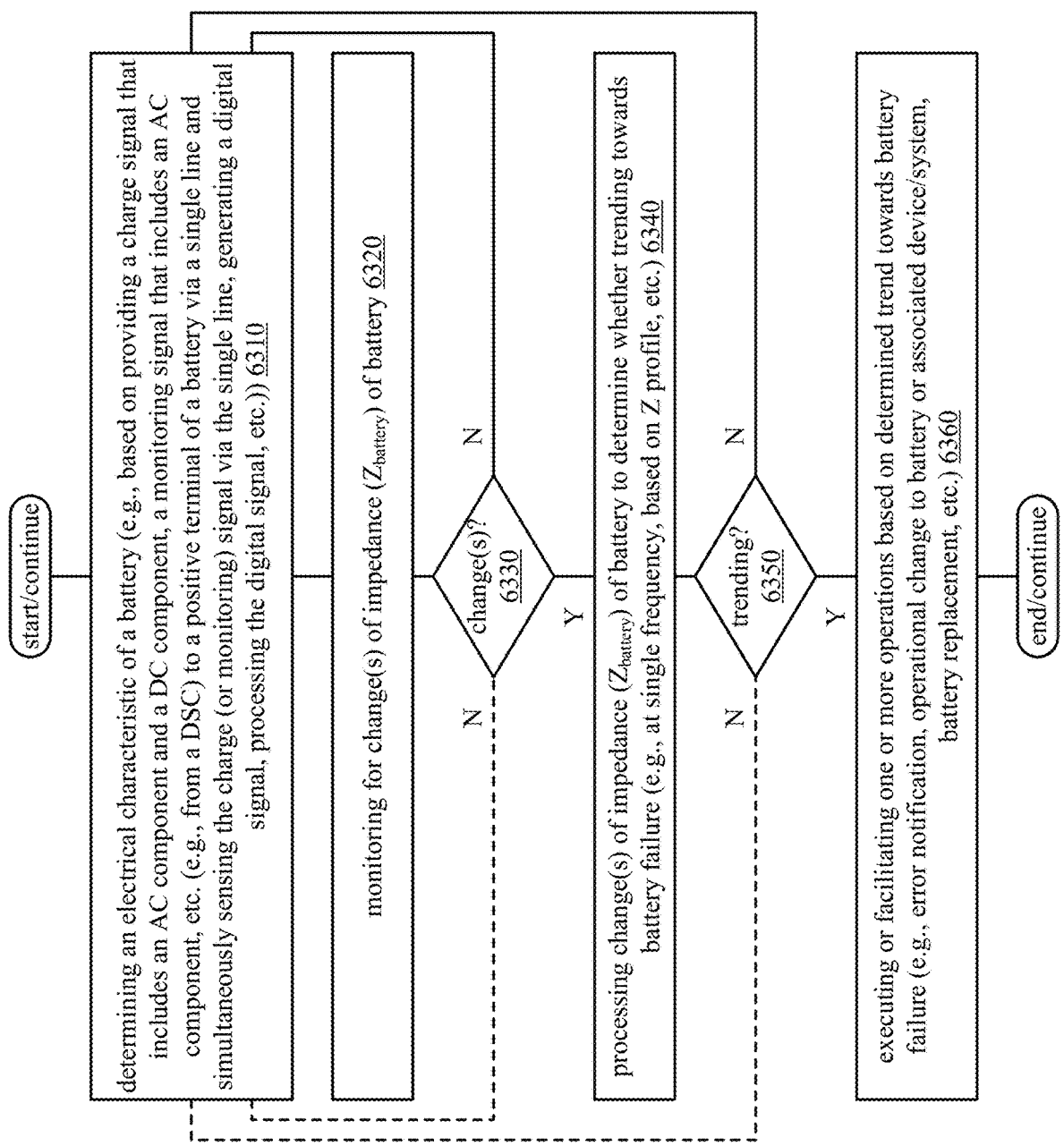

FIG. 62 is a schematic block diagram of an embodiment of impedance (Z) monitoring of a battery across a range of frequencies as may be implemented within battery casings and/or sheaths for use in battery monitoring and characterization in accordance with the present invention; and FIG. 63 is a schematic block diagram of another embodiment of a method for execution by one or more devices in accordance with the present invention.

DETAILED DESCRIPTION OF THE INVENTION

Figure 1:
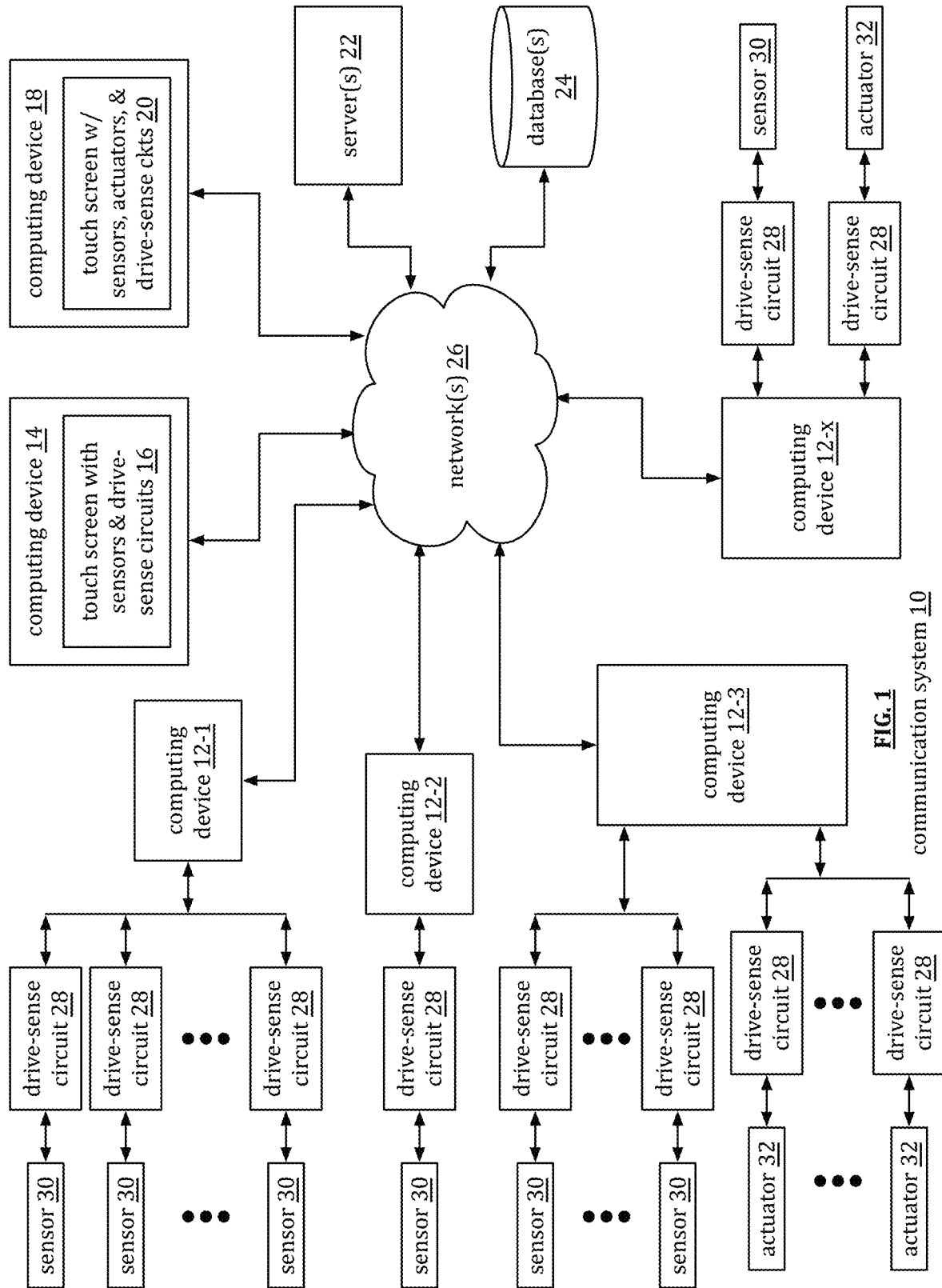
FIG. 1 is a schematic block diagram of an embodiment of a communication system in accordance with the present invention.

FIG. 1 is a schematic block diagram of an embodiment of a communication system 10 that includes a plurality of computing. devices 12-10, one or more servers 22, one or more databases 24, one or more networks 26, a plurality of drive-sense circuits 28, a plurality of sensors 30, and a plurality of actuators 32. Computing devices 14 include a touch screen 16 with sensors and drive-sensor circuits and computing devices 18 include a touch & tactic screen that includes sensors, actuators, and drive-sense circuits.

A sensor 30 functions to convert a physical input into an electrical output and/or an optical output. The physical input of a sensor may be one of a variety of physical input conditions. For example, the physical condition includes one or more of, but is not limited to, acoustic waves (e.g., amplitude, phase, polarization, spectrum, and/or wave velocity); a biological and/or chemical condition (e.g., fluid concentration, level, composition, etc.); an electric condition (e.g., charge, voltage, current, conductivity, permittivity, eclectic field, which includes amplitude, phase, and/or polarization); a magnetic condition (e.g., flux, permeability, magnetic field, which amplitude, phase, and/or polarization); an optical condition (e.g., refractive index, reflectivity, absorption, etc.); a thermal condition (e.g., temperature, flux, specific heat, thermal conductivity, etc.); and a mechanical condition (e.g., position, velocity, acceleration, force, strain, stress, pressure, torque, etc.). For example, piezoelectric sensor converts force or pressure into an eclectic signal. As another example, a microphone converts audible acoustic waves into electrical signals.

There are a variety of types of sensors to sense the various types of physical conditions. Sensor types include, but are not limited to, capacitor sensors, inductive sensors, accelerometers, piezoelectric sensors, light sensors, magnetic field sensors, ultrasonic sensors, temperature sensors, infrared (IR) sensors, touch sensors, proximity sensors, pressure sensors, level sensors, smoke sensors, and gas sensors. In many ways, sensors function as the interface between the physical world and the digital world by converting real world conditions into digital signals that are then processed by computing devices for a vast number of applications including, but not limited to, medical applications, production automation applications, home environment control, public safety, and so on.

The various types of sensors have a variety of sensor characteristics that are factors in providing power to the sensors, receiving signals from the sensors, and/or interpreting the signals from the sensors. The sensor characteristics include resistance, reactance, power requirements, sensitivity, range, stability, repeatability, linearity, error, response time, and/or frequency response. For example, the resistance, reactance, and/or power requirements are factors in determining drive circuit requirements. As another example, sensitivity, stability, and/or linear are factors for interpreting the measure of the physical condition based on the received electrical and/or optical signal (e.g., measure of temperature, pressure, etc.).

An actuator 32 converts an electrical input into a physical output. The physical output of an actuator may be one of a variety of physical output conditions. For example, the physical output condition includes one or more of, but is not limited to, acoustic waves (e.g., amplitude, phase, polarization, spectrum, and/or wave velocity); a magnetic condition (e.g., flux, permeability, magnetic field, which amplitude, phase, and/or polarization); a thermal condition (e.g., temperature, flux, specific heat, thermal conductivity, etc.); and a mechanical condition (e.g., position, velocity, acceleration, force, strain, stress, pressure, torque, etc.). As an example, a piezoelectric actuator converts voltage into force or pressure. As another example, a speaker converts electrical signals into audible acoustic waves.

An actuator 32 may be one of a variety of actuators. For example, an actuator 32 is one of a comb drive, a digital micro-mirror device, an electric motor, an electroactive polymer, a hydraulic cylinder, a piezoelectric actuator, a pneumatic actuator, a screw jack, a servomechanism, a solenoid, a stepper motor, a shape-memory allow, a thermal bimorph, and a hydraulic actuator.

The various types of actuators have a variety of actuators characteristics that are factors in providing power to the actuator and sending signals to the actuators for desired performance. The actuator characteristics include resistance, reactance, power requirements, sensitivity, range, stability, repeatability, linearity, error, response time, and/or frequency response. For example, the resistance, reactance, and power requirements are factors in determining drive circuit requirements. As another example, sensitivity, stability, and/or linear are factors for generating the signaling to send to the actuator to obtain the desired physical output condition.

The computing devices 12, 14, and 18 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. The computing devices 12, 14, and 18 will be discussed in greater detail with reference to one or more of FIGS. 2-4.

A server 22 is a special type of computing device that is optimized for processing large amounts of data requests in parallel. A server 22 includes similar components to that of the computing devices 12, 14, and/or 18 with more robust processing modules, more main memory, and/or more hard drive memory (e.g., solid state, hard drives, etc.). Further, a server 22 is typically accessed remotely; as such it does not generally include user input devices and/or user output devices. In addition, a server may be a standalone separate computing device and/or may be a cloud computing device.

A database 24 is a special type of computing device that is optimized for large scale data storage and retrieval. A database 24 includes similar components to that of the computing devices 12, 14, and/or 18 with more hard drive memory (e.g., solid state, hard drives, etc.) and potentially with more processing modules and/or main memory. Further, a database 24 is typically accessed remotely; as such it does not generally include user input devices and/or user output devices. In addition, a database 24 may be a standalone separate computing device and/or may be a cloud computing device.

The network 26 includes one more local area networks (LAN) and/or one or more wide area networks WAN), which may be a public network and/or a private network. A LAN may be a wireless-LAN (e.g., Wi-Fi access point, Bluetooth, ZigBee, etc.) and/or a wired network (e.g., Firewire, Ethernet, etc.). A WAN may be a wired and/or wireless WAN. For example, a LAN may be a personal home or business's wireless network and a WAN is the Internet, cellular telephone infrastructure, and/or satellite communication infrastructure.

In an example of operation, computing device 12-1 communicates with a plurality of drive-sense circuits 28, which, in turn, communicate with a plurality of sensors 30. The sensors 30 and/or the drive-sense circuits 28 are within the computing device 12-1 and/or external to it. For example, the sensors 30 may be external to the computing device 12-1 and the drive-sense circuits are within the computing device 12-1. As another example, both the sensors 30 and the drive-sense circuits 28 are external to the computing device 12-1. When the drive-sense circuits 28 are external to the computing device, they are coupled to the computing device 12-1 via wired and/or wireless communication links as will be discussed in greater detail with reference to one or more of FIGS. 5A-5C.

The computing device 12-1 communicates with the drive-sense circuits 28 to; (a) turn them on, (b) obtain data from the sensors (individually and/or collectively), (c) instruct the drive sense circuit on how to communicate the sensed data to the computing device 12-1, (d) provide signaling attributes (e.g., DC level, AC level, frequency, power level, regulated current signal, regulated voltage signal, regulation of an impedance, frequency patterns for various sensors, different frequencies for different sensing applications, etc.) to use with the sensors, and/or (e) provide other commands and/or instructions.

As a specific example, the sensors 30 are distributed along a pipeline to measure flow rate and/or pressure within a section of the pipeline. The drive-sense circuits 28 have their own power source (e.g., battery, power supply, etc.) and are proximally located to their respective sensors 30. At desired time intervals (milliseconds, seconds, minutes, hours, etc.), the drive-sense circuits 28 provide a regulated source signal or a power signal to the sensors 30. An electrical characteristic of the sensor 30 affects the regulated source signal or power signal, which is reflective of the condition (e.g., the flow rate and/or the pressure) that sensor is sensing.

The drive-sense circuits 28 detect the effects on the regulated source signal or power signals as a result of the electrical characteristics of the sensors. The drive-sense circuits 28 then generate signals representative of change to the regulated source signal or power signal based on the detected effects on the power signals. The changes to the regulated source signals or power signals are representative of the conditions being sensed by the sensors 30.

The drive-sense circuits 28 provide the representative signals of the conditions to the computing device 12-1. A representative signal may be an analog signal or a digital signal. In either case, the computing device 12-1 interprets the representative signals to determine the pressure and/or flow rate at each sensor location along the pipeline. The computing device may then provide this information to the server 22, the database 24, and/or to another computing device for storing and/or further processing.

As another example of operation, computing device 12-2 is coupled to a drive-sense circuit 28, which is, in turn, coupled to a senor 30. The sensor 30 and/or the drive-sense circuit 28 may be internal and/or external to the computing device 12-2. In this example, the sensor is sensing a condition that is particular to the computing device 12-2. For example, the sensor 30 may be a temperature sensor, an ambient light sensor, an ambient noise sensor, etc. As described above, when instructed by the computing device 12-2 (which may be a default setting for continuous sensing or at regular intervals), the drive-sense circuit 28 provides the regulated source signal or power signal to the sensor 30 and detects an effect to the regulated source signal or power signal based on an electrical characteristic of the sensor. The drive-sense circuit generates a representative signal of the affect and sends it to the computing device 12-2.

In another example of operation, computing device 12-3 is coupled to a plurality of drive-sense circuits 28 that are coupled to a plurality of sensors 30 and is coupled to a plurality of drive-sense circuits 28 that are coupled to a plurality of actuators 32. The generally functionality of the drive-sense circuits 28 coupled to the sensors 30 in accordance with the above description.

Since an actuator 32 is essentially an inverse of a sensor in that an actuator converts an electrical signal into a physical condition, while a sensor converts a physical condition into an electrical signal, the drive-sense circuits 28 can be used to power actuators 32. Thus, in this example, the computing device 12-3 provides actuation signals to the drive-sense circuits 28 for the actuators 32. The drive-sense circuits modulate the actuation signals on to power signals or regulated control signals, which are provided to the actuators 32. The actuators 32 are powered from the power signals or regulated control signals and produce the desired physical condition from the modulated actuation signals.

As another example of operation, computing device 12-x is coupled to a drive-sense circuit 28 that is coupled to a sensor 30 and is coupled to a drive-sense circuit 28 that is coupled to an actuator 32. In this example, the sensor 30 and the actuator 32 are for use by the computing device 12-x. For example, the sensor 30 may be a piezoelectric microphone and the actuator 32 may be a piezoelectric speaker.

Figure 2:
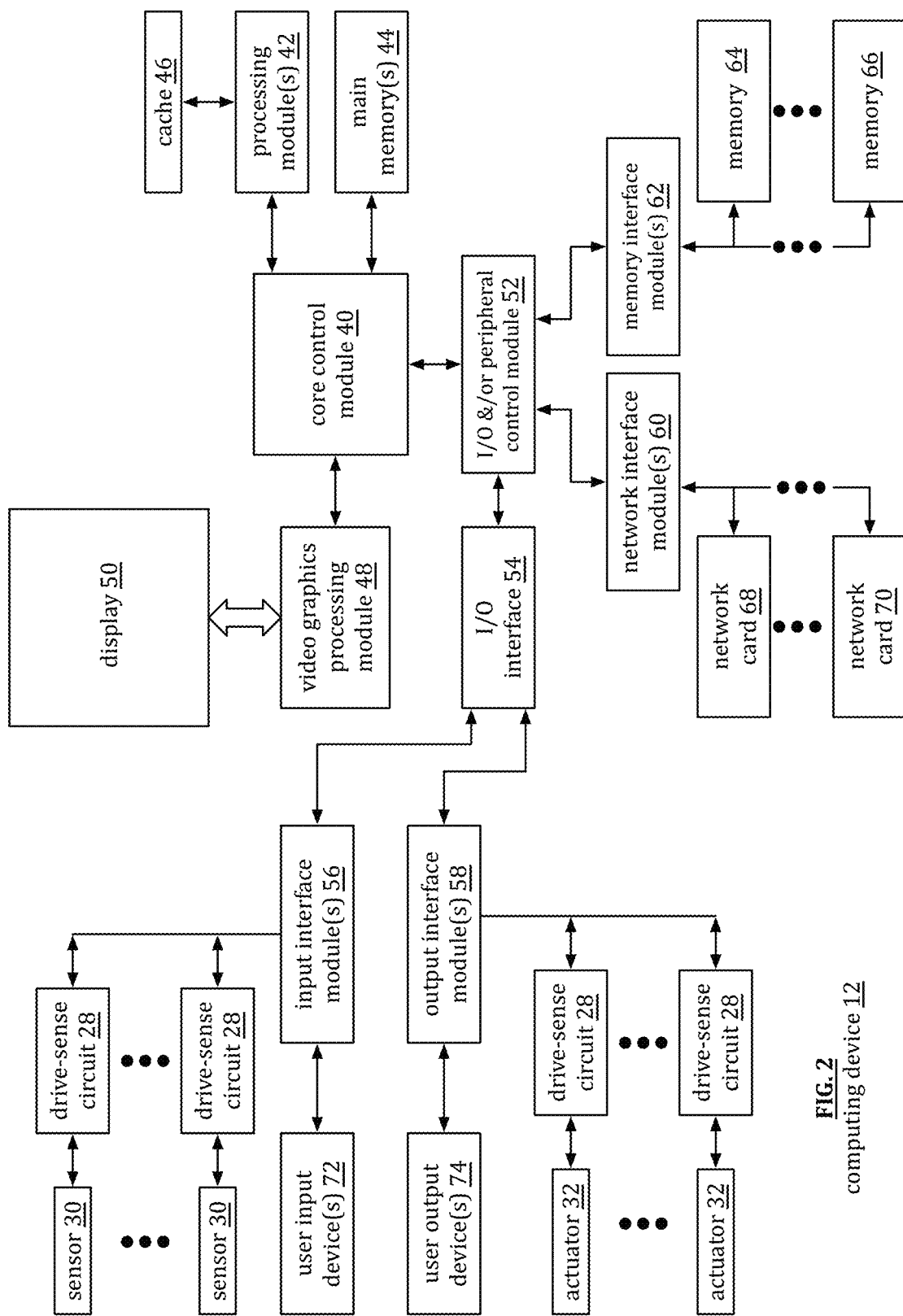
FIG. 2 is a schematic block diagram of an embodiment of a computing device in accordance with the present invention.

FIG. 2 is a schematic block diagram of an embodiment of a computing device 12 (e.g., any one of 12-1 through 12-x). The computing device 12 includes a core control module 40, one or more processing modules 42, one or more main memories 44, cache memory 46, a video graphics processing module 48, a display 50, an Input-Output (I/O) peripheral control module 52, one or more input interface modules 56, one or more output interface modules 58, one or more network interface modules 60, and one or more memory interface modules 62. A processing module 42 is described in greater detail at the end of the detailed description of the invention section and, in an alternative embodiment, has a direction connection to the main memory 44. In an alternate embodiment, the core control module 40 and the I/O and/or peripheral control module 52 are one module, such as a chipset, a quick path interconnect (QPI), and/or an ultra-path interconnect (UPI).

Each of the main memories 44 includes one or more Random Access Memory (RAM) integrated circuits, or chips. For example, a main memory 44 includes four DDR4 (4th generation of double data rate) RAM chips, each running at a rate of 2,400 MHz. In general, the main memory 44 stores data and operational instructions most relevant for the processing module 42. For example, the core control module 40 coordinates the transfer of data and/or operational instructions from the main memory 44 and the memory 64-66. The data and/or operational instructions retrieve from memory 64-66 are the data and/or operational instructions requested by the processing module or will most likely be needed by the processing module. When the processing module is done with the data and/or operational instructions in main memory, the core control module 40 coordinates sending updated data to the memory 64-66 for storage.

The memory 64-66 includes one or more hard drives, one or more solid state memory chips, and/or one or more other large capacity storage devices that, in comparison to cache memory and main memory devices, is/are relatively inexpensive with respect to cost per amount of data stored. The memory 64-66 is coupled to the core control module 40 via the I/O and/or peripheral control module 52 and via one or more memory interface modules 62. In an embodiment, the I/O and/or peripheral control module 52 includes one or more Peripheral Component Interface (PCI) buses to which peripheral components connect to the core control module 40. A memory interface module 62 includes a software driver and a hardware connector for coupling a memory device to the I/O and/or peripheral control module 52. For example, a memory interface 62 is in accordance with a Serial Advanced Technology Attachment (SATA) port.

The core control module 40 coordinates data communications between the processing module(s) 42 and the network(s) 26 via the I/O and/or peripheral control module 52, the network interface module(s) 60, and a network card 68 or 70. A network card 68 or 70 includes a wireless communication unit or a wired communication unit. A wireless communication unit includes a wireless local area network (WLAN) communication device, a cellular communication device, a Bluetooth device, and/or a ZigBee communication device. A wired communication unit includes a Gigabit LAN connection, a Firewire connection, and/or a proprietary computer wired connection. A network interface module 60 includes a software driver and a hardware connector for coupling the network card to the I/O and/or peripheral control module 52. For example, the network interface module 60 is in accordance with one or more versions of IEEE 802.11, cellular telephone protocols, 10/100/1000 Gigabit LAN protocols, etc.

The core control module 40 coordinates data communications between the processing module(s) 42 and input device(s) 72 via the input interface module(s) 56 and the I/O and/or peripheral control module 52. An input device 72 includes a keypad, a keyboard, control switches, a touchpad, a microphone, a camera, etc. An input interface module 56 includes a software driver and a hardware connector for coupling an input device to the I/O and/or peripheral control module 52. In an embodiment, an input interface module 56 is in accordance with one or more Universal Serial Bus (USB) protocols.

The core control module 40 coordinates data communications between the processing module(s) 42 and output device(s) 74 via the output interface module(s) 58 and the I/O and/or peripheral control module 52. An output device 74 includes a speaker, etc. An output interface module 58 includes a software driver and a hardware connector for coupling an output device to the I/O and/or peripheral control module 52. In an embodiment, an output interface module 56 is in accordance with one or more audio codec protocols.

The processing module 42 communicates directly with a video graphics processing module 48 to display data on the display 50. The display 50 includes an LED (light emitting diode) display, an LCD (liquid crystal display), and/or other type of display technology. The display has a resolution, an aspect ratio, and other features that affect the quality of the display. The video graphics processing module 48 receives data from the processing module 42, processes the data to produce rendered data in accordance with the characteristics of the display, and provides the rendered data to the display 50.

FIG. 2 further illustrates sensors 30 and actuators 32 coupled to drive-sense circuits 28, which are coupled to the input interface module 56 (e.g., USB port). Alternatively, one or more of the drive-sense circuits 28 is coupled to the computing device via a wireless network card (e.g., WLAN) or a wired network card (e.g., Gigabit LAN). While not shown, the computing device 12 further includes a BIOS (Basic Input Output System) memory coupled to the core control module 40.

Figure 3:
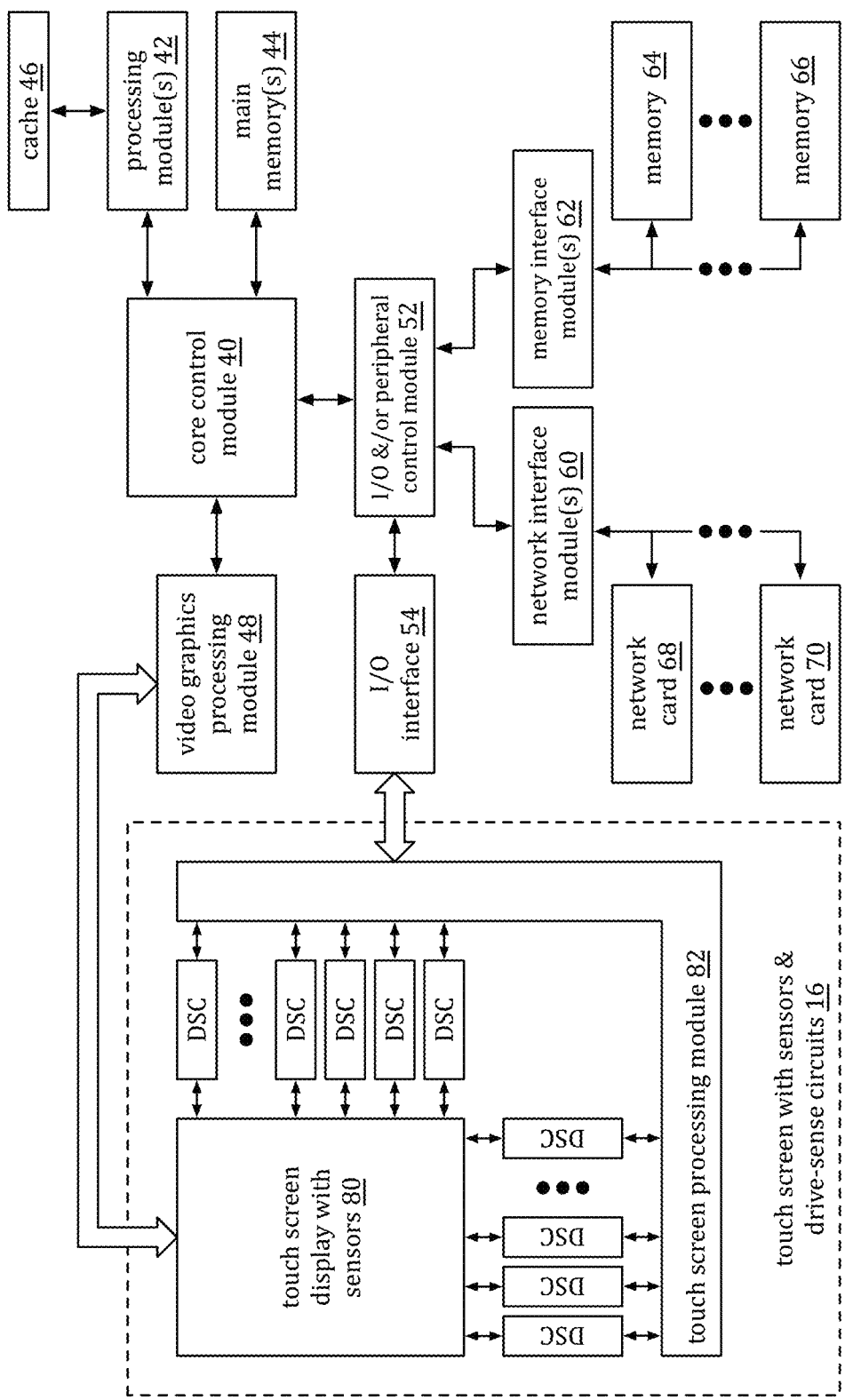
FIG. 3 is a schematic block diagram of another embodiment of a computing device in accordance with the present invention.

FIG. 3 is a schematic block diagram of another embodiment of a computing device 14 that includes a core control module 40, one or more processing modules 42, one or more main memories 44, cache memory 46, a video graphics processing module 48, a touch screen 16, an Input-Output (I/O) peripheral control module 52, one or more input interface modules 56, one or more output interface modules 58, one or more network interface modules 60, and one or more memory interface modules 62. The touch screen 16 includes a touch screen display 80, a plurality of sensors 30, a plurality of drive-sense circuits (DSC), and a touch screen processing module 82.

Computing device 14 operates similarly to computing device 12 of FIG. 2 with the addition of a touch screen as an input device. The touch screen includes a plurality of sensors (e.g., electrodes, capacitor sensing cells, capacitor sensors, inductive sensor, etc.) to detect a proximal touch of the screen. For example, when one or more fingers touches the screen, capacitance of sensors proximal to the touch(es) are affected (e.g., impedance changes). The drive-sense circuits (DSC) coupled to the affected sensors detect the change and provide a representation of the change to the touch screen processing module 82, which may be a separate processing module or integrated into the processing module 42.

The touch screen processing module 82 processes the representative signals from the drive-sense circuits (DSC) to determine the location of the touch(es). This information is inputted to the processing module 42 for processing as an input. For example, a touch represents a selection of a button on screen, a scroll function, a zoom in-out function, etc.

Figure 4:
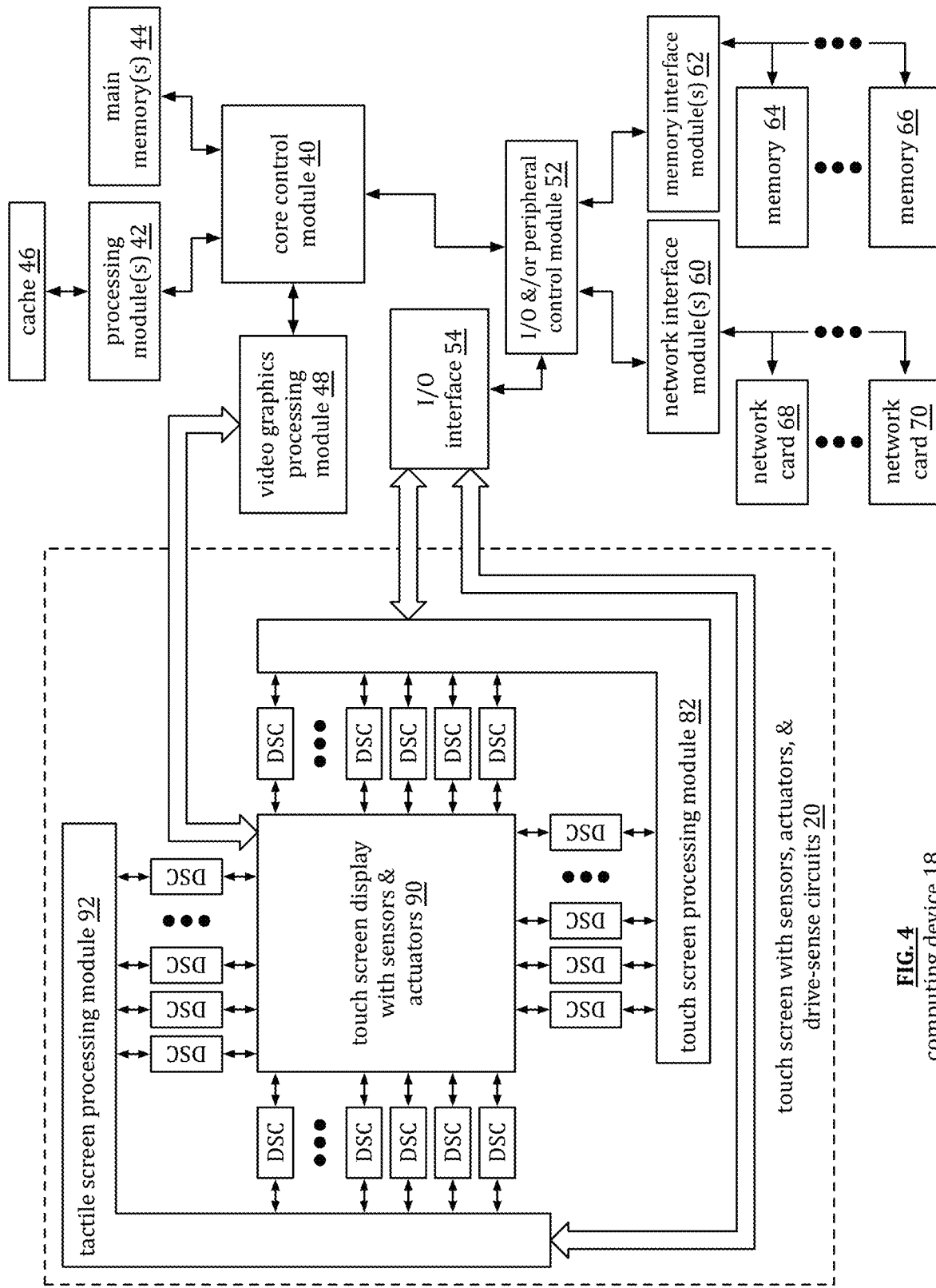
FIG. 4 is a schematic block diagram of another embodiment of a computing device in accordance with the present invention.

FIG. 4 is a schematic block diagram of another embodiment of a computing device 18 that includes a core control module 40, one or more processing modules 42, one or more main memories 44, cache memory 46, a video graphics processing module 48, a touch and tactile screen 20, an Input-Output (I/O) peripheral control module 52, one or more input interface modules 56, one or more output interface modules 58, one or more network interface modules 60, and one or more memory interface modules 62. The touch and tactile screen 20 includes a touch and tactile screen display 90, a plurality of sensors 30, a plurality of actuators 32, a plurality of drive-sense circuits (DSC), a touch screen processing module 82, and a tactile screen processing module 92.

Computing device 18 operates similarly to computing device 14 of FIG. 3 with the addition of a tactile aspect to the screen 20 as an output device. The tactile portion of the screen 20 includes the plurality of actuators (e.g., piezoelectric transducers to create vibrations, solenoids to create movement, etc.) to provide a tactile feel to the screen 20. To do so, the processing module creates tactile data, which is provided to the appropriate drive-sense circuits (DSC) via the tactile screen processing module 92, which may be a stand-alone processing module or integrated into processing module 42. The drive-sense circuits (DSC) convert the tactile data into drive-actuate signals and provide them to the appropriate actuators to create the desired tactile feel on the screen 20.

Figure 5A:
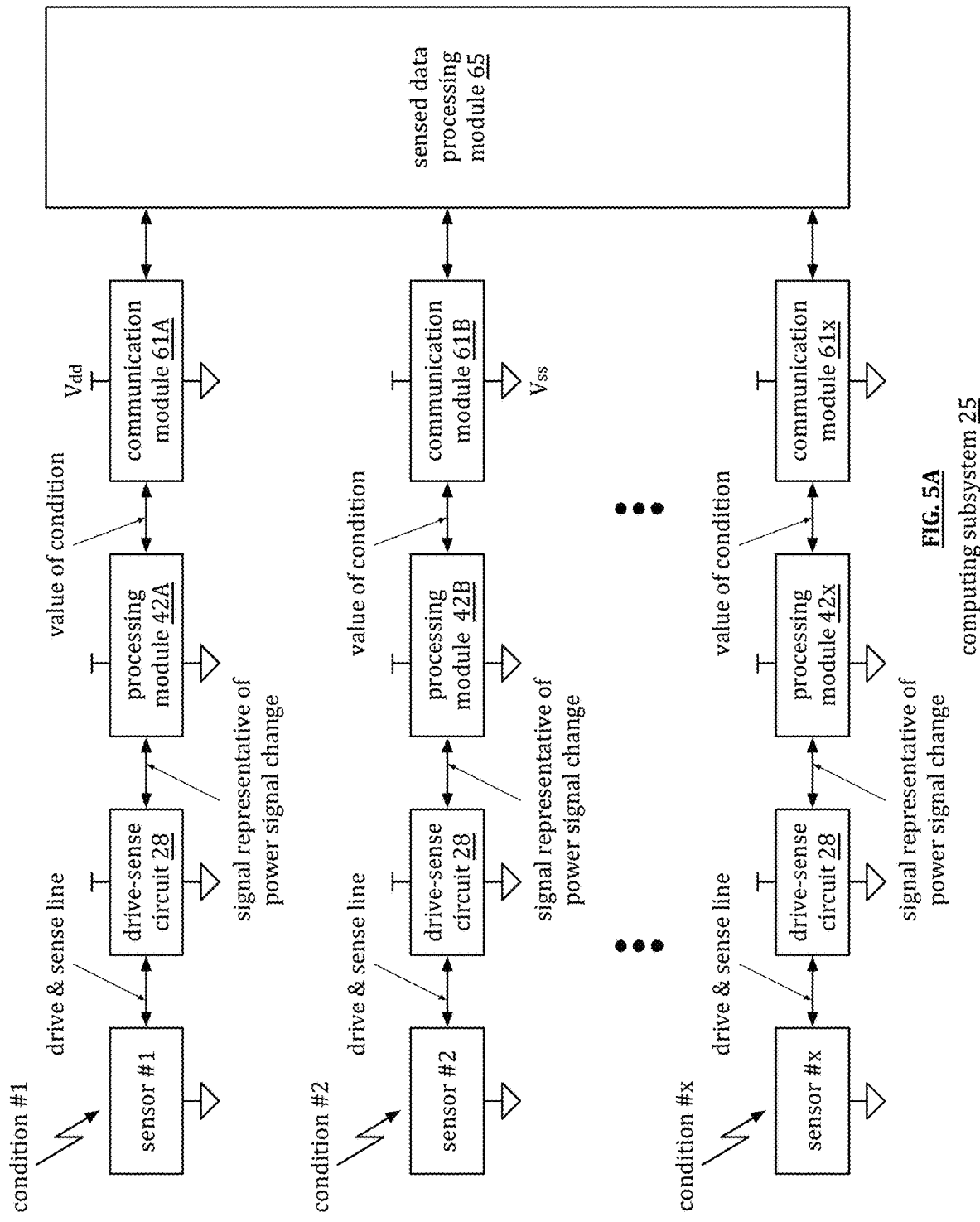
FIG. 5A is a schematic plot diagram of a computing subsystem in accordance with the present invention.

FIG. 5A is a schematic plot diagram of a computing subsystem 25 that includes a sensed data processing module 65, a plurality of communication modules 61A-x, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing devices in which processing modules 42A— x reside.

A drive-sense circuit 28 (or multiple drive-sense circuits), a processing module (e.g., 41A), and a communication module (e.g., 61A) are within a common computing device. Each grouping of a drive-sense circuit(s), processing module, and communication module is in a separate computing device. A communication module 61A-x is constructed in accordance with one or more wired communication protocol and/or one or more wireless communication protocols that is/are in accordance with the one or more of the Open System Interconnection (OSI) model, the Transmission Control Protocol/Internet Protocol (TCP/IP) model, and other communication protocol module.

In an example of operation, a processing module (e.g., 42A) provides a control signal to its corresponding drive-sense circuit 28. The processing module 42 A may generate the control signal, receive it from the sensed data processing module 65, or receive an indication from the sensed data processing module 65 to generate the control signal. The control signal enables the drive-sense circuit 28 to provide a drive signal to its corresponding sensor. The control signal may further include a reference signal having one or more frequency components to facilitate creation of the drive signal and/or interpreting a sensed signal received from the sensor.

Based on the control signal, the drive-sense circuit 28 provides the drive signal to its corresponding sensor (e.g., 1) on a drive & sense line. While receiving the drive signal (e.g., a power signal, a regulated source signal, etc.), the sensor senses a physical condition 1-x (e.g., acoustic waves, a biological condition, a chemical condition, an electric condition, a magnetic condition, an optical condition, a thermal condition, and/or a mechanical condition). As a result of the physical condition, an electrical characteristic (e.g., impedance, voltage, current, capacitance, inductance, resistance, reactance, etc.) of the sensor changes, which affects the drive signal. Note that if the sensor is an optical sensor, it converts a sensed optical condition into an electrical characteristic.

The drive-sense circuit 28 detects the effect on the drive signal via the drive & sense line and processes the affect to produce a signal representative of power change, which may be an analog or digital signal. The processing module 42A receives the signal representative of power change, interprets it, and generates a value representing the sensed physical condition. For example, if the sensor is sensing pressure, the value representing the sensed physical condition is a measure of pressure (e.g., x PSI (pounds per square inch)).

In accordance with a sensed data process function (e.g., algorithm, application, etc.), the sensed data processing module 65 gathers the values representing the sensed physical conditions from the processing modules. Since the sensors 1-x may be the same type of sensor (e.g., a pressure sensor), may each be different sensors, or a combination thereof; the sensed physical conditions may be the same, may each be different, or a combination thereof. The sensed data processing module 65 processes the gathered values to produce one or more desired results. For example, if the computing subsystem 25 is monitoring pressure along a pipeline, the processing of the gathered values indicates that the pressures are all within normal limits or that one or more of the sensed pressures is not within normal limits.

As another example, if the computing subsystem 25 is used in a manufacturing facility, the sensors are sensing a variety of physical conditions, such as acoustic waves (e.g., for sound proofing, sound generation, ultrasound monitoring, etc.), a biological condition (e.g., a bacterial contamination, etc.) a chemical condition (e.g., composition, gas concentration, etc.), an electric condition (e.g., current levels, voltage levels, electro-magnetic interference, etc.), a magnetic condition (e.g., induced current, magnetic field strength, magnetic field orientation, etc.), an optical condition (e.g., ambient light, infrared, etc.), a thermal condition (e.g., temperature, etc.), and/or a mechanical condition (e.g., physical position, force, pressure, acceleration, etc.).

The computing subsystem 25 may further include one or more actuators in place of one or more of the sensors and/or in addition to the sensors. When the computing subsystem includes an actuator, the corresponding processing module provides an actuation control signal to the corresponding drive-sense circuit 28. The actuation control signal enables the drive-sense circuit 28 to provide a drive signal to the actuator via a drive & actuate line (e.g., similar to the drive & sense line, but for the actuator). The drive signal includes one or more frequency components and/or amplitude components to facilitate a desired actuation of the actuator.

In addition, the computing subsystem 25 may include an actuator and sensor working in concert. For example, the sensor is sensing the physical condition of the actuator. In this example, a drive-sense circuit provides a drive signal to the actuator and another drive sense signal provides the same drive signal, or a scaled version of it, to the sensor. This allows the sensor to provide near immediate and continuous sensing of the actuator's physical condition. This further allows for the sensor to operate at a first frequency and the actuator to operate at a second frequency.

In an embodiment, the computing subsystem is a stand-alone system for a wide variety of applications (e.g., manufacturing, pipelines, testing, monitoring, security, etc.). In another embodiment, the computing subsystem 25 is one subsystem of a plurality of subsystems forming a larger system. For example, different subsystems are employed based on geographic location. As a specific example, the computing subsystem 25 is deployed in one section of a factory and another computing subsystem is deployed in another part of the factory. As another example, different subsystems are employed based function of the subsystems. As a specific example, one subsystem monitors a city's traffic light operation and another subsystem monitors the city's sewage treatment plants.

Regardless of the use and/or deployment of the computing system, the physical conditions it is sensing, and/or the physical conditions it is actuating, each sensor and each actuator (if included) is driven and sensed by a single line as opposed to separate drive and sense lines. This provides many advantages including, but not limited to, lower power requirements, better ability to drive high impedance sensors, lower line to line interference, and/or concurrent sensing functions.

FIG. 5B is a schematic block diagram of another embodiment of a computing subsystem 25 that includes a sensed data processing module 65, a communication module 61, a plurality of processing modules 42A-x, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device, devices, in which processing modules 42A-x reside.

In an embodiment, the drive-sense circuits 28, the processing modules, and the communication module are within a common computing device. For example, the computing device includes a central processing unit that includes a plurality of processing modules. The functionality and operation of the sensed data processing module 65, the communication module 61, the processing modules 42A-x, the drive sense circuits 28, and the sensors 1-x are as discussed with reference to FIG. 5A.

FIG. 5C is a schematic block diagram of another embodiment of a computing subsystem 25 that includes a sensed data processing module 65, a communication module 61, a processing module 42, a plurality of drive sense circuits 28, and a plurality of sensors 1-x, which may be sensors 30 of FIG. 1. The sensed data processing module 65 is one or more processing modules within one or more servers 22 and/or one more processing modules in one or more computing devices that are different than the computing device in which the processing module 42 resides.

In an embodiment, the drive-sense circuits 28, the processing module, and the communication module are within a common computing device. The functionality and operation of the sensed data processing module 65, the communication module 61, the processing module 42, the drive sense circuits 28, and the sensors 1-x are as discussed with reference to FIG. 5A.

Figure 5D:
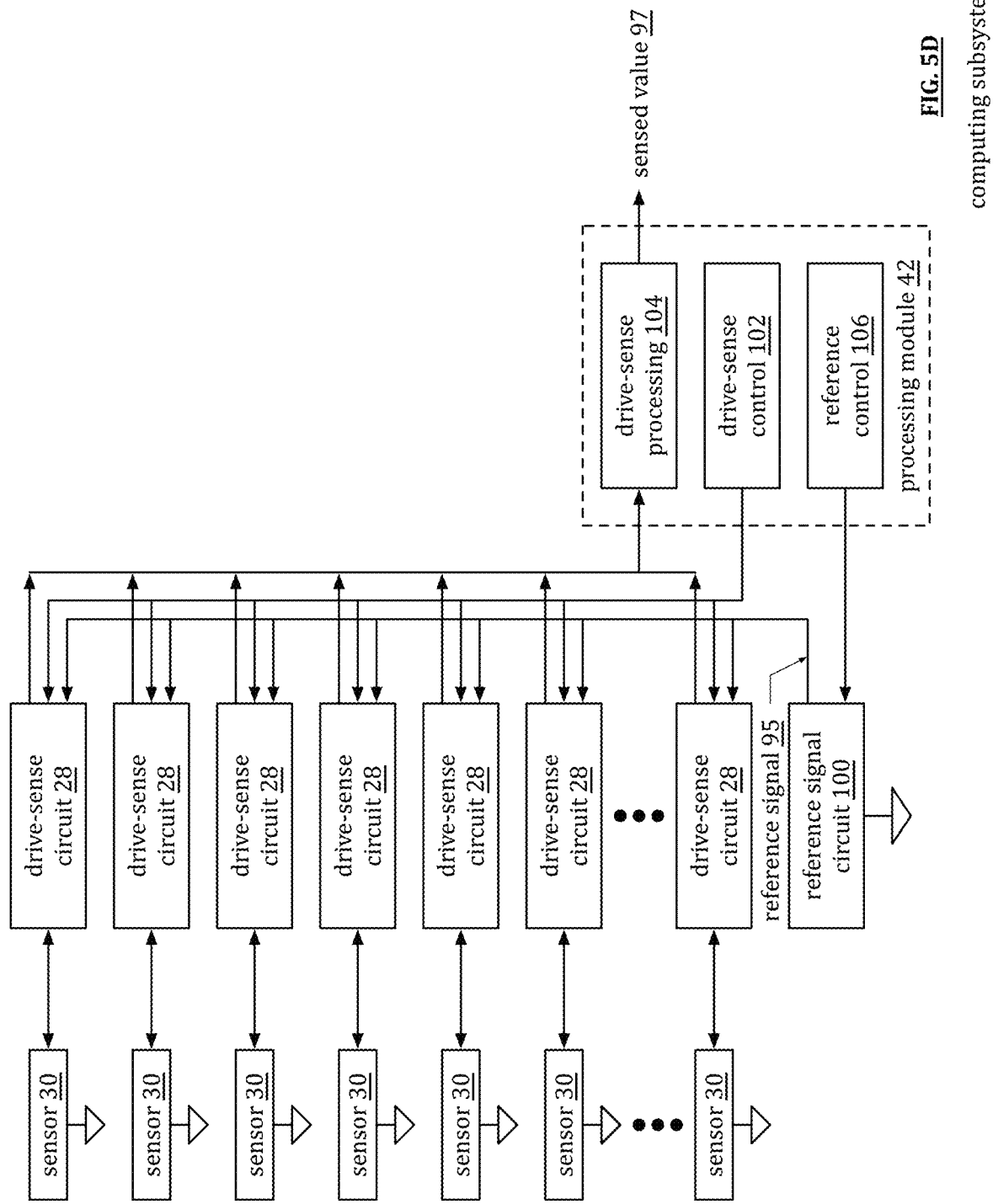
FIG. 5D is a schematic block diagram of another embodiment of a computing subsystem in accordance with the present invention.

FIG. 5D is a schematic block diagram of another embodiment of a computing subsystem 25 that includes a processing module 42, a reference signal circuit 100, a plurality of drive sense circuits 28, and a plurality of sensors 30. The processing module 42 includes a drive-sense processing block 104, a drive-sense control block 102, and a reference control block 106. Each block 102-106 of the processing module 42 may be implemented via separate modules of the processing module, may be a combination of software and hardware within the processing module, and/or may be field programmable modules within the processing module 42.

In an example of operation, the drive-sense control block 104 generates one or more control signals to activate one or more of the drive-sense circuits 28. For example, the drive-sense control block 102 generates a control signal that enables of the drive-sense circuits 28 for a given period of time (e.g., 1 second, 1 minute, etc.). As another example, the drive-sense control block 102 generates control signals to sequentially enable the drive-sense circuits 28. As yet another example, the drive-sense control block 102 generates a series of control signals to periodically enable the drive-sense circuits 28 (e.g., enabled once every second, every minute, every hour, etc.).

Continuing with the example of operation, the reference control block 106 generates a reference control signal that it provides to the reference signal circuit 100. The reference signal circuit 100 generates, in accordance with the control signal, one or more reference signals for the drive-sense circuits 28. For example, the control signal is an enable signal, which, in response, the reference signal circuit 100 generates a pre-programmed reference signal that it provides to the drive-sense circuits 28. In another example, the reference signal circuit 100 generates a unique reference signal for each of the drive-sense circuits 28. In yet another example, the reference signal circuit 100 generates a first unique reference signal for each of the drive-sense circuits 28 in a first group and generates a second unique reference signal for each of the drive-sense circuits 28 in a second group.

The reference signal circuit 100 may be implemented in a variety of ways. For example, the reference signal circuit 100 includes a DC (direct current) voltage generator, an AC voltage generator, and a voltage combining circuit. The DC voltage generator generates a DC voltage at a first level and the AC voltage generator generates an AC voltage at a second level, which is less than or equal to the first level. The voltage combining circuit combines the DC and AC voltages to produce the reference signal. As examples, the reference signal circuit 100 generates a reference signal similar to the signals shown in FIG. 7, which will be subsequently discussed.

As another example, the reference signal circuit 100 includes a DC current generator, an AC current generator, and a current combining circuit. The DC current generator generates a DC current a first current level and the AC current generator generates an AC current at a second current level, which is less than or equal to the first current level. The current combining circuit combines the DC and AC currents to produce the reference signal.

Returning to the example of operation, the reference signal circuit 100 provides the reference signal, or signals, to the drive-sense circuits 28. When a drive-sense circuit 28 is enabled via a control signal from the drive sense control block 102, it provides a drive signal to its corresponding sensor 30. As a result of a physical condition, an electrical characteristic of the sensor is changed, which affects the drive signal. Based on the detected effect on the drive signal and the reference signal, the drive-sense circuit 28 generates a signal representative of the effect on the drive signal.

The drive-sense circuit provides the signal representative of the effect on the drive signal to the drive-sense processing block 104. The drive-sense processing block 104 processes the representative signal to produce a sensed value 97 of the physical condition (e.g., a digital value that represents a specific temperature, a specific pressure level, etc.). The processing module 42 provides the sensed value 97 to another application running on the computing device, to another computing device, and/or to a server 22.

Figure 5E:
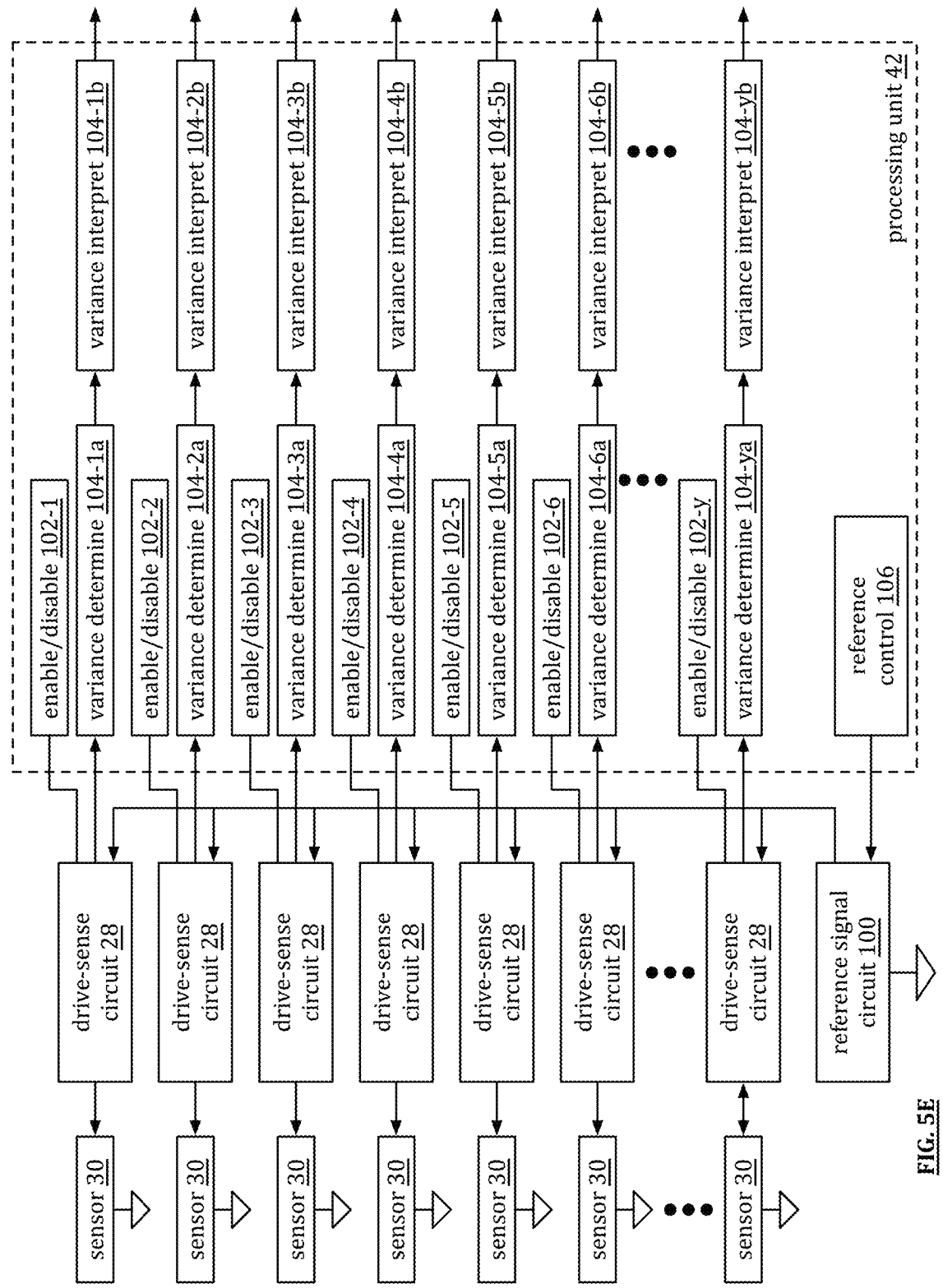
FIG. 5E is a schematic block diagram of another embodiment of a computing subsystem in accordance with the present invention.

FIG. 5E is a schematic block diagram of another embodiment of a computing subsystem 25 that includes a processing module 42, a plurality of drive sense circuits 28, and a plurality of sensors 30. This embodiment is similar to the embodiment of FIG. 5D with the functionality of the drive-sense processing block 104, a drive-sense control block 102, and a reference control block 106 shown in greater detail. For instance, the drive-sense control block 102 includes individual enable/disable blocks 102-1 through 102-y. An enable/disable block functions to enable or disable a corresponding drive-sense circuit in a manner as discussed above with reference to FIG. 5D.

The drive-sense processing block 104 includes variance determining modules 104-1a through y and variance interpreting modules 104-2a through y. For example, variance determining module 104-1a receives, from the corresponding drive-sense circuit 28, a signal representative of a physical condition sensed by a sensor. The variance determining module 104-1a functions to determine a difference from the signal representing the sensed physical condition with a signal representing a known, or reference, physical condition. The variance interpreting module 104-1b interprets the difference to determine a specific value for the sensed physical condition.

As a specific example, the variance determining module 104-1a receives a digital signal of 1001 0110 (150 in decimal) that is representative of a sensed physical condition (e.g., temperature) sensed by a sensor from the corresponding drive-sense circuit 28. With 8-bits, there are 28 (256) possible signals representing the sensed physical condition. Assume that the units for temperature is Celsius and a digital value of 0100 0000 (64 in decimal) represents the known value for 25 degree Celsius. The variance determining module 104-b1 determines the difference between the digital signal representing the sensed value (e.g., 1001 0110, 150 in decimal) and the known signal value of (e.g., 0100 0000, 64 in decimal), which is 0011 0000 (86 in decimal). The variance determining module 104-*b*1 then determines the sensed value based on the difference and the known value. In this example, the sensed value equals 25+86*(100/256) =25+33.6=58.6 degrees Celsius.

FIG. 6 is a schematic block diagram of a drive center circuit 28-*a* coupled to a sensor 30. The drive sense-sense circuit 28 includes a power source circuit 110 and a power signal change detection circuit 112. The sensor 30 includes one or more transducers that have varying electrical characteristics (e.g., capacitance, inductance, impedance, current, voltage, etc.) based on varying physical conditions 114 (e.g., pressure, temperature, biological, chemical, etc.), or vice versa (e.g., an actuator).

The power source circuit 110 is operably coupled to the sensor 30 and, when enabled (e.g., from a control signal from the processing module 42, power is applied, a switch is closed, a reference signal is received, etc.) provides a power signal 116 to the sensor 30. The power source circuit 110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provide a desired power level to the sensor and substantially matches impedance of the sensor. The power source circuit 110 generates the power signal 116 to include a DC (direct current) component and/or an oscillating component.

When receiving the power signal 116 and when exposed to a condition 114, an electrical characteristic of the sensor affects 118 the power signal. When the power signal change detection circuit 112 is enabled, it detects the affect 118 on the power signal as a result of the electrical characteristic of the sensor. For example, the power signal is a 1.5 voltage signal and, under a first condition, the sensor draws 1 milliamp of current, which corresponds to an impedance of 1.5 K Ohms. Under a second conditions, the power signal remains at 1.5 volts and the current increases to 1.5 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

As another example, the power signal is a 1.5 voltage signal and, under a first condition, the sensor draws 1 milliamp of current, which corresponds to an impedance of 1.5 K Ohms. Under a second conditions, the power signal drops to 1.3 volts and the current increases to 1.3 milliamps. As such, from condition 1 to condition 2, the impedance of the sensor changed from 1.5 K Ohms to 1 K Ohms. The power signal change detection circuit 112 determines this change and generates a representative signal 120 of the change to the power signal.

The power signal 116 includes a DC component 122 and/or an oscillating component 124 as shown in FIG. 7. The oscillating component 124 includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component). Note that the power signal is shown without affect from the sensor as the result of a condition or changing condition.

In an embodiment, power generating circuit 110 varies frequency of the oscillating component 124 of the power signal 116 so that it can be tuned to the impedance of the sensor and/or to be off-set in frequency from other power signals in a system. For example, a capacitance sensor's impedance decreases with frequency. As such, if the frequency of the oscillating component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

In an embodiment, the power generating circuit 110 varies magnitude of the DC component 122 and/or the oscillating component 124 to improve resolution of sensing and/or to adjust power consumption of sensing. In addition, the power generating circuit 110 generates the drive signal 110 such that the magnitude of the oscillating component 124 is less than magnitude of the DC component 122.

FIG. 6A is a schematic block diagram of a drive center circuit 28-*a*1 coupled to a sensor 30. The drive sense-sense circuit 28-*a*1 includes a signal source circuit 111, a signal change detection circuit 113, and a power source 115. The power source 115 (e.g., a battery, a power supply, a current source, etc.) generates a voltage and/or current that is combined with a signal 117, which is produced by the signal source circuit 111. The combined signal is supplied to the sensor 30.

The signal source circuit 111 may be a voltage supply circuit (e.g., a battery, a linear regulator, an unregulated DC-to-DC converter, etc.) to produce a voltage-based signal 117, a current supply circuit (e.g., a current source circuit, a current mirror circuit, etc.) to produce a current-based signal 117, or a circuit that provide a desired power level to the sensor and substantially matches impedance of the sensor. The signal source circuit 111 generates the signal 117 to include a DC (direct current) component and/or an oscillating component.

When receiving the combined signal (e.g., signal 117 and power from the power source) and when exposed to a condition 114, an electrical characteristic of the sensor affects 119 the signal. When the signal change detection circuit 113 is enabled, it detects the affect 119 on the signal as a result of the electrical characteristic of the sensor.

FIG. 8 is an example of a sensor graph that plots an electrical characteristic versus a condition. The sensor has a substantially linear region in which an incremental change in a condition produces a corresponding incremental change in the electrical characteristic. The graph shows two types of electrical characteristics: one that increases as the condition increases and the other that decreases and the condition increases. As an example of the first type, impedance of a temperature sensor increases and the temperature increases. As an example of a second type, a capacitance touch sensor decreases in capacitance as a touch is sensed.

FIG. 9 is a schematic block diagram of another example of a power signal graph in which the electrical characteristic or change in electrical characteristic of the sensor is affecting the power signal. In this example, the effect of the electrical characteristic or change in electrical characteristic of the sensor reduced the DC component but had little to no effect on the oscillating component. For example, the electrical characteristic is resistance. In this example, the resistance or change in resistance of the sensor decreased the power signal, inferring an increase in resistance for a relatively constant current.

FIG. 10 is a schematic block diagram of another example of a power signal graph in which the electrical characteristic or change in electrical characteristic of the sensor is affecting the power signal. In this example, the effect of the electrical characteristic or change in electrical characteristic of the sensor reduced magnitude of the oscillating component but had little to no effect on the DC component. For example, the electrical characteristic is impedance of a capacitor and/or an inductor. In this example, the impedance or change in impedance of the sensor decreased the magnitude of the oscillating signal component, inferring an increase in impedance for a relatively constant current.

FIG. 11 is a schematic block diagram of another example of a power signal graph in which the electrical characteristic or change in electrical characteristic of the sensor is affecting the power signal. In this example, the effect of the electrical characteristic or change in electrical characteristic of the sensor shifted frequency of the oscillating component but had little to no effect on the DC component. For example, the electrical characteristic is reactance of a capacitor and/or an inductor. In this example, the reactance or change in reactance of the sensor shifted frequency of the oscillating signal component, inferring an increase in reactance (e.g., sensor is functioning as an integrator or phase shift circuit).

FIG. 11A is a schematic block diagram of another example of a power signal graph in which the electrical characteristic or change in electrical characteristic of the sensor is affecting the power signal. In this example, the effect of the electrical characteristic or change in electrical characteristic of the sensor changes the frequency of the oscillating component but had little to no effect on the DC component. For example, the sensor includes two transducers that oscillate at different frequencies. The first transducer receives the power signal at a frequency of $f_1$ and converts it into a first physical condition. The second transducer is stimulated by the first physical condition to create an electrical signal at a different frequency $f_2$. In this example, the first and second transducers of the sensor change the frequency of the oscillating signal component, which allows for more granular sensing and/or a broader range of sensing.

FIG. 12 is a schematic block diagram of an embodiment of a power signal change detection circuit 112 receiving the affected power signal 118 and the power signal 116 as generated to produce, therefrom, the signal representative 120 of the power signal change. The affect 118 on the power signal is the result of an electrical characteristic and/or change in the electrical characteristic of a sensor; a few examples of the affects are shown in FIGS. 8-11A.

In an embodiment, the power signal change detection circuit 112 detect a change in the DC component 122 and/or the oscillating component 124 of the power signal 116. The power signal change detection circuit 112 then generates the signal representative 120 of the change to the power signal based on the change to the power signal. For example, the change to the power signal results from the impedance of the sensor and/or a change in impedance of the sensor. The representative signal 120 is reflective of the change in the power signal and/or in the change in the sensor's impedance.

In an embodiment, the power signal change detection circuit 112 is operable to detect a change to the oscillating component at a frequency, which may be a phase shift, frequency change, and/or change in magnitude of the oscillating component. The power signal change detection circuit 112 is also operable to generate the signal representative of the change to the power signal based on the change to the oscillating component at the frequency. The power signal change detection circuit 112 is further operable to provide feedback to the power source circuit 110 regarding the oscillating component. The feedback allows the power source circuit 110 to regulate the oscillating component at the desired frequency, phase, and/or magnitude.

FIG. 13 is a schematic block diagram of another embodiment of a drive sense circuit 28-*b* includes a change detection circuit 150, a regulation circuit 152, and a power source circuit 154. The drive-sense circuit 28-*b* is coupled to the sensor 30, which includes a transducer that has varying electrical characteristics (e.g., capacitance, inductance, impedance, current, voltage, etc.) based on varying physical conditions 114 (e.g., pressure, temperature, biological, chemical, etc.).

The power source circuit 154 is operably coupled to the sensor 30 and, when enabled (e.g., from a control signal from the processing module 42, power is applied, a switch is closed, a reference signal is received, etc.) provides a power signal 158 to the sensor 30. The power source circuit 154 may be a voltage supply circuit (e.g., a battery, a linear regulator, an unregulated DC-to-DC converter, etc.) to produce a voltage-based power signal or a current supply circuit (e.g., a current source circuit, a current mirror circuit, etc.) to produce a current-based power signal. The power source circuit 154 generates the power signal 158 to include a DC (direct current) component and an oscillating component.

When receiving the power signal 158 and when exposed to a condition 114, an electrical characteristic of the sensor affects 160 the power signal. When the change detection circuit 150 is enabled, it detects the affect 160 on the power signal as a result of the electrical characteristic of the sensor 30. The change detection circuit 150 is further operable to generate a signal 120 that is representative of change to the power signal based on the detected effect on the power signal.

The regulation circuit 152, when its enabled, generates regulation signal 156 to regulate the DC component to a desired DC level and/or regulate the oscillating component to a desired oscillating level (e.g., magnitude, phase, and/or frequency) based on the signal 120 that is representative of the change to the power signal. The power source circuit 154 utilizes the regulation signal 156 to keep the power signal at a desired setting 158 regardless of the electrical characteristic of the sensor. In this manner, the amount of regulation is indicative of the affect the electrical characteristic had on the power signal.

In an example, the power source circuit 158 is a DC-DC converter operable to provide a regulated power signal having DC and AC components. The change detection circuit 150 is a comparator and the regulation circuit 152 is a pulse width modulator to produce the regulation signal 156. The comparator compares the power signal 158, which is affected by the sensor, with a reference signal that includes DC and AC components. When the electrical characteristics is at a first level (e.g., a first impedance), the power signal is regulated to provide a voltage and current such that the power signal substantially resembles the reference signal.

When the electrical characteristics changes to a second level (e.g., a second impedance), the change detection circuit 150 detects a change in the DC and/or AC component of the power signal 158 and generates the representative signal 120, which indicates the changes. The regulation circuit 152 detects the change in the representative signal 120 and creates the regulation signal to substantially remove the effect on the power signal. The regulation of the power signal 158 may be done by regulating the magnitude of the DC and/or AC components, by adjusting the frequency of AC component, and/or by adjusting the phase of the AC component.

With respect to the operation of various drive-sense circuits as described herein and/or their equivalents, note that the operation of such a drive-sense circuit is operable simultaneously to drive and sense a signal via a single line. In comparison to switched, time-divided, time-multiplexed, etc. operation in which there is switching between driving and sensing (e.g., driving at first time, sensing at second time, etc.) of different respective signals at separate and distinct times, the drive-sense circuit is operable simultaneously to perform both driving and sensing of a signal. In some examples, such simultaneous driving and sensing is performed via a single line using a drive-sense circuit.

In addition, other alternative implementations of various drive-sense circuits are described in U.S. Utility patent application Ser. No. 16/113,379, entitled "DRIVE SENSE CIRCUIT WITH DRIVE-SENSE LINE,", filed 08-27-2018, now issued as U.S. Pat. No. 11,099,032 on Aug. 24, 2021. Any instantiation of a drive-sense circuit as described herein may also be implemented using any of the various implementations of various drive-sense circuits described in U.S. Utility patent application Ser. No. 16/113,379.

In addition, note that the one or more signals provided from a drive-sense circuit (DSC) may be of any of a variety of types. For example, such a signal may be based on encoding of one or more bits to generate one or more coded bits used to generate modulation data (or generally, data). For example, a device is configured to perform forward error correction (FEC) and/or error checking and correction (ECC) code of one or more bits to generate one or more coded bits. Examples of FEC and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, binary convolutional code (BCC), Cyclic Redundancy Check (CRC), and/or any other type of ECC and/or FEC code and/or combination thereof, etc. Note that more than one type of ECC and/or FEC code may be used in any of various implementations including concatenation (e.g., first ECC and/or FEC code followed by second ECC and/or FEC code, etc. such as based on an inner code/outer code architecture, etc.), parallel architecture (e.g., such that first ECC and/or FEC code operates on first bits while second ECC and/or FEC code operates on second bits, etc.), and/or any combination thereof.

Also, the one or more coded bits may then undergo modulation or symbol mapping to generate modulation symbols (e.g., the modulation symbols may include data intended for one or more recipient devices, components, elements, etc.). Note that such modulation symbols may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.).

In addition, note that a signal provided from a DSC may be of a unique frequency that is different from signals provided from other DSCs. Also, a signal provided from a DSC may include multiple frequencies independently or simultaneously. The frequency of the signal can be hopped on a pre-arranged pattern. In some examples, a handshake is established between one or more DSCs and one or more processing module (e.g., one or more controllers) such that the one or more DSC is/are directed by the one or more processing modules regarding which frequency or frequencies and/or which other one or more characteristics of the one or more signals to use at one or more respective times and/or in one or more particular situations.

With respect to any signal that is driven and simultaneously detected by a DSC, note that any additional signal that is coupled into a line, an electrode, a touch sensor, a bus, a communication link, a battery, a load, an electrical coupling or connection, etc. associated with that DSC is also detectable. For example, a DSC that is associated with such a line, an electrode, a touch sensor, a bus, a communication link, a battery, a load, an electrical coupling or connection, etc. is configured to detect any signal from one or more other lines, electrodes, touch sensors, buses, communication links, loads, electrical couplings or connections, etc. that get coupled into that line, electrode, touch sensor, bus, communication link, battery, load, electrical coupling or connection, etc.

Note that the different respective signals that are driven and simultaneously sensed by one or more DSCs may be differentiated from one another. Appropriate filtering and processing can identify the various signals given their differentiation, orthogonality to one another, difference in frequency, etc. Other examples described herein and their equivalents operate using any of a number of different characteristics other than or in addition to frequency.

Moreover, with respect to any embodiment, diagram, example, etc. that includes more than one DSC, note that the DSCs may be implemented in a variety of manners. For example, all of the DSCs may be of the same type, implementation, configuration, etc. In another example, the first DSC may be of a first type, implementation, configuration, etc., and a second DSC may be of a second type, implementation, configuration, etc. that is different than the first DSC. Considering a specific example, a first DSC may be implemented to detect change of impedance associated with a line, an electrode, a touch sensor, a bus, a communication link, a battery, a load, an electrical coupling or connection, etc. associated with that first DSC, while a second DSC may be implemented to detect change of voltage associated with a line, an electrode, a touch sensor, a bus, a communication link, a battery, a load, an electrical coupling or connection, etc. associated with that second DSC. In addition, note that a third DSC may be implemented to detect change of a current associated with a line, an electrode, a touch sensor, a bus, a communication link, a battery, a load, an electrical coupling or connection, etc. associated with that DSC. In general, while a common reference may be used generally to show a DSC or multiple instantiations of a DSC within a given embodiment, diagram, example, etc., note that any particular DSC may be implemented in accordance with any manner as described herein, such as described in U.S. Utility patent application Ser. No. 16/113,379, etc. and/or their equivalents.

Note that certain of the following diagrams show one or more processing modules. In certain instances, the one or more processing modules is configured to communicate with and interact with one or more other devices including one or more of DSCs, one or more components associated with a DSC, input electric power, one or more components associated with battery, a load being serviced by a battery, a battery charge circuit, etc. Note that any such implementation of one or more processing modules may include integrated memory and/or be coupled to other memory. At least some of the memory stores operational instructions to be executed by the one or more processing modules. In addition, note that the one or more processing modules may interface with one or more other devices, components, elements, etc. via one or more communication links, networks, communication pathways, channels, etc.

In addition, when a DSC is implemented to communicate with and interact with another element, the DSC is configured simultaneously to transmit and receive one or more signals with the element. For example, a DSC is configured simultaneously to sense and to drive one or more signals to the one element. During transmission of a signal from a DSC, that same DSC is configured simultaneously to sense the signal being transmitted from the DSC and any other signal may be coupled into the signal that is being transmitted from the DSC.

Many embodiments, examples, etc. described herein deal with the interaction between one or more drive-sense circuits (DSCs) and a battery. A particular battery may be implemented in a variety of different contexts and applications. Generally speaking, a battery may be viewed as being an energy source that is operative to provide electric energy via the flow of electrons through an electric circuit. A battery is often described as including three basic components, namely, an anode (the negative terminal/electrode), a cathode (the positive terminal/electrode), and an electrolyte. In certain battery implementations, the fourth component, a separator/insulator, may be implemented within the electrolyte to prevent the cathode from coming in contact with the anode, which carries the negative charge.

Chemical reactions in the battery and particularly within the electrolyte cause a buildup of electrons at the anode (the negative terminal/electrode), which, as a result, generates an electrical difference between the anode and cathode. During discharge when the battery is servicing one or more loads and an electric circuit is closed between the anode and the cathode, the electrons are able to pass through the electric circuit from the anode to the cathode thereby powering the electric circuit. The electrolyte of the battery prevents the electrons from going straight from the anode to the cathode within the battery and instead operate to service the electric circuit. The chemicals inside of the battery, the electrolyte, may be viewed as the element that prevents the electrons from traveling between the respective terminals/electrodes of the battery. When an electric circuit is connected to the battery, there is an alternative pathway for the electrons to flow, and the electrons flow from the anode (the negative terminal/electrode) to the cathode (the positive terminal/electrode). Also, in the electrical engineering arts, note that current is typically defined as flowing from a positive terminal of the battery to the negative terminal of the battery. As the battery continues to service the one or more loads, electrochemical processes within the battery change the anode and the cathode and reduce their ability to continue supplying electrons to service the electric circuit.

Note that certain examples herein include providing a charge signal or a monitoring signal to a positive terminal of a battery. Note also that a charge signal or a monitoring signal may alternatively be provided to a negative terminal of a battery in certain examples (e.g., such as providing an alternative means by which battery charging and/or characterization may be performed). In an example, a monitoring signal (e.g., as including an AC only component) is selected to have a magnitude as not to interfere adversely with the operation of the battery even when provided to the positive or negative terminal of a battery.

During charging of the battery or recharge of the battery, an external source of electric power is used to change the direction of the flow of electrons in the battery again. When this happens, the electro-chemical processes within the battery that operate to service the one or more loads are reversed, and the anode and cathode are restored back to, or close to, their original state and are thereby able to service one or more loads and provide power thereto.

Note that the anode (the negative terminal/electrode) and the cathode (the positive terminal/electrode) within a battery are made from two different materials that both have electrically conductive capabilities. One of the materials provides electrons and the other received them thereby facilitating the flow of current and enabling the battery to service one or more loads providing power thereto. As the two different types of metal electrodes, the anode (the negative terminal/electrode) and the cathode (the positive terminal/electrode), are immersed in the electrolyte of the battery, the chemicals of the electrolyte react with the metal electrodes causing excess electrons to build up on the anode (the negative terminal/electrode) and producing a shortage of electrons on the cathode (the positive terminal/electrode). This difference in number of electrons on the anode (the negative terminal/electrode) and the cathode (the positive terminal/electrode) creates a voltage, sometimes referred to as an electromotive force, which may be harnessed to provide electric power to one or more loads.

From certain perspectives, the electrolyte of the battery may be viewed as a chemical medium that facilitates the flow of electrical charge between the cathode and the anode. When servicing a load, the chemical reactions on the electrodes of the battery generate an electric current and the flow of electric energy that may be used to service one or more loads. Specifically, the chemical reactions on the anode release electrons to the negative terminal, and via an oxidation reaction, ions into the electrolyte while the positive terminal accepts the electrons thereby closing the electric circuit to facilitate the delivery of electric energy to the one or more loads.

In addition, an actual battery is a non-ideal component having internal impedance (e.g., resistance and/or reactance), will have a finite lifetime, will have burying and changing characteristics over a lifetime, will have susceptibility to environmental conditions including temperature, etc. Among other things, this disclosure provides various means by which monitoring and/or characterization of a battery may be performed using one or more DSCs. In addition, not only may such monitoring and/or characterization of the battery be performed including determining the current electrical characteristics thereof, but various means of monitoring the operation and health of the battery are presented including using one or more DSCs in conjunction with one or more other components such as electrodes that are appropriately implemented to monitor for and detect undesirable buildup of gases within a battery. Based upon such monitoring and/or characterization of the battery during charging, during load servicing, during a standby operational mode, when idle, etc. allow for improved utilization of the battery and extension of the life thereof. For example, based on detection of any one or more adverse conditions (e.g., buildup of gas, changing impedance, etc.) one or more corrective actions may be taken including to provide an error signal to a user, adapting operation of one or more circuits with which the battery is coupled or connected to, initiating a battery replacement operation, etc.

In addition, the monitoring and/or characterization of the battery allows for improved interaction with the battery in accordance with charging of the battery including, in some examples, to facilitate maximum power transfer during a charging process. By maximizing power transfer during the charging process, the effective charge time of the battery may be reduced. Providing for means of reduction in the time to charge a battery thereby reducing down time, increasing the time of servicing a load, increasing user experience, and many other improvements and benefits as well.

Figure 14:
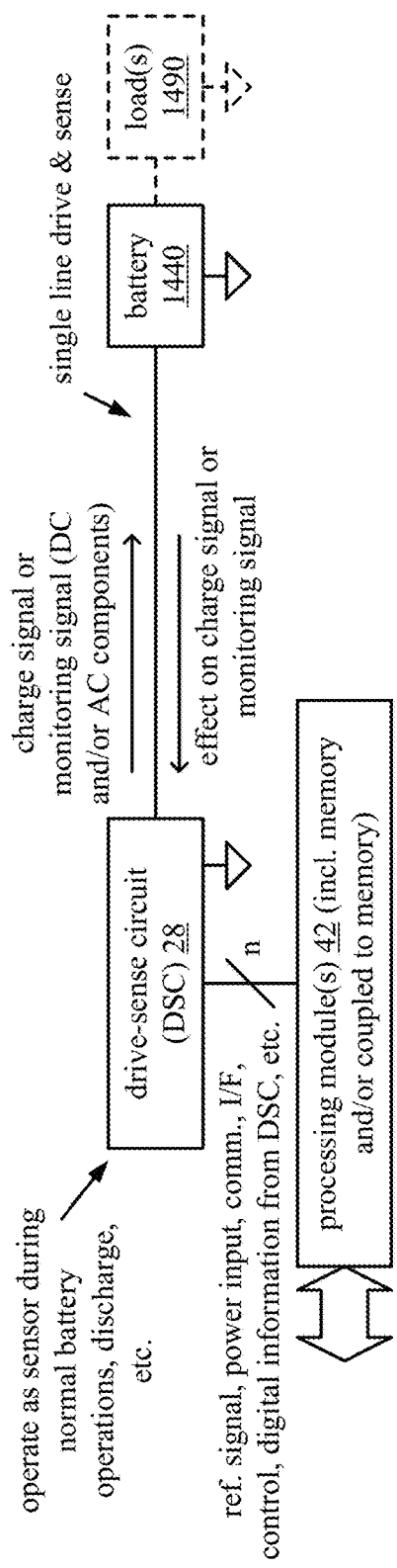
FIG. 14 is a schematic block diagram of an embodiment of a drive-sense circuit (DSC) configured simultaneously to drive and sense a charge signal to a battery that may optionally be implemented to service one or more loads in accordance with the present invention.

FIG. 14 is a schematic block diagram of an embodiment 1400 of a drive-sense circuit (DSC) configured simultaneously to drive and sense a charge signal to a battery 14440 that may optionally be implemented to service one or more loads 1490 in accordance with the present invention. In this diagram and others herein, note that the battery 1440 may be of a variety of types including rechargeable, lead acid (e.g., such as may be used in automotive applications, energy storage in solar cell/photovoltaic applications, etc.), Lithium-ion (alternative referred to as Li-ion) of any of a variety of types including Lithium Cobalt Oxide (LiCoO2) (e.g., such as used commonly for personal devices such as mobile phones, laptops, digital cameras, etc.), Lithium Manganese Oxide (LiMn2O4), Lithium Nickel Manganese Cobalt Oxide (LiNiMnCoO2 or NMC), Lithium Iron Phosphate (LiFePO4), Lithium Nickel Cobalt Aluminum Oxide (LiNiCoAlO2), Lithium Titanate (Li4Ti5O12), etc., among other types of Lithium-ion (Li-ion) battery types, Nickel-Cadmium, Nickel-metal hydride, etc., among other types of batteries.

In this diagram as well as others here and, one or more processing modules 42 is configured to communicate with and interact with a drive-sense circuit (DSC) 28. Such communication and interaction may be implemented in via any desired number of communication pathways between the one or more processing modules 42 and the DSC 28 (e.g., generally n communication pathways, where n is a positive integer greater than or equal to one). The one or more processing modules 42 is coupled to a DSC 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

The DSC 28 is configured to provide a charge signal to the battery 1440. In some instances, the DSC 28 is configured to provide a charge signal that includes only a DC component to the battery 1440. In other instances, the DSC 28 is configured to provide a charge signal that includes both a DC and AC component. The DSC 28 is configured to use the AC component to perform characterization of the battery 1440. Moreover, in other instances, the DSC 20 just configured to provide a monitoring signal to the battery 1440 that includes no DC component but does include an AC component. In this implementation, the DSC 28 is configured to use the AC component to perform characterization of the battery 1440 even when no charging of the battery 1440 is being performed.

In this diagram, the DSC 28 operates to provide a charge signal or a monitoring signal to the battery 1440 and also simultaneously to detect any effect on the charge signal or the monitoring signal. Note that power may be provided to the DSC 28 in a variety of ways. For example, the one or more processing modules 42 is configured to provide power input to the DSC 28. In other examples described later herein, a separate battery charger supply circuit is configured to provide power to the DSC 28.

In addition, the one or more processing modules 42 is configured to provide a reference signal to the DSC 28, facilitate communication with the DSC 28, perform interfacing and control of the operation of one or more components of the DSC 28, received digital information from the DSC 28 that may be used for a variety of purposes and putting performing characterization of the battery 1440.

Generally speaking, note that the reference signal is provided from the one or more processing modules 42 to the DSC in this diagram as well as any other diagram herein may have any desired form. For example, the reference signal may be selected to have any desired magnitude, frequency, phase, etc. among other various signal characteristics. In addition, the reference signal may have any desired waveform. For example, many examples described herein are directed towards a reference signal having a DC component and/or an AC component. Note that the AC component may have any desired waveform shape including sinusoid, sawtooth wave, triangular wave, square wave, etc. among the various desired waveform shapes. In addition, note that DC component may be positive or negative. Moreover, note that some examples operate having no DC component (e.g., a DC component having a value of zero/0). In addition, note that more the AC component may include more than one component corresponding to more than one frequency. For example, the AC component may include a first AC component having a first frequency and a second AC component having a second frequency. Generally speaking, the AC component may include any number of AC components having any number of respective frequencies.

Note also that the DSC 28, in cooperation with the one or more processing modules 42, is configured to adapt one or more characteristics of the charge signal or the monitoring signal that is provided from the DSC 28 to the battery 1440. For example, in some instances, one or more characteristics of the DC component and/or the AC component of the charge signal is modified and/or adapted during interaction between the DSC 28 in the battery 1440. For example, the DC level of a charge signal may be modified during different time periods and phases of a charge cycle on the battery 1440.

In addition, when performing characterization of the battery 1440 during a charge cycle on the battery 1440, the frequency of the AC component of the charge signal may be modified and/or adapted to facilitate characterization of the battery 1440 across a range of frequencies. In addition, when performing characterization of the battery 1440 during a charge cycle on the battery 1440, the magnitude of the AC component of the charge signal may be modified and/or adapted to facilitate characterization of the battery 1440 across various input signals having different levels. Similarly, when performing characterization of the battery 1440 during non-charging, such as during a monitoring process such as when the battery 1440 is a standby mode, a mode involving servicing of one or more loads 1490, a discharge mode, a mode including normal battery operations, etc. or any other operational mode during which the battery 1440 is not being charged, variation of such characteristics of the AC component of the monitoring signal may be performed including modifying and/or adapting the frequency and/or magnitude of the AC component of the monitoring signal. In addition, the shape and waveform of the AC component of the charge signal or the monitoring signal may similarly be adapted and modified as a function of time and/or in response to any one or more considerations.

Also, in some examples, note that when the DSC 28 is configured to provide a charge signal to the battery 1440, the charge signal is a current signal such as provided from a current source. In other examples, note that when the DSC 28 is configured to provide a charge signal to the battery 1440, the charge signal is a voltage signal such as provided from a voltage source. Generally speaking, a current source or a voltage source may be implemented to facilitate charging of the battery 1440 by providing a charge signal to the battery 1440. In accordance with charging of the battery 1440, a signal having a nonzero DC offset (e.g., such as a nonzero DC offset voltage with respect to the voltage of the battery, Vbattery) is provided to the battery 1440 to facilitate changing of the voltage of the battery by moving charge of the battery.

Similarly, note that when the DSC 28 is configured to provide a monitoring signal to the battery 1440, the monitoring signal may be either a current signal such as provided from a current source or a voltage signal such as provided from a voltage source. For example, when monitoring and no charging is being performed on the battery 1440 by the DSC 28, the monitoring signal may be a current signal such as provided from a current source or a voltage signal such as provided from a voltage source. Generally speaking, a current source or a voltage source may be implemented to facilitate providing a monitoring signal to the battery 1440 to facilitate battery monitoring and characterization.

With respect to the differentiation between providing a charge signal to the battery 1440 or a monitoring signal to the battery 1440, whether provided as a current signal from a current source or as a voltage signal from voltage source, depends on the DC offset of the signal is being provided to the battery 1440. In accordance with charging of the battery 1440, the charge signal has a nonzero DC offset (e.g., such as a nonzero DC offset voltage with respect to the voltage of the battery, Vbattery). Alternatively, in accordance with monitoring of the battery 1440 without performing charging, a monitoring signal is provided to the battery 1440 that has no DC offset (e.g., such as a zero DC offset voltage with respect to the voltage of the battery, Vbattery).

In an example of operation and implementation, a battery characterization system includes a drive-sense circuit (DSC) and one or more processing modules operably coupled to the DSC. The one or more processing modules is connected or coupled to memory, and/or includes memory, that stores operational instructions.

The DSC is configured to receive a reference signal and to generate a charge signal that includes an AC (alternating current) component based on the reference signal. When enabled, the DSC operably coupled and configured to provide the charge signal to a terminal of a battery via a single line and simultaneously to sense the charge signal via the single line. In certain samples, note that the DSC is coupled or connected to a terminal of the battery via the single line. However, note that the DSC may alternatively be coupled or connected to a negative terminal of the battery via a single line.

Note that the DSC may be coupled or connected to either terminal connection of the battery to facilitate charging of the battery. Note also that the charge signal provided to the terminal of the battery may be positive or negative. That is to say, the charge signal may be implemented by providing a positive signal or a negative signal to a desired terminal of the battery. In some examples, with respect to facilitating charging, a positive signal is provided to a terminal of the battery, and with respect to facilitating discharging, a negative signal is provided to the terminal the battery. However, alternatively, with respect to facilitating charging, a negative signal may be provided to a negative terminal of the battery, and with respect to facilitating discharging, a positive signal may be provided to the negative terminal of the battery. Note that charging of the battery can be performed by connecting to either the positive or negative terminal of the battery to provide a charge signal to that respective terminal. In addition, note that battery monitoring and characterization may be performed by coupling or connecting a DSC to a ground terminal of the battery as well.

Note that the sensing of the charge signal includes detection of an electrical characteristic of the battery that is based on a response of the battery to the charge signal. the DSC is also operably coupled and configured to generate a digital signal representative of the electrical characteristic of the battery that is based on the response of the battery to the charge signal.

When enabled, the one or more processing modules is configured to execute the operational instructions to generate the reference signal to include a frequency sweep of the AC component of the charge signal such that the AC component of the charge signal includes different respective frequencies at or during different respective times including a first frequency at or during a first time and a second frequency different than the first frequency at or during a second time as varying across a predetermined frequency range. Also, at or during the different respective times, the one or more processing modules is configured to execute the operational instructions to process the digital signal representative of the electrical characteristic of the battery that is based on the response of the battery to the AC component of the charge signal that varies across the different respective frequencies of the predetermined frequency range to determine respective values of the electrical characteristic of the battery across the different respective frequencies and to generate spectrum analysis (SA) information of the battery that is based on a signal response of the battery to the frequency sweep of the AC component of the charge signal.

In some examples, the electrical characteristic of the battery across the different respective frequencies includes a first value of the electrical characteristic of the battery based on the first frequency and a second value of the electrical characteristic of the battery based on the second frequency.

Also, note that the electrical characteristic may be of any of a variety of types include any one or more of a resistance of the battery, an impedance of the battery, one or more components of an equivalent circuit model of the battery, a signal response of the battery to the charge signal, a signal response of the battery to the AC component of the charge signal, and/or spectrum analysis (SA) information of the battery that is based on a signal response of the battery to a frequency sweep of the AC component of the charge signal.

Also, in other examples, the battery characterization system also includes a battery charge supply circuit configured to provide a power signal that includes a DC component to the DSC. The DSC is implemented in-line between the battery charge supply circuit and the single line coupling to the terminal of the battery and further configured to add the AC component to the DC component in accordance with generating the charge signal that includes the AC component based on the reference signal.

The DSC may be implemented in a variety of ways. In one example, the DSC includes a comparator configured to receive the reference signal from the one or more processing modules at a first comparator input and to drive the charge signal from a second comparator input to the terminal of the battery via the single line and to generate an output comparator signal based on the reference signal and the charge signal. The DSC also includes a dependent current source operably coupled to source a current to the terminal of the battery via the single line based on control from the output comparator signal. The DSC also includes an analog to digital converter (ADC) operably coupled to the comparator output. When enabled, the ADC operably coupled and configured to process the output comparator signal to generate the digital signal representative of the electrical characteristic of the battery that is based on the response of the battery to the charge signal.

In other specific examples the DSC also includes a power source circuit operably coupled to the terminal of the battery via the single line, wherein, when enabled, the power source circuit is configured to provide the charge signal that includes the AC component via the single line coupling to the terminal of the battery, and the charge signal includes a DC (direct current) component and the AC component. The DSC also includes a power source change detection circuit operably coupled to the power source circuit. When enabled, the power source change detection circuit is configured to detect an effect on the charge signal that is based on the electrical characteristic of the battery and to generate the digital signal representative of the electrical characteristic of the battery that is based on the response of the battery to the charge signal.

Figure 15:
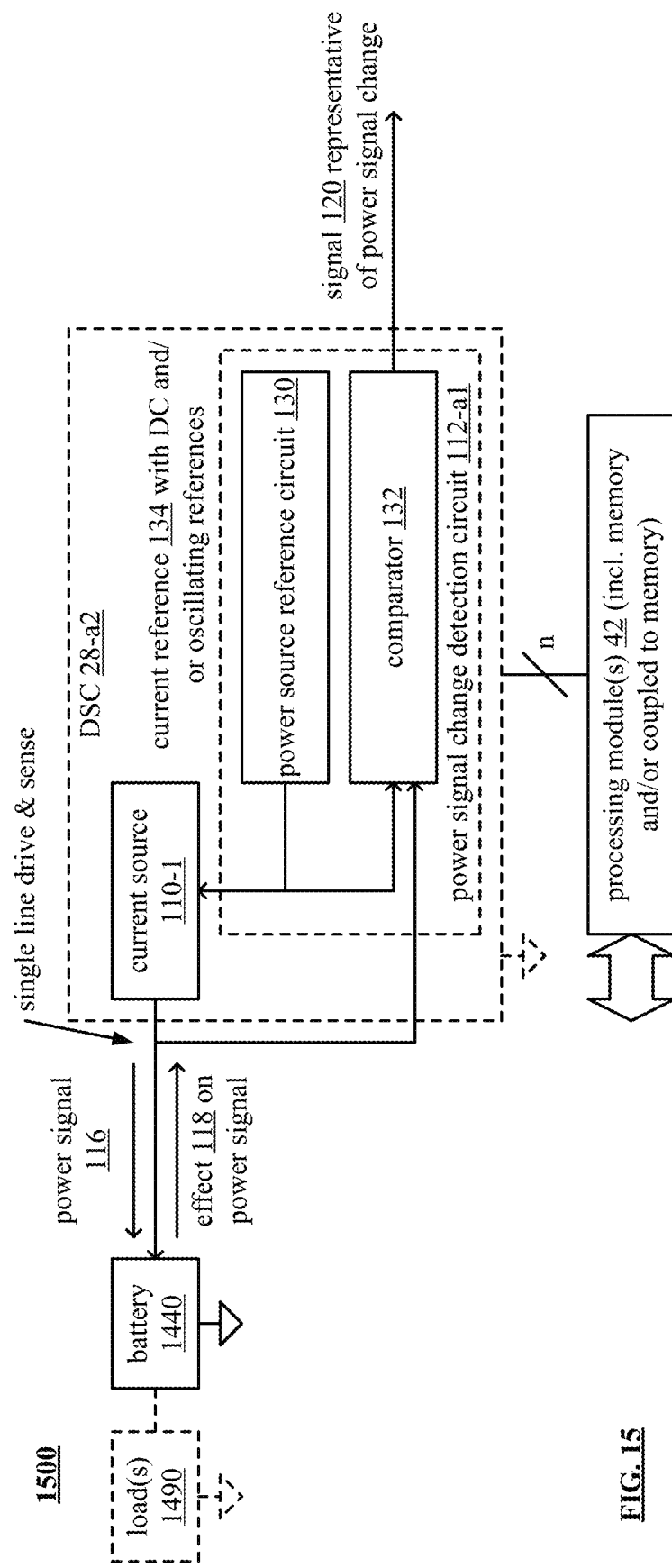
FIG. 15 is a schematic block diagram of an embodiment of a DSC that is interactive with a battery in accordance with the present invention.

FIG. 15 is a schematic block diagram of an embodiment 1500 of a DSC that is interactive with a battery in accordance with the present invention. Similar to other diagrams, examples, embodiments, etc. herein, the DSC 28-*a*2 of this diagram is in communication with one or more processing modules 42. The DSC 28-*a*2 is configured to provide a signal (e.g., a charge signal or a monitoring signal) to the battery 1440 (e.g., to a terminal of the battery 1440) via a single line and simultaneously to sense that signal via the single line. In some examples, sensing the signal includes detection of an electrical of the battery that is based on a response of the battery to that signal. In addition, note that the battery 1440 may be implemented to service and provide energy to one or more loads 1490. In some examples, the DSC 28-*a*2 is configured to provide the signal (e.g., monitoring signal) to the battery 1440 during non-charging related operation of the battery 1440. In other examples, the DSC 28-*a*2 is configured to provide the signal (e.g., charge signal) to the battery 1440 during charging related operation of the battery 1440 which may also correspond to the operation of the battery 1440 in servicing the one or more loads 1490.

This embodiment of a DSC 28-*a*2 includes a current source 110-1 and a power signal change detection circuit 112-*a*1. The power signal change detection circuit 112-*a*1 includes a power source reference circuit 130 and a comparator 132. The current source 110-1 may be an independent current source, a dependent current source, a current mirror circuit, etc.

In an example of operation, the power source reference circuit 130 provides a current reference 134 with DC and oscillating components to the current source 110-1. The current source generates a current as the power signal 116 based on the current reference 134. An electrical characteristic of the battery 1440 has an effect on the current power signal 116. For example, if the impedance of the battery 1440 decreases and the current power signal 116 remains substantially unchanged, the voltage across the battery 1440 is decreased.

The comparator 132 compares the current reference 134 with the affected power signal 118 to produce the signal 120 that is representative of the change to the power signal. For example, the current reference signal 134 corresponds to a given current (I) times a given impedance (Z). The current reference generates the power signal to produce the given current (I). If the impedance of the battery 1440 substantially matches the given impedance (Z), then the comparator's output is reflective of the impedances substantially matching. If the impedance of the battery 1440 is greater than the given impedance (Z), then the comparator's output is indicative of how much greater the impedance of the battery 1440 is than that of the given impedance (Z). If the impedance of the battery 1440 is less than the given impedance (Z), then the comparator's output is indicative of how much less the impedance of the battery 1440 is than that of the given impedance (Z).

Figure 16:
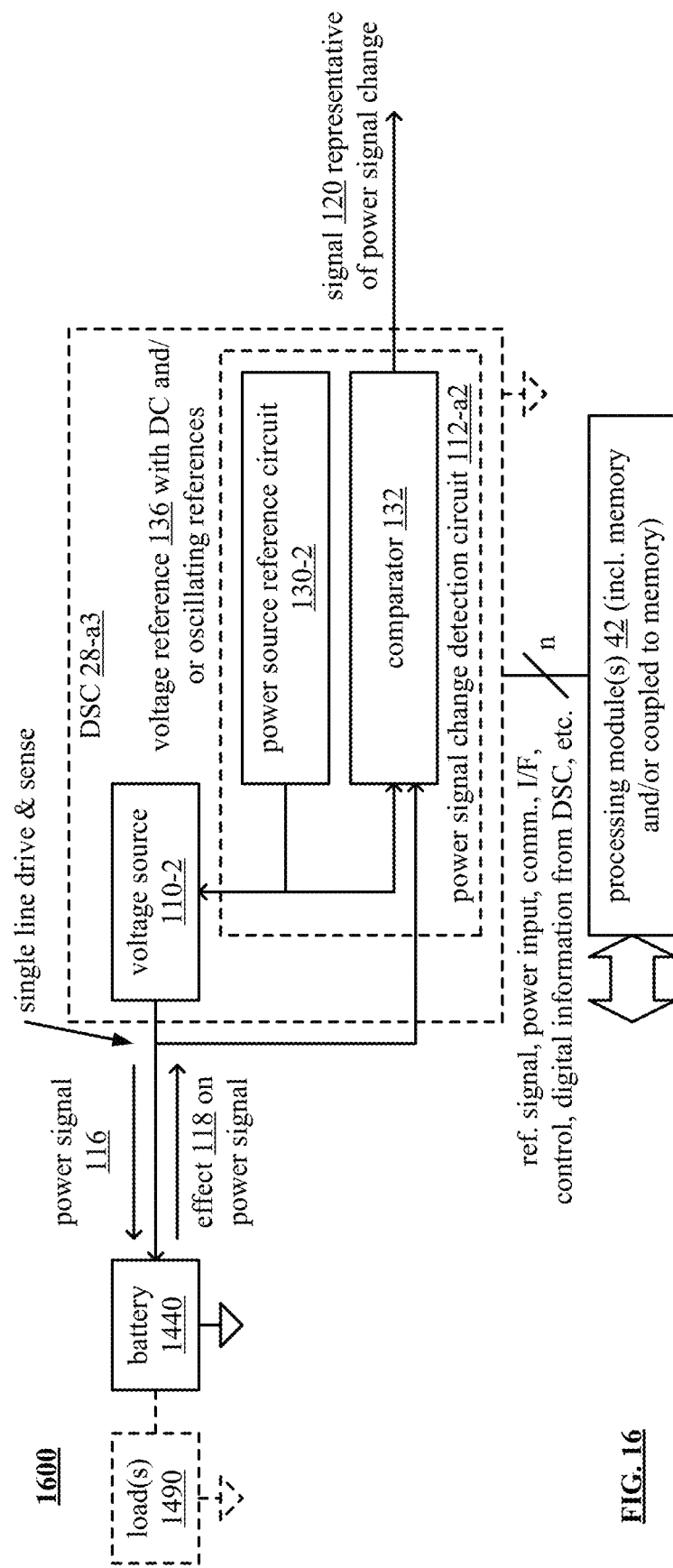
FIG. 16 is a schematic block diagram of another embodiment of a DSC that is interactive with a battery in accordance with the present invention.

FIG. 16 is a schematic block diagram of another embodiment 1600 of a DSC that is interactive with a battery in accordance with the present invention. Similar to other diagrams, examples, embodiments, etc. herein, the DSC 28-*a*3 of this diagram is in communication with one or more processing modules 42. Similar to the previous diagram, although providing a different embodiment of the DSC, the DSC 28-*a*3 is configured to provide a signal (e.g., a monitoring signal) to the battery 1440 (e.g., to a terminal of the battery 1440) via a single line and simultaneously to sense that signal via the single line. In some examples, sensing the signal includes detection of an electrical of the battery that is based on a response of the battery to that signal. In addition, note that the battery 1440 may be implemented to service and provide energy to one or more loads 1490. In some examples, the DSC 28-*a*3 is configured to provide the signal (e.g., monitoring signal) to the battery 1440 during non-charging related operation of the battery 1440.

This embodiment of a DSC 28-*a*3 includes a voltage source 110-2 and a power signal change detection circuit 112-*a*2. The power signal change detection circuit 112-*a*2 includes a power source reference circuit 130-2 and a comparator 132-2. The voltage source 110-2 may be a battery, a linear regulator, a DC-DC converter, etc.

In an example of operation, the power source reference circuit 130-2 provides a voltage reference 136 with DC and oscillating components to the voltage source 110-2. The voltage source generates a voltage as the power signal 116 based on the voltage reference 136. An electrical characteristic of the battery 1440 has an effect on the voltage power signal 116. For example, if the impedance of the battery 1440 decreases and the voltage power signal 116 remains substantially unchanged, the current through the battery 1440 is increased.

The comparator 132 compares the voltage reference 136 with the affected power signal 118 to produce the signal 120 that is representative of the change to the power signal. For example, the voltage reference signal 134 corresponds to a given voltage (V) divided by a given impedance (Z). The voltage reference generates the power signal to produce the given voltage (V). If the impedance of the battery 1440 substantially matches the given impedance (Z), then the comparator's output is reflective of the impedances substantially matching. If the impedance of the battery 1440 is greater than the given impedance (Z), then the comparator's output is indicative of how much greater the impedance of the battery 1440 is than that of the given impedance (Z). If the impedance of the battery 1440 is less than the given impedance (Z), then the comparator's output is indicative of how much less the impedance of the battery 1440 is than that of the given impedance (Z).

Figure 17:
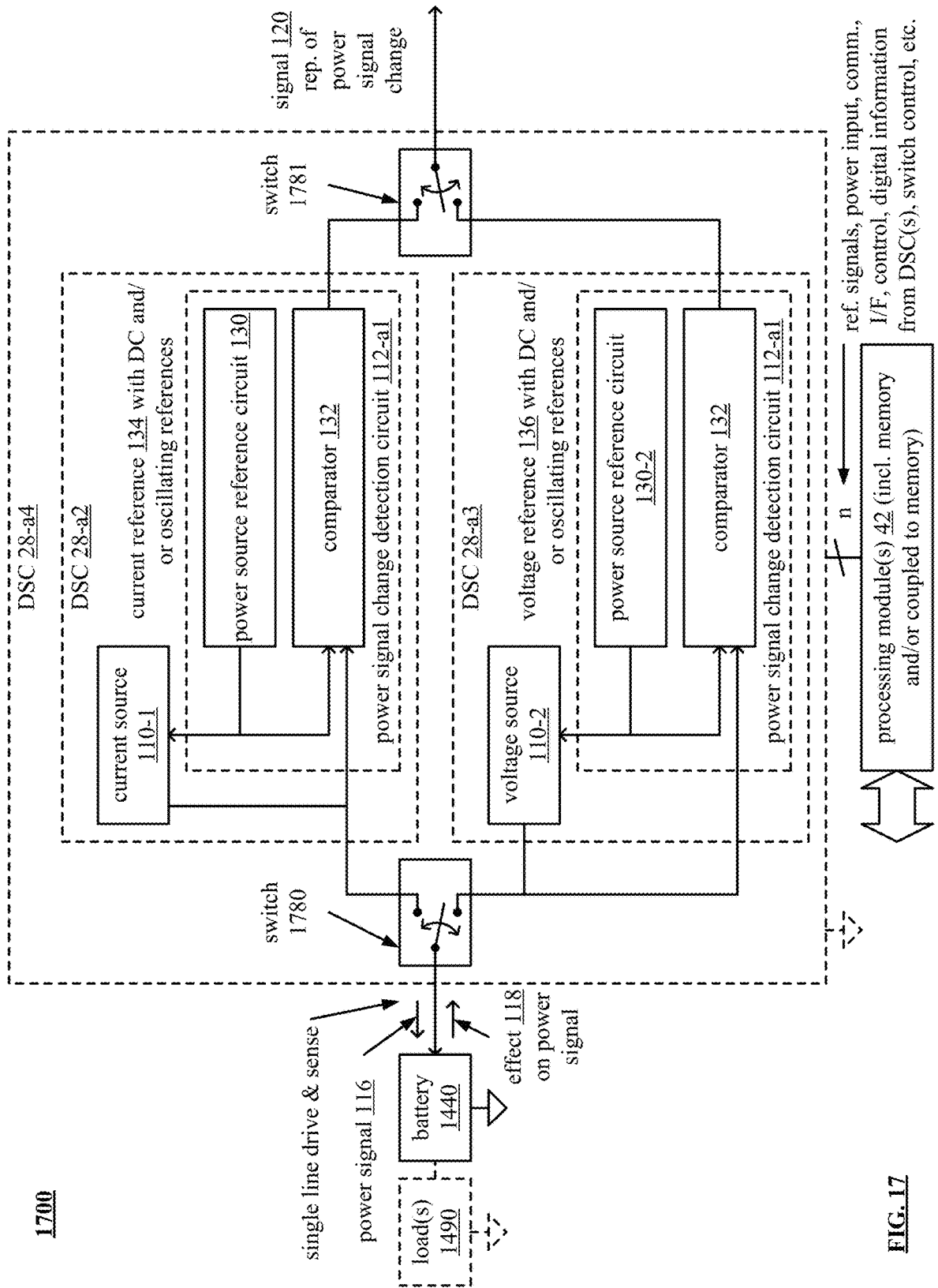
FIG. 17 is a schematic block diagram of another embodiment of a DSC that is interactive with a battery in accordance with the present invention.

FIG. 17 is a schematic block diagram of another embodiment 1700 of a DSC that is interactive with a battery in accordance with the present invention. Similar to other diagrams, examples, embodiments, etc. herein, the DSC 28-*a*4 of this diagram is in communication with one or more processing modules 42.

Generally speaking, this diagram illustrates DSC 28-a4 that includes an implementation of the DSC 28-a2 and the DSC 28-a3 such that either one of them may be implemented to interact with the battery 1440 at a given time. For example, the one or more processing modules 42 is configured to effectuate connectivity of the switches 1780 in 1781 to facilitate operation of the DSC 28-a2 for the DSC 28-a3 at different respective times. In an example of operation and implementation, when performing a charging operation on the battery 1440, the DSC 28-a2 is implemented to interact with the battery 1440 in accordance with providing a charge signal (e.g., a current signal) to the battery 1440 that has a nonzero DC offset (e.g., such as a nonzero DC offset voltage with respect to the voltage of the battery, Vbattery). Note that this mode of operation of performing battery characterization during charge operation of the battery 1440 may be performed during the entire time over which the battery undergoes a charge cycle, only one or more time periods of that time during which the battery undergoes a charge cycle, continually during a charge operation, in response to one or more conditions, etc.

In addition, in another example of operation and implementation, when a non-charging operation of the battery 1440 is being performed such as when performing a monitoring operation (and no charging) on the battery 1440, the DSC 28-a2 is implemented to interact with the battery 1440 in accordance with providing a monitoring signal (e.g., a current signal) to the battery 1440 that has a zero DC offset.

In yet another example of operation and implementation, when a non-charging operation of the battery 1440 is being performed such as when performing a monitoring operation (and no charging) on the battery 1440, the DSC 28-a3 is implemented to interact with the battery 1440 and to provide a voltage signal having a zero DC offset to the battery 1440 such as may be used to facilitate characterization of one or more electrical characteristics of the battery 1440. For example, even when a charging operation on the battery 1440 is not being performed, the one or more processing modules 42 is configured to facilitate operation of the DSC 28-a3 to interact with the battery 1440 so that characterization of the battery 1440 may be performed. Note that this mode of operation of performing battery characterization during non-charge operation of the battery 1440 may be performed at any desired time, continually during operation, in response to one or more conditions, etc.

In yet another example of operation and implementation, when performing a charging operation on the battery 1440, the DSC 28-a1 is implemented to interact with the battery 1440 in accordance with providing a charge signal (e.g., a voltage signal) to the battery 1440 that has a nonzero DC offset (e.g., such as a nonzero DC offset voltage with respect to the voltage of the battery, Vbattery). Note that this mode of operation of performing battery characterization during charge operation of the battery 1440 may also be performed during the entire time over which the battery undergoes a charge cycle, only one or more time periods of that time during which the battery undergoes a charge cycle, continually during a charge operation, in response to one or more conditions, etc.

Figure 18:
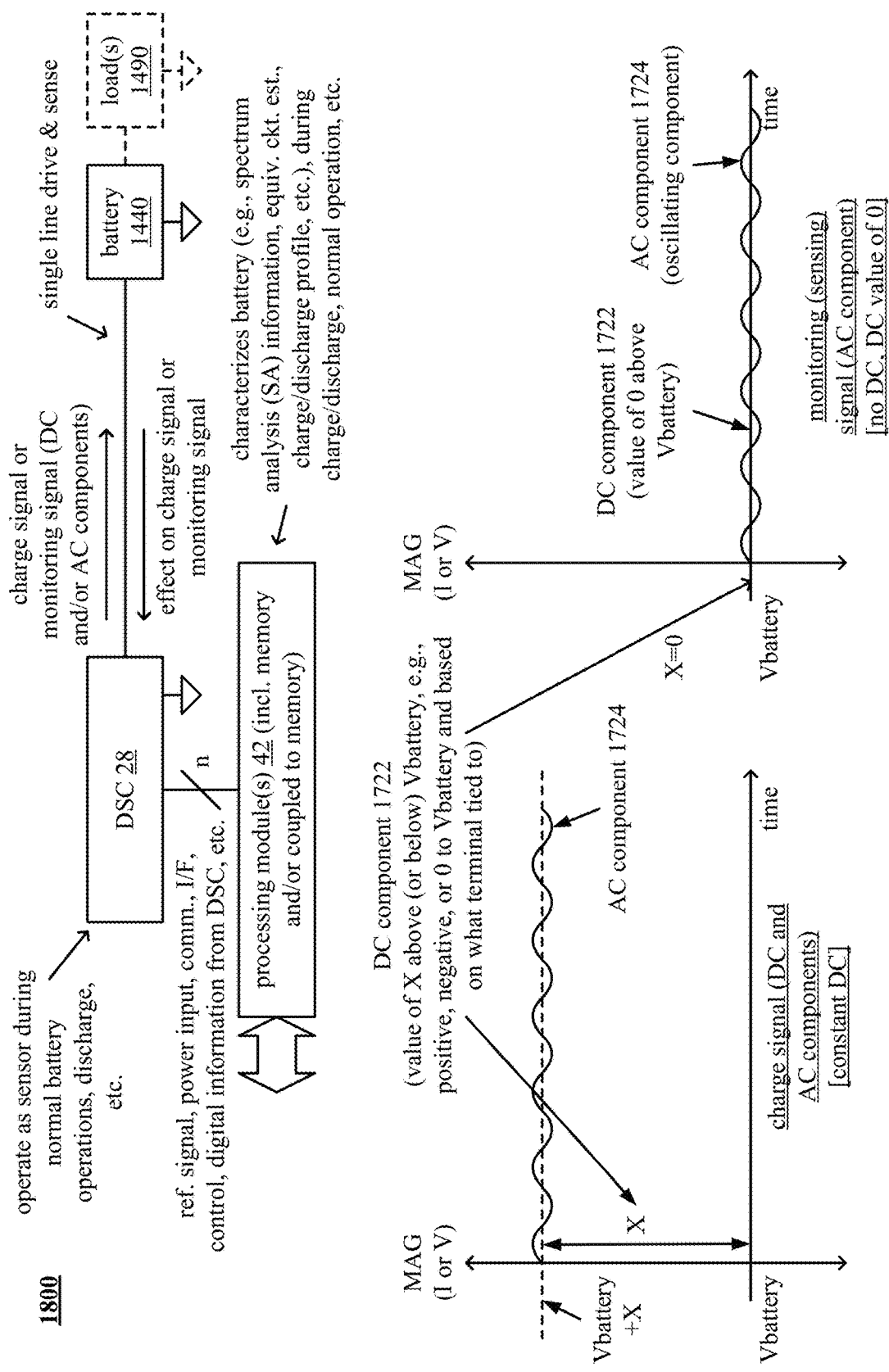
FIG. 18 is a schematic block diagram of an embodiment of various types of signals that may be provided from a DSC to a battery in accordance with the present invention.

FIG. 18 is a schematic block diagram of an embodiment 1800 of various types of signals that may be provided from a DSC to a battery in accordance with the present invention. At the top of this diagram is a similar implementation of that which is shown above in FIG. 14. At the bottom of this diagram are examples of a charge signal or a monitoring signal that may be used to perform battery characterization in operation with the DSC 28 and the one or more processing modules 42.

The bottom left of the diagram shows a charge signal having both an AC component 1724 and a DC component 1722 (e.g., considering an example in which the charge signal is provided via a voltage signal, such as from a voltage source, then the DC component 1722 would include some value X above the voltage of the battery, Vbattery). Note that the value of X may be positive or negative in different examples. Considering one particular example, the DSC 28 is implemented to facilitate discharging of the battery by providing a DC component 1722 that is less than the voltage of the battery, Vbattery. For example, this may be viewed as providing a signal to the battery 1440 that is opposite of what would be provided to facilitate charging of the battery 1440. In some examples, this is performed (e.g., only for a short period of time such as less than one second, multiple seconds, etc.) before charging of the battery by providing a DC component 1722 that is greater than the voltage of the battery, Vbattery.

In one particular implementation, the DC component 1722 is shown as having a constant level over time, and the AC component 1724 is shown as varying as a function of time and having a DC offset level of the DC component 1722. In some examples, note that the magnitude of the AC component 1724 is relatively small in comparison to the magnitude of the DC component 1722 in certain examples. For example, the magnitude or the peak to peak signal range of the AC component 1724 is within range of 0.01 to 1% of the magnitude of the DC component in some examples. In other examples, the AC component 1724 is within range of 1% to 5% of the magnitude of the DC component 1722. In even other examples, the AC component 1724 is within range of 5% to 10% of the magnitude of the DC component 1722. Generally speaking, the DSC 28 and the one or more processing modules 42 they be configured to provide any desired signal magnitude of the AC component 1724, and generally speaking, the AC component 1724 is selected so as to facilitate battery characterization of the battery 1440 without adversely affecting the charging of the battery 1440.

In other examples, the magnitude or the peak to peak signal range of the AC component 1724 is directly selected to have a particular value, such as a certain number of amps (e.g., 10 micro-amps, 100 micro-amps, 500 micro-amps, 1.3 milliamps, 5 mA, 10 mA, 100 mA, 500 mA, 1 A, etc., or any other desired value).

Considering an example of a lead acid battery including 6 cells each having a nominal voltage of 2.1 V per cell to provide a battery voltage of 12.6 V, and having a rating of 125 amp hours, meaning it can supply a current signal of 10 A for 12.5 hours for 20 A for a period of 6.25 hours, then a charging current of 25% of the battery capacity is sometimes used during at least a portion of a charging process for lead acid battery.. The battery capacity is provided in terms of amp hours (Ah), and an associated current rating based on C is often used, where C corresponds to a measure of the rate at which the battery is discharged relative to its maximum capacity. For example, a 1 C rate means that the discharge current of the battery will discharge the entire battery in one hour, and in considering a battery having a capacity of 125 amp hours, then the 1 C discharge current would be 125 A. The charging current of 25% of 125 A, namely, 31.25 A, would be used in certain examples. Considering a battery having a capacity of 45 amp hours, the 1 C rate would be 45 A, and a charging current of 25% of 45 A, namely, 11.25 A, would be used in certain examples.

In one example, considering a charge signal having a DC component 1722 of 31.25 A, an AC component 1724 having a magnitude that is 1% of the DC component 1722 correspond to 0.3125 A or 312.5 mA, an AC component 1724 having a magnitude that is 5% of the DC component 1722 correspond to 1.5625 A, and a an AC component 1724 having a magnitude that is 10% of the DC component 1722 correspond to 3.125 A. In another example, considering a charge signal having a DC component 1722 of 11.25 A, an AC component 1724 having a magnitude that is 1% of the DC component 1722 correspond to 0.1125 A or 112.5 mA, an AC component 1724 having a magnitude that is 5% of the DC component 1722 correspond to 0.5625 A or 562.5 mA, and an AC component 1724 having a magnitude that is 10% of the DC component 1722 correspond to 1.125 A.

In yet other examples, the magnitude or the peak to peak signal range of the AC component 1724 is directly selected to have a particular value, such as a certain number of amps (e.g., 10 micro-amps, 100 micro-amps, 500 micro-amps, 1.3 milliamps (mA), 5 mA, 10 mA, 100 mA, 500 mA, 1 A, etc., or any other desired value).

Considering an example of a Lithium-ion battery including 3 or 4 cells each having a nominal voltage of approximately 3.6/3.7 V per cell to provide a battery voltage of 10.8-14.8 V, and having a capacity for rating of 2000 mA hours, or 2 amp hours, then the 1 discharge current would be 2000 mA thereby fully discharging the battery within one hour. With respect to Lithium-ion batteries, a charging current of 0.5-1.0 C is sometimes used. Some manufacturers recommend a charging current of 0.8 C during at least a portion of a charging process.

In some examples, note that the magnitude of the DC component 1722 varies during different time periods of the charging cycle, as is described in some other examples herein. In such instances, note that the magnitude of the AC component 1724 is implemented such that it remains at a constant value even as the DC component 1722 varies. In other instances, note that the magnitude of the AC component 1724 is implemented such that it varies based on change of the magnitude of the DC component 1722 to maintain a similar percentage magnitude in comparison to the DC component 1722. For example, when the magnitude of the DC component 1722 changes in a charging cycle to one half of a prior value (e.g., from 0.25 C to 0.125 C), then the magnitude of the AC, 1724 is also similarly modified to be one half of a prior value.

In one example, considering a charge signal having a DC component 1722 of 1.6 A (e.g., 0.8 C of a battery having a 1 C rating of 2000 mA, or 2 amps), an AC component 1724 having a magnitude that is 1% of the DC component 1722 correspond to 0.016 A or 16 mA, an AC component 1724 having a magnitude that is 5% of the DC component 1722 correspond to 0.08 A or 80 mA, and a an AC component 1724 having a magnitude that is 10% of the DC component 1722 correspond to 0.16 A or 160 mA.

In yet other examples, the magnitude or the peak to peak signal range of the AC component 1724 is directly selected to have a particular value, such as a certain number of amps (e.g., 10 micro-amps, 100 micro-amps, 500 micro-amps, 1.3 milliamps, 5 mA, 10 mA, 100 mA, 500 mA, 1 A, etc., or any other desired value).

The bottom right of the diagram shows a monitoring signal having both an AC component 1724 and no DC component 1722 (e.g., considering an example in which the monitoring signal is provided via a voltage signal, such as from a voltage source, then the DC component 1722 would include some value X=0, or a DC component 1722 having a value of zero above the voltage of the battery, Vbattery). Note that the AC component 1724 may be implemented as either a current signal or a voltage signal. The magnitude or the peak to peak signal range of the AC component 1724 may be any desired value including those described above and within such ranges.

Alternatively, when the AC component 1724 is implemented as a voltage signal, the magnitude or the peak to peak signal range of the AC component 1724 may be selected as being based on the voltage rating of the battery (e.g., such as within a range of 0.01 to 1% of the magnitude of the magnitude voltage rating of the battery in some examples, within a range of 1% to 5% of the magnitude of the voltage rating of the battery in other examples, and within a range of 5% to 10% of the magnitude of the voltage rating of the battery in even other examples).

In one example, considering a lead acid battery having a voltage rating of 12.6 V, then a corresponding AC component 1724 of a monitoring signal being 0.1% of the battery voltage rating would be 0.0126 V or 12.6 mV, 0.5% of the battery voltage rating would be 0.063 V or 63 mV, 1% of the battery voltage rating would be 0.126 V or 126 mV, 5% of the battery voltage rating would be 0.63 V or 630 mV, and 10% of the battery voltage rating would be 1.26 V.

In another example, considering a Lithium-ion battery having a voltage rating of 10.8 V, then a corresponding AC component 1724 of a monitoring signal being 0.1% of the battery voltage rating would be 0.0126 V or 12.6 mV, 0.5% of the battery voltage rating would be 0.054 V or 54 mV, 1% of the battery voltage rating would be 0.108 V or 108 mV, 5% of the battery voltage rating would be 0.54 V or 540 mV, and 10% of the battery voltage rating would be 1.08 V.

In yet other examples, when the AC component 1724 is implemented as a voltage signal, the magnitude or the peak to peak signal range of the AC component 1724 is directly selected to have a particular value, such as a certain number of volts (e.g., 10 micro-volts, 50 micro-volts, 100 micro-volts, 500 micro-volts, 1 milli-volt, 10 milli-volts, 50 milli-volts, 100 milli-volts, 1 V, etc., or any other desired value).

In another example of operation and implementation, a battery characterization system includes a drive-sense circuit (DSC) and one or more processing modules operably coupled to the DSC. The one or more processing modules is connected or coupled to memory, and/or includes memory, that stores operational instructions.

The DSC is operably coupled to receive a reference signal and to generate a charge signal that includes an AC (alternating current) component based on the reference signal. When enabled, the DSC operably coupled and configured to provide the charge signal to a terminal of a battery via a single line and simultaneously to sense the charge signal via the single line, wherein sensing of the charge signal includes detection of an electrical characteristic of the battery that is based on a response of the battery to the charge signal and to generate a digital signal representative of the electrical characteristic of the battery that is based on the response of the battery to the charge signal.

When enabled, the one or more processing modules is configured to execute the operational instructions to generate the reference signal, and process the digital signal representative of the electrical characteristic of the battery that is based on the response of the battery to the charge signal to determine the electrical characteristic of the battery.

In some examples, when enabled, the one or more processing modules further configured to execute the operational instructions to generate the reference signal to include a frequency sweep of the AC component of the charge signal such that the AC component of the charge signal includes a first frequency at or during a first time and includes a second frequency different than the first frequency at or during a second time. At or during the first time, the one or more processing modules further configured to execute the operational instructions to process the digital signal representative of the electrical characteristic of the battery that is based on the response of the battery to the AC component of the charge signal that includes the first frequency to determine a first value of the electrical characteristic of the battery based on the first frequency. At or during the second time, the one or more processing modules further configured to execute the operational instructions to process the digital signal representative of the electrical characteristic of the battery that is based on the response of the battery to the AC component of the charge signal that includes the second frequency to determine a second value of the electrical characteristic of the battery based on the second frequency.

Note that the electrical characteristic of the battery may include any one or more of a resistance of the battery, an impedance of the battery, one or more components of an equivalent circuit model of the battery, a signal response of the battery to the charge signal, a signal response of the battery to the AC component of the charge signal, and/or spectrum analysis (SA) information of the battery that is based on a signal response of the battery to a frequency sweep of the AC component of the charge signal.

In some particular examples, the battery characterization system a battery charge supply circuit configured to provide a power signal that includes a DC component to the DSC. The DSC is implemented in-line between the battery charge supply circuit and the single line coupling to the terminal of the battery and further configured to add the AC component to the DC component in accordance with generating the charge signal that includes the AC component based on the reference signal.

Also, the DSC may be implemented to include a comparator configured to receive the reference signal from the one or more processing modules at a first comparator input and to drive the charge signal from a second comparator input to the terminal of the battery via the single line and to generate an output comparator signal based on the reference signal and the charge signal. The DSC also includes a dependent current source operably coupled to source a current to the terminal of the battery via the single line based on control from the output comparator signal. The DSC also includes an analog to digital converter (ADC) operably coupled to the comparator output, wherein, when enabled, the ADC operably coupled and configured to process the output comparator signal to generate the digital signal representative of the electrical characteristic of the battery that is based on the response of the battery to the charge signal.

In some specific implementations, the DSC is implemented to include a power source circuit operably coupled to the terminal of the battery via the single line. When enabled, the power source circuit is configured to provide the charge signal that includes the AC component via the single line coupling to the terminal of the battery. The charge signal includes a DC (direct current) component and the AC component. The DSC also includes a power source change detection circuit operably coupled to the power source circuit. When enabled, the power source change detection circuit is configured to detect an effect on the charge signal that is based on the electrical characteristic of the battery and to generate the digital signal representative of the electrical characteristic of the battery that is based on the response of the battery to the charge signal.

In some specific examples, the power source circuit is implemented to include a power source to source at least one of a voltage or a current to the terminal of the battery via the single line. The power source change detection circuit is implemented to include a power source reference circuit configured to provide at least one of a voltage reference or a current reference based on the reference signal. The power source change detection circuit is also implemented to include a comparator configured to compare the at least one of the voltage and the current provided to the terminal of the battery via the single line to the at least one of the voltage reference and the current reference to produce the charge signal.

Moreover, in some particular examples, battery characterization system is implemented such that the power source circuit includes a first power source circuit and a second power source circuit. Also, the power source change detection circuit includes a first power source change detection circuit and a second power source change detection circuit, and the first power source circuit includes a current source to source a current to the terminal of the battery via the single line.

The first power source change detection circuit is implemented to include a first power source reference circuit configured to provide a current reference based on the reference signal and a first comparator configured to compare the current provided to the terminal of the battery via the single line to the current reference to produce the charge signal. The second power source circuit is implemented to include a voltage source to source a voltage to the terminal of the battery via the single line. The second power source change detection circuit is implemented to include a second power source reference circuit configured to provide a voltage reference based on the reference signal and a second comparator configured to compare the voltage provided to the terminal of the battery via the single line to the voltage reference to produce the charge signal.

Several the following diagrams include one or more processing modules 42. The one or more processing modules 42 is configured to communicate with and interact with one or more DSCs 28 and, in some diagrams, one or more other components. The one or more processing modules 42 is coupled to a DSC 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc. In addition, several of the following diagrams include a battery 1440 that may be implemented to service one or more loads 1490. Various configurations and implementations are provided by which one or more DSCs 28 may be implemented to perform battery characterization of the battery 1440.

In this diagram and in certain other embodiments, examples, diagrams, etc., the one or more processing modules 42 is implemented to characterize the battery 1440 in cooperation with the DSC 28 and information provided there from based on driving one or more signals to the battery 1440 (e.g., to the terminal of the battery via a single line) while simultaneously detecting those one or more signals. This may involve generation of a number of different types of information including spectrum analysis (SA) information, estimation of components and their respective values within a battery equivalent circuit that is used to characterize the battery 1440, determination of a charge-discharge profile of the battery 1440, determination of charge and discharge patterns and histories of the battery 1440, determination of the impedance of the battery 1440, characterization of the impedance of the battery 1440 is a function of different respective frequencies, tracking of any one or more characteristics of the battery as a function of time such as change as a function of time of any one or more of impedance, SA information, charge and discharge patterns, etc. Note also that such battery characterization may be performed at any of a variety of times. In some examples, the battery characterization is performed during charging of the battery 1440. In other examples, the battery characterization is performed during non-charge operation of the battery 1440, such as when the battery 1440 is not being charged, is in the standby mode, is servicing the one or more loads 1490, etc.

For example, as the DSC 28 provides a signal to the battery 1440 via a single line, any internal impedance of the battery 1440 may be detected based on change of that signal that is provided to the battery 1440 via the single line in accordance with operation of the DSC 28 as it adapts that signal to track a reference signal provided thereto, and any difference or divergence between the signal being provided to the battery 1440 and reference signal is interpreted by the one or more processing modules 42 to determine the characteristics of the battery 1440.

In an example of operation and implementation, the one or more processing modules 42 is configured to perform communication, interfacing, control, etc. to and with the one or more DSCs 28 and also to one or more other components when coupled or connected thereto. For example, the one or more processing modules 42 is configured to provide and/or receive, to and/or from a DSC 28, one or more of a reference signal, power input signal, communication, interfacing, control, receiving a digital information from the DSC, etc.

FIG. 19A is a schematic block diagram of an embodiment 1901 of a DSC that is interactive with battery charge supply circuit and a battery in accordance with the present invention. In this diagram, the one or more processing modules 42 is configured to interact and communicate with a DSC 28 and the battery charge supply circuit 1910. The one or more processing modules 42 supports communication, interfacing, control, etc. to and with the battery charge supply circuit 1910. Such communication and interaction may be implemented in via any desired number of communication pathways between the one or more processing modules 42 and the battery charge supply circuit 1910 (e.g., generally m communication pathways, where m is a positive integer greater than or equal to one).

For example, the one or more processing modules 42 is configured to enable operation of the battery charge supply circuit 1910 for charging of the battery 1440 and disable operation of the battery charge supply circuit 1910 during non-charge operations such as discharge of the battery 1440. The one or more processing modules 42 is configured to facilitate charging of a battery 1440 using the battery charge supply circuit 1910 and the DSC 28. In this diagram, the battery charge supply circuit 1910 provides a DC component of the charge signal, and the DSC 28 is configured to provide an AC component that is modulated onto or added onto the DC component of the charge signal. The DSC 28 is configured to perform single line drive and sense (e.g., both driving or transmitting of the AC component of the charge signal and simultaneously detecting or receiving of any effect on the AC component of the charge signal a single line). In addition, note that any effect on the DC component of the charge signal is also detected by the DSC 28 via the single line.

In some examples, note that the DSC 28 is configured to provide an AC component that is modulated onto or added onto the DC component of the charge signal via an AC coupling capacitor (e.g., as shown in a dotted line box). In other examples, the DSC 28 is configured to provide an AC component that is modulated onto or added onto the DC component of the charge signal via a direct connection or coupling to the line between the battery charge supply circuit 1910 and the battery 1440.

In this diagram, note that when the battery charge supply circuit 1910 is not operative to perform charging by the delivery of a DC component of a charge signal to the battery 1440, such as when one or more processing modules 42 disables operation of the battery charge supply circuit 1910 during non-charge operation, the DSC 28 may nevertheless be operative to provide a monitoring signal, whether as a current signal or a voltage signal, to perform characterization of the battery 1440. In addition, in some alternative examples, power is provided to the DSC 28 from the battery charge circuit 1910 directly, and not from the one or more processing modules 42.

FIG. 19B is a schematic block diagram of another embodiment 1902 of a DSC that is interactive with battery charge supply circuit and a battery in accordance with the present invention. This diagram is similar to the previous diagram with at least one difference being that another DSC 28 is implemented between the one or more processing modules 42 and the battery charge supply circuit 1910. For example, in this diagram, a DSC 28 is implemented to facilitate the interaction between the one or more processing modules 42 and the battery charge supply circuit 1910 including control of the battery charge supply circuit 1910 by the one or more processing modules 42.

With respect to this diagram as well, note that in some examples, note that the DSC 28 is configured to provide an AC component that is modulated onto or added onto the DC component of the charge signal via an AC coupling capacitor (e.g., as shown in a dotted line box). In other examples, the DSC 28 is configured to provide an AC component that is modulated onto or added onto the DC component of the charge signal via a direct connection or coupling to the line between the battery charge supply circuit 1910 and the battery 1440.

In yet another example of operation and implementation, a battery characterization system includes a battery charge supply circuit, a drive-sense circuit (DSC), and one or more processing modules operably coupled to the DSC. The one or more processing modules is connected or coupled to memory, and/or includes memory, that stores operational instructions.

The battery charge supply circuit configured to output a charge signal that includes a DC component to a terminal of a battery. The DSC is operably coupled to generate an AC (alternating current) component based on a reference signal and to add the AC component to the charge signal that includes the DC component that is output to the terminal of a battery. When enabled, the DSC is operably coupled and configured to add the AC component to the charge signal via a single line and simultaneously to sense the charge signal and the AC component via the single line, wherein sensing of the charge signal and the AC component includes detection of an electrical characteristic of the battery that is based on a response of the battery to at least one of the charge signal or the AC component. Also, the DSC is operably coupled and configured to generate a digital signal representative of the electrical characteristic of the battery that is based on the response of the battery to the at least one of the charge signal or the AC component.

When enabled, the one or more processing modules is configured to execute the operational instructions to generate the reference signal and to process the digital signal representative of the electrical characteristic of the battery that is based on the response of the battery to the at least one of the charge signal or the AC component to determine the electrical characteristic of the battery.

In some examples, when enabled, the one or more processing modules is further configured to execute the operational instructions to generate the reference signal to include a frequency sweep of the AC component such that the AC component includes a first frequency at or during a first time and includes a second frequency different than the first frequency at or during a second time. At or during the first time, the one or more processing modules is further configured to execute the operational instructions to process the digital signal representative of the electrical characteristic of the battery that is based on the response of the battery to the at least one of the charge signal or the AC component that includes the first frequency to determine a first value of the electrical characteristic of the battery based on the first frequency. At or during the second time, the one or more processing modules is further configured to execute the operational instructions to process the digital signal representative of the electrical characteristic of the battery that is based on the response of the battery to the at least one of the charge signal or the AC component that includes the second frequency to determine a second value of the electrical characteristic of the battery based on the second frequency.

Note that the electrical characteristic of the battery may correspond to any one or more of a resistance of the battery, an impedance of the battery, one or more components of an equivalent circuit model of the battery, a signal response of the battery to the charge signal, a signal response of the battery to the AC component of the charge signal, and/or spectrum analysis (SA) information of the battery that is based on a signal response of the battery to a frequency sweep of the AC component of the charge signal.

In some particular examples, the DSC is implemented to include a comparator configured to receive the reference signal from the one or more processing modules at a first comparator input and to add the AC component to the charge signal from a second comparator input to the terminal of the battery via the single line and to generate an output comparator signal based on the reference signal and the charge signal including the AC component. The DSC also includes a dependent current source operably coupled to source a current to add the AC component to the charge signal via the single line based on control from the output comparator signal. The DSC also includes an analog to digital converter (ADC) operably coupled to the comparator output. When enabled, the ADC operably coupled and configured to process the output comparator signal to generate the digital signal representative of the electrical characteristic of the battery that is based on the response of the battery to the at least one of the charge signal or the AC component.

Also, in certain examples, the DSC also includes a power source circuit operably coupled to the terminal of the battery via the single line. When enabled, the power source circuit is configured to add the AC component to the charge signal via the single line. Also, when enabled, The DSC also includes is configured to detect an effect on the at least one of the charge signal or the AC component that is based on the electrical characteristic of the battery and to generate the digital signal representative of the electrical characteristic of the battery that is based on the response of the battery to the at least one of the charge signal or the AC component.

Figure 20A:
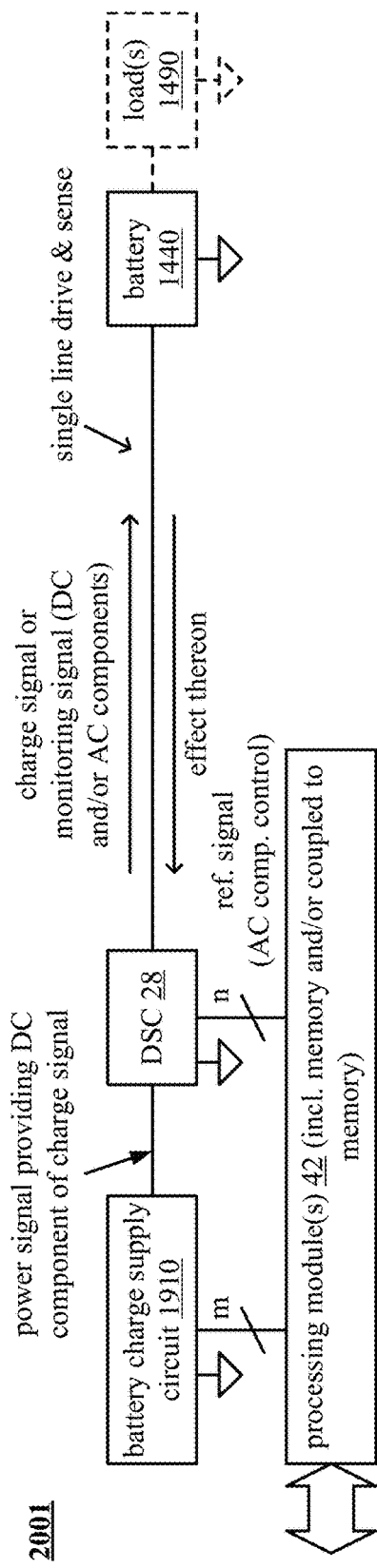
FIG. 20A is a schematic block diagram of another embodiment of a DSC that is interactive with battery charge supply circuit and a battery in accordance with the present invention.

FIG. 20A is a schematic block diagram of another embodiment 2001 of a DSC that is interactive with battery charge supply circuit and a battery in accordance with the present invention. In this diagram, a DSC 28 is implemented in-line between the battery charge supply circuit 1910 and the battery 1440. The DSC 28 receives the power signal providing a DC component of a charge signal from the battery charge supply circuit 1910 when it is enabled for operation by the one or more processing modules 42. When performing battery characterization during a battery charging operation, the DSC 28 adds an additional AC component onto the DC component of the charge signal to facilitate characterization of the battery 1440. When performing characterization during non-charge battery operation, the DSC 28 provides a signal having only an AC component to the battery 1440.

Figure 20B:
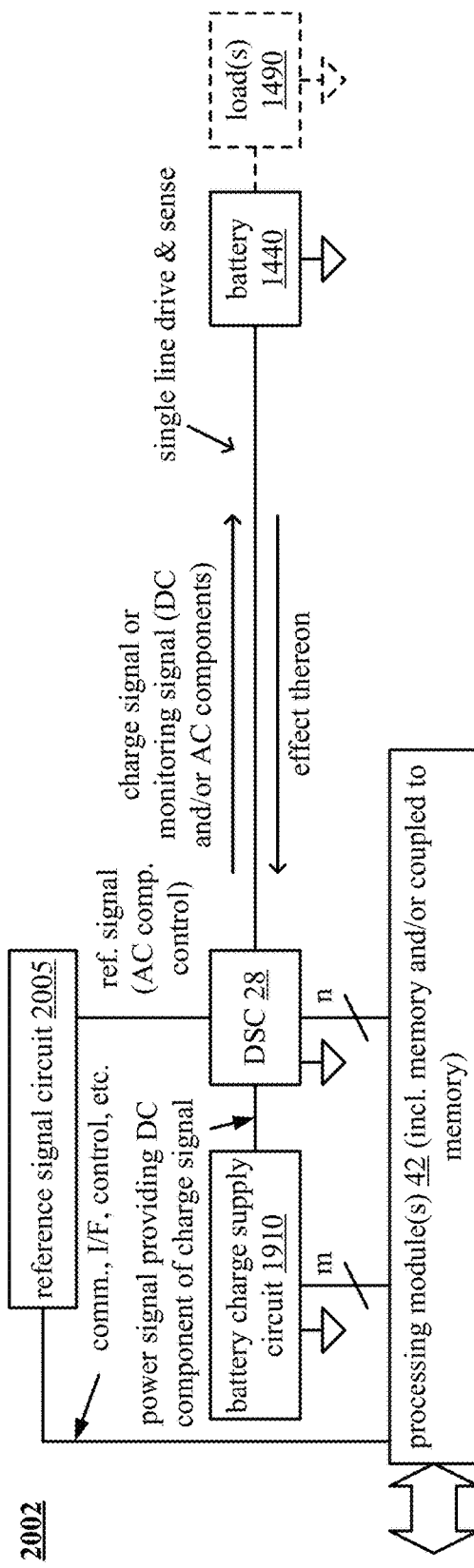
FIG. 20B is a schematic block diagram of another embodiment of a DSC that is interactive with battery charge supply circuit and a battery in accordance with the present invention.

FIG. 20B is a schematic block diagram of another embodiment 2002 of a DSC that is interactive with battery charge supply circuit and a battery in accordance with the present invention. This diagram is similar to the previous diagram with at least one difference being that a reference signal circuit 2005 is implemented between the one or more processing modules 42 and the DSC 28 to provide a reference signal to the DSC 28. Note that one or more additional circuits, such as the reference signal circuit 2005, may be implemented between the one or more processing modules 42 and a DSC 28 that is implemented to facilitate characterization of the battery 1440 to assist in providing a reference signal to the DSC 28 having any one or more desired characteristics such as frequency, amplitude, shape, waveform type, etc. In certain other examples, the one or more processing modules 42 itself includes appropriate functionality and capability to provide a reference signal to the DSC 28 having any such one or more desired characteristics.

FIG. 21A is a schematic block diagram of another embodiment 2101 of a DSC that is interactive with a battery in accordance with the present invention. This diagram shows an alternative implementation of the DSC 28-1 and includes a power source circuit 2110 and a signal change detection circuit 2112. The battery 1440 includes and exhibits one or more varying electrical characteristics that may be varying over time (e.g., resistance, capacity, capacitance, inductance, impedance, current delivering capability, power delivering capability, voltage level, etc.) based on varying physical conditions (e.g., age, usage, number of charge and discharge cycles, pressure, temperature, etc.).

The power source circuit 2110 is operably coupled to the battery 1440 and, when enabled (e.g., from a control signal from the one or more processing modules 42, power is applied, a switch is closed, a reference signal is received, etc.) provides a charge signal or monitoring signal to the battery 1440. The power source circuit 2110 may be a voltage supply circuit (e.g., a battery, a linear regulator, an unregulated DC-to-DC converter, etc.) to produce a voltage-based power signal, a current supply circuit (e.g., a current source circuit, a current mirror circuit, etc.) to produce a current-based power signal, or a circuit that provide a desired power level to the battery 1440 and substantially matches impedance of the battery 1440. The power source circuit 2110 generates the charge signal or monitoring signal to include a DC (direct current) component and/or an oscillating component.

When receiving the charge signal or monitoring signal, one or more electrical characteristics of the battery 1440 affect the charge signal or monitoring signal. When the signal change detection circuit 2112 is enabled, it detects the effect on the charge signal or monitoring signal as a result of the electrical characteristic of the battery 1440. The power signal change detection circuit 112 determines any change of the charge signal or monitoring signal and generates a signal that is representative of the change to the charge signal or monitoring signal.

In some examples, the charge signal or monitoring signal includes a DC component and/or an oscillating (AC) component 124 (e.g., such as shown in FIG. 18). The oscillating (AC) component includes a sinusoidal signal, a square wave signal, a triangular wave signal, a multiple level signal (e.g., has varying magnitude over time with respect to the DC component), and/or a polygonal signal (e.g., has a symmetrical or asymmetrical polygonal shape with respect to the DC component).

In an embodiment, power source circuit 2110 varies frequency of the oscillating (AC) component of the charge signal or monitoring signal so that it can be tuned to the impedance of the battery 1440 and/or to be off-set in frequency from other power signals in a system. For example, an capacitive impedance the battery 1440 (e.g., such as a capacitive element of an equivalent circuit used to characterize and describe the battery 1440) decreases with frequency. As such, if the frequency of the oscillating (AC) component is too high with respect to the capacitance, the capacitor looks like a short and variances in capacitances will be missed. Similarly, if the frequency of the oscillating component is too low with respect to the capacitance, the capacitor looks like an open and variances in capacitances will be missed.

For another example, an inductive impedance the battery 1440 (e.g., such as a capacitive element of an equivalent circuit used to characterize and describe the battery 1440) increases with frequency. As such, if the frequency of the oscillating (AC) component is too low with respect to the inductance, the inductance looks like a short and variances in inductances will be missed. Similarly, if the frequency of the oscillating component is too high with respect to the inductance, the inductance looks like an open and variances in inductances will be missed.

In an embodiment, the power source circuit 2110 varies magnitude of the DC component and/or the oscillating (AC) component to improve resolution of sensing/detection of any change of the charge signal or monitoring signal and/or to adjust power consumption of such sensing/detection. In addition, the power source circuit 2110 generates the charge signal or monitoring signal such that the magnitude of the oscillating (AC) component is less than magnitude of the DC component 122.

FIG. 21B is a schematic block diagram of another embodiment 2102 of a DSC that is interactive with battery charge supply circuit and a battery in accordance with the present invention. A DSC 28-2 is coupled or connected to a battery charge supply circuit 1910, and the DSC 28-2 includes a signal change detection circuit 2112. When enabled for operation by the one or more processing modules 42, the battery charge supply circuit 1910 generates a DC component of a charge signal that is provided to the power source circuit 2110 and may be combined with an AC component that is generated by and provided from the DSC 28-2.

When the DSC 28-2 is receiving the charge signal or monitoring signal, the DSC 28-2 is configured to detect/sense any effect on the charge signal or monitoring signal based on one or more electrical characteristics of the battery 1440.

Certain of the following diagrams show various implementations of charge signals that may be used to perform charging of batteries while also performing battery characterization. In many of the diagrams, the vertical axis is shown as the magnitude of the charge signal, many of which are shown as current, and provided as a function of C corresponding to the rating and capacity of the battery such as described above. For example, consider a 2000 mA hour battery of a Lithium-ion type, then a current of 1 C would correspond to 2000 mA, being the amount of current, that when drawn, would deplete the battery within one hour.

In many of the examples, and AC component is shown as being modulated on a DC component of the charge signal. Note that in a charging application, the DC component is used to effectuate charging of the battery, and the AC component may be used to perform battery characterization during the charging of the battery. Note also that the AC component may be used only at certain particular times. For example, with respect to FIG. 32 herein, different respective examples of battery characterization are described such that battery characterization may be performed during battery charge operation, during non-charge operation, optionally only during certain portions of a battery charge operation, optionally only during certain portions of non-charge operation, and/or any desired combination.

Figure 22:
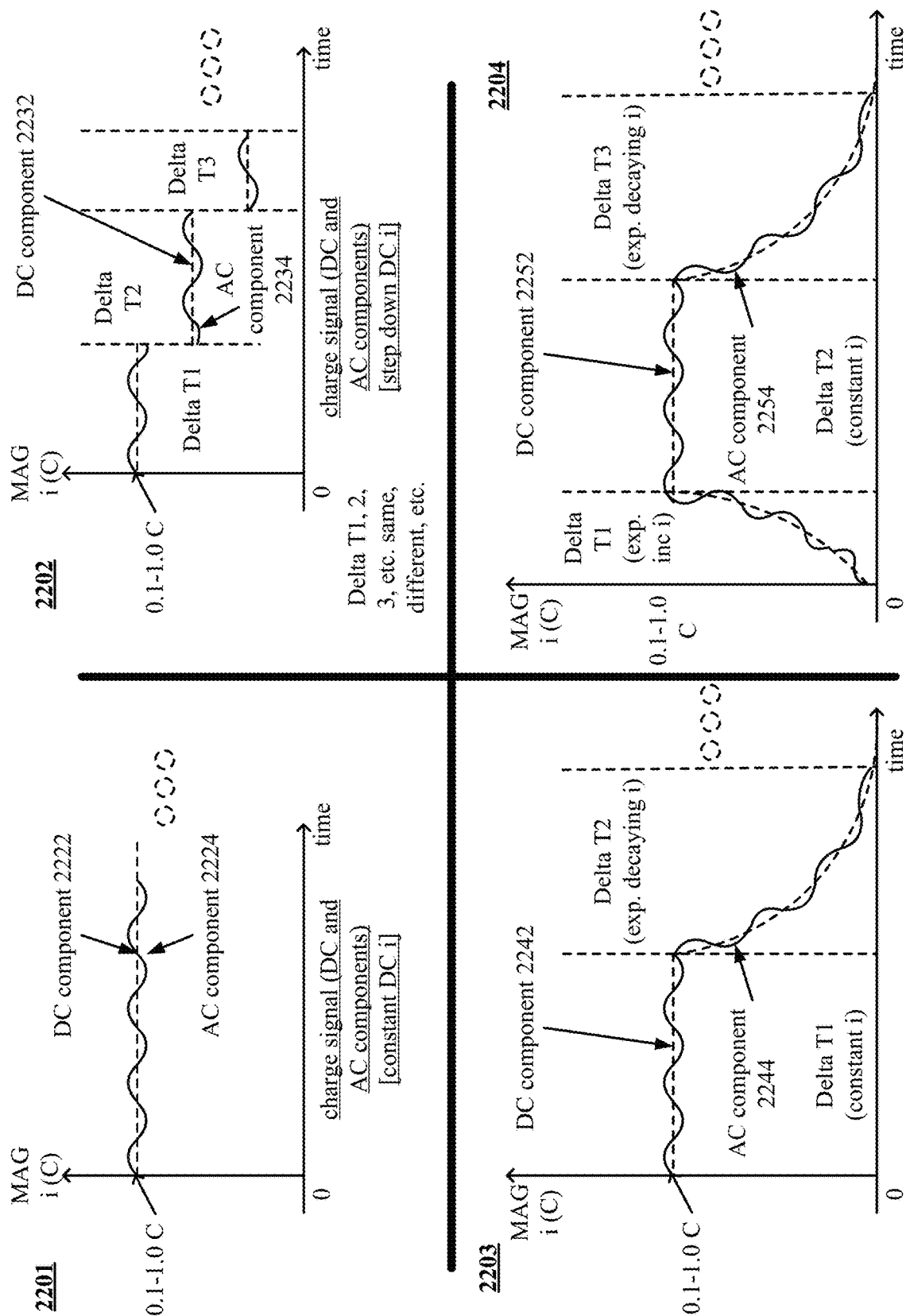
FIG. 22 is a schematic block diagram showing various embodiments of charge signals that may be used to charge a battery in accordance with the present invention.

FIG. 22 is a schematic block diagram showing various embodiments 2201, 2202, 2203, and 2204 of charge signals that may be used to charge a battery in accordance with the present invention. At the top left of the diagram, a charge signal is shown as including both DC and AC components 2222 and 2224, respectively. In this diagram, the DC component is of a constant level. In some examples, the DC component 2222 has a value within the range of 0.1-1.0 C. For example, with respect to a Lithium-ion type battery, some manufacturers recommend a charging current having a DC component 2222 of 0.8 C. With respect to a lead acid type battery, some manufacturers recommend a charging current having a DC component 2222 of 0.25 C.

At the top right of the diagram, a charge signal is shown as including an AC component 2234 and a DC component 2232 that changes the values as a function of time. For example, at or during the first time (e.g., Delta T1), the DC component 2232 has a first value. Then, at or during the second time (e.g., Delta T2), the DC component 2232 has a second value that is lower than the first value; then, at or during the third time (e.g., Delta T3), the DC component 2232 has a third value that is lower than the second value, and so on. This diagram shows a charge signal having a changing DC component 2232 that varies and steps down as a function of different respective time periods.

At the bottom left of the diagram, a charge signal is shown as including an AC component 2244 and a DC component 2242 that maintains a constant level at or during a first time (e.g., Delta T1), then gradually reduces at or during a second time (e.g., Delta T2). Such gradual reduction may be implemented as an exponentially decaying DC component 2242 value as a function of time based on some desired decay rate.

At the bottom right of the diagram, the charge signal is shown as including an AC component 2254 and a DC component 2252 that gradually increases at or during the first time (e.g., Delta T1), maintains a constant level at or during a second time (e.g., Delta T2), then gradually reduces at or during a third time (e.g., Delta T3). Such gradual increase and/or reduction may be implemented as an exponentially increasing and/or decaying DC component 2252 value as a function of time based on one or more desired increasing and/or decay rates. Note that the rates at which the DC component 2252 increases and decreases at or during the first time (e.g., Delta T1) and at or during the third time (e.g., Delta T3) may be the same or different as desired in different respective applications.

Figure 23:
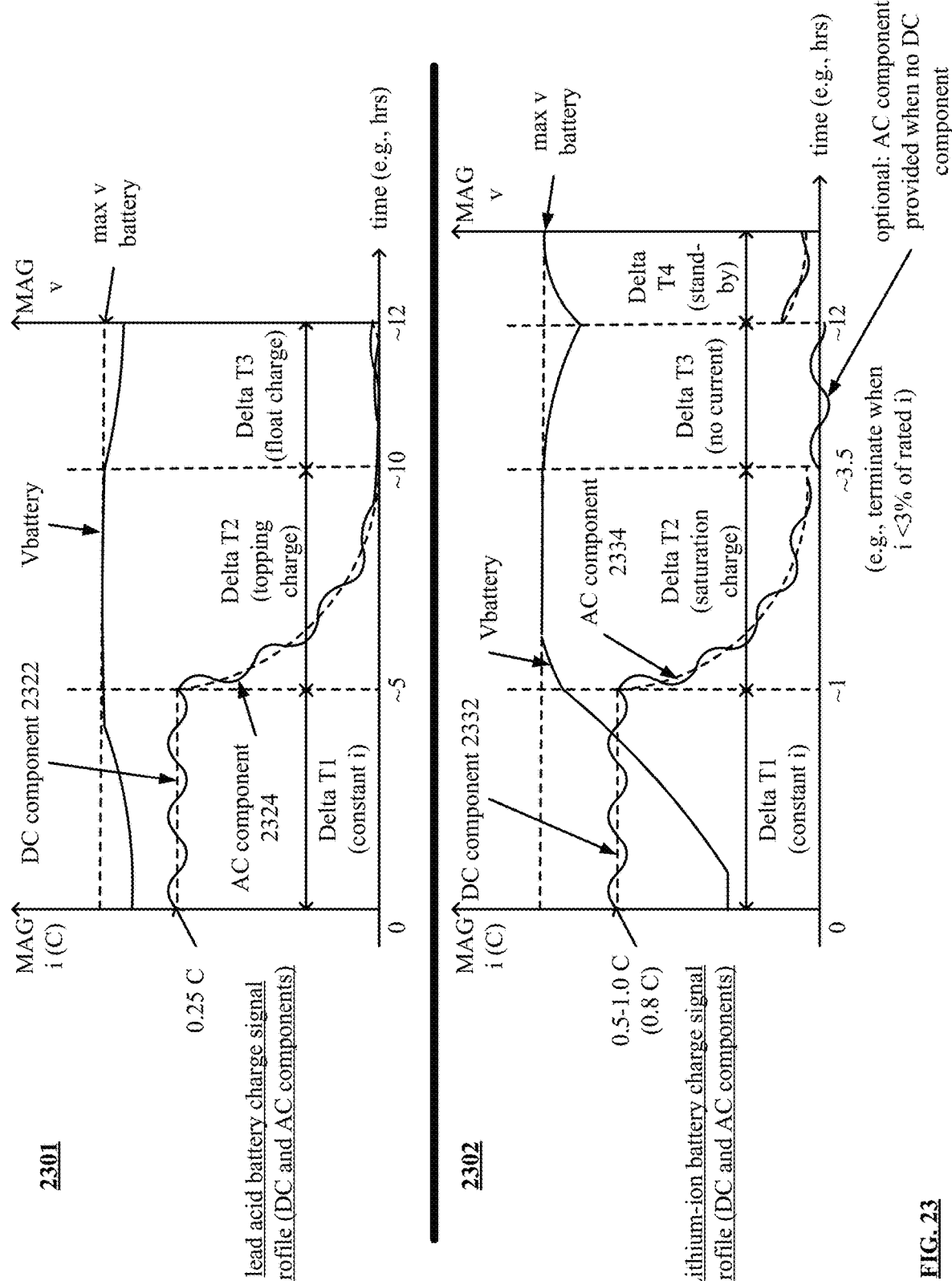
FIG. 23 is a schematic block diagram showing other various embodiments of charge signals that may be used to charge a battery in accordance with the present invention.

FIG. 23 is a schematic block diagram showing other various embodiments 2301 and 2302 of charge signals that may be used to charge a battery in accordance with the present invention.

The top of the diagram shows one possible charge signal profile such as may be used for charging a lead acid type battery in performing battery characterization. In this example, the charging is performed in three different respective stages corresponding to a constant-current charge (at or during a first time (e.g., Delta Ti)), a topping charge (at or during a second time (e.g., Delta T2)), and a float charge (at or during a third time (e.g., Delta T3)). As can be seen, an AC component 2324 is modulated on a DC component 2322, and the DC component 2322 maintains a constant level during a majority of the charge cycle and takes up roughly half of the required charge time, often times being approximately 12 hours in duration, with the constant level portion occupying approximately 5 hours of that time. During this time period, the battery undergoes the majority of its charging. Some estimates suggest that lead acid type battery is charged to about 70% of its capacity and approximately 5-8 hours. The remaining charging is filled with the topping charge and the float charge and charges the remaining 30% of the battery capacity. The float charge generally maintains the battery at a full charge capacity. The transition from the constant-current charge to the topping charge is generally performed when the battery is beginning to reach its set voltage limit.

Some manufacturers recommend a charging current of a lead acid battery to be 0.25 C of the rated capacity. others recommend a charging current of a lead acid battery to be somewhere within the range of 0.1-0.3 C of the rated capacity. This diagram shows the constant-current charge signal level to be 0.2 5 C of the rated capacity. The voltage of the battery is also shown in the diagram as a function of time and can be seen in relation to the charge signal. As can be seen, the battery very quickly reaches the maximum voltage of the battery (e.g., 12.6 V in one possible lead acid battery, considering 6 cells each of approximately 2.1 V per cell).

The bottom of the diagram shows one possible charge signal profile such as may be used for charging a Lithium-ion type battery in performing battery characterization. In this example, the charging is performed in four different respective stages corresponding to a constant-current charge (at or during a first time (e.g., Delta T1)), a saturation charge (at or during a second time (e.g., Delta T2)), a period of providing no charge signal (at or during a third time (e.g., Delta T3)), and a standby charge (at or during a fourth time (e.g., Delta T4)). Note that an AC component may still be provided when a zero valued DC component is provided during the third time (e.g., Delta T3).

Some manufacturers recommend a constant-current charge signal level of between 0.5-1.0 C of the rated capacity. Others recommend a constant-current charge signal level of 0.8 C of the rated capacity. During the constant-current charge phase, the voltage across the respective Lithium-ion cells increases nearly to the maximum voltage of the battery, and this phase typically lasts around one hour. After the voltage has reached its maximum, the charge signal transitions to a saturation charge phase during which the DC component 2332 of the charge signal gradually decreases. As the voltage of the battery is maintained, the DC component 2332 of the charge signal continues to decrease, and this phase can last approximately 2.5 hours. Then, there may be a period during which no charge current is provided, such as for the subsequent 8.5-9 hours, and then a very small standby charge signal may be provided after some time, in response to some condition, such as voltage sagging of the voltage maintained by the battery.

The voltage of the battery is also shown in the diagram as a function of time and can be seen in relation to the charge signal. As can be seen, the battery very quickly reaches the maximum voltage of the battery (e.g., 10.8 V in one possible Lithium-ion battery, considering 3 cells each of approximately 3.6 V per cell).

Figure 24B:
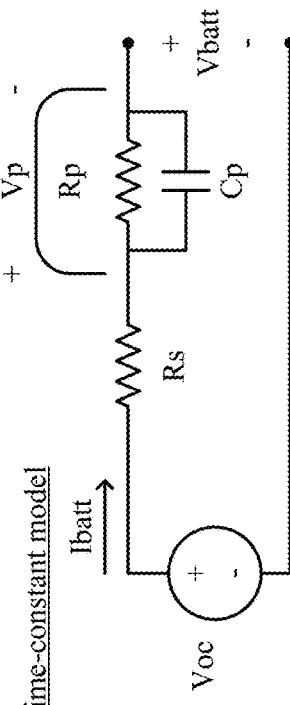
FIG. 24B is a schematic block diagram showing an embodiment of a one-time-constant model of an equivalent circuit of a battery that may be used to perform battery characterization in accordance with the present invention.
Figure 24A:
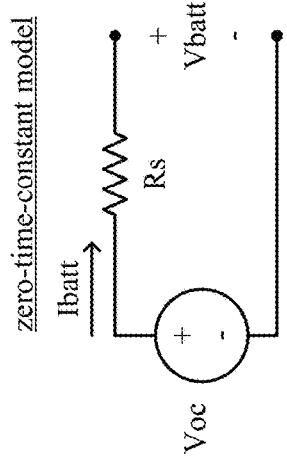
FIG. 24A is a schematic block diagram showing an embodiment of a zero-time-constant model of an equivalent circuit of a battery that may be used to perform battery characterization in accordance with the present invention.

FIG. 24A is a schematic block diagram showing an embodiment 2401 of a zero-time-constant model of an equivalent circuit of a battery that may be used to perform battery characterization in accordance with the present invention. This diagram shows an equivalent circuit representation of a battery that includes a voltage source, Voc, corresponding to the open circuit voltage of the battery when no load is connected and a singular resistor, Rs, sometimes characterized as corresponding to the resistance of the electrodes and the electrolyte of the battery, through which the current battery, Ibatt, flows to the terminal of the battery that provides an output voltage, Vbatt, when connected to one or more loads. With respect to this equivalent circuit representation of the battery, the relationship between the various parameters is as follows: Vbatt=Voc−Rs×Ibatt.

As can be seems suspect this diagram, the internal impedance of the battery is shown solely as a singular resistor, Rs. There are many other possible equivalent circuit representations of the battery including those described below that provide representation of reactance components of the impedance of the battery including characterizing that impedance using capacitive and/or inductive components showing variation of that impedance as a function of frequency. Such an equivalent circuit model of the battery in accordance with this diagram may be used for various battery types including lead acid and Lithium-ion.

FIG. 24B is a schematic block diagram showing an embodiment 2402 of a one-time-constant model of an equivalent circuit of a battery that may be used to perform battery characterization in accordance with the present invention. This diagram shows an alternative equivalent circuit representation of a battery that includes a voltage source, Voc, corresponding to the open circuit voltage of the battery when no load is connected, an in-line resistor, Rs, sometimes characterized as corresponding to the resistance of the electrodes and the electrolyte of the battery, and also a RC network including a resistor, Rp, and a capacitor, Cp, implemented in parallel and corresponding to the transient response of the battery charge/discharge profile, through which the current battery, Ibatt, flows to the terminal of the battery that provides an output voltage, Vbatt, when connected to one or more loads. The resistor, Rp, and the capacitor, Cp, may be viewed as corresponding to the charge transfer resistance that is encountered upon charge transfer from electrode to electrolyte (Rp) and the double layer capacitance of the battery (Cp).

With respect to this equivalent circuit representation of the battery, the relationship between the various parameters is as follows:

$$Vbatt(t)=Voc-Ibatt\times(Rs+Rp)+(Ibatt\times Rp-Vp(t=0))$$
$$\exp((-t/(Rp\times Cp)))$$

Note that at time, t=0, Vp(t=0)=Voc−Ibatt×(Rs)−Vbatt (t=0).

Note that some alternative equivalent circuit models operate by adding additional RC elements in the chain of the top half of the equivalent circuit model. In some modeling, the addition of a chain of RC elements is used to represent the diffusion impedance of the battery, such as with respect to a Lithium-ion battery.

Note that there are other equivalent circuit models that may alternatively be used to represent the characteristics of a battery. For example, some alternative equivalent circuit models of a Lithium-ion battery include more than two RC networks each including a respective resistor and a respective fastener, as well as one or more in-line capacitors connecting between the final RC network in the chain and the terminal of the battery. For example, one possible alternative equivalent circuit model is a dual polarization (DP) model as described below.

Figure 24C:
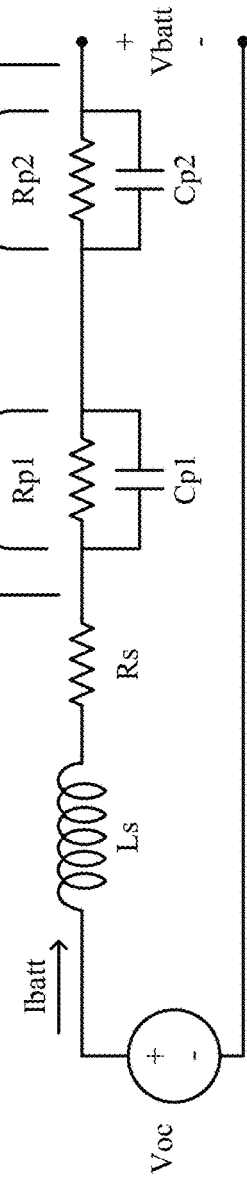
FIG. 24C is a schematic block diagram showing an embodiment of a dual polarization (DP) model of an equivalent circuit of a battery that may be used to perform battery characterization in accordance with the present invention.

FIG. 24C is a schematic block diagram showing an embodiment 2403 of a dual polarization (DP) model of an equivalent circuit of a battery that may be used to perform battery characterization in accordance with the present invention. This diagram shows yet another alternative equivalent circuit representation of a battery that includes a voltage source, Voc, corresponding to the open circuit voltage of the battery when no load is connected, an in-line inductor used to model inductive behavior of the battery at very high frequencies, Ls, an in-line resistor, Rs, sometimes characterized as corresponding to the resistance of the electrodes and the electrolyte of the battery, and also multiple RC networks each including a respective resistor, Rp1 and Rp2, and a respective capacitor, Cp1 and Cp2, each respectively implemented in parallel and corresponding to the transient response of the battery charge/discharge profile as well as representing the diffusion impedance of the battery, through which the current battery, Ibatt, flows to the terminal of the battery that provides an output voltage, Vbatt, when connected to one or more loads.

Figure 25:
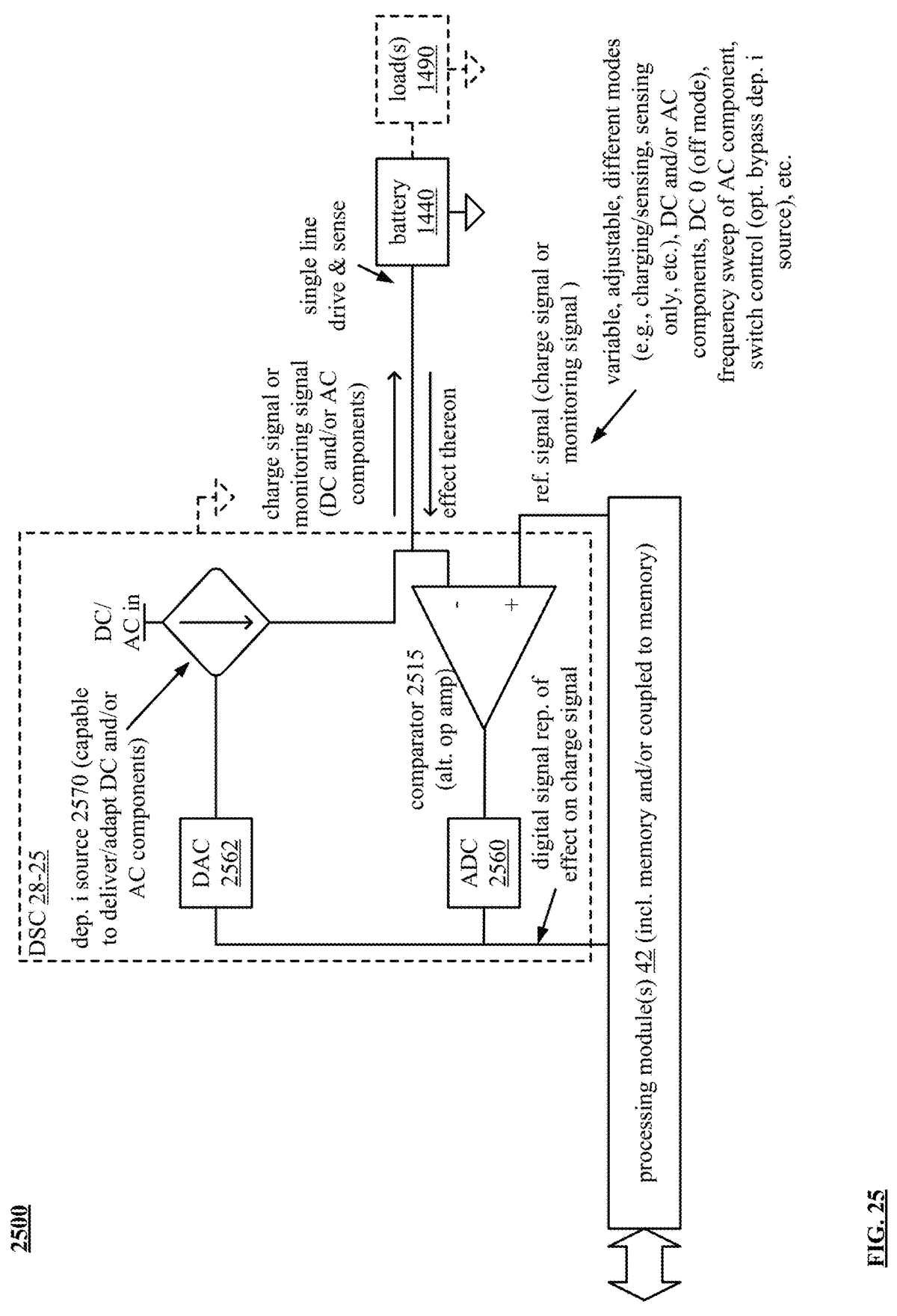

FIG. 25 is a schematic block diagram of another embodiment 2500 of a DSC that is interactive with a battery in accordance with the present invention. In this diagram, one or more processing modules 42 is configured to communicate with and interact with a DSC 28-25. The one or more processing modules 42 is coupled to a DSC 28-25 and is operable to provide control to and communication with the DSC 28-25. In this diagram has also described with respect to other diagrams, note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In this diagram, the one or more processing module 42 is configured to provide a reference signal to one of the inputs of a comparator 2515. Note that the comparator 2515 may alternatively be implemented as an operational amplifier in certain embodiments. The other input of the comparator 2515 is coupled to provide a charge signal or monitoring signal directly from the DSC 28-25 to the battery 1440, which optionally services one or more loads 1490. The reference signal may be viewed as the reference signal that is used to control the charge signal or monitoring signal that is output from the DSC 28-25 to the battery 1440, which optionally services one or more loads 1490. The DSC 28-25 is implemented such that any effect on the charge signal or monitoring signal is detected and compensated for so that the charge signal or monitoring signal tracks the reference signal.

The DSC 28-25 is configured to provide the charge signal or monitoring signal to the battery 1440 and also simultaneously to sense the charge signal or monitoring signal and to detect any effect on the charge signal or monitoring signal (e.g., via a single line connecting or coupling the DSC 28-25 to the battery 1440.

The output of the comparator 2515 is provided to an analog to digital converter (ADC) 2560 that is configured to generate a digital signal that is representative of the effect on the charge signal or monitoring signal that is provided to the battery 1440. In addition, the digital signal is output from the ADC 1760 is fed back as a control signal, via a digital to analog converter (DAC) 2562, to generate a control signal of a dependent current source 2570 that is operably coupled to generate and provide the charge signal or monitoring signal to the battery 1440. In addition, the digital signal that is representative of the effect on the drive signal is also provided to the one or more processing modules 42. The one or more processing modules 42 is configured to provide control to and be in communication with the DSC 28-25 including to adapt the charge signal or monitoring signal that is provided to the comparator 2515 therein as desired to direct and control operation of the battery 1440 via the drive signal (e.g., such as effectuating a battery charge operation, a battery characterization operation, a simultaneous battery charge and battery characterization operation, etc.).

Note that the reference signal provided from the one or more processing modules 42 to the DSC 28-25 may be variable and adjustable and adaptive with respect to different operational modes. For example, the reference signal will include different respective characteristics based on what is being done and performed by the DSC 28-25 when interacting with the battery 1440. For example, the reference signal may include one or both of DC and or AC components. When performing a battery characterization operation, the reference signal may include only an AC component such that there is no DC component. An AC components of the reference signal may have a varying frequency as a function of time, such as in accordance with performing a frequency sweep of the AC component to facilitate characterization of the battery across a number of different frequencies, the reference signal may be appropriately modified and adapted to facilitate generation of spectrum analysis (SA) information corresponding to the battery 1440, etc. Generally speaking, the reference signal provided from the one or more processing modules 42 may be of any type desired and have any one or more characteristics. The charge signal or monitoring signal provided from the dependent current source 2570 and the output of the comparator 2515 to the battery 1440 will track the reference signal provided from the one or more processing modules 42.

Note also that an alternative implementation may be made by replacing the dependent current source 2570 with a voltage source, such as a dependent voltage source, may alternatively be implemented within another variation of a DSC that may be used to facilitate battery characterization.

In this diagram, the one or more processing modules 42 is configured to perform processing of the digital signal provided from the DSC 28-25 that is representative of an electrical characteristic of the battery 1440 that is based on the response of the battery 1442 the charge or monitoring signal to determine the electrical characteristic of the battery 1440. Also, note that the electrical characteristic of the battery 1440 may be of any of a variety of types include any one or more of a resistance of the battery, an impedance of the battery, one or more components of an equivalent circuit model of the battery, a signal response of the battery to the charge signal or monitoring signal, a signal response of the battery to the AC component of the charge signal or monitoring signal, and/or spectrum analysis (SA) information of the battery that is based on a signal response of the battery to a frequency sweep of the AC component of the charge signal or monitoring signal.

Figure 26:
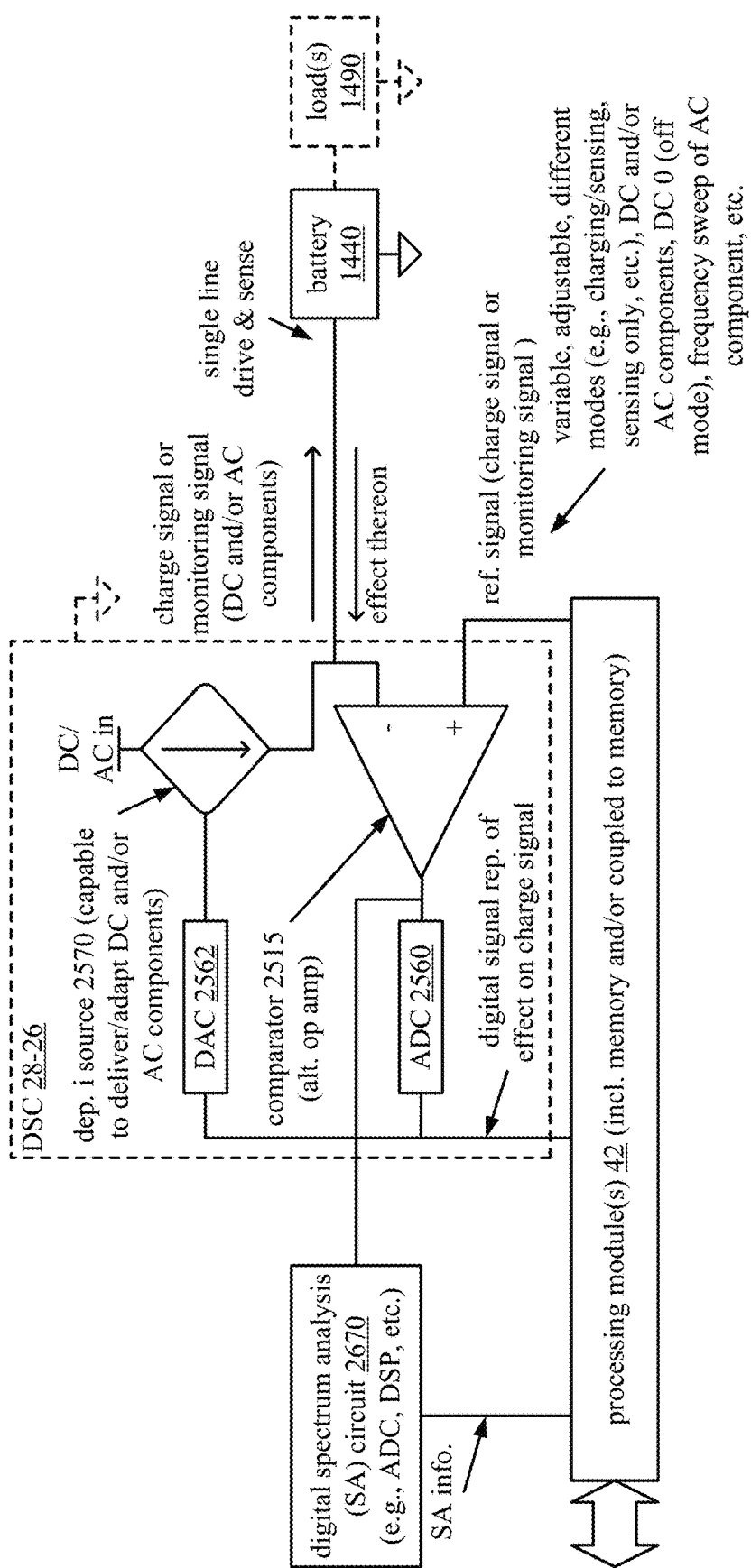
FIG. 26 is a schematic block diagram of another embodiment of a DSC that is interactive with a battery in accordance with the present invention.

FIG. 26 is a schematic block diagram of another embodiment 2600 of a DSC that is interactive with a battery in accordance with the present invention. This diagram is similar to the previous diagram with at least one difference that a DSC 28-26 includes an output of the comparator 2515 that is operably coupled to provide a signal to a digital spectrum analysis (SA) circuit 2670. Note that such a digital SA circuit 2670 may be implemented to include one or more components such as an analog to digital converter (ADC), a digital signal processor (DSP), etc. The digital SA circuit 2670 but this diagram is a separate and dedicated circuit, separate from the one or more processing modules 42, that is configured to provide SA information to the one or more processing modules 42.

Figure 27:
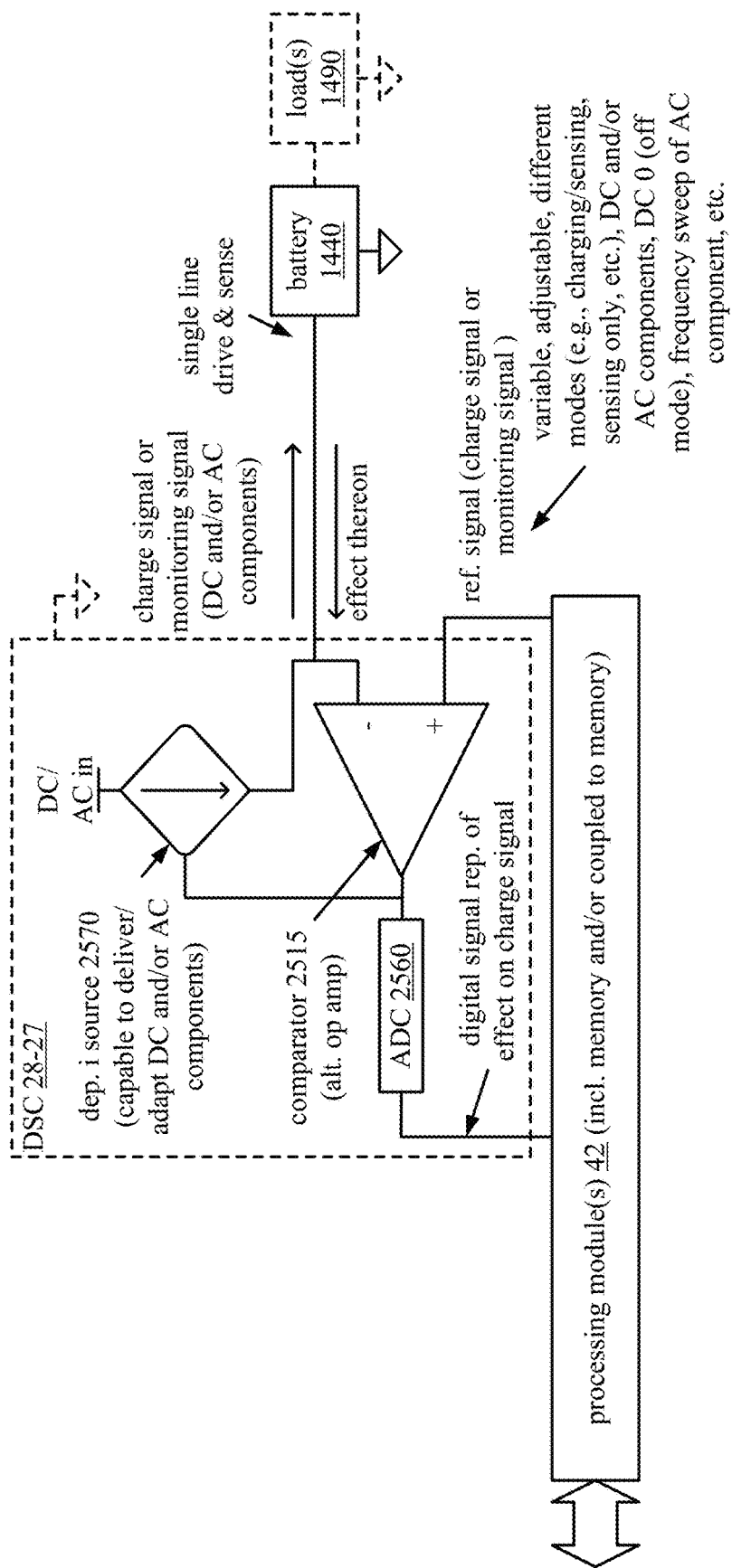
FIG. 27 is a schematic block diagram of another embodiment of a DSC that is interactive with a battery in accordance with the present invention.

FIG. 27 is a schematic block diagram of another embodiment 2700 of a DSC that is interactive with a battery in accordance with the present invention. This diagram is similar to FIG. 25 with at least one difference being that a DSC 28-27 does not include any DAC in the control loop that provides control to the dependent current source 2570. In this diagram, the output from the comparator 2570 is provided to control the dependent current source 2570.

Figure 28:
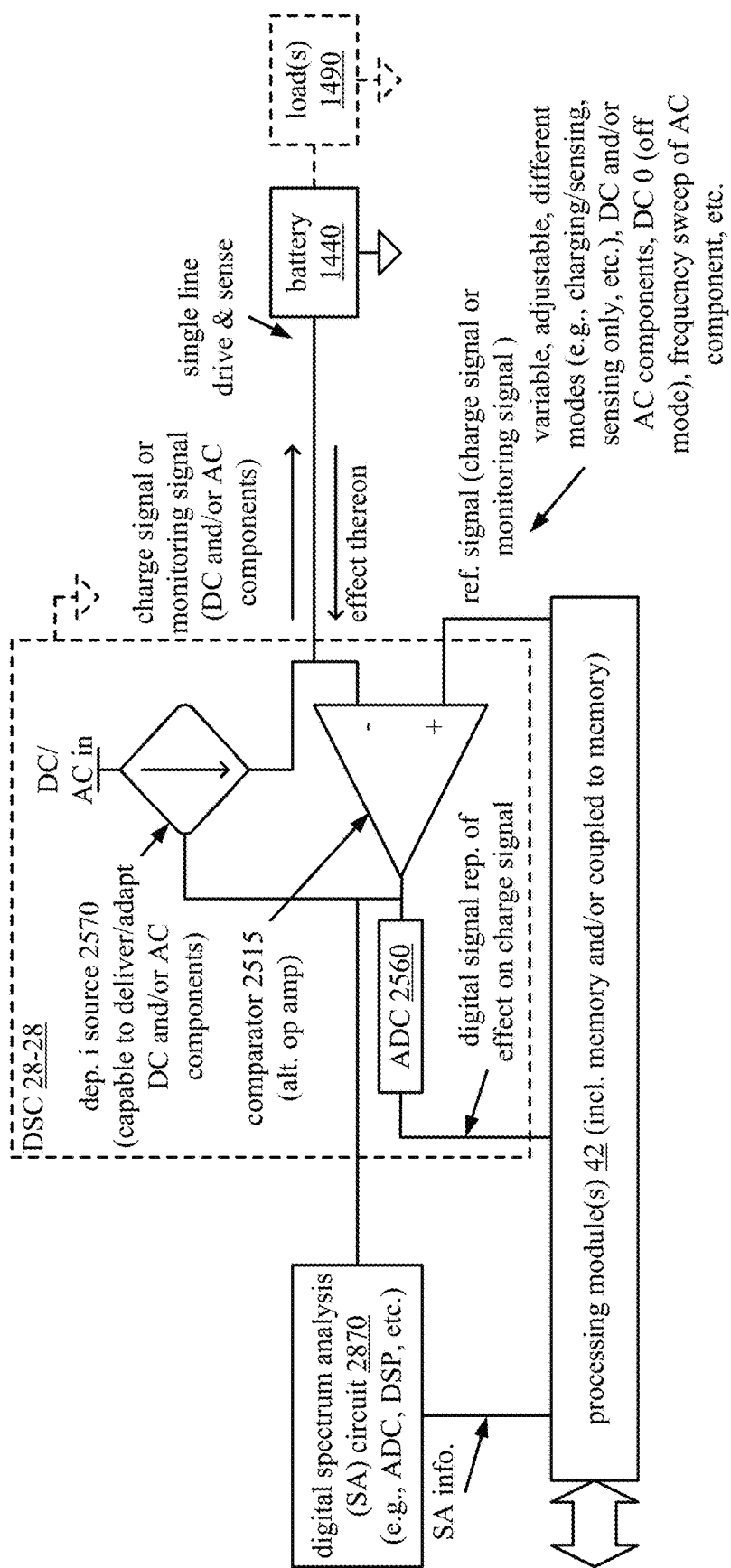
FIG. 28 is a schematic block diagram of another embodiment of a DSC that is interactive with a battery in accordance with the present invention.

FIG. 28 is a schematic block diagram of another embodiment 2800 of a DSC that is interactive with a battery in accordance with the present invention. This diagram has similarities to certain of the previous diagrams. For example, in this diagram, a DSC 28-28 does not include any DAC in the control loop that provides control to the dependent current source 2570. In this diagram, the output from the comparator 2570 is provided to control the dependent current source 2570. Also, this diagram is similar to the previous diagram with at least one difference that a DSC 28-28 includes an output of the comparator 2515 that is operably coupled to provide a signal to a digital SA circuit 2670 (e.g., such as may be implemented to include one or more components such as an analog to digital converter (ADC), a digital signal processor (DSP), etc.). The digital SA circuit 2670 but this diagram is a separate and dedicated circuit, separate from the one or more processing modules 42, that is configured to provide SA information to the one or more processing modules 42.

Figure 29:
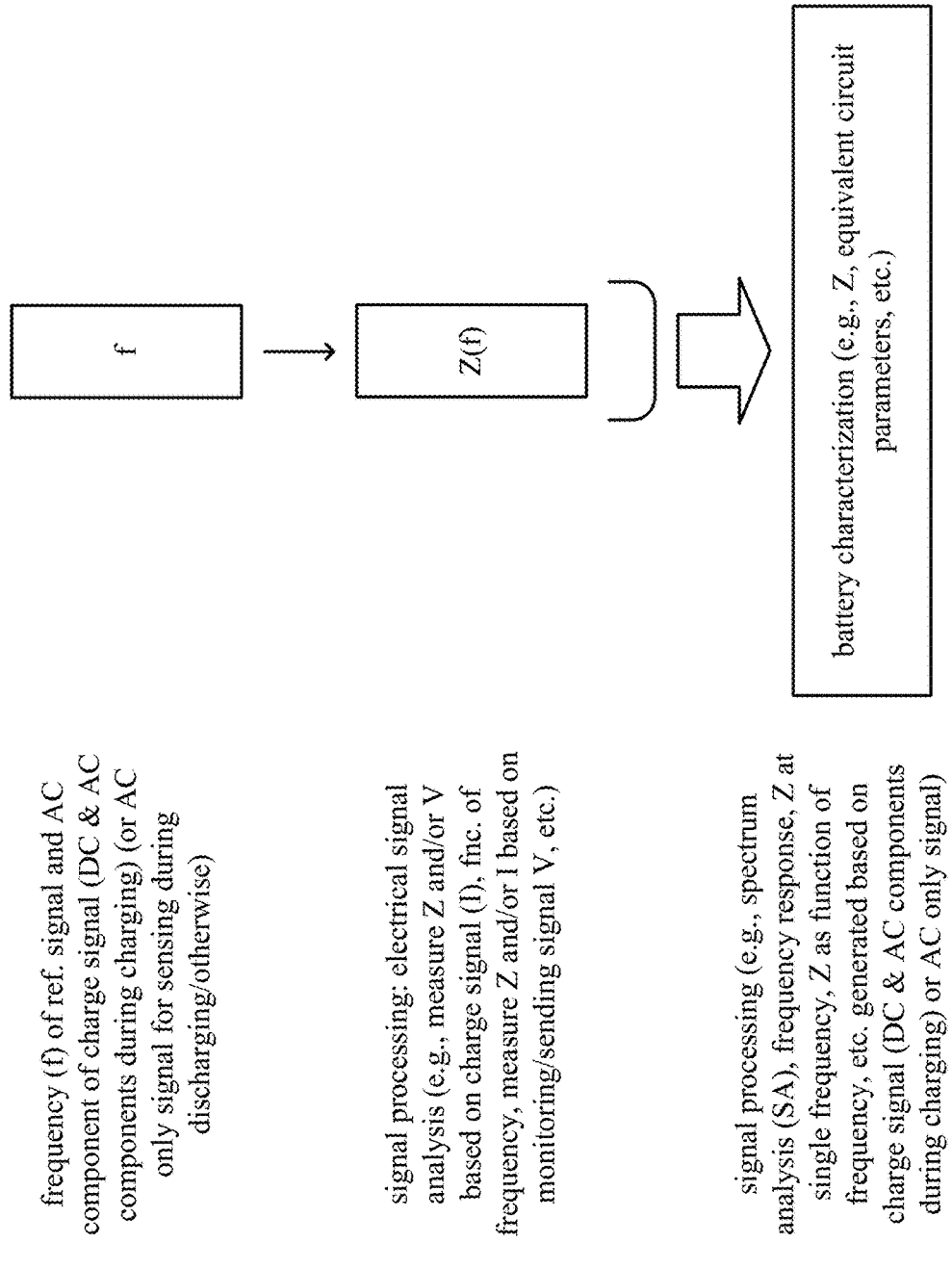
FIG. 29 is a schematic block diagram showing an embodiment of operations as may be used to perform battery characterization in accordance with the present invention.

FIG. 29 is a schematic block diagram showing an embodiment 2900 of operations as may be used to perform battery characterization in accordance with the present invention. This diagram shows battery characterization based on a reference signal having an AC component with frequency, f Based on reference signal, a DSC is configured to generate a charge signal or monitoring signal having AC component with that frequency, f Note that when both battery charging and battery characterization are performed simultaneously, charge signal having both AC and DC components is provided from the DSC. Alternatively, when only battery characterization is being performed, a monitoring signal having only AC components may be provided from the DSC.

Based on the response of the battery to the charge signal or the monitoring signal, the DSC generates a digital signal that is representative of one or more electrical characteristics of the battery. For example, the impedance of the battery, $Z(f)$, at the frequency, f, may be determined based on one or more processing modules interpreting the digital signal that is provided from the defense see based on the response of the battery to the charge signal of monitoring signal. Generally speaking, signal processing is performed to determine one or more electrical characteristics of the battery. For example, based on a change of one or both of a charge signal or monitoring signal that is provided to the battery, the DSC is configured to generate a digital signal representative of that change.

Consider an example in which a charge signal that is a current signal. As such a charge signal (e.g., current signal in this example) is provided to the battery, then based on the impedance of the battery, $Z(f)$, one or more characteristics of the charge signal (current signal) will be changed in response to the impedance of the battery, $Z(f)$. In one example, the impedance of the battery, $Z(f)$, or voltage of the battery may be determined based on a change of the charge signal (current signal).

In another example, consider a monitoring signal that is a voltage signal. As such a monitoring signal (voltage signal) is provided to the battery, then based on the impedance of the battery, $Z(f)$, one or more characteristics of the monitoring signal (voltage signal) will be changed in response to the impedance of the battery, $Z(f)$. In one example, the impedance of the battery, $Z(f)$, or current drawn by the battery may be determined based on a change of the monitoring signal (voltage signal).

One or more processing modules is configured to perform signal processing of the digital signal provided from the DSC to determine one or more electrical characteristics of the battery. Note that such one or more electrical characteristics of the battery may include any one or more of spectrum analysis (SA) information, a frequency response of the battery to the charge or monitoring signal, determination of the impedance of the battery, $Z(f)$, at the frequency, f, etc. such determination may be used to estimate one or more equivalent circuit parameters of the battery as corresponding to one or more equivalent battery equivalent circuit models.

In an example of operation and implementation, spectrum analysis (SA) information is generated by measuring the magnitude of the signal that is detected/sensed by the DSC in response to a charge signal or a monitoring signal that is provided to the battery as a function of frequency within a desired frequency range. Generally speaking, SA information corresponds to measuring where the power or energy of the signal lies as a function of frequency. Such SA information also provides information of the frequency response of the battery, in that, comparison of the charge signal or the monitoring signal to the detected/sensed signal provides information regarding the electrical characteristics of the battery and how it responds to the charge signal and monitoring signal. Such SA information includes information regarding the spectral components of the detected/sensed signal including a dominant frequency (if present), power including distribution of where the power within the detected/sensed signal may lie as a function of frequency, harmonics, bandwidth, etc.

There are a variety of ways in which spectrum analysis (SA) information may be acquired. In some examples, one or more processing modules is configured to perform a Fourier transform operation in accordance with digital signal processing (e.g., discrete Fourier transform (DFT)) on the digital signal that is provided from the DSC. For example, based on the signal that is output from an ADC of the DSC that provides a digital signal, the one or more processing modules is configured to perform such a Fourier transform operation to determine the spectrum of the detected/sensed signal and where the energy of the signal is located as a function of frequency.

In other examples, a spectrum analyzer using the heterodyne principle may be used such that an input signal undergoes some initial filtering (e.g., often times attenuation, low pass filtering, etc.), then is passed through a frequency mixer to perform frequency conversion to a desired frequency, an intermediate frequency (IF), for which the spectrum analyzer is specifically designed intent to process, then subsequent filtering, and/or amplification, attenuation is performed on the signal before providing it to an envelope detector that is operative to detect the amount of energy within the frequency of interest. Over time, the operation of the frequency mixer is adapted to sweep across a desired frequency range so that analysis of the detected/sensed signal may be performed at a number of different frequencies within a frequency range of interests.

Such SA information may also include the power spectral density (PSD) of the detected/sensed signal that corresponds to the spectral energy distribution of the signal as a function of per unit time. Such SA information may also include the energy spectral density of the detected/sensed signal that corresponds to the spectral energy distribution of the signal. Generally speaking, a spectrum analyzer is operative to determine the signal level of the detected/sensed signal at each of a number of desired frequencies within a desired frequency range.

As described herein, a separately implemented digital spectrum analysis (SA) circuit may be implemented to perform such spectrum analysis, or the one or more processing modules may be configured to perform digital signal processing of a digital signal provided from a DSC in accordance with such spectrum analysis. The DSC is operative to provide a digital signal to such a digital SA circuit or one or more processing modules that may undergo any subsequent desired processing including determination of SA information associated with the detected/sensed signal.

Modifying the frequency of an AC component of a reference signal is provided to a DSC to be used in the generation of charge signal or a monitoring signal may be performed in a variety of ways. In some examples, one or more processing modules includes functionality and capability to generate signals having different frequencies. For example, one or more processing modules may include a voltage controlled oscillator (VCO) that is operative to generate a signal having a frequency that is a function of the voltage applied thereto.

Figure 30:
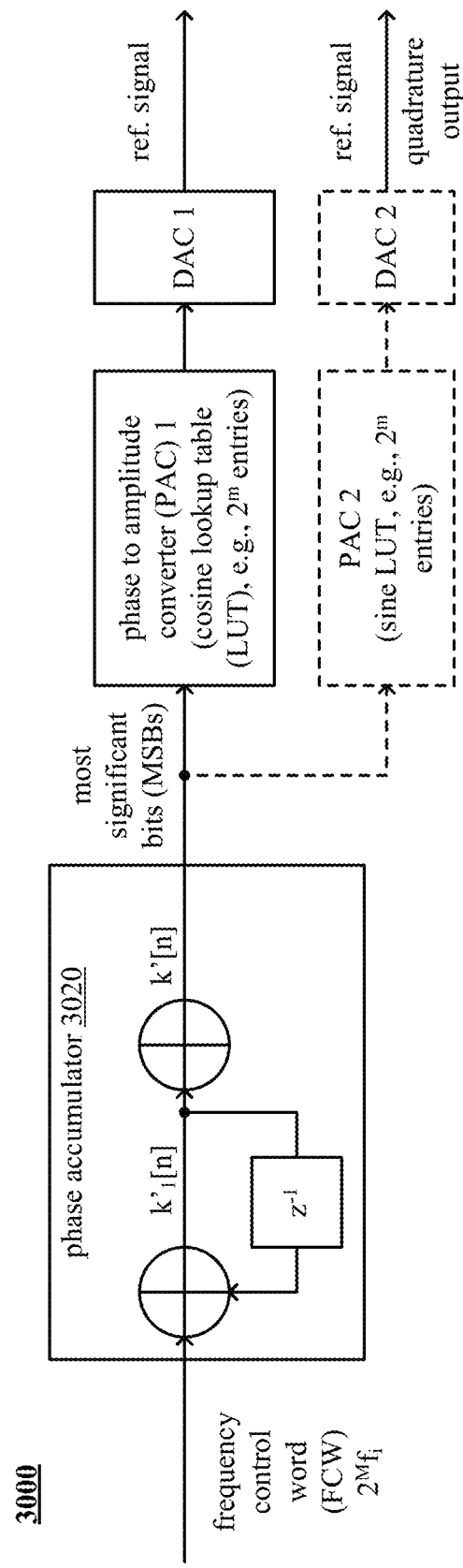
FIG. 30 is a schematic block diagram showing another embodiment of a circuit configured to provide a reference signal having a desired frequency to a DSC in accordance with the present invention.

FIG. 30 is a schematic block diagram showing another embodiment 3000 of a circuit configured to provide a reference signal having a desired frequency to a DSC in accordance with the present invention. This diagram shows one possible implementation of a numerically controlled oscillator (NCO) that may be used to generate a reference signal to be provided to the DSC having a desired frequency. The NCO includes a phase accumulator 3020 and at least one phase to amplitude converter (PAC). This diagram shows the PAC 1 followed by a DAC 1 that are operative to generate a reference signal and a PAC 2 followed by a DAC 2 that are operative to generate another reference signal (e.g., a quadrature output of the reference signal generated by the PAC 1 followed by a DAC 1).

The phase accumulator 3020 receives a frequency control word (FCW) that is used to specify the frequency of the signal is to be generated by the NCO. For example, phase accumulation is performed (e.g., using an M-bit integer register). In operation and when the NCO is clocked, the phase accumulator 3020 accumulates or adds to its currently held value at each clock cycle. The PAC uses the output from the phase accumulator 3020 which may be viewed as a phase word (e.g., sometimes using the most significant bits (MSBs) of that phase word, such as in accordance with truncation of the phase were), as the index to locate an appropriate value within a lookup table (LUT) (e.g., a cosine LUT including $2^m$ entries, where m is a positive integer) to provide an output signal having the corresponding desired amplitude. This output signal from the PAC is provided to a DAC to generate the reference signal. In this diagram, a quadrature output may be generated using a second PAC (e.g., a sine LUT including $2^m$ entries, where m is a positive integer).

Generally speaking, in operation, the phase accumulator 3020 creates a sawtooth waveform that is processed by the PAC to generate the respective samples of an oscillating signal, such as a sinusoidal signal. Those respective samples are provided to the DAC to perform digital to analog conversion thereby generating the reference signal that may be provided to the DSC.

Note that such an NCO may be implemented within one or more processing modules that is implemented to provide a reference signal to a DSC. Alternatively, an NCO may be implemented in between the one or more processing modules and the DSC and is operative to generate the reference signal to be provided to the DSC based on input from the one or more processing modules.

Figure 31:
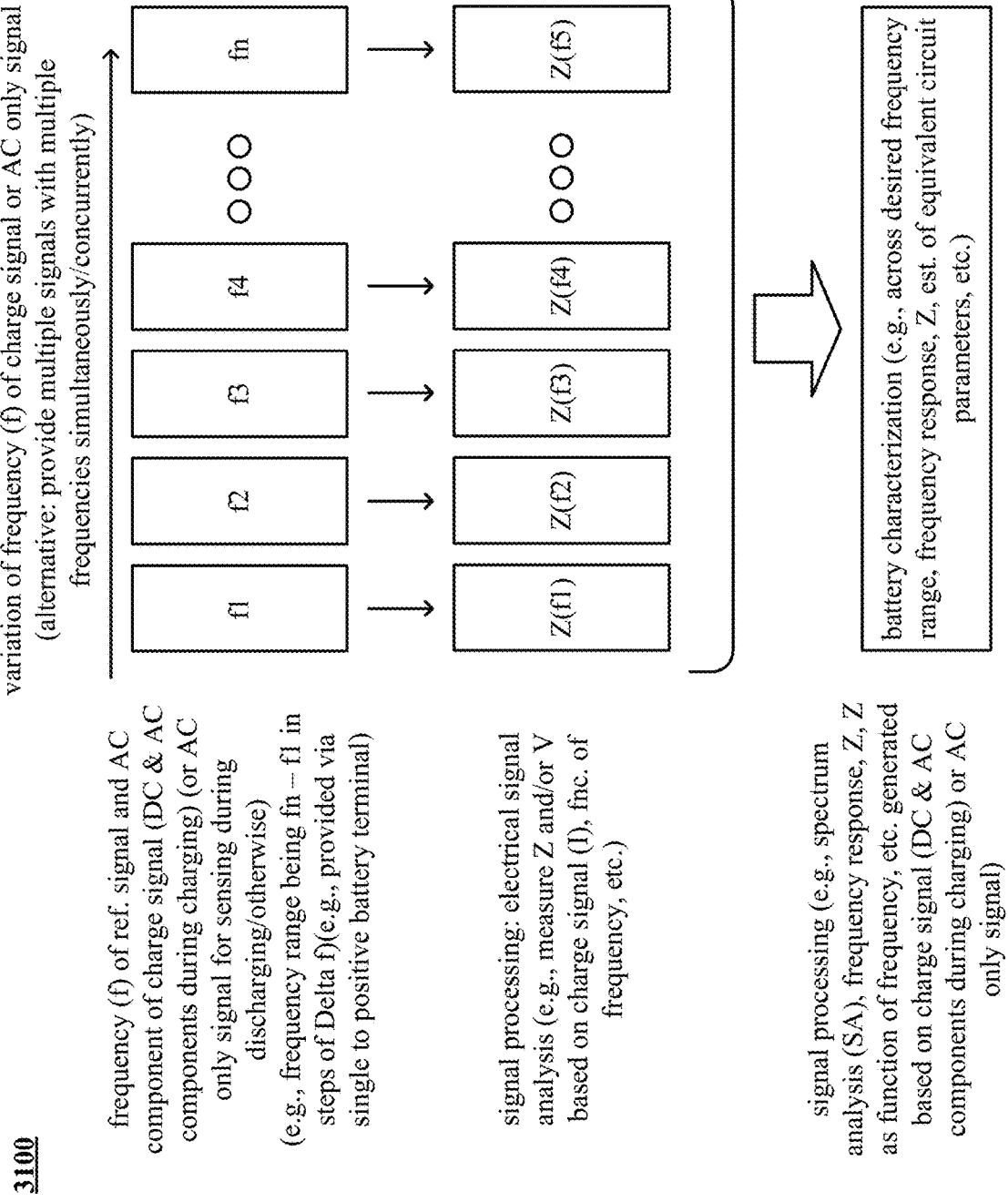
FIG. 31 is a schematic block diagram showing an embodiment of operations as may be used to perform battery characterization across a number of different frequencies in accordance with the present invention.

FIG. 31 is a schematic block diagram showing an embodiment 3100 of operations as may be used to perform battery characterization across a number of different frequencies in accordance with the present invention. This diagram has some similarity to FIG. 29 with at least one difference being that the frequency of the charge signal or the monitoring signal is varied across a variety of frequencies within a desired frequency range.

Signal processing and electrical signal analysis may be performed on the digital signal provided from a DSC that is operative to sense/detect the response of the charge signal or the monitoring signal that is provided to the battery. As such, battery characterization may be performed not only based on the response of the battery to an AC component of the charge signal or the monitoring signal having a singular frequency, but based on response of the battery to the AC component of the charge signal or the monitoring signal across any desired frequency range.

Figure 32:
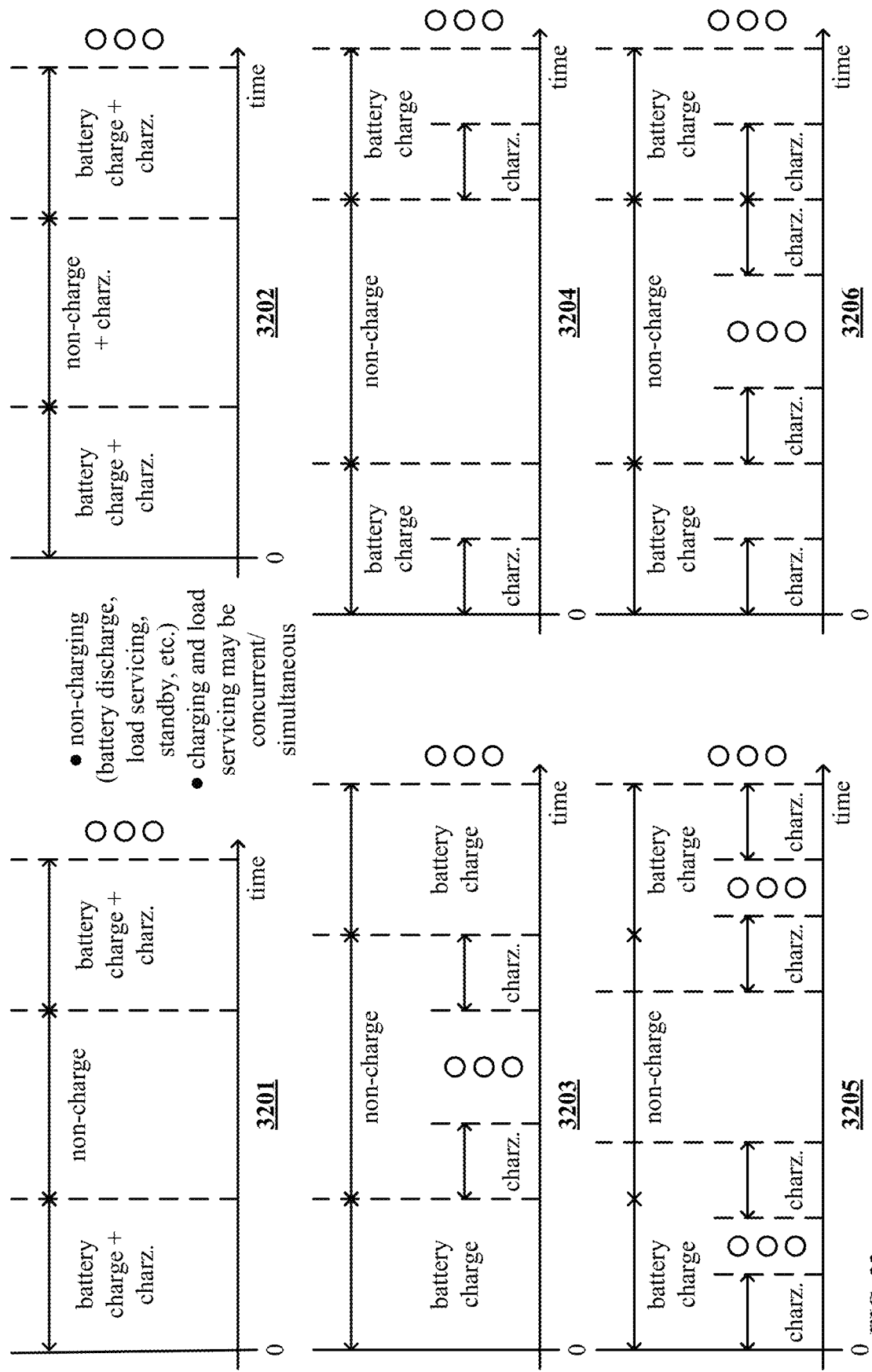
FIG. 32 is a schematic block diagram showing various embodiments of different possible operational sequences involving battery charge, battery characterization, non-charge including various combinations thereof in accordance with the present invention.

FIG. 32 is a schematic block diagram showing various embodiments 3201, 3203, 3203, 3204, 3205, and 3206 of different possible operational sequences involving battery charge, battery characterization, non-charge including various combinations thereof in accordance with the present invention.

Note that non-charge operation of the battery may correspond to any one or more of battery discharge, load servicing, standby, etc. Note that both charging of the battery and load servicing by the battery may be performed on currently/simultaneously. This diagram shows a variety of examples of when battery characterization may be performed including during charging and during any non-charge operational modes. For example, during a charging operational mode, a charge signal may be provided to the battery that includes both an AC and the DC component to facilitate battery characterization. During a non-charge operational mode, and monitoring signal may be provided to the battery that includes only an AC component to facilitate battery characterization.

With respect to the operational sequence 3201, during a first period of time, both battery charge and battery characterization are performed. Then, during a second period of time following the first period of time, the battery is operated in a non-charge mode. Then, during a third period of time following the second period of time, then both battery charge and battery characterization are performed.

With respect to the operational sequence 3202, during a first period of time, both battery charge and battery characterization are performed. Then, during a second period of time following the first period of time, the battery is operated in a non-charge mode while battery characterization is performed. Then, during a third period of time following the second period of time, then both battery charge and battery characterization are performed.

With respect to the operational sequence 3203, during a first period of time, battery charge is performed. Then, during a second period of time following the first period of time, the battery is operated in a non-charge mode while battery characterization is performed during some, but not all, of the second period of time. For example, battery characterization may be performed during one or more portions of the second period of time and not during others. Then, during a third period of time following the second period of time, battery charge is performed.

With respect to the operational sequence 3204, during a first period of time, battery charge is performed while battery characterization is performed during a portion of the first period of time. For example, battery characterization may be performed during only part of the first period of time. That is to say, as a charge signal is provided to the battery, there is a period during which the charge signal includes both an AC and a DC component, and there is another period during which the charge signal includes only a DC component during which no battery characterization is performed. Then, during a second period of time following the first period of time, the battery is operated in a non-charge mode. Then, during a third period of time following the second period of time, battery charge is performed while battery characterization is performed during a portion of the third period of time.

With respect to the operational sequence 3205, during a first period of time, battery charge is performed while battery characterization is performed during some, but not all, of the first period of time. For example, battery characterization may be performed during one or more portions of the first period of time and not during others. That is to say, as a charge signal is provided to the battery in the first period of time, there may be periods during which the charge signal includes both an AC and a DC component, and there may be other periods during which the charge signal includes only a DC component during which no battery characterization is performed. Then, during a second period of time following the first period of time, the battery is operated in a non-charge mode. Then, during a third period of time following the second period of time, battery charge is performed while battery characterization is performed during some, but not all, of the third period of time. For example, battery characterization may be performed during one or more portions of the third period of time and not during others. That is to say, as a charge signal is provided to the battery in the third period of time, there may be periods during which the charge signal includes both an AC and a DC component, and there may be other periods during which the charge signal includes only a DC component during which no battery characterization is performed.

With respect to the operational sequence 3206, during a first period of time, battery charge is performed while battery characterization is performed during a portion of the first period of time. For example, battery characterization may be performed during only part of the first period of time. That is to say, as a charge signal is provided to the battery, there is a period during which the charge signal includes both an AC and a DC component, and there is another period during which the charge signal includes only a DC component during which no battery characterization is performed. Then, during a second period of time following the first period of time, the battery is operated in a non-charge mode while battery characterization is performed during some, but not all, of the second period of time. For example, battery characterization may be performed during one or more portions of the second period of time and not during others. Then, during a third period of time following the second period of time, battery charge is performed while battery characterization is performed during a portion of the third period of time.

Note that such examples of such operational sequences are not exhaustive, in any combination of charge operation, non-charge operation, standby, discharge, load servicing, etc. may be performed in various embodiments, examples, etc. Note that battery characterization may be performed at any time including during battery charge and non-charge operations.

Figure 33:
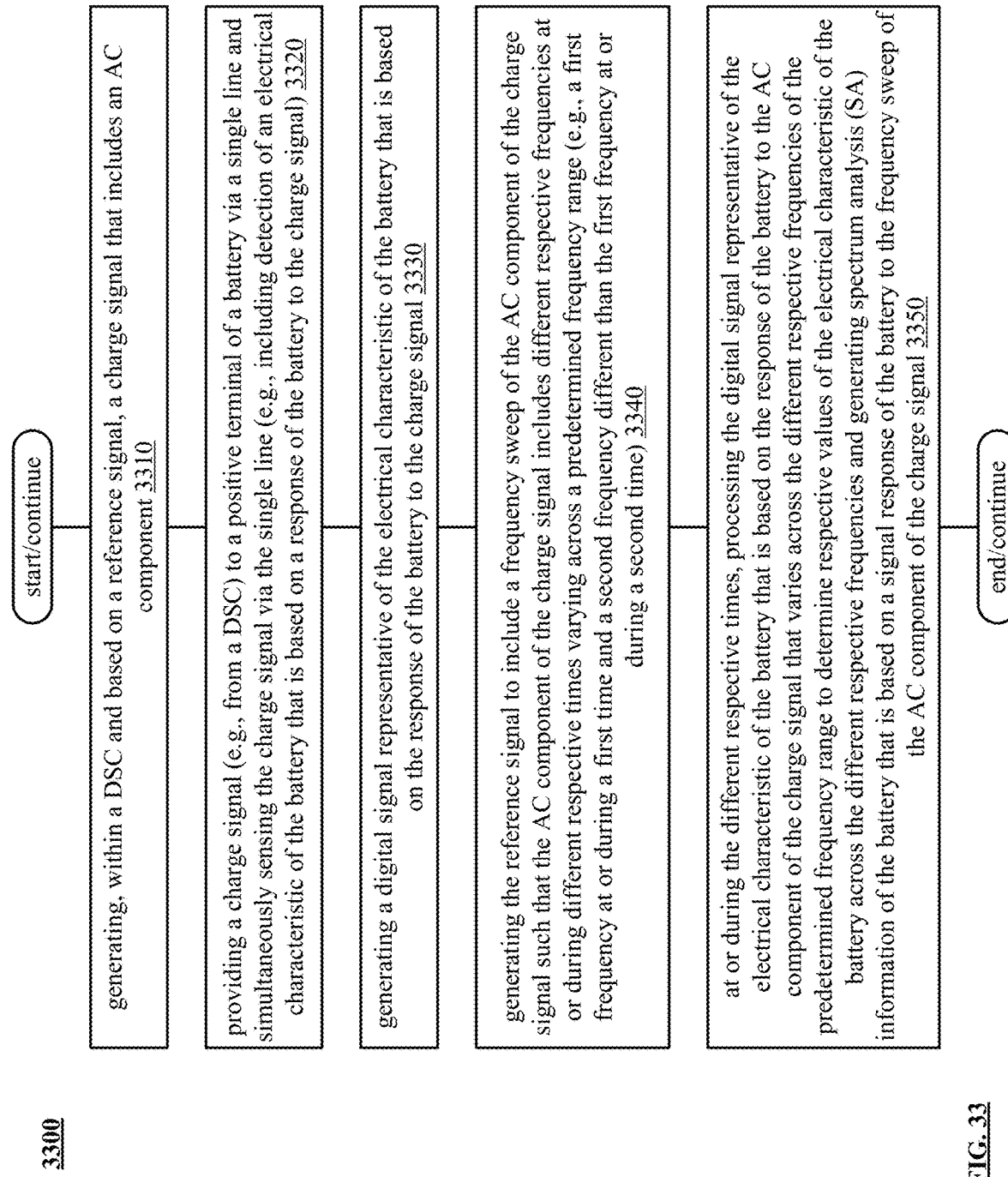
FIG. 33 is a schematic block diagram of an embodiment of a method for execution by one or more devices in accordance with the present invention.

FIG. 33 is a schematic block diagram of an embodiment of a method 3300 for execution by one or more devices in accordance with the present invention. The method 3300 operates in step 3310 by generating, within a DSC and based on a reference signal, a charge signal that includes an AC component.

The method 3300 also operates in step 3320 by providing a charge signal (e.g., from a DSC) to a terminal of a battery via a single line and simultaneously sensing the charge signal via the single line (e.g., including detection of an electrical characteristic of the battery that is based on a response of the battery to the charge signal). The method 3300 operates in step 3330 by generating a digital signal representative of the electrical characteristic of the battery that is based on the response of the battery to the charge signal.

The method 3300 also operates in step 3340 by generating the reference signal to include a frequency sweep of the AC component of the charge signal (or a monitoring signal) such that the AC component of the charge signal includes different respective frequencies at or during different respective times varying across a predetermined frequency range (e.g., a first frequency at or during a first time and a second frequency different than the first frequency at or during a second time).

Alternatively, note that multiple different respective signals having multiple different respective frequencies may be provided simultaneously/concurrently such that the AC component of the charge signal or a monitoring signal includes multiple respective signals having multiple respective frequencies.

At or during the different respective times, the method 3300 operates in step 3350 by processing the digital signal representative of the electrical characteristic of the battery that is based on the response of the battery to the AC component of the charge signal that varies across the different respective frequencies of the predetermined frequency range to determine respective values of the electrical characteristic of the battery across the different respective frequencies and generating spectrum analysis (SA) information of the battery that is based on a signal response of the battery to the frequency sweep of the AC component of the charge signal.

FIG. 34A is a schematic block diagram of another embodiment of a method 3401 for execution by one or more devices in accordance with the present invention. The method 3401 operates in step 3410 by generating, within a DSC and based on a reference signal, a charge signal that includes an AC component and a DC component.

The method 3401 also operates in step 3420 by providing a charge signal (e.g., from a DSC) to a terminal of a battery via a single line and simultaneously sensing the charge signal via the single line (e.g., including detection of an electrical characteristic of the battery that is based on a response of the battery to the charge signal). The method 3401 operates in step 3430 by generating a digital signal representative of the electrical characteristic of the battery that is based on the response of the battery to the charge signal.

The method 3401 also operates in step 3440 by processing the digital signal representative of the electrical characteristic of the battery that is based on the response of the battery to the charge signal to determine the electrical characteristic of the battery.

FIG. 34B is a schematic block diagram of another embodiment of a method 3402 for execution by one or more devices in accordance with the present invention. The method 3402 operates in step 3410 by generating, within a DSC and based on a reference signal, a monitoring signal that includes an AC component and a DC component.

The method 3402 also operates in step 3420 by providing a monitoring signal, (e.g., from a DSC) to a terminal of a battery via a single line and simultaneously sensing the monitoring signal via the single line (e.g., including detection of an electrical characteristic of the battery that is based on a response of the battery to the monitoring signal). The method 3402 operates in step 3430 by generating a digital signal representative of the electrical characteristic of the battery that is based on the response of the battery to the monitoring signal.

The method 3402 also operates in step 3440 by processing the digital signal representative of the electrical characteristic of the battery that is based on the response of the battery to the monitoring signal to determine the electrical characteristic of the battery.

FIG. 35A is a schematic block diagram of an embodiment 3501 of a DSC that is interactive with a battery via a configurable impedance (Z) circuit in accordance with the present invention. Based on characterization of the battery and one or more of electrical characteristics of the battery, a configurable impedance (Z) circuit 3510 may be implemented in line and between a DSC 28 and a battery. By providing an impedance between a DSC 28 and a battery, and by selecting or setting an appropriate value of that impedance to match the impedance of the battery ($Z_{battery}$ 3512), maximum power transfer can be made from the DSC 28 to the battery. For example, impedance matching involves providing an input impedance between the source of power and the load, which is a battery in this case, that matches the impedance of the load to maximize power transfer or minimize signal reflection from the load (battery).

Consider that the impedance of the battery is purely resistive, then the configurable Z circuit 3510 may be configured so that it provides a purely resistive impedance matching the value of the impedance of the battery. This will maximize power transfer from the DSC 28 to the battery.

Consider that the impedance of the battery is both resistive and reactance (e.g., $Z_{battery}=R+j\omega L$, or $Z_{battery}=R-(1/\omega C)$, etc. where $\omega=2\pi f$, where f is frequency), and maximum power transfer from the DSC 28 to the battery will be achieved when the configurable Z circuit 3510 is configured so that it provides the complex conjugate of the impedance of the battery. For example, the configurable Z circuit 3510 would be configured to provide an impedance of $Z_{battery}*$ to facilitate maximum power transfer from the DSC 28 to the battery. For example, consider that the impedance of the battery is $Z_{battery}=R+j L$, then the configurable Z circuit 3510 would be configured to provide an impedance that is the complex conjugate of the battery, $Z=R-j L$ to facilitate maximum power transfer from the DSC 28 to the battery.

Minimum reflection of the signal provided to the battery via the configurable Z circuit 3510 is achieved when the configurable Z circuit 3510 is configured to provide an impedance that matches that of the battery, $Z_{battery}$.

Note that when the impedance of the battery is purely resistive, configuring the configurable Z circuit 3510 to have a matching impedance provides for both maximum power transfer and minimum signal reflection.

FIG. 35B is a schematic block diagram of another embodiment 3502 of a DSC that is interactive with a battery via a configurable impedance (Z) circuit in accordance with the present invention. One or more processing modules 42 is configured to communicate with and interact with a DSC 28. Such communication and interaction may be implemented in via any desired number of communication pathways between the one or more processing modules 42 and the DSC 28 (e.g., generally n communication pathways, where n is a positive integer greater than or equal to one). The one or more processing modules 42 is coupled to a DSC 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

The DSC is configured to provide a charge signal or a monitoring signal to a battery 1440 that may optionally service one or more loads 1490. In addition, a configurable Z circuit 3510a is implemented in line between the battery 1440 and the optional one or more loads 1490. The one or more processing modules 42 is operative not only to interact with and control operation of the DSC 28 but also to select or set a value of impedance to be provided in line between the battery 1440 and the optional one or more loads 1490 by appropriately configuring the configurable Z circuit 3510. In some examples that do not include one or more loads 1490, the configurable Z circuit 3510a may be used to provide one or more known load values on the battery 1440 to facilitate improved battery monitoring and characterization. For example, by connecting a known impedance using the configurable Z circuit 3510a to the battery 1440, then battery characterization and monitoring may be performed on the battery 1440 under a known load. Also, in some examples the one or more processing modules 42 is operative to select different respective impedance values for the configurable Z circuit 3510a at different times to allow for characterization and monitoring of the battery 1440 under different respective load conditions. Providing the ability to connect known impedance values to the battery 1440 provides yet another aspect by which battery characterization 1440 may be performed.

In addition, in certain examples, the one or more processing modules 42 is configured to select an appropriate impedance for the configurable Z circuit 3510*a* to facilitate maximum power transfer or minimum reflection from the battery 1440 to the one or more loads 1490. Generally speaking, similar principles as described above with respect to maximizing power transfer or minimizing reflection may be implemented at the output of the battery 1440 as it interacts with one or more loads 1490.

Note that such a configurable Z circuit 3510*a* may also be implemented in other various configurations as described herein has shown within certain subsequent diagrams as including a configurable Z circuit 3510*a* that is implemented in line between the battery 1440 and the optional one or more loads 1490 (e.g., FIGS. 35C, 36, 37, 38).

FIG. 35C is a schematic block diagram of another embodiment 3503 of a DSC that is interactive with a battery via a configurable impedance (Z) circuit in accordance with the present invention. One or more processing modules 42 is configured to communicate with and interact with a DSC 28. Such communication and interaction may be implemented in via any desired number of communication pathways between the one or more processing modules 42 and the DSC 28 (e.g., generally n communication pathways, where n is a positive integer greater than or equal to one). The one or more processing modules 42 is coupled to a DSC 28. Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

The DSC is configured to provide a charge signal or a monitoring signal via a configurable Z circuit 3510 to a battery 1440 that may optionally service one or more loads 1490. The one or more processing modules 42 is operative not only to interact with and control operation of the DSC 28 but also to select or set a value of impedance to be provided in line between the DSC 28 and the battery 1440 by appropriately configuring the configurable Z circuit 3510.

Note that the impedance of a battery may change over time due to various considerations including aging, approaching end-of-life, having undergone multiple charge-discharge cycles, environmental conditions including temperature, etc. Battery characterization may be performed at different times to provide accurate characterization of the impedance of the battery at those different times. Having this information regarding characterization of the battery including the impedance of the battery, the one or more processing modules 42 is configured to select or set an appropriate value for the configurable Z circuit 3510 to facilitate desired operation. For example, when maximum power transfer is desired from the DSC 28 to the battery 1440 such as during a charge operation, then the one or more processing modules is configured to select or set an appropriate value for the configurable Z circuit 3510 that is the complex conjugate of the impedance of the battery 1440.

Maximizing power transfer from the DSC 28 to the battery 1440 can provide a number of benefits including faster charging of the battery 1440 thereby reducing the amount of charge time, more full or complete charge of the battery 1440, etc. in addition, note that the use of the DSC 28 to facilitate charging of the battery 1440 in cooperation with the one or more processing modules 42 allows for charge signals of any desired type to be provided to the battery 1440. Using the configurable Z circuit 3510 and by selecting or setting an appropriate and thereof, even smaller magnitude charge signals may be provided from the DSC 28 to the battery 1440 via the configurable Z circuit 3510 based on impedance matching to maximize power transfer while still achieving effective and efficient charging of the battery 1440. A number of benefits may be achieved by providing a configurable Z circuit 3510 in line between the DSC 28 and the battery 1440.

Moreover, even during non-charge operation, improvement of battery characterization may be achieved by providing an appropriately by selecting an appropriate impedance value for the configurable Z circuit 3510. For example, either maximum power transfer or minimal reflection of a monitoring signal to the battery 1440 may be desired in various instances, and an appropriate impedance value may be selected for the configurable Z circuit 3510 as may be desired in various examples.

Figure 36:
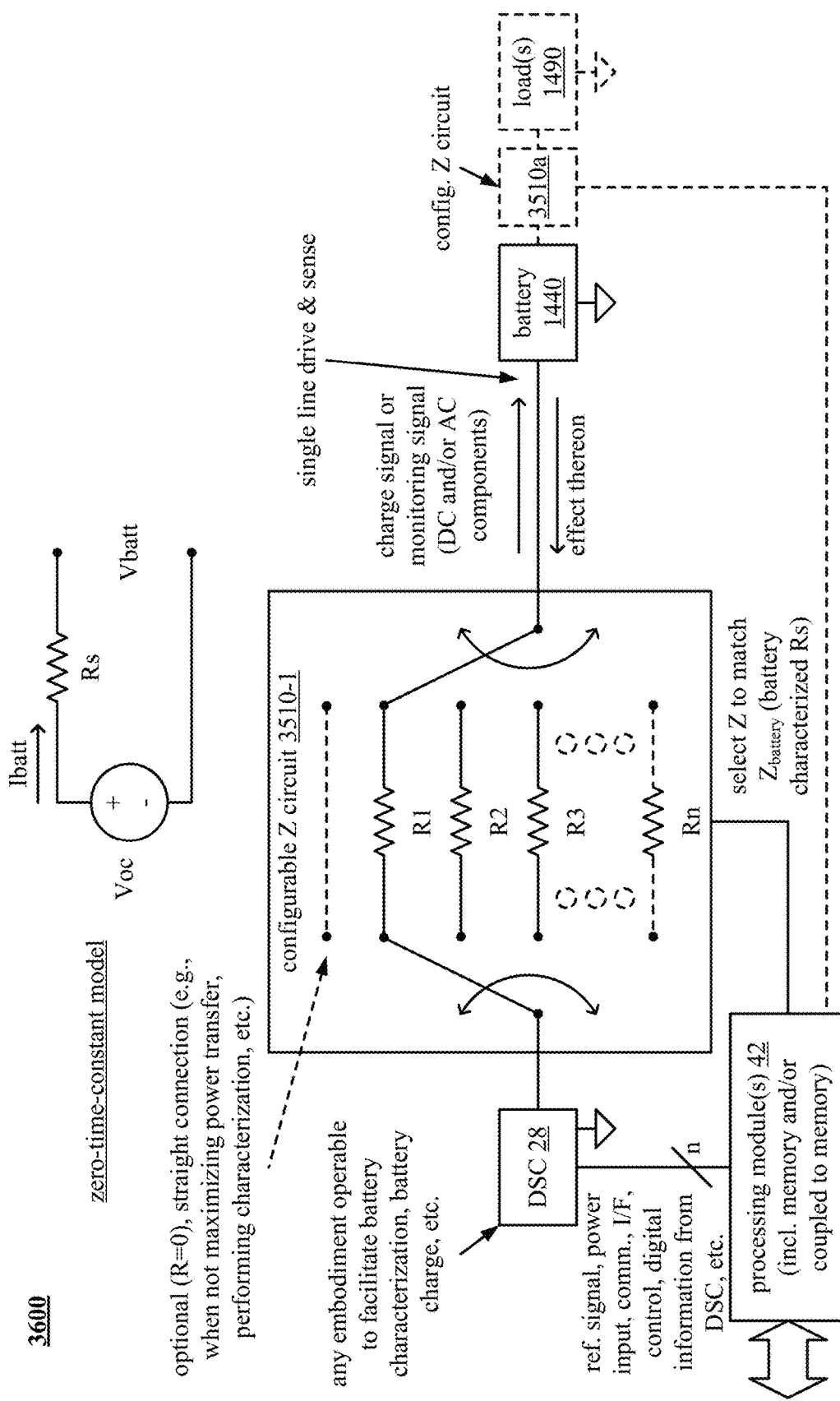
FIG. 36 is a schematic block diagram of another embodiment of a DSC that is interactive with a battery via a configurable impedance (Z) circuit in accordance with the present invention.

FIG. 36 is a schematic block diagram of another embodiment 3600 of a DSC that is interactive with a battery via a configurable impedance (Z) circuit in accordance with the present invention. This diagram shows one possible implementation of a configurable Z circuit 3510-1. In this diagram, a zero-time-constant model for the equivalent circuit of the battery is used as can be seen at the top of the diagram. As such, the impedance of the battery is characterized as having a purely resistive component. The configurable Z circuit 3510-1 includes a number of different impedances that are purely resistive components. Based on the desired operation of the DSC 28 when interacting with the battery 1440, the one or more processing modules 42 is configured to select the appropriate impedance value within the configurable Z circuit 3510-1. For example, the configurable Z circuit 3510-1 includes a number of different resistances that may be selected to be connected in line between the DSC 28 in the battery 1440 (e.g., R1, R2, and so on up to Rn, where n is some positive integer value).

In addition, note that an optional direct connection may be selected within the configurable Z circuit 3510-1 such as a connection having no impedance (e.g., R=0). This may be selected by the one or more processing modules 42 when not maximizing power transfer, performing characterization, etc.

Figure 37:
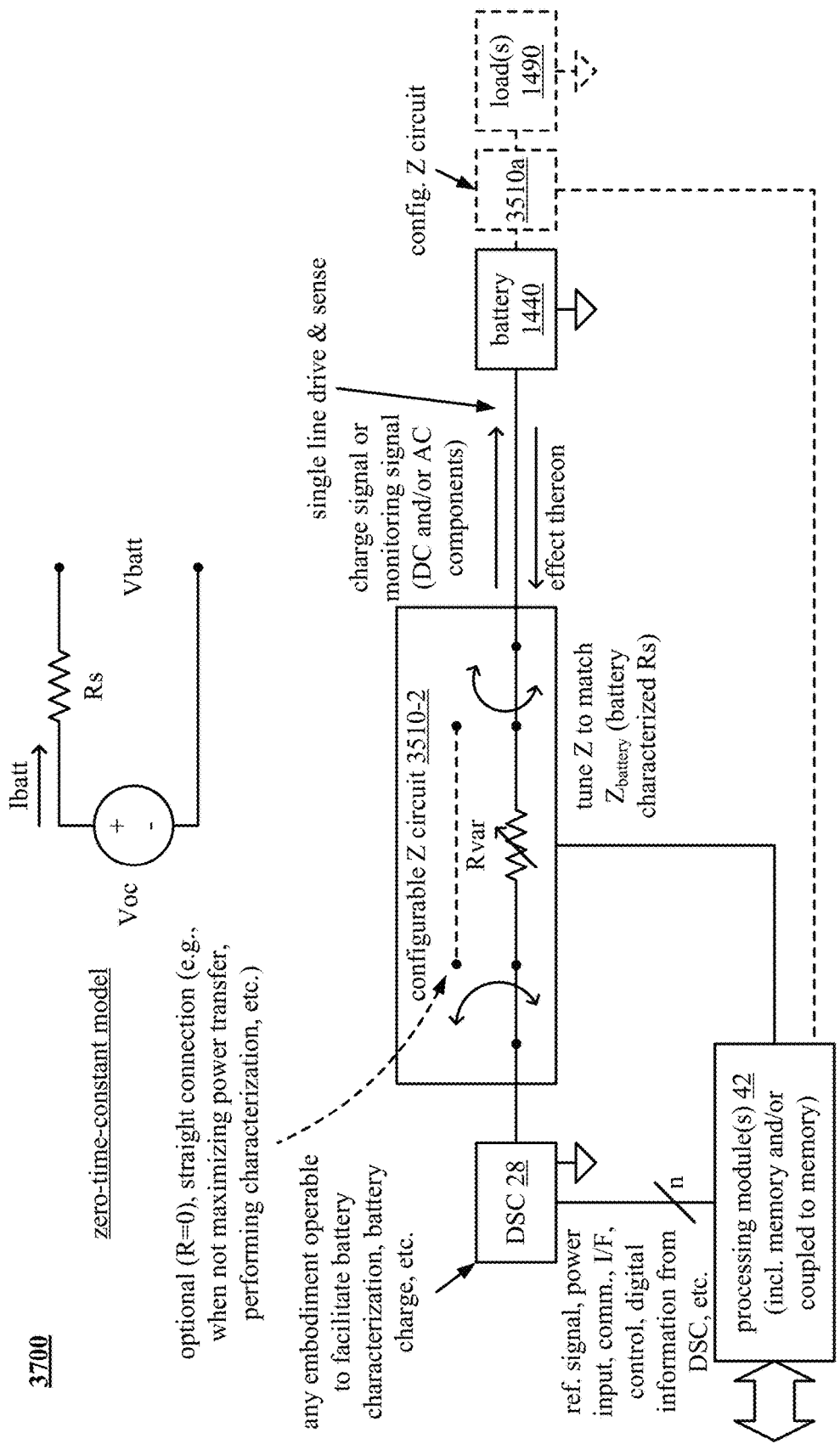
FIG. 37 is a schematic block diagram of another embodiment of a DSC that is interactive with a battery via a configurable impedance (Z) circuit in accordance with the present invention.

FIG. 37 is a schematic block diagram of another embodiment 3700 of a DSC that is interactive with a battery via a configurable impedance (Z) circuit in accordance with the present invention. This diagram shows another possible implementation of a configurable Z circa 3510-2. Also, in this diagram, a zero-time-constant model for the equivalent circuit of the battery is used as can be seen at the top of the diagram. As such, the impedance of the battery is characterized as having a purely resistive component. The configurable Z circuit 3510-2 in this diagram includes a variable resistor having a value that is selected or tuned by the one or more processing modules 42. Based on the desired operation of the DSC 28 when interacting with the battery 1440, the one or more processing modules 42 is configured to set or tune the appropriate impedance value of the variable resistor within the configurable Z circuit 3510-2.

In addition, note that an optional direct connection may be selected within the configurable Z circuit 3510-2 such as a connection having no impedance (e.g., R=0). This may be selected by the one or more processing modules 42 when not maximizing power transfer, performing characterization, etc.

Figure 38:
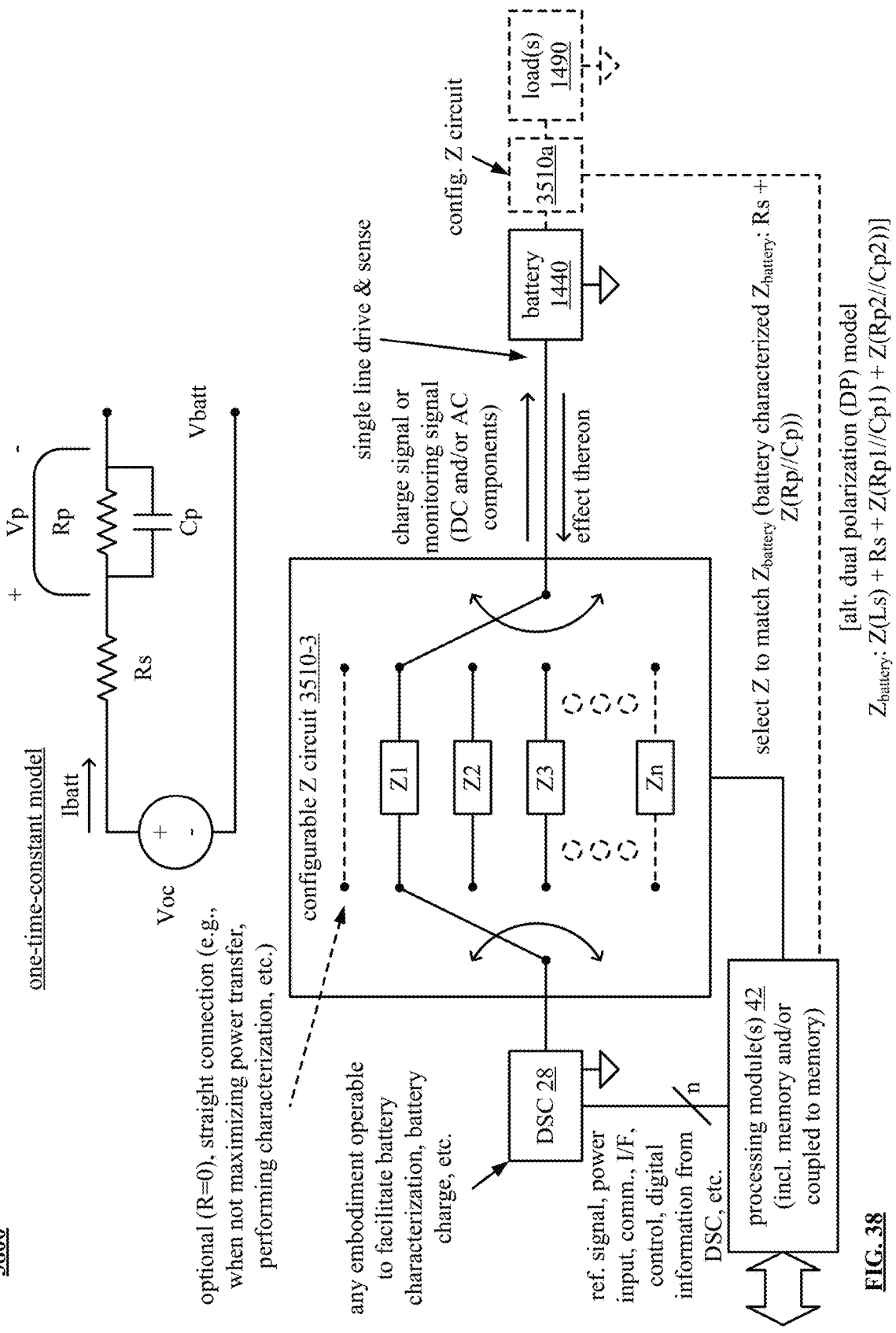
FIG. 38 is a schematic block diagram of another embodiment of a DSC that is interactive with a battery via a configurable impedance (Z) circuit in accordance with the present invention.

FIG. 38 is a schematic block diagram of another embodiment 3800 of a DSC that is interactive with a battery via a configurable impedance (Z) circuit in accordance with the present invention. This diagram shows yet another possible implementation of a configurable Z circuit 3510-1. In this diagram, a one-time-constant model for the equivalent circuit of the battery is used as can be seen at the top of the diagram. As such, the impedance of the battery is characterized as having both a resistive component and a reactance component.

The configurable Z circuit 3510-3 includes a number of different impedances that include both resistive and reactance components. Based on the desired operation of the DSC 28 when interacting with the battery 1440, the one or more processing modules 42 is configured to select the appropriate impedance value within the configurable Z circuit 3510-3. For example, the configurable Z circuit 3510-3 includes a number of different impedances that may be selected to be connected in line between the DSC 28 in the battery 1440 (e.g., Z1, Z2, and so on up to Zn, where n is some positive integer value).

In addition, note that an optional direct connection may be selected within the configurable Z circuit 3510-1 such as a connection having no impedance (e.g., R=0). This may be selected by the one or more processing modules 42 when not maximizing power transfer, performing characterization, etc.

Figure 39:
FIG. 39 is a schematic block diagram of an embodiment of various examples of impedance (Zs) such as may be implemented within a configurable impedance (Z) circuit in accordance with the present invention.

FIG. 39 is a schematic block diagram of an embodiment 3900 of various examples of impedance (Zs) such as may be implemented within a configurable impedance (Z) circuit in accordance with the present invention. This diagram shows a number of possible impedances that may be included within a configurable Z circuit. An impedance Z1 includes a single resistor such that the impedance is as follows: Z=R. An impedance Z2 includes a single inductor such that the impedance is as follows: $Z=j\omega L$. An impedance Z3 includes a single capacitor such that the impedance is as follows: $Z=-j(1/\omega C)$.

Note that when two impedances are in series with another, e.g., Z1 in series with Z2, then totally equivalent impedance is the sum of the two as follows: Ze=Z1+Z2.

However, when two impedances are in parallel with another, e.g., Z1 in parallel with Z2, then totally equivalent impedance is as follows: Ze=(Z1*Z2)/(Z1+Z2).

An impedance Z4 includes a resistor in series with an inductor such that the impedance is as follows: $Z=R+j\omega L$. An impedance Z5 includes a resistor in series with an capacitor such that the impedance is as follows: $Z=R-j(1/\omega C)$. An impedance Z6 includes an inductor in series with a capacitor such that the impedance is as follows: $Z=j\omega L-j(1/\omega C)$.

An impedance Z7 includes an inductor in parallel with a capacitor such that the impedance is as follows: $Z=R//j\omega L$, where // indicates parallel connectivity of the two components. An impedance Z8 includes a resistor in parallel with a capacitor such that the impedance is as follows: $Z=R//(-j(1/\omega C))$, where // indicates parallel connectivity of the two components. An impedance Z9 includes an inductor in parallel with a capacitor such that the impedance is as follows: $Z=j\omega L//(-j(1/\omega C))$, where // indicates parallel connectivity of the two components.

Generally speaking, an impedance Z10 such as may be included within a configurable Z circuit may include any other combination of R, L, C in series, parallel, etc. In addition, note that any one or more of the impedances within a given configurable Z circuit may include variability or adjustability (e.g., a variable/tunable capacitor, a variable/tunable inductor, a variable/tunable resistor, etc.).

Note that one or more processing modules may be configured to select an appropriate impedance value within a configurable Z circuit that is implemented in line between the DSC and the battery to facilitate the desired operation of the various components. Examples of some desired operations may include maximizing power transfer of a signal provided from the DSC to the battery or minimizing reflection of the signal provided from the DSC to the battery.

Figure 40:
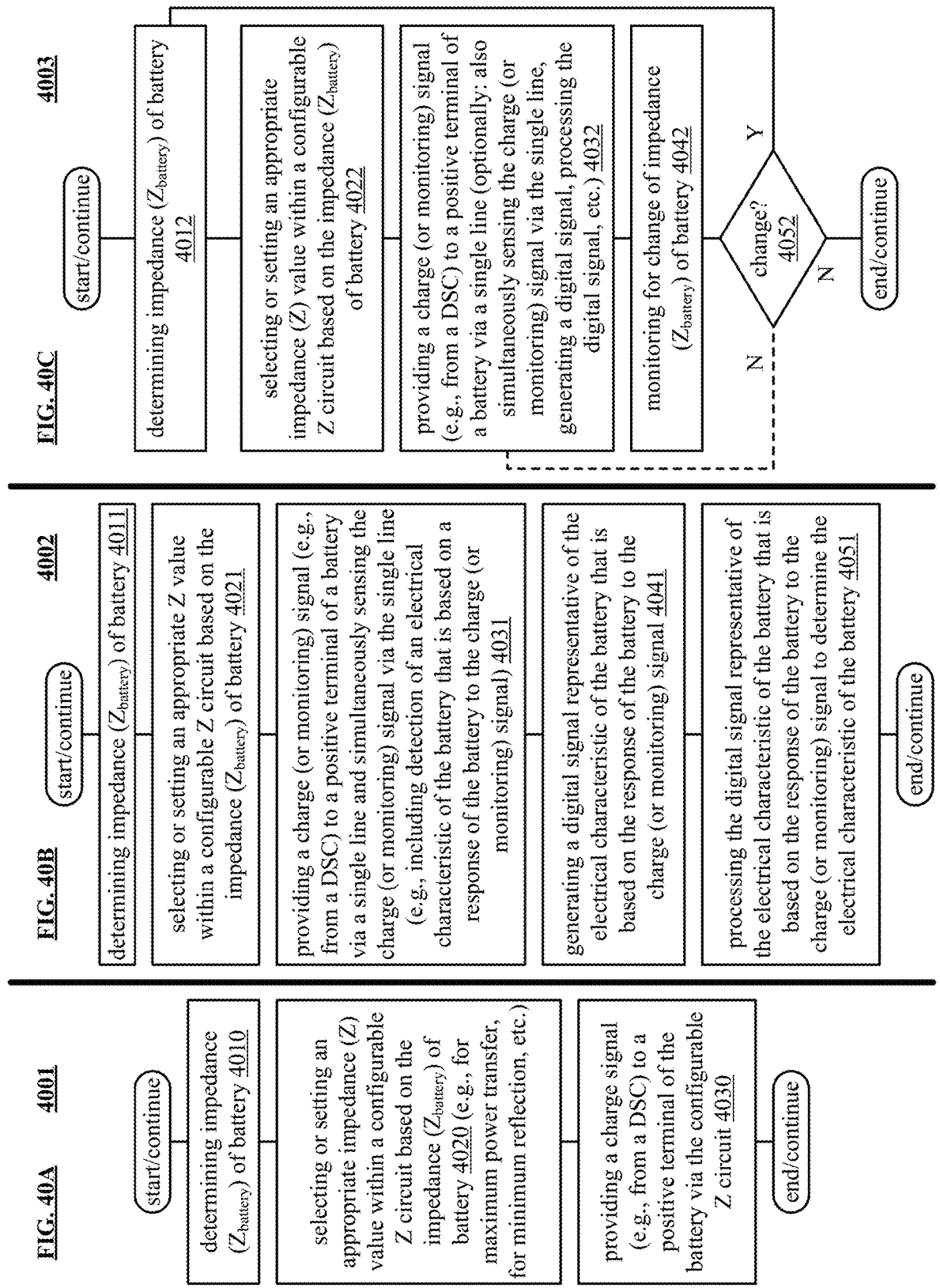
FIG. 40A is a schematic block diagram of another embodiment of a method for execution by one or more devices in accordance with the present invention.
FIG. 40B is a schematic block diagram of another embodiment of a method for execution by one or more devices in accordance with the present invention.
FIG. 40C is a schematic block diagram of another embodiment of a method for execution by one or more devices in accordance with the present invention.

FIG. 40A is a schematic block diagram of another embodiment of a method 4001 for execution by one or more devices in accordance with the present invention. The method 4001 operates in step 4010 by determining impedance ($Z_{battery}$) of a battery.

The method 4001 also operates in step 4020 by selecting or setting an appropriate impedance (Z) value within a configurable Z circuit based on the impedance ($Z_{battery}$) of the battery. Note that this selecting or setting may be made based on various considerations. In some examples, the selecting or setting is to facilitate maximum power transfer. In other examples, the selecting or setting is to facilitate for minimum reflection.

The method 4001 operates in step 4030 by providing a charge signal (e.g., from a DSC) to a terminal of the battery via the configurable Z circuit.

FIG. 40B is a schematic block diagram of another embodiment of a method 4002 for execution by one or more devices in accordance with the present invention. The method 4002 operates in step 4011 by determining impedance ($Z_{battery}$) of a battery.

The method 4002 also operates in step 4021 by selecting or setting an appropriate Z value within a configurable Z circuit based on the impedance ($Z_{battery}$) of the battery. Here as well, that this selecting or setting may be made based on various considerations. In some examples, the selecting or setting is to facilitate maximum power transfer. In other examples, the selecting or setting is to facilitate for minimum reflection.

The method 4002 operates in step 4031 by providing a charge (or monitoring) signal (e.g., from a DSC) to a terminal of a battery via a single line and simultaneously sensing the charge (or monitoring) signal via the single line (e.g., including detection of an electrical characteristic of the battery that is based on a response of the battery to the charge (or monitoring) signal).

The method 4002 also operates in step 4041 by generating a digital signal representative of the electrical characteristic of the battery that is based on the response of the battery to the charge (or monitoring) signal. The method 4002 operates in step 4051 by processing the digital signal representative of the electrical characteristic of the battery that is based on the response of the battery to the charge (or monitoring) signal to determine the electrical characteristic of the battery.

FIG. 40C is a schematic block diagram of another embodiment of a method 4003 for execution by one or more devices in accordance with the present invention. The method 4003 operates in step 4012 by determining impedance ($Z_{battery}$) of a battery.

The method 4003 also operates in step 4022 by selecting or setting an appropriate Z value within a configurable Z circuit based on the impedance ($Z_{battery}$) of the battery. Here as well, that this selecting or setting may be made based on various considerations (e.g., for maximum power transfer, for minimum reflection, etc.).

The method 4003 operates in step 4032 by providing a charge (or monitoring) signal (e.g., from a DSC) to a terminal of a battery via a single line. In some alternative variants of the method 4003, the method 4003 also operates by simultaneously sensing the charge (or monitoring) signal via the single line, generating a digital signal, processing the digital signal, etc. such as in accordance with the steps 4031, 4041, and 4051 of method 4002 of FIG. 40B.

The method 4003 also operates in step 4042 by monitoring for change of impedance ($Z_{battery}$) of battery. Such monitoring may be performed based on monitoring for a certain percentage change of the change of impedance ($Z_{battery}$) of battery (e.g., 1%, 2%, 5%, etc. or some other desired value in accordance with a particular application). Such monitoring may be performed based on monitoring of a change that affects or adversely affects the operation of providing a charge (or monitoring) signal (e.g., from a DSC) to a terminal of a battery via a single line.

Based on no detection of change of the impedance ($Z_{battery}$) of the battery in the step 4052, the method 4003 loops back to the step 4032. Alternatively, based on detection of change of impedance ($Z_{battery}$) of the battery in the step 4052, the method 4003 loops back to the step 4012 for determining impedance ($Z_{battery}$) of the battery (e.g., an updated impedance value ($Z_{battery}$) of the battery and continues operation based thereon.

Alternatively, based on no detection of change of the impedance ($Z_{battery}$) of the battery in the step 4052, the method 4003 ends.

Figure 41:
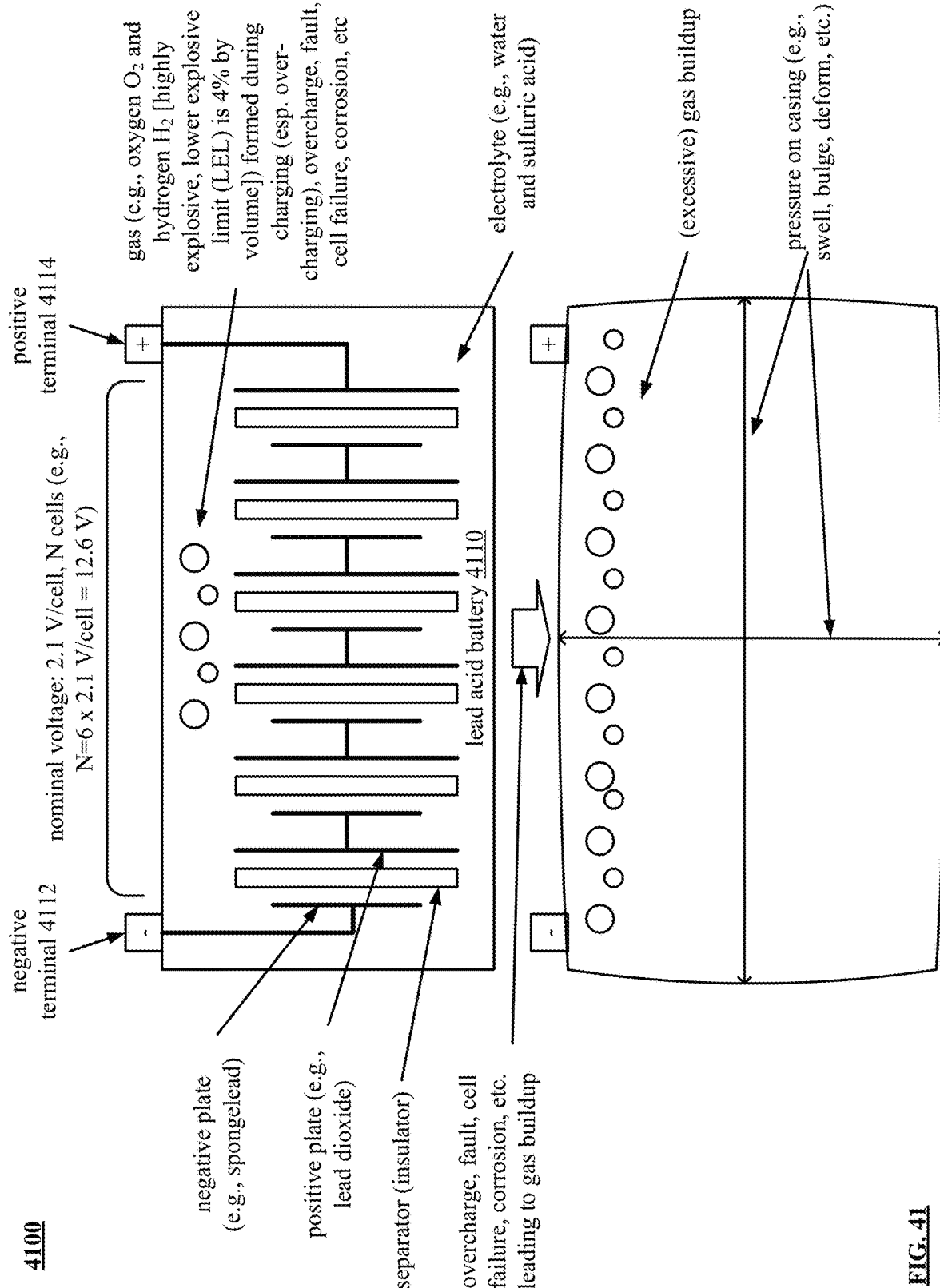
FIG. 41 is a schematic block diagram of an embodiment of a lead acid battery such as may be serviced using a DSC in accordance with the present invention.

FIG. 41 is a schematic block diagram of an embodiment 4100 of a lead acid battery such as may be serviced using a DSC in accordance with the present invention. Generally speaking, a lead acid battery 4110 includes a number of cells each having approximately a similar voltage per cell (e.g., often times cited as approximately 2.1 V per cell and including 6 respective cells providing a nominal voltage of 12.6 V). In some applications, 2 separate 6 V batteries are implemented within a given battery casing in series with one another to generate an output voltage of approximately 12 V. A nominal 6 V battery may be implemented using three separate single cells each of approximate 2.1 V per cell thereby providing an output voltage of approximately 6.3 V.

Each cell includes a respective negative plate (e.g., such as may be implemented using sponge lead, etc.) and a positive plate (e.g., lead dioxide, etc.). The lead acid battery 4110 also includes a negative terminal 4112 (e.g., anode) that is connected to a negative plate and a positive terminal 4114 (e.g., cathode) that is connected to a positive plate. Within each cell, the negative plate and the positive plate are separated by a separator or insulator. The respective cells are immersed within an electrolyte (e.g., often implemented using water and sulfuric acid).

During a charging cycle, or recharging process, battery charger is connected to the positive terminal 4114 and the negative terminal 4112. During this process, as electricity flows through the water portion of the electrolyte, some of the water is converted to its basic elements of hydrogen and oxygen thereby producing gas within the casing of the lead acid battery 4110. Gassing of a battery can be problematic for a number of reasons including the fact that these gases are extremely flammable. In addition, the gassing can reduce the amount of water content of the electrolyte and dry out the battery. Some types of lead acid batteries operate such that they are vented to allow these gases to escape, but sealed lead acid batteries do not perform any such bending and keep such gases trapped within the battery casing. Ideally and preferably, when the such gases are trapped within the battery casing, they will recombine into the electrolyte are at however, there can be some instances in which this does not occur such as based on the battery being overcharged, based on the battery including an internal electrical failure of fault, based on an electrical failure or fault within one or more of the cells, based on corrosion within the battery or on the respective battery terminals, based on buildup of lead sulfate on certain plates of the battery, etc. among other possible adverse conditions that can adversely affect the health of a lead acid battery 4110.

With respect to the seriousness of the gases produced within a lead acid battery 4110 in these circumstances, note that oxygen and hydrogen are highly flammable and can even be explosive in certain situations. For example, while hydrogen is not particularly toxic, at high concentrations it is a highly explosive gas having a lower explosive limit (LEL) concentration of approximately 4% by volume. Not only does the buildup of gas within a lead acid battery 4110 can adversely affect the operation of the lead acid battery 4110 (e.g., adversely affecting the electrolyte, drying out the battery by reducing the amount of water within the electrolyte, etc.), but the buildup of such gases can be a potentially dangerous situation.

Gas buildup within the battery casing can generate pressure on the battery casing. For example, this can cause the surface of the battery to swell, bulge, deform, etc. Based on the excess of gas buildup inside. In addition, some non-sealed lead acid batteries include one or more ports via which one or more of the respective cells may be accessed such as to check electrolyte levels, add electrolyte, add water, etc. In such non-sealed lead acid batteries, excessive gas buildup within the battery casing will sometimes affect such ports before affecting other portions of the battery casing in terms of swelling, bulging, deformation, etc.

Figure 42:
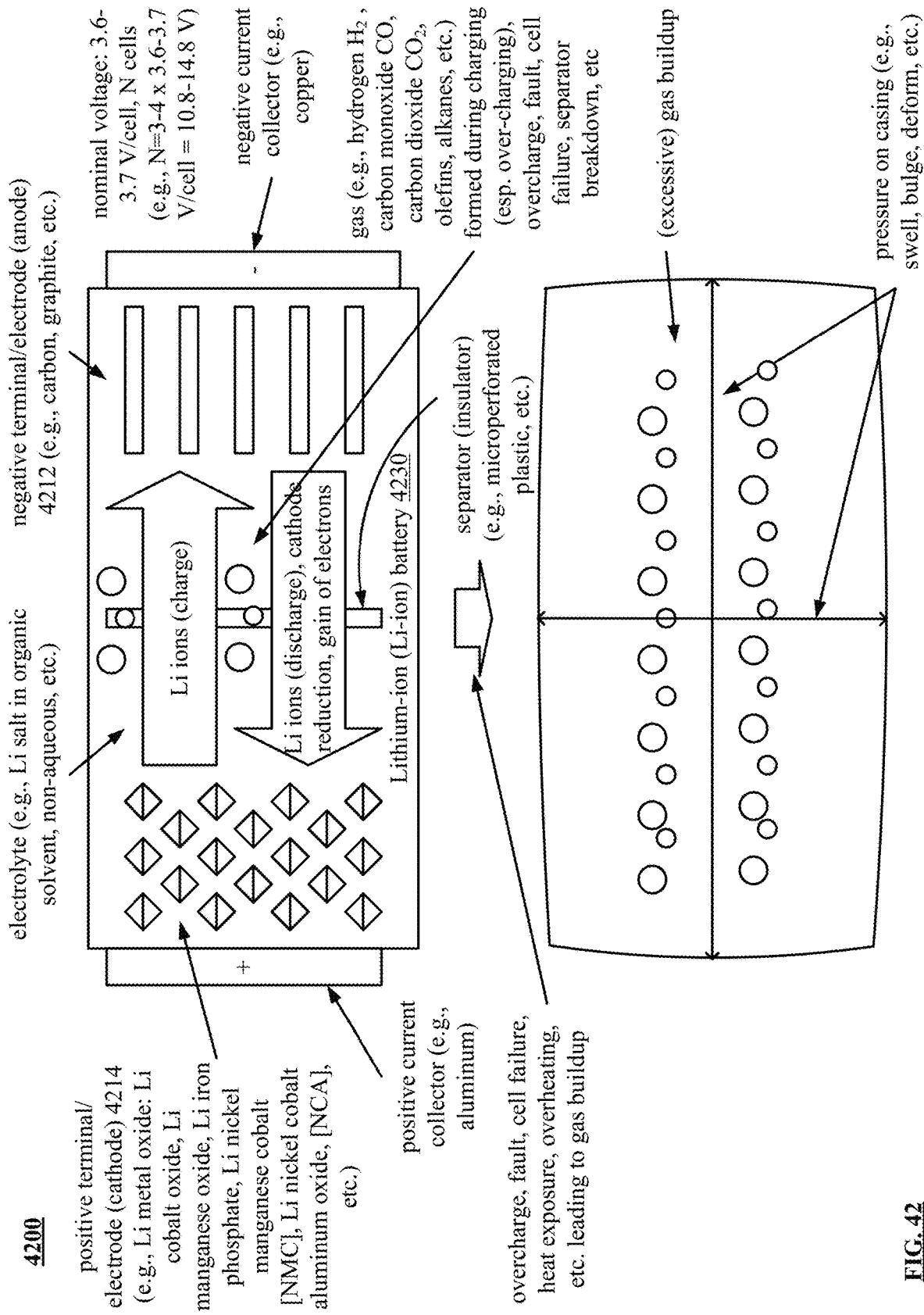
FIG. 42 is a schematic block diagram of an embodiment of a Lithium-ion battery such as may be serviced using a DSC in accordance with the present invention.

FIG. 42 is a schematic block diagram of an embodiment 4200 of a Lithium-ion battery such as may be serviced using a DSC in accordance with the present invention. Another type of battery is a Lithium-ion battery 4230, sometimes referred to as a Li-ion battery. Lithium-ion batteries are used in a variety of applications including portable and user devices such as laptop computers, cell phones, electronic pad devices, personal digital assistants, portable music devices, portable media players, etc. In addition, Lithium-ion batteries have found a great deal of acceptance and traction within electric vehicle applications. For example, Lithium-ion batteries are used in many plug-in hybrid and all-electric vehicles. With respect to an electric vehicle applications, some electric vehicles are powered by what are often referred to as wet Lithium ion batteries that use a liquid electrolytes. There has been significant interest in research efforts to develop Lithium-ion batteries that are implemented in solid-state such that they have cells that are made of solid and dry conductive material. Lithium-ion batteries have application to a wide variety of applications including power tools, electronics, electric vehicles, etc. among other possible applications.

Generally speaking, a Lithium-ion battery 4230 includes one or more cells each having approximately a similar voltage per cell (e.g., often times cited as approximately 3.6 to 3.7 V per cell). Considering one possible example, a Lithium-ion battery 4230 including 3-4 cells each having a nominal approximate voltage of 3.6 to 3.7 V per cell will be able to provide an output voltage within the range of 10.8-14.8 V.

This diagram shows a Lithium-ion battery 4230 that includes a positive current collector, such as made of aluminum, that is connected to a positive terminal/electrode 4214 (e.g., cathode). The positive terminal/electrode 4214 may be constructed of various materials such as Lithium metal oxide, Lithium cobalt oxide, Lithium manganese oxide, Lithium iron phosphate, Lithium nickel manganese cobalt (NMC), Lithium nickel cobalt aluminum oxide (NCA), etc., among other possible candidate materials. The Lithium ion battery 4230 also includes an negative current collector, such as made of copper, that is connected to a negative terminal/electrode 4212 (e.g., anode). The negative terminal/electrode 4212 may be constructed of various materials such as carbon, graphite, etc., among other possible candidate materials.

In addition, and electrolyte facilitates the transportation of Lithium-ion charge between the positive terminal/electrode 4214 in the negative terminal/electrode 4212. The electrolyte may be implemented as a variety of materials such as a Lithium salt in an organic solvent, a non-aqueducts material, etc., among other possible candidate materials. Often times a separator or insulator is implemented within the electrolyte. Such a separator or insulator may be constructed of various materials such as micro perforated plastic, among other possible candidate materials. Generally speaking, the separator or insulator operates to keep the positive terminal/electrode 4214 in the negative terminal/electrode 4212 separated while still facilitating the transportation of lithium ions between the positive terminal/electrode 4214 and the negative terminal/electrode 4212.

During the charging operation of the Lithium-ion battery 4230, Lithium ions are transported from the positive terminal/electrode 4214 to the negative terminal/electrode 4212. During discharge (e.g., such as during load servicing) of the Lithium-ion battery 4230, Lithium ions are transported in the opposite direction from the negative terminal/electrode 4212 to the positive terminal/electrode 4214.

Similar to the gas buildup situation that can occur within lead acid batteries, similar gassing problems may unfortunately occur within lithium ion batteries. For example, in some instances, Lithium-ion batteries have the ability to burst into flames. Generally speaking, the same problems of buildup of flammable or explosive gas that may unfortunately occur within lead acid batteries may unfortunately occur within Lithium-ion batteries and generally batteries of many or most types. Given the prevalence of Lithium-ion batteries in so many applications, even a very percentage of failure can be catastrophic in certain situations. For example, consider the number of products carried by passengers on commercial aircraft that include one or more lithium ion batteries. Even a very small percentage of failure of such batteries that may lead to a potentially hazardous condition or unfortunately a failure such as flaming, bursting into flames, exploding can be catastrophic.

Some examples of the types of gases that may unfortunately build up within a lithium ion battery may include any one or more of hydrogen, carbon monoxide, carbon dioxide, olefins, alkanes, etc., among other types of gases. Such gases may unfortunately be formed during charging, especially during overcharging, by a fault in the battery, cell failure, separator breakdown, overheating, over-use, abuse conditions, etc.

Within Lithium-ion batteries, similar to lead acid batteries, gas buildup within the battery casing can generate pressure on the battery casing. For example, this can cause the surface of the battery to swell, bulge, deform, etc. Various aspects, embodiments, and/or examples of the invention (and/or their equivalents) described herein provide various means to facilitate improvement of the operation of the battery, monitoring of the battery, determining the health of the battery, etc. including avoiding one or more unsafe conditions that may unfortunately occur with a battery such as flaming, bursting into flames, exploding, etc.

Figure 43:
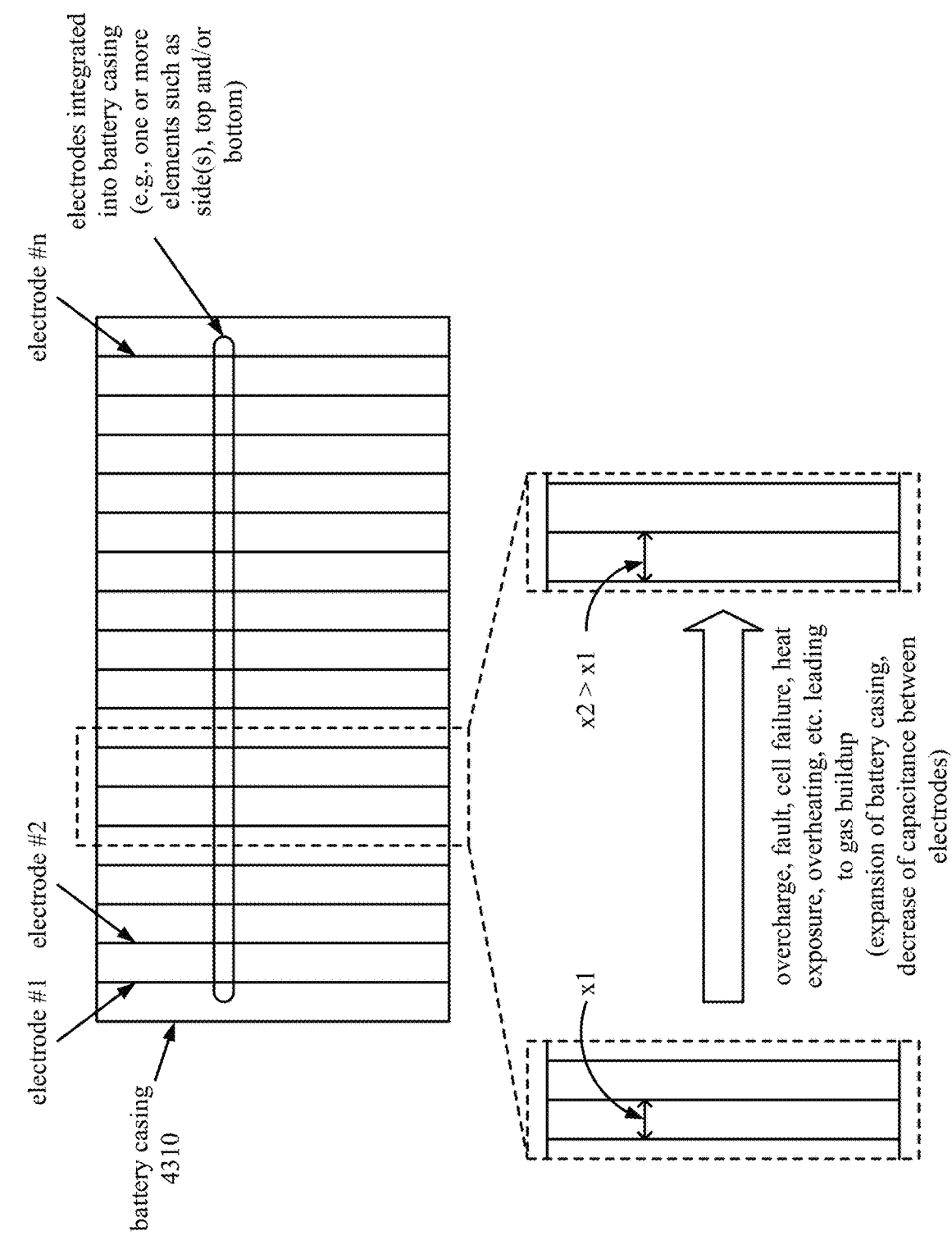
FIG. 43 is a schematic block diagram of an embodiment of integrated electrodes within a battery casing for use in battery monitoring and characterization in accordance with the present invention.

FIG. 43 is a schematic block diagram of an embodiment 4300 of integrated electrodes within a battery casing for use in battery monitoring and characterization in accordance with the present invention. This diagram shows multiple electrodes (e.g., electrode 1, 2, up to n, where n is any desired positive integer greater than or equal to 2) that are integrated into the battery casing 4310. For example, considering a lead acid battery, the electrodes are integrated into the battery casing 4310 during its construction. The electrodes are implemented in such a way as not to interfere with the operation of the battery. For example, electrodes are implemented in the battery casing 4310 such that they are electrically isolated from the operative and functional components of the lead acid battery such as the terminals, the plates of the respective cells, the electrolyte, etc. The electrodes are particularly implemented within one or more portions or regions of the battery casing 4310 having at least one surface that would be affected by expansion or contraction of the surface of battery (e.g., such as in the instance of undesirable gas building up within the lead acid battery). In some particular applications, electrodes are integrated into those portions of the battery casing 4310 are potentially most susceptible to expansion or contraction of the surface, such as with respect to one or more ports via which one or more of the respective cells may be accessed such as to check electrolyte levels, add electrolyte, add water, etc.

For another example, considering a Lithium-ion battery, the electrodes are integrated into the battery casing 4310 of such a Lithium-ion battery. Lithium-ion batteries may be constructed in a variety of shapes including cylindrical, button or coin cells (e.g., such as may be used within cordless telephones, medical devices, etc. and that may be stacked one on top of another to provide higher voltages, having sizes that may be within the range of 10-20 mm in diameter and 50-80 mm in length), prismatic (e.g., generally rectangular in shape and relatively thin, such as are often used in personal and portable devices such as cell phones, personal digital assistants, etc.), pouch, etc.

In the event when gas builds up within the battery, the battery casing 4310 will experience some swelling, bulging, expansion, etc. Different types of battery casing 4310 will exhibit different characteristics in terms of expansion due to gas build up therein. For example, a cylindrical cell provides very good mechanical stability and can withstand higher internal pressures without deforming than a pouch cell (or a prismatic cell) based on being is constructed of and including relatively more flexible material than a cylindrical cell.

Considering one example of a prismatic cell (e.g., as including a 5 mm cell), based on due to gas buildup therein, the battery casing 4310 of such a prismatic cell may expand to as much as 8-10 mm. Such as for any of a number of reasons including having undergone a number of charge-discharge cycles (e.g., 500-700 charge-discharge cycles), overcharge, age, etc.

As can be seen at the bottom of the diagram, based on an effect causing an expansion of the battery casing 4310 itself, the distance between two electrodes will change (e.g., the distance between the electrodes will increase due to swelling, expansion, bulging, of the battery casing 4310. Conversely, when the condition has subsided and the battery casing 4310 returns to its original shape, the distance between two electrodes will decrease (e.g., back to the original distance by which the electrodes were spaced).

For example, consider any of a variety of conditions that may result in gas build up within the battery (e.g., overcharge, fall, cell failure, heat exposure, overheating, etc.), Then expansion of the battery casing 4310 will increase the distance between electrodes and thereby decrease the capacitance between those electrodes. For example, consider two conductive electrodes that are separated by some distance, then the capacitance between the two electrodes varies inversely with respect to the separation between the two electrodes.

Consider a capacitor with air as the dielectric between the two electrodes or plates, then $$C = Q/V = \varepsilon_o(A/d)$$

where C is the capacitance in Farads, Q is the charge in Coulombs, and V is the voltage in volts. The value $\varepsilon_o$ is the permittivity of air (e.g., $8.84 \times 10^{-12}$ F/m), the dielectric material between the electrodes or plates of the capacitor in this instance, A is the area of the electrodes or plates (e.g., in square meters), and d is the distance of separation between the two electrodes or plates in meters.

Consider alternatively capacitor with a solid material as the dielectric between the electrodes or plates $$C = Q/V = \varepsilon_o \varepsilon_r(A/d)$$

Where $\varepsilon_r$ is the permittivity of the dielectric material between the electrodes or plates.

Therefore, as the distance between the electrodes that are integrated within the battery casing 4310 increases, such as due to swelling, bulging, expansion, etc., then the capacitance between the electrodes decreases. Conversely, as the distance between the electrodes within the battery casing 4310 decreases, the capacitance between the electrodes increases. Note that while many of the examples provided herein are directed towards detecting change of capacitance between electrodes that are implemented within the battery casing 4310, note that change of impedance between electrodes may also occur such that that change is not purely capacitive in nature. A similar architecture and implementation as described herein will also build the detect generally any change of impedance between electrodes.

For example, consider the bottom of the diagram that the distance between two electrodes is x1, then based on an expansion of the battery casing 4310, then the distance between those two electrodes will increase to x2, which is greater than x1.

Figure 44:
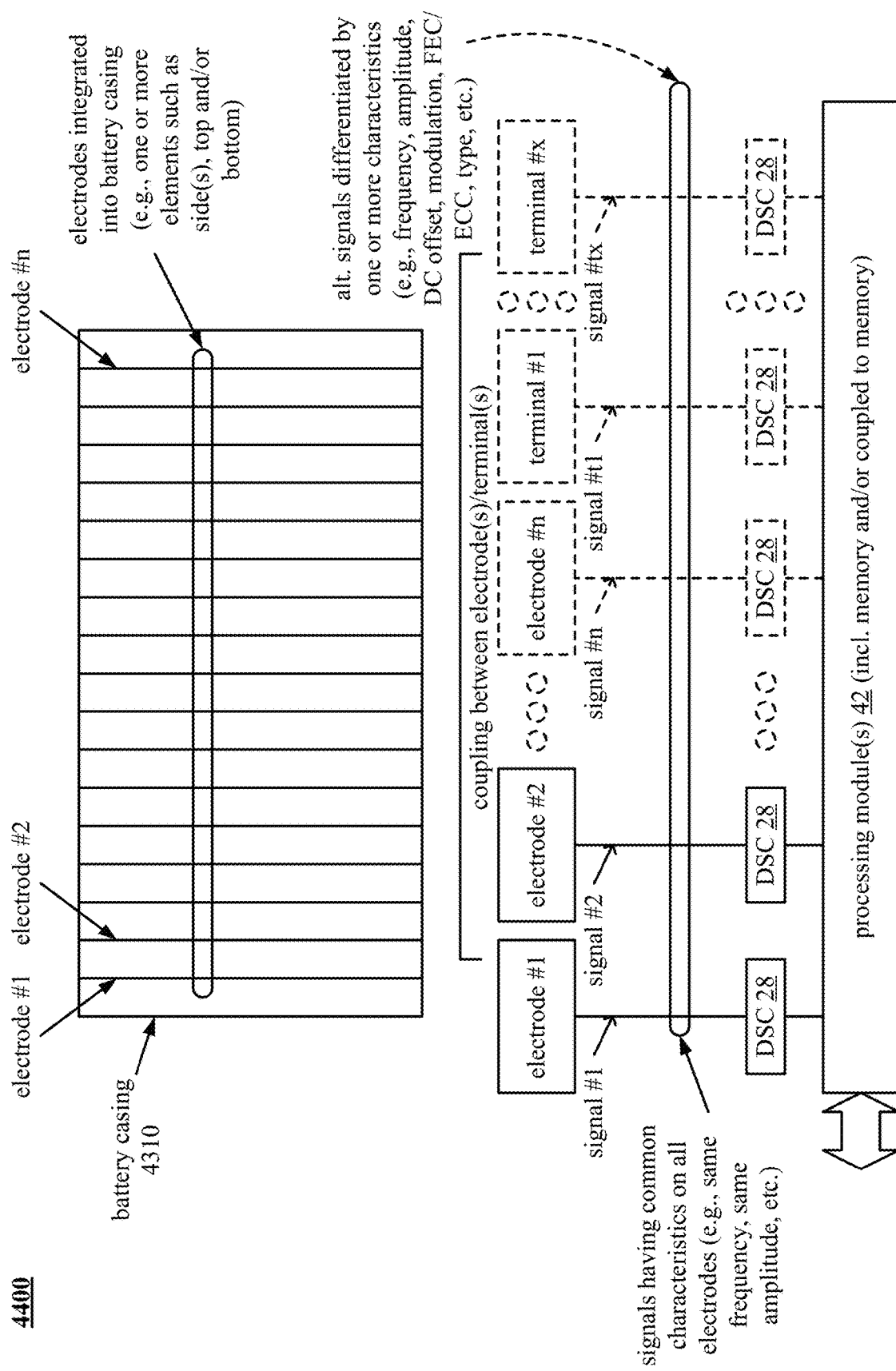
FIG. 44 is a schematic block diagram of an embodiment of integrated electrodes within a battery casing for use in battery monitoring and characterization in conjunction with DSCs in accordance with the present invention.

FIG. 44 is a schematic block diagram of an embodiment 4400 of integrated electrodes within a battery casing for use in battery monitoring and characterization in conjunction with DSCs in accordance with the present invention. The top of the diagram shows a battery casing 4310 with multiple electrodes implemented and integrated therein. At the bottom of the diagram, one or more processing modules 42 is coupled to respective DSCs 28 that are connected to the respective electrodes. Any of a number of interfaces may be provided between the electrodes and the one or more processing modules 42. For example, one implementation may include a connector that is integrated into the battery casing 4310 having multiple contacts that each respectively connect to the electrodes such that connection to the connector facilitates connection of multiple DSCs 28 to the multiple respective electrodes. In another example, each of the respective DSCs 28 is connected to a respective one of the electrodes directly. Any of a variety of means may be incremented to facilitate the connection between the DSCs 28 and the electrodes integrated within the battery casing 4310.

Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In an example of operation and implementation, the one or more processing modules 42 is configured to provide respective reference signals to the DSCs 28 to facilitate their respective driving and sensing of signals via the respective electrodes. For example, a first DSC 28 is configured to receive a first reference signal from the one or more processing modules 42 and is configured to generate a first signal that is transmitted via a first electrode (electrode 1) and simultaneously to sense that signal via the first electrode. A second DSC 28 is configured to receive a second reference signal from the one or more processing modules 42 and is configured to generate a second signal that is transmitted via a second electrode (electrode 2) and simultaneously to sense that signal via the second electrode.

In some examples, signals having common characteristics are provided from each of the respective DSCs 28 to the respective electrodes. For example, each of the respective signals may have common characteristics such as the same frequency, same amplitude, same waveform, etc. among other signal properties and characteristics. Alternatively, in other examples, the different respective signals are differentiated by one or more properties and characteristics. For example, each respective signal provided from the respective DSCs may be of different frequency, amplitude, DC offset, modulation, forward error correction (FEC)/error checking and correction (ECC) type, type, waveform shape, phase, etc. among other signal properties and characteristics by which signals may be differentiated. In examples in which signals are differentiated, and based on coupling of signals between electrodes via capacitive coupling, straightforward identification of which electrode and which electrodes signal is being coupled may be made based on the differentiation of the signals. For example, a first DSC 28 that simultaneously transmits and senses a first signal via electrode 1 may detect a second signal that is coupled into electrode 1, and when that second signal is identified as being associated with electrode 2 (or another electrode), then determination may be made with respect to not only any change in capacitance between the electrodes 1 and 2, but also further granularity based on specifically which signal is being coupled into electrode 1 may be made.

In addition, in this diagram as well as others, note that one or more DSCs 28 may be interactive with the one or more processing modules 42 to provide one or more additional signals (e.g., shown as signal t1 through tx) to one or more terminals of the battery (e.g., shown as terminal 1 through terminal x). Note also that a similar configuration may be provided to a ground terminal of the battery. For example, with respect to the signaling provided from one or more DSCs 28 that are interactive with the one or more processing modules 42, signals provided via the electrodes may be sensed via one or more terminals of battery, and vice versa. In an example of operation and implementation, with respect to detecting signals, the signal t1 that is provided to the terminal 1 may be detected via coupling between the terminal 1 and one or more of the electrodes 1-*n*. For example, considering the construction of various types of batteries, providing a signal to a positive and/or negative terminal of the battery can provide a signal coupled from one or more internal components of the battery associated with the positive and/or negative terminal of the battery and the electrodes, and vice versa. This can provide another level of granularity in monitoring the health of the battery including changes in capacitance between the electrodes and the one or more terminals of the battery and/or one or more internal components of the battery associated with the one or more terminals of the battery.

For example, as distance between any two respective electrodes changes (e.g., such as based on gassing or gas build up within the battery thereby causing swelling, bulging, etc. of the battery casing 4310), then the capacitance between them will change. As the distance between two electrodes increases, the capacitance between them decreases. Conversely, as the distance between two electrodes decreases, the capacitance between them increases. Similarly, in accordance with such deleteriously effects (e.g., such as based on gassing or gas build up within the battery thereby causing swelling, bulging, etc. of the battery casing 4310), then distance between one or more of the electrodes implemented in the battery casing 4310 and the one or more terminals of the battery and/or one or more internal components of the battery associated with the one or more terminals of the battery will also change. Conversely, as the distance between such components decreases, the capacitance between them increases.

In an example of operation and implementation, one or more signals may be provided, via one or more DSCs via one or more of the one or more terminals of the battery and/or one or more electrodes in the battery casing 4310, and detection of those one or more signals may be performed using one or more of the DSCs 28 that service the one or more terminals of the battery and/or one or more electrodes in the battery casing 4310. In one specific example, a singular signal is provided via one DSC 28 to one electrode (e.g., electrode 1), and then that one DSC 28 is configured to drive that signal and simultaneously detect/sense that signal while each of the other respective DSCs 28 are also configured to detect that signal as it is coupled from one electrode (e.g., electrode 1) to the component being serviced by that DSC 28 (e.g., another electrode, such as electrode 2, or a terminal of the battery, such as terminal 1). For example, consider a signal that is provided via one DSC 28 to one electrode (e.g., electrode 1), then that one DSC 28 is configured to drive that signal and simultaneously detect/sense that signal while another DSC 28 also configured to detect that signal as it is coupled from that one electrode (e.g., electrode 1) to another electrode (e.g., electrode 2) and/or even another DSC 28 also configured to detect that signal as it is coupled from that one electrode (e.g., electrode 1) to a terminal of the battery (e.g., terminal 1). Note also that such functionality may alternatively be performed such that a signal is provided via one DSC 28 to one terminal of the battery (e.g., terminal 1), and then that one DSC 28 is configured to drive that signal and simultaneously detect/sense that signal while each of the other respective DSCs 28 are also configured to detect that signal as it is coupled from that terminal of the battery (e.g., terminal 1) to the component being serviced by that DSC 28 (e.g., an electrode, such as electrode 1 or 2, or another terminal of the battery, such as terminal x).

In another example of operation and implementation of two adjacently implemented electrodes, each of the DSCs 28 that are in communication with two adjacently implemented electrodes will be able to detect, via capacitive coupling between them, changes of the capacitance caused by change in the distance between those two electrodes.

For example, based on a change in the capacitance between electrodes based on a change in the distance between the electrodes, the signal transmitted via a given electrode will change in response to that change of capacitance. In addition, having knowledge of the construction of the electrodes within the battery casing and their arrangement and spacing, and having a baseline of the capacitance between the electrodes based on that arrangement and spacing, then based on a change of capacitance between the electrodes, an estimation of a change of the distance between those electrodes may also be estimated.

One or more threshold may be used by the one or more processing modules 42 to determine whether or not any detected change of capacitance between two electrodes based on expansion between them poses a problem. For example, a change of capacitance corresponding to a change of distance between two electrodes less than or equal to a threshold of 5% change based the original distance between the electrodes may be determined not to be a problem in some examples. In others, a threshold of 10% change based on the original distance may be used. Generally speaking, any desired threshold may be used to make determination of whether or not change of distance between two electrodes is problematic. Note that different respective ranges may also be used. For example, any change below a threshold of a first value (e.g., X %) may be determined not to be problematic, while any change above that first value and lower than or equal to a second value (e.g., Y % of the original distance) may be associated with a potential problem, while a change above the second value may be associated with an actual problem.

Once a determination is made regarding a problem or a potential problem (e.g., such as associated with swelling, bulging, gas build up, etc.), the one or more processing modules 42 is configured to take one or more actions. Consider an example that the battery is undergoing charging. Based on the battery undergoing charging, and based on the one or more processing modules interpreting signals provided from at least some of the DSCs 28 to determine the existence of a problem with the battery based on a change of capacitance the one or more processing modules 42 is configured to cease charging of the battery based on detection of a problem (e.g., such as associated with swelling, bulging, gas build up, etc.). For another example, when the battery is servicing one or more loads and not undergoing charging, the one or more processing modules 42 is configured to provide an error signal (e.g., such as via a user interface, via a display or indicator of a device in which the battery is implemented, etc.) such as to indicate to a user the existence of the problem to facilitate the user taking action to remedy or mitigate the problem.

For example, consider the one or more processing modules 42 also processing information regarding the ambient temperature of the environment in which a device in which the battery is implemented being of a high-value (e.g., about 90° F.), of the pressure or humidity of the environment being such as to affect adversely the operation of the battery or a device in which the battery is implemented (e.g., relatively high humidity such as above 70%, very low pressure such as 980 mbar, or approximately 29 inches of mercury such as corresponding to an adverse weather event such as a hurricane, etc.), then the one or more processing modules 42 is configured to provide not only an error signal such as to indicate to a user the existence of the problem to facilitate the user taking action to remedy or mitigate the problem but also to provide information regarding the one or more other factors (e.g., environment being of a very high temperature). Based on this, a user may relocate the battery or a device in which the battery is implemented to another appropriate environments (e.g., take the battery or the device in which the battery is implemented into an air-conditioned building). Alternatively, the user may choose to power down the device given that the environmental conditions are unsuitable for ineffective battery and/or device operation.

In another example, when the battery is servicing one or more loads and not undergoing charging, the one or more processing modules 42 is configured to make or facilitate one or more operational changes to remedy or mitigate the problem (e.g., shut down one or more processes or operations of a device in which the battery is implemented, operate one or more processes or operations of the device in which the battery is implemented in any lower power or power savings mode, etc.).

In addition, when the one or more processing modules 42 also processes other information such as described above regarding the environment in which the battery or a device that includes the battery is implemented, the one or more processing modules 42 may direct modification of one or more environmental control systems (e.g., heating, ventilation, air conditioning (HVAC), etc.) to modify the environment in which the battery or the device that includes a battery is implemented to be changed. For example, consider that the temperature of the room in which the battery or the device that includes the battery is too high (e.g., above some threshold temperature), then the one or more processing modules 42 is configured to facilitate cooling of the room by turning on air conditioning within that realm to reestablish the room temperature to be within an acceptable range for operation of the battery or the device includes the battery.

Generally speaking, the one or more processing modules 42 is configured to facilitate one or more operations to modify the operation of the battery in an effort to stop the production of gas inside of the battery (e.g., by taking action regarding one or more operations associated with production of gas, such as overcharging, etc.), to modify the environment in which the battery or a device includes a battery is located, etc.

Figure 45:
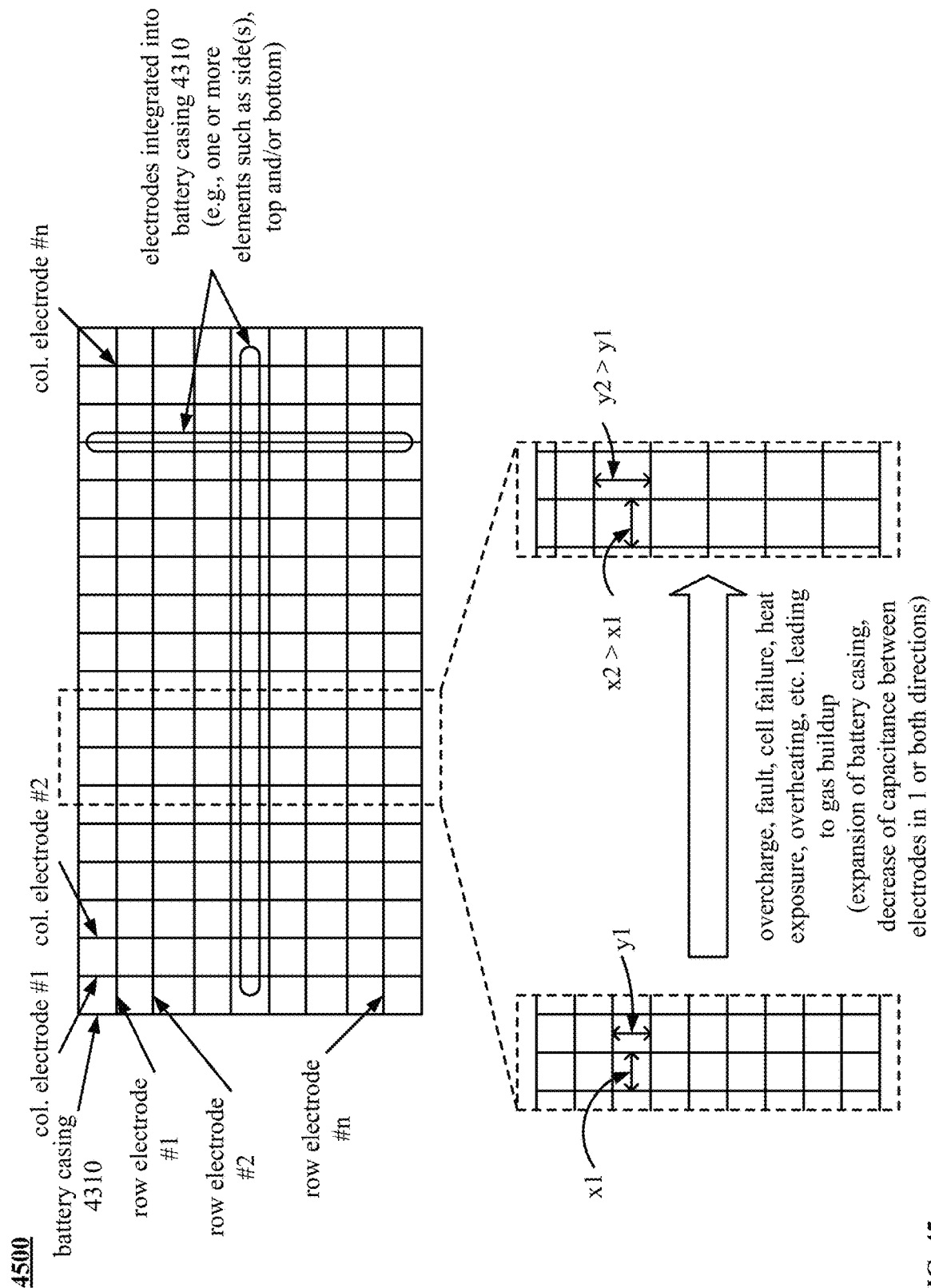
FIG. 45 is a schematic block diagram of another embodiment of integrated electrodes within a battery casing for use in battery monitoring and characterization in accordance with the present invention.

FIG. 45 is a schematic block diagram of another embodiment 4500 of integrated electrodes within a battery casing for use in battery monitoring and characterization in accordance with the present invention. This diagram is similar to FIG. 43 with at least one difference being that electrodes are integrated into the battery casing 4310 in more than one direction. For example, the electrode pattern within the battery casing 4310 includes multiple row electrodes (e.g., row electrode 1 through n, where n is some desired positive integer greater than or equal to 2) and multiple column electrodes (e.g., col. electrode 1 through m, where m is some desired positive integer greater than or equal to 2). Note that the row and column electrodes may be electrically isolated from one another such that there is not direct contact between them.

As can be seen at the bottom of the diagram, based on a change of distance between two adjacent row electrodes and/or two adjacent column electrodes, such as based on swelling, bulging, gas build up, etc. within the battery, the distance between two adjacent row electrodes and/or two adjacent column electrodes, respectively, will increase, thereby changing the capacitance between the two adjacent row electrodes and/or two adjacent column electrodes. This diagram presents another possible implementation by which electrodes may be implemented within a battery casing 4310. For example, at the bottom of the diagram, consider the distance between two column electrodes to be x1 and the distance between two row electrodes to be y1, then based on an expansion of the battery casing 4310, then the distance between two column electrodes will increase to be x2, which is greater than x1, and/or the distance between two row electrodes will increase to be y2, which is greater than y1. The distance between two column electrodes and/or two row electrodes will increase in such an example, the capacitance between the two column electrodes and/or two row electrodes will thereby decrease.

Figure 46:
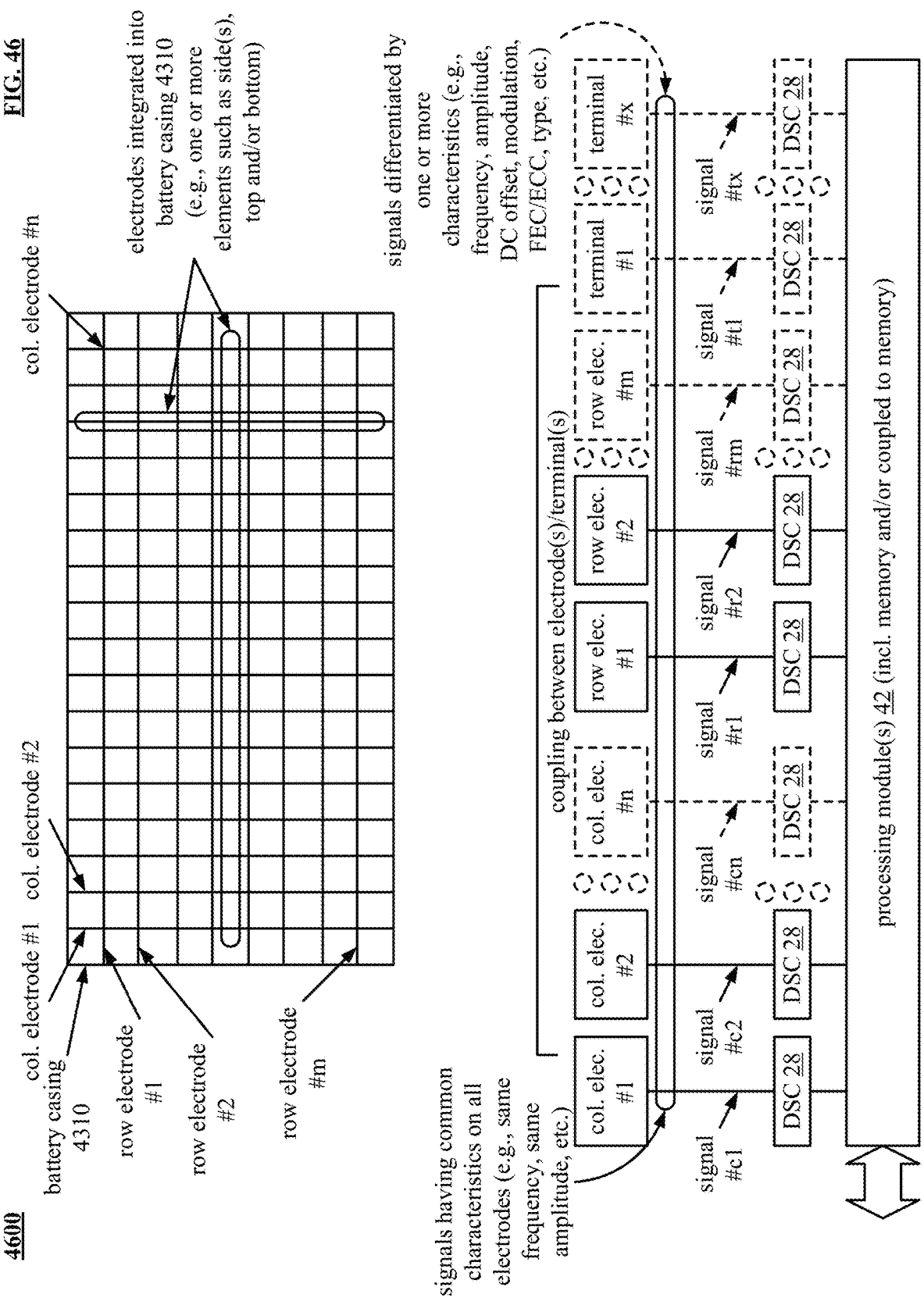
FIG. 46 is a schematic block diagram of another embodiment of integrated electrodes within a battery casing for use in battery monitoring and characterization in conjunction with DSCs in accordance with the present invention.

FIG. 46 is a schematic block diagram of another embodiment 4600 of integrated electrodes within a battery casing for use in battery monitoring and characterization in conjunction with DSCs in accordance with the present invention.

The top of the diagram shows a battery casing 4310 with multiple electrodes implemented and integrated therein. this implementation and architecture is similar to that shown in FIG. 45. At the bottom of the diagram, one or more processing modules 42 is coupled to respective DSCs 28 that are connected to the respective electrodes. Similar to other examples herein, any of a number of interfaces may be provided between the electrodes and the one or more processing modules 42 (e.g., including those described above FIG. 44 above).

Note that the one or more processing modules 42 may include integrated memory and/or be coupled to other memory. At least some of the memory stores operational instructions to be executed by the one or more processing modules 42. In addition, note that the one or more processing modules 42 may interface with one or more other devices, components, elements, etc. via one or more communication links, networks, communication pathways, channels, etc.

In an example of operation and implementation, the one or more processing modules 42 is configured to provide respective reference signals to the DSCs 28 to facilitate their respective driving and sensing of signals via the respective electrodes. For example, the DSCs 28 may be viewed as being grouped into a first subset of DSCs 28 implemented to service column electrodes and a second subset of DSCs 28 implemented to service row electrodes.

A first DSC 28 (e.g., of the first subset of DSCs 28) is configured to receive a first column reference signal from the one or more processing modules 42 and is configured to generate a first column signal (e.g., signal c1) that is transmitted via a first column electrode (col. electrode 1) and simultaneously to sense that first column signal (e.g., signal c1) via the first column electrode. A second DSC 28 (e.g., of the first subset of DSCs 28) is configured to receive a second column reference signal from the one or more processing modules 42 and is configured to generate a second column signal (e.g., signal c2) that is transmitted via a second column electrode (col. electrode 2) and simultaneously to sense that second column signal (e.g., signal c2) via the second column electrode. Such operations are similarly performed for any additional DSCs and column electrode (e.g., up to signal cn associated with col. electrode n, where n is a positive integer).

Similarly, a third DSC 28 (e.g., of the second subset of DSCs 28) is configured to receive a first row reference signal from the one or more processing modules 42 and is configured to generate a first row signal (e.g., signal r1) that is transmitted via a first row electrode (row electrode 1) and simultaneously to sense that first row signal (e.g., signal r1) via the first row electrode. A fourth DSC 28 (e.g., of the second subset of DSCs 28) is configured to receive a second row reference signal from the one or more processing modules 42 and is configured to generate a second row signal (e.g., signal r2) that is transmitted via a second row electrode (row electrode 2) and simultaneously to sense that second row signal (e.g., signal r2) via the second row electrode. Such operations are similarly performed for any additional DSCs and row electrode (e.g., up to signal rm associated with row electrode m, where m is a positive integer).

Similar with respect to other examples, in some examples, signals having common characteristics are provided from each of the respective DSCs 28 to the respective electrodes. For example, each of the respective signals may have common characteristics such as the same frequency, same amplitude, same waveform, etc. among other signal properties and characteristics.

Alternatively, in other examples, the different respective signals are differentiated by one or more properties and characteristics. For example, each respective signal provided from the respective DSCs may be of different frequency, amplitude, DC offset, modulation, forward error correction (FEC)/error checking and correction (ECC) type, type, waveform shape, phase, etc. among other signal properties and characteristics by which signals may be differentiated. In examples in which signals are differentiated, and based on coupling of signals between electrodes via capacitive coupling, straightforward identification of which electrode and which electrodes signal is being coupled may be made based on the differentiation of the signals. For example, a first DSC 28 that simultaneously transmits and senses a first signal via column electrode 1 may detect a second signal that is coupled into column electrode 1, and when that second signal is identified as being associated with column electrode 2 (or another electrode such as row electrode 1, row electrode 2, etc.), then determination may be made with respect to not only any change in capacitance between the column electrodes 1 and 2, but also further granularity based on specifically which signal is being coupled into column electrode 1 may be made.

As distance between any two respective electrodes changes in one or both directions (e.g., such as based on gassing or gas build up within the battery thereby causing swelling, bulging, etc. of the battery casing 4310), then the capacitance between them will change. As the distance between two electrodes increases in one or both, the capacitance between them decreases. Conversely, as the distance between two electrodes decreases in one or both, the capacitance between them increases.

Each of the DSCs 28 that are in communication with two adjacently implemented column electrodes will be able to detect, via capacitive coupling between them, changes of the capacitance caused by change in the distance between those two column electrodes. For example, each of the DSCs 28 that are in communication with two adjacently implemented row electrodes will be able to detect, via capacitive coupling between them, changes of the capacitance caused by change in the distance between those two row electrodes For example, based on a change in the capacitance between column (or row) electrodes based on a change in the distance between the electrodes, the signal transmitted via a given electrode will change in response to that change of capacitance. In addition, having knowledge of the construction of the electrodes within the battery casing in such a row and column implementation and their arrangement and spacing, and having a baseline of the capacitance between the column and row electrodes, respectively, based on that arrangement and spacing, then based on a change of capacitance between the column (or row) electrodes, an estimation of a change of the distance between those column (or row) electrodes may also be estimated.

Also, one or more threshold may be used by the one or more processing modules 42 to determine whether or not any detected change of capacitance between two electrodes based on expansion between them poses a problem. For example, a change of capacitance corresponding to a change of distance between two column (and/or row) electrodes less than or equal to a threshold of 5% change based the original distance between the electrodes may be determined not to be a problem in some examples. In others, a threshold of 10% change based on the original distance may be used. Generally speaking, any desired threshold may be used to make determination of whether or not change of distance between two column (and/or row) electrodes is problematic. Note that different respective ranges may also be used. For example, any change below a threshold of a first value (e.g., X %) may be determined not to be problematic, while any change above that first value and lower than or equal to a second value (e.g., Y % of the original distance) may be associated with a potential problem, while a change above the second value may be associated with an actual problem.

Once a determination is made regarding a problem or a potential problem (e.g., such as associated with swelling, bulging, gas build up, etc.), the one or more processing modules 42 is configured to take one or more actions including any of those described above such as based on determination of a problem with the battery during charging, cease charging of the battery; alternatively, based on determination of a problem with the battery during non-charging, provide an error signal to facilitate the user taking action to remedy or mitigate the problem; shut down one or more processes or operations of a device in which the battery is implemented; etc.

Figure 47:
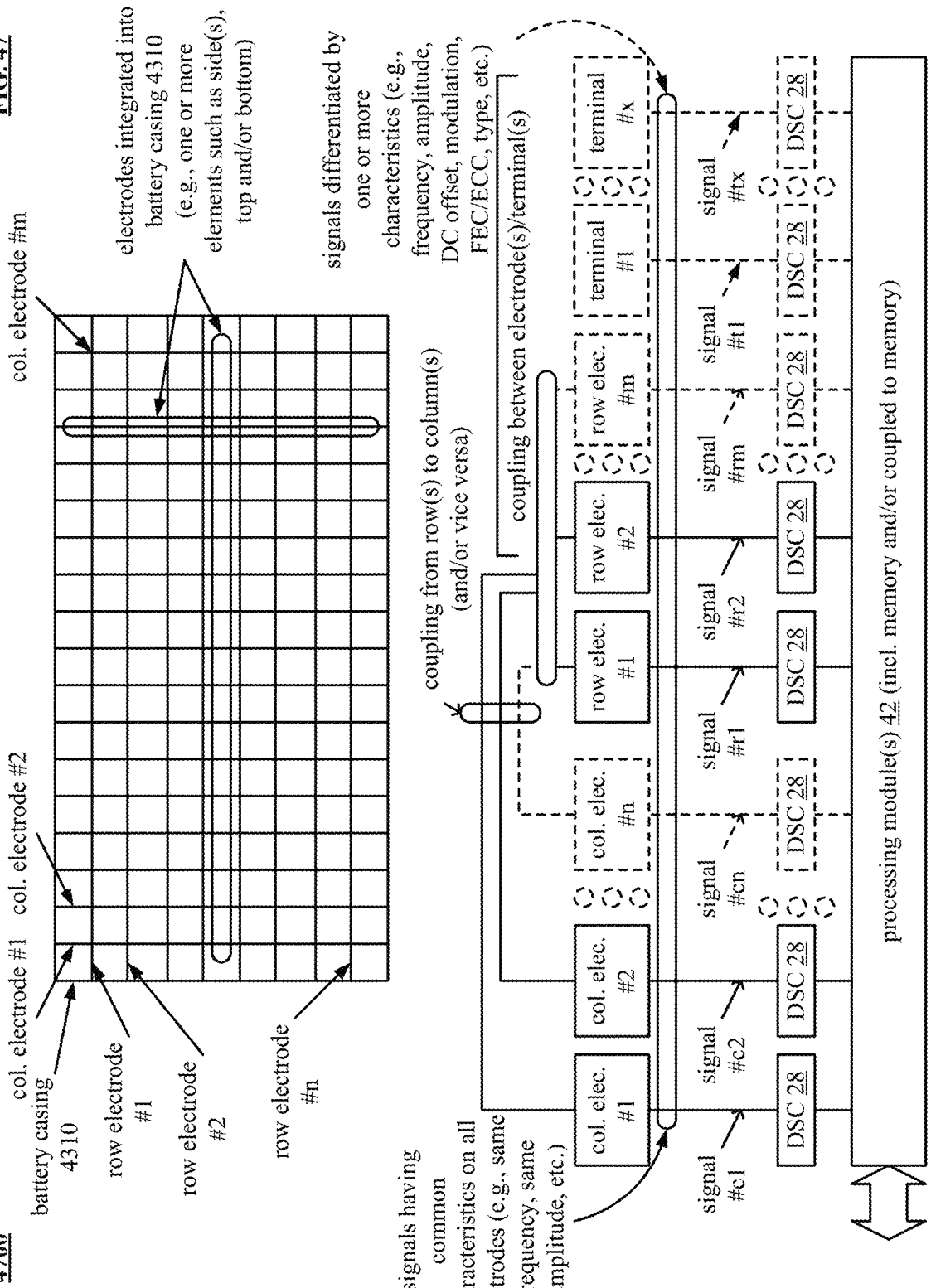
FIG. 47 is a schematic block diagram of another embodiment of integrated electrodes within a battery casing for use in battery monitoring and characterization in conjunction with DSCs in accordance with the present invention.

FIG. 47 is a schematic block diagram of another embodiment 4700 of integrated electrodes within a battery casing for use in battery monitoring and characterization in conjunction with DSCs in accordance with the present invention. This diagram is similar to the prior diagram with at least one difference being that one or more signals are coupled from one or more road electrodes to one or more column electrodes, and/or vice versa. For example, each of the respective DSCs 28 that service the row electrodes may be implemented to operate by providing a first type of signal and a second type of signal simultaneously, and each of the respective DSCs 28 the service the column electrodes may be implemented operate by providing the first type of signal and detecting coupling of at least one of the second types of signals from one or more of the row electrodes.

In one particular implementation, each of the DSCs 28 that service row and column electrodes provides a common type of signal (e.g., a similar signal provided from each of the DSCs 28 to the respective row and column electrodes that they service). In addition, the DSCs 28 that service the column electrodes also provide respective unique signals as well via those column electrodes. For example, a first DSC 28 that services column electrode 1 also provides a first unique signal via the column electrode 1 in addition to the common signal that it provides and that other DSCs provide. Similarly, a second DSC 28 that services column electrode 2 also provides a second unique signal via the column electrode 1 in addition to the common signal that it provides and that other DSCs provide. The unique signals provided from the different respective DSCs via the different respective column electrodes may then be detected by one or more of the DSCs 28 that service the respective row electrodes. This additional signaling and unique identification of the respective signaling provided via the various DSCs 28 that service the column electrodes may be used to provide additional further granularity based on specifically which signal is being coupled into the row electrodes.

In in alternative examples, note that the reverse operation may alternatively be performed, or may also be performed, such that the DSCs that service row electrodes may provide unique respective signals in addition to the common signal that it provides that other DSCs provide.

Certain of the previous diagrams describe electrodes that are integrated into and within a battery casing 4310. Note alternatively that a sheath 4810 may be constructed as to include electrodes therein in a similar fashion. In certainties instances, a sheath 4810 is preferable to integrating electrodes directly into a battery casing 4310. For example, a sheath 4810 that includes such electrodes may be mounted on at least a portion of a battery casing 4310 to allow for similar monitoring of expansion of the battery casing 4310. Note that such a sheath 4810 that includes electrodes integrated therein may be implemented using any desired material. Generally speaking, the material include some form of flexible material that may be affixed to one or more elements of the battery casing 4310. In some examples, all surfaces of the battery casing 4310 have one or more sheaths 4810 affixed thereto. In other examples, at least one, but less than all, of the surfaces of the battery casing 4310 have sheaths 4810 affixed thereto. In certain instances, only one surface (or only one portion of one surface) of the battery casing 4310 has a sheath 4810 affixed thereto.

The sheath 4810 may be affixed to the battery casing 4310 in any desired manner. Some examples include an adhesive, epoxy, a bonding agent, etc. In other examples, the sheath 4810 is affixed to the battery casing 4310 via static electricity to clean to the desired portion(s) of the battery casing 4310. For example, by providing a smooth physical interface having high continuity between the sheath 4810 and the desired portion(s) of the battery casing 4310, a static type connection may be made to affix the sheath 4810 to the battery casing 4310. In general, any desired means by which the sheath 4810 is affixed to the battery casing 4310 may be used. The type of affixing of the sheath 4810 to the battery casing 4310 is provided in such a way as to ensure the ability of the sheath 4810 to flex and move as the surface of the battery casing 4310 also flexes and moves.

Figure 48:
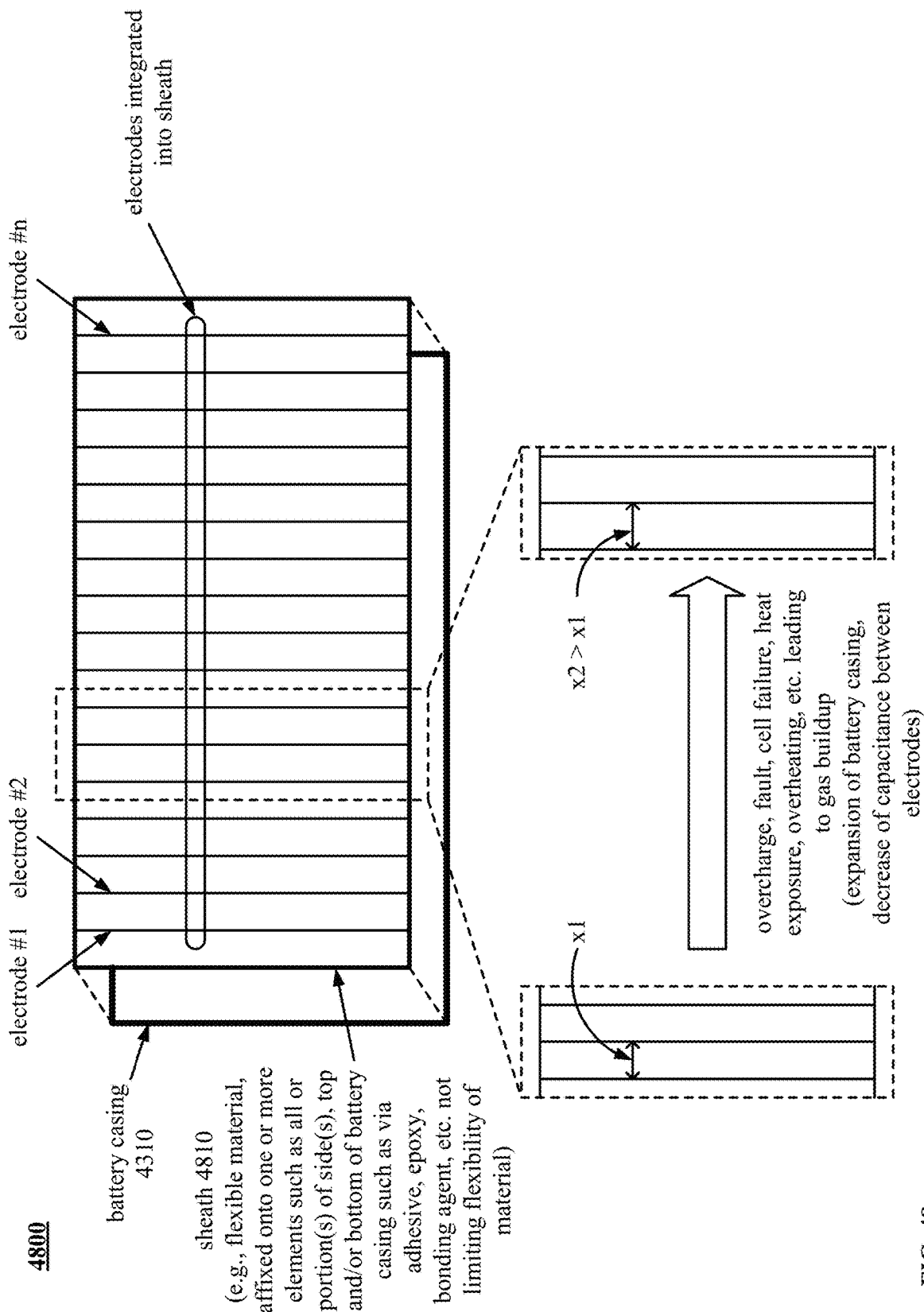
FIG. 48 is a schematic block diagram of an embodiment of a sheath including integrated electrodes adapted for mounting to one or more surfaces of a battery for use in battery monitoring and characterization in accordance with the present invention.

FIG. 48 is a schematic block diagram of an embodiment 4800 of a sheath including integrated electrodes adapted for mounting to one or more surfaces of a battery for use in battery monitoring and characterization in accordance with the present invention. This diagram has certain similarities with FIG. 43 above that includes electrodes integrated into a battery casing 4310. In this diagram, the electrodes are integrated into a sheath 4810 that is mounted on at least a portion of the battery casing 4310. This diagram shows multiple electrodes (e.g., electrode 1, 2, up to n, where n is any desired positive integer greater than or equal to 2) that are integrated into the sheath 4810 that is mounted on at least a portion of the battery casing 4310.

Therefore, as the distance between the electrodes that are integrated within the sheath 4810 that is mounted on at least a portion of the battery casing 4310 increases, such as due to swelling, bulging, expansion, etc. of the battery, then the capacitance between the electrodes decreases. Conversely, as the distance between the electrodes that are integrated within the sheath 4810 that is mounted on at least a portion of the battery casing 4310 decreases, the capacitance between the electrodes increases. Note that while certain examples provided herein are directed towards detecting change of capacitance between electrodes that are integrated within the sheath 4810 that is mounted on at least a portion of the battery casing 4310, note that change of impedance between electrodes may also occur such that that change is not purely capacitive in nature. A similar architecture and implementation as described herein will also build the detect generally any change of impedance between electrodes.

For example, consider the bottom of the diagram that the distance between two electrodes is x1, then based on an expansion of the sheath 4810 that is mounted on at least a portion of the battery casing 4310, then the distance between those two electrodes will increase to x2, which is greater than x1.

Figure 49:
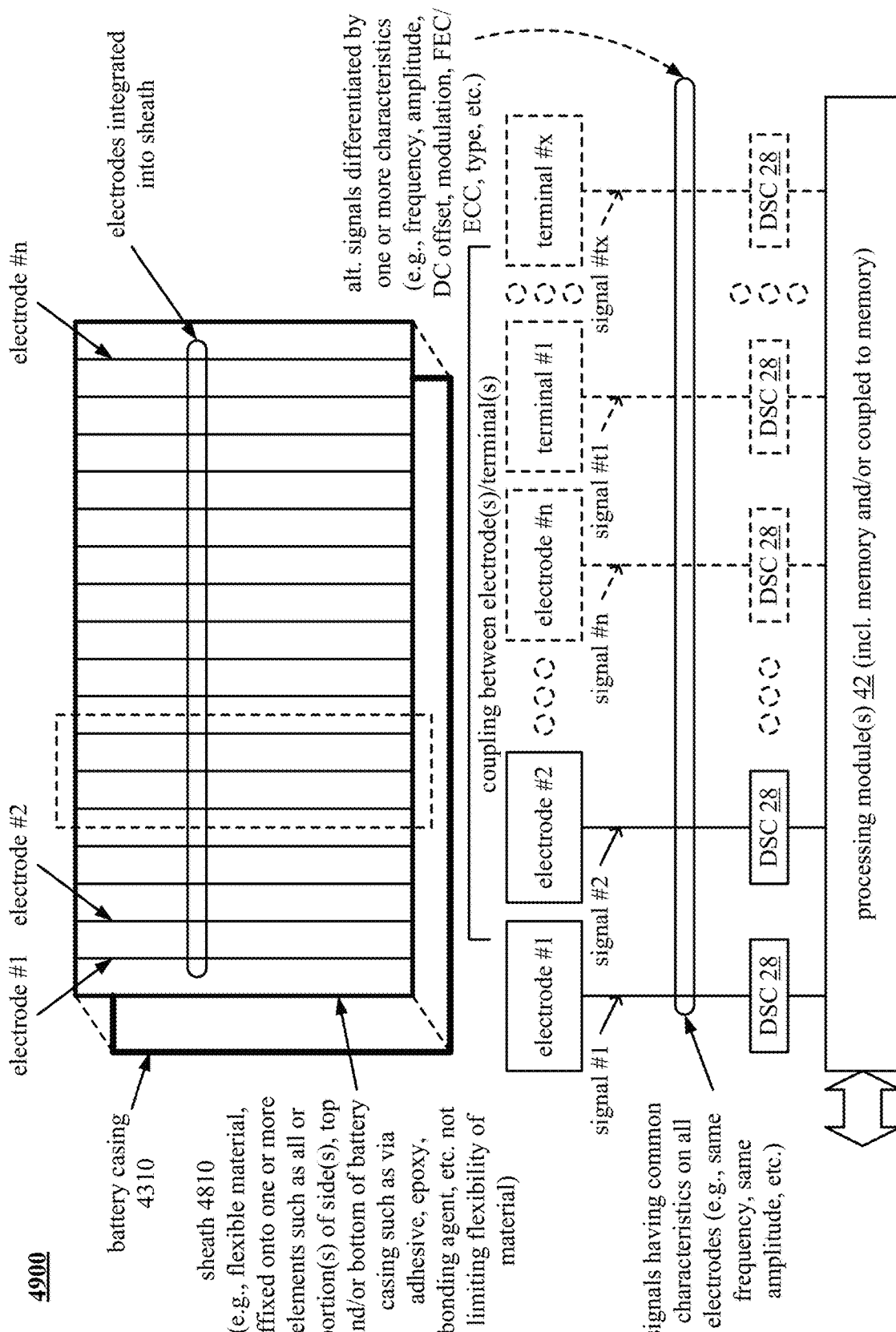
FIG. 49 is a schematic block diagram of an embodiment of a sheath including integrated electrodes adapted for mounting to one or more surfaces of a battery for use in battery monitoring and characterization in conjunction with DSCs in accordance with the present invention.

FIG. 49 is a schematic block diagram of an embodiment 4900 of a sheath including integrated electrodes adapted for mounting to one or more surfaces of a battery for use in battery monitoring and characterization in conjunction with DSCs in accordance with the present invention. This diagram has certain similarities with FIG. 44 above with at least one difference being that this diagram shows multiple electrodes implemented and integrated within a sheath 4810 that is mounted on at least a portion of the battery casing 4310.

The one or more processing modules 42 may be implemented to operate in a similar manner in cooperation with the one or more DSCs 28 as described above. For example, the respective DSCs 28 are configured to receive respective reference signals from the one or processing modules 42, to perform simultaneous transmit and receive (e.g., drive and sense) via the respective electrodes to which they are connected or coupled, the signals may have common characteristics and/or unique identifying characteristics, estimates of the change of distance between electrodes may be made based on detected changes of capacitance (and/or generally any type of impedance) of one or more of the electrodes, determination of whether or not a problem exists based on desired decision-making criteria, one or more corrective actions may be performed based on a determination of a problem (e.g., ceasing charging, providing an error signal, modifying environmental conditions, etc.).

Figure 50:
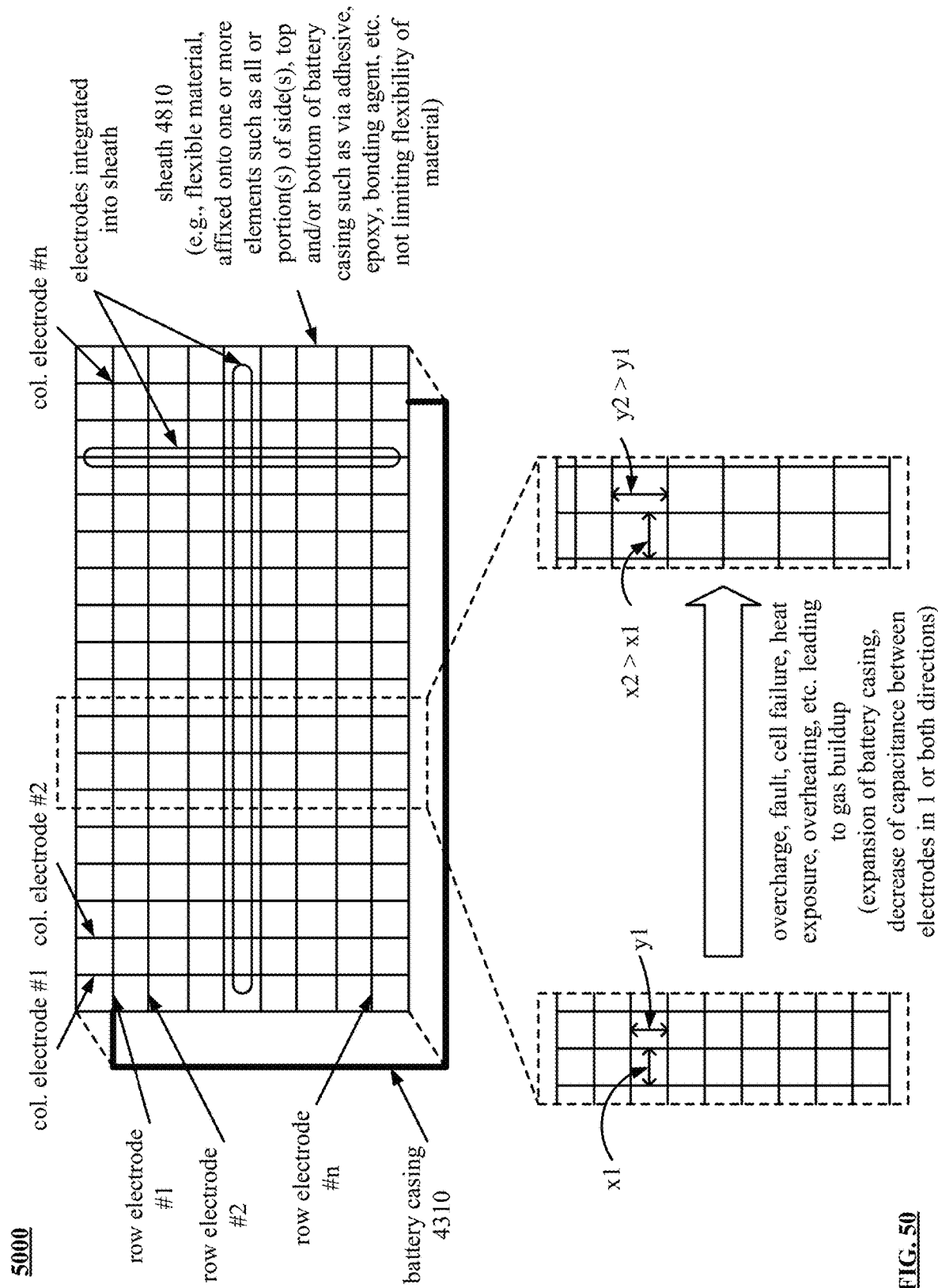
FIG. 50 is a schematic block diagram of another embodiment of a sheath including integrated electrodes adapted for mounting to one or more surfaces of a battery for use in battery monitoring and characterization in accordance with the present invention.

FIG. 50 is a schematic block diagram of another embodiment 5000 of a sheath including integrated electrodes adapted for mounting to one or more surfaces of a battery for use in battery monitoring and characterization in accordance with the present invention. This diagram has certain similarities with FIG. 45 above that includes electrodes integrated into a battery casing 4310 with at least one difference being that this diagram shows multiple electrodes implemented and integrated within a sheath 4810 that is mounted on at least a portion of the battery casing 4310 instead.

In this diagram, the electrodes are integrated into a sheath 4810 that is mounted on at least a portion of the battery casing 4310. This diagram shows multiple row and column electrodes (e.g., column electrodes 1, 2, up to n, where n is any desired positive integer greater than or equal to 2 and row electrodes 1, 2, up to m, where m is any desired positive integer greater than or equal to 2) that are integrated into the sheath 4810 that is mounted on at least a portion of the battery casing 4310.

As can be seen at the bottom of the diagram, based on a change of distance between two adjacent row electrodes and/or two adjacent column electrodes, such as based on swelling, bulging, gas build up, etc. within the battery, the distance between two adjacent row electrodes and/or two adjacent column electrodes, respectively, will increase, thereby changing the capacitance between the two adjacent row electrodes and/or two adjacent column electrodes. This diagram presents another possible implementation by which electrodes may be implemented within a sheath 4810 that is mounted on at least a portion of the battery casing 4310. For example, at the bottom of the diagram, consider the distance between two column electrodes to be x1 and the distance between two row electrodes to be y1, then based on an expansion of the sheath 4810 that is mounted on at least a portion of the battery casing 4310, then the distance between two column electrodes will increase to be x2, which is greater than x1, and/or the distance between two row electrodes will increase to be y2, which is greater than y1. The distance between two column electrodes and/or two row electrodes will increase in such an example, the capacitance between the two column electrodes and/or two row electrodes will thereby decrease.

FIG. 51 is a schematic block diagram of another embodiment 5100 of a sheath including integrated electrodes adapted for mounting to one or more surfaces of a battery for use in battery monitoring and characterization in conjunction with DSCs in accordance with the present invention. This diagram has certain similarities with FIG. 46 above that includes electrodes integrated into a battery casing 4310 with at least one difference being that this diagram shows multiple electrodes implemented and integrated within a sheath 4810 that is mounted on at least a portion of the battery casing 4310 instead.

The one or more processing modules 42 may be implemented to operate in a similar manner in cooperation with the one or more DSCs 28 as described above such as with respect to FIG. 46 that instead includes one or more DSCs 28 respectively connected or coupled to row and column electrodes that are integrated within a battery casing 4310.

For example, the respective DSCs 28 are configured to receive respective reference signals from the one or processing modules 42, to perform simultaneous transmit and receive (e.g., drive and sense) via the respective row or column electrodes to which they are connected or coupled, the signals may have common characteristics and/or unique identifying characteristics, estimates of the change of distance between row and/or column electrodes may be made based on detected changes of capacitance (and/or generally any type of impedance) of one or more of the electrodes, determination of whether or not a problem exists based on desired decision-making criteria, one or more corrective actions may be performed based on a determination of a problem (e.g., ceasing charging, providing an error signal, modifying environmental conditions, etc.).

Figure 52:
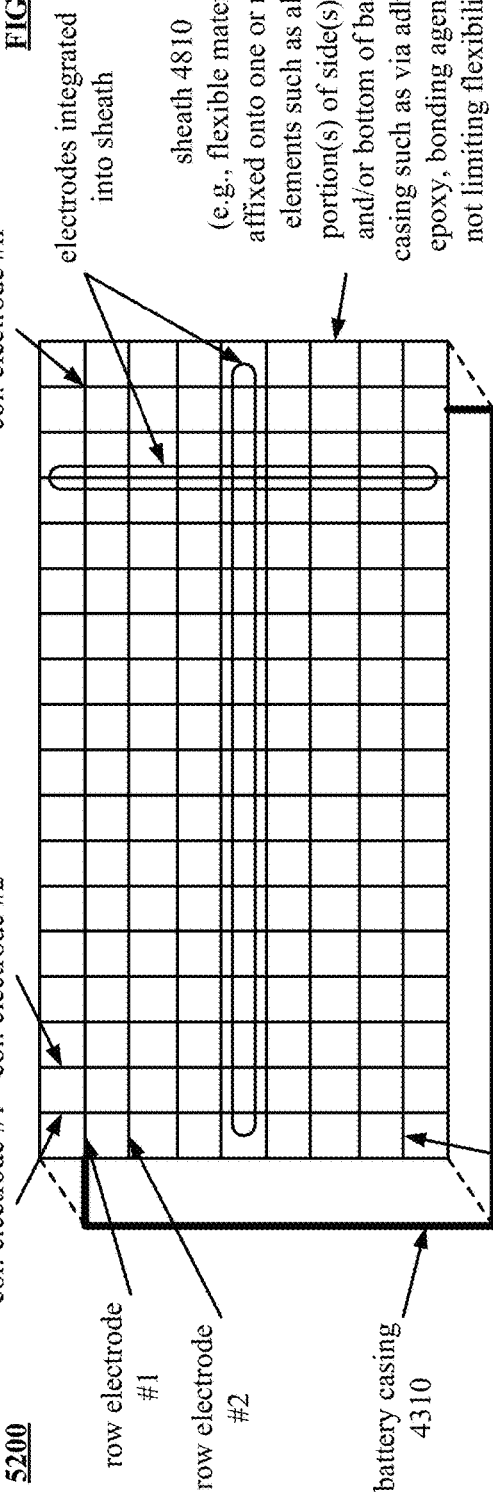
FIG. 52 is a schematic block diagram of another embodiment of a sheath including integrated electrodes adapted for mounting to one or more surfaces of a battery for use in battery monitoring and characterization in conjunction with DSCs in accordance with the present invention.

FIG. 52 is a schematic block diagram of another embodiment 5200 of a sheath including integrated electrodes adapted for mounting to one or more surfaces of a battery for use in battery monitoring and characterization in conjunction with DSCs in accordance with the present invention. This diagram has certain similarities with FIG. 47 above that includes electrodes integrated into a battery casing 4310 with at least one difference being that this diagram shows multiple electrodes implemented and integrated within a sheath 4810 that is mounted on at least a portion of the battery casing 4310.

The one or more processing modules 42 may be implemented to operate in a similar manner in cooperation with the one or more DSCs 28 as described above such as with respect to FIG. 46 that instead includes one or more DSCs 28 respectively connected or coupled to row and column electrodes that are integrated within a battery casing 4310.

For example, the respective DSCs 28 are configured to receive respective reference signals from the one or processing modules 42, to perform simultaneous transmit and receive (e.g., drive and sense) via the respective electrodes to which they are connected or coupled, the signals may have common characteristics and/or unique identifying characteristics, estimates of the change of distance between electrodes may be made based on detected changes of capacitance (and/or generally any type of impedance) of one or more of the electrodes, determination of whether or not a problem exists based on desired decision-making criteria, one or more corrective actions may be performed based on a determination of a problem (e.g., ceasing charging, providing an error signal, modifying environmental conditions, etc.).

In addition, in some particular implementations, note that each of the DSCs 28 that service row and column electrodes provides a common type of signal (e.g., a similar signal provided from each of the DSCs 28 to the respective row and column electrodes that they service). In addition, the DSCs 28 that service the column electrodes also provide respective unique signals as well via those column electrodes. For example, a first DSC 28 that services column electrode 1 also provides a first unique signal via the column electrode 1 in addition to the common signal that it provides and that other DSCs provide. Similarly, a second DSC 28 that services column electrode 2 also provides a second unique signal via the column electrode 1 in addition to the common signal that it provides and that other DSCs provide. The unique signals provided from the different respective DSCs via the different respective column electrodes may then be detected by one or more of the DSCs 28 that service the respective row electrodes. This additional signaling and unique identification of the respective signaling provided via the various DSCs 28 that service the column electrodes may be used to provide additional further granularity based on specifically which signal is being coupled into the row electrodes.

In in alternative examples, note that the reverse operation may alternatively be performed, or may also be performed, such that the DSCs that service row electrodes may provide unique respective signals in addition to the common signal that it provides that other DSCs provide.

Figure 53:
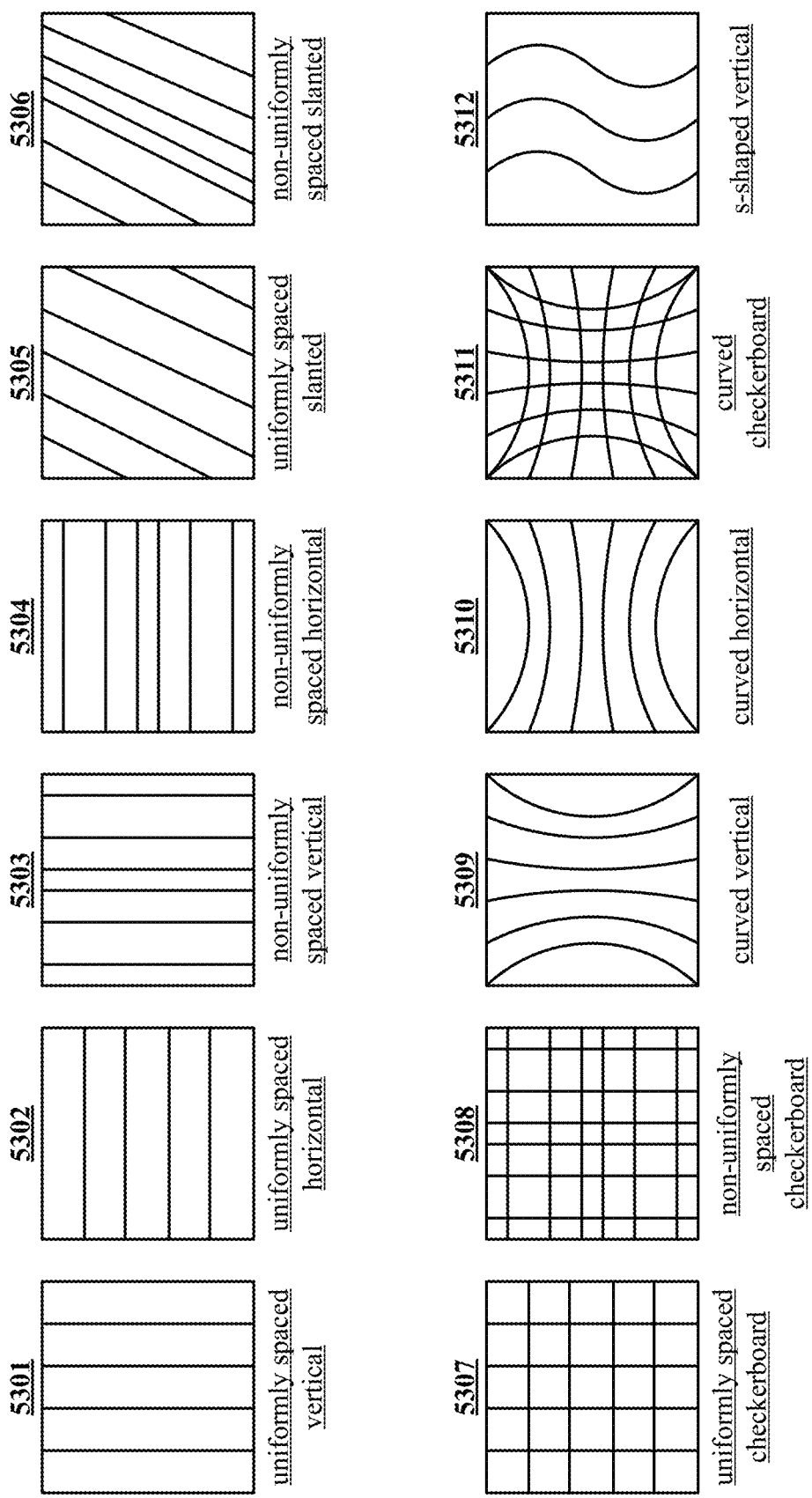
FIG. 53 is a schematic block diagram showing various embodiments of cross-sections of various embodiments of electrode patterns impedance (Zs) such as may be implemented within battery casings and/or sheaths for use in battery monitoring and characterization in accordance with the present invention.

FIG. 53 is a schematic block diagram showing various embodiments 5301, 5302, 5303, 5304, 5305, 5306, 5307, 5308, 5309, 5310, 5311, and 5312 of cross-sections of various embodiments of electrode patterns impedance (Zs) such as may be implemented within battery casings and/or sheaths for use in battery monitoring and characterization in accordance with the present invention.

Generally speaking, the various electrodes within a battery casing or a sheath that may be affixed to a battery casing may be implemented in any desired configuration. Reference 5301 corresponds to a pattern that includes uniformly spaced vertical electrodes. Reference numeral 5302 corresponds to a pattern that includes uniformly spaced horizontal electrodes. Generally speaking, note that the electrodes of such patterns may be aligned in any desired direction.

Reference numeral 5303 corresponds to a pattern that includes non-uniformly spaced vertical electrodes. Reference numeral 5304 corresponds to a pattern that includes non-uniformly spaced horizontal electrodes. Note that the non-uniformity of spacing of the vertical or horizontal electrodes may be based on any desired pattern, including a repetitive pattern, a random pattern, etc.

Reference numeral 5305 corresponds to a pattern that includes uniformly spaced slanted electrodes. For example, consider a lead acid battery having a particular shape such that each of the sides thereof (e.g., a 6 sided lead acid battery) may generally be described as being square or rectangle, and the slanted electrodes of this pattern may be viewed as extending from lower left to upper right of one of the rectangular or square surfaces of the battery, or alternatively from lower right to upper left of one of the rectangular or square surfaces of the battery. Considering other types of batteries, such as prismatic, pouch, etc., As may be implemented using Lithium-ion technology, consider that such slanted electrodes may be implemented. In some examples, it may be desirable to operate based on an implementation in which the electrodes are not aligned parallel to or perpendicular to one of the edges of the battery. Reference numeral 5306 corresponds to a pattern that includes non-uniformly spliced slanted electrodes.

Reference 5307 corresponds to a pattern that includes a uniformly spaced checkerboard. Reference 5308 corresponds to a pattern that includes non-uniformly spaced checkerboard. Note that the non-uniformity of spacing of the vertical and horizontal electrodes within such a non-uniformly spaced checkerboard pattern may be based on any desired pattern, including a repetitive pattern, a random pattern, etc. In addition, note that a pattern including electrodes extending in various directions such as checkerboard may include electrical isolation between the electrodes aligned in one direction and the electrodes aligned in another direction. For example, considering a checkerboard pattern such as these, the vertical and horizontal aligned electrodes may be electrically isolated such that there is not direct electrical connection between the vertical and horizontal aligned electrodes.

Reference 5309 corresponds to a pattern that includes curved vertical aligned electrodes. In this particular example, the electrodes are more closely aligned to one another near the middle of the pattern than at the top or the bottom of the pattern.

Reference 5310 corresponds to a pattern that includes curved horizontal aligned electrodes. In this particular example, the electrodes are more closely aligned to one another near the middle of the pattern than at the left or the right of the pattern.

Reference 5311 corresponds to a pattern that includes a curved checkerboard that includes both curved vertical aligned electrodes and curved horizontal aligned electrodes. Note also that the curved vertical aligned electrodes and curved horizontal aligned electrodes may be electrically isolated from one another such that such that there is not direct electrical connection between the vertical aligned electrodes and curved horizontal aligned electrodes.

Reference 5312 corresponds to a pattern that includes s-shaped vertical aligned electrodes. Note that an alternative pattern may alternatively include s-shaped horizontal aligned electrodes.

Note that such examples of such patterns of electrodes that may be implemented within a battery casing or a sheath that may be affixed to at least one portion of a battery casing are not exhaustive. Generally speaking, any desired pattern including two or more electrodes therein that are serviced by two or more respective DSCs may be used such that one or more processing modules operating cooperatively with the two or more respective DSCs may determine a change of distance between the two or more electrodes based on a change of capacitance (or other type of impedance) between the electrodes. Again, note that any such respective pattern of electrodes may be implemented within a battery casing, within the sheath that is configured to affix to at least one surface of a battery casing, etc.

Figure 54:
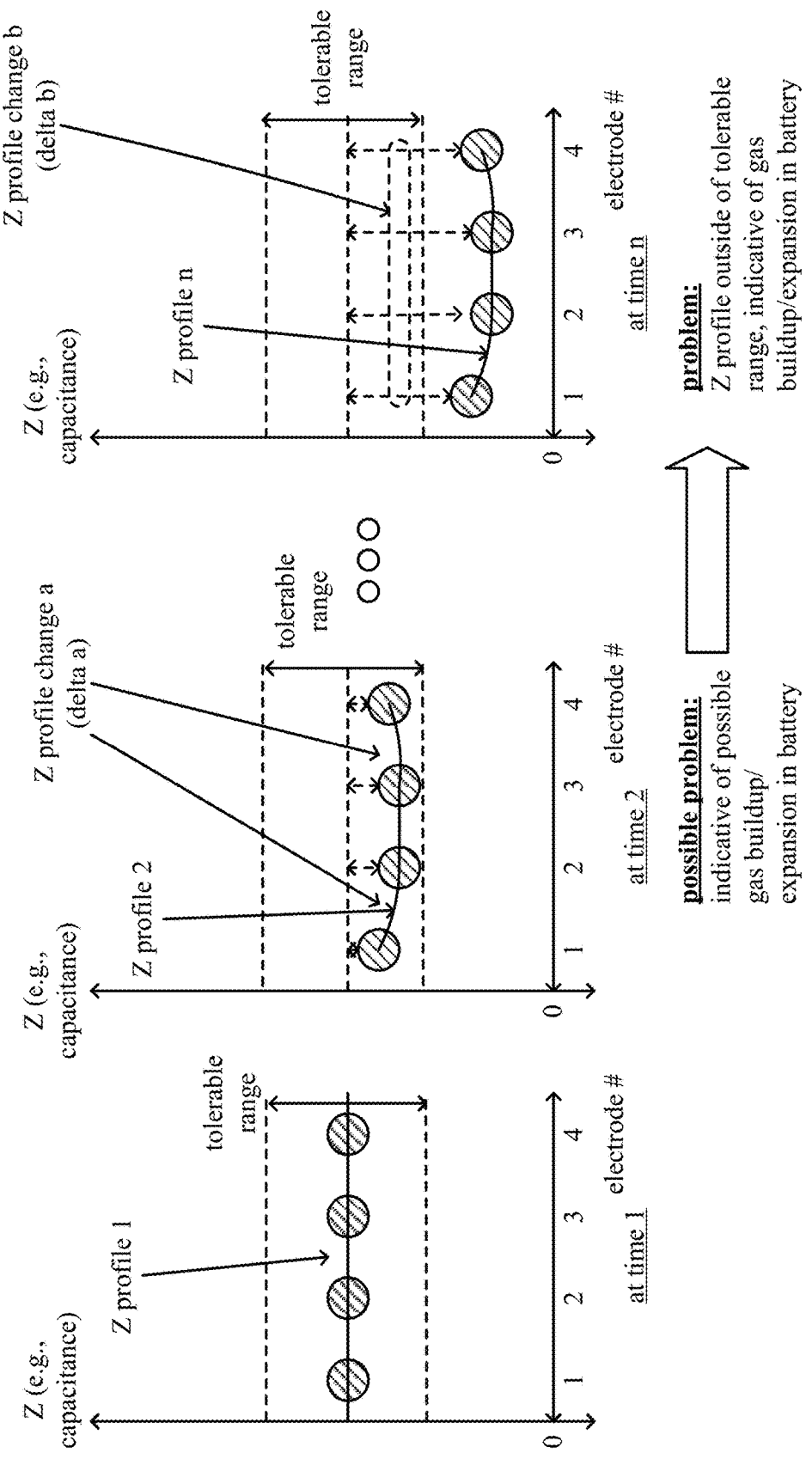
FIG. 54 is a schematic block diagram of an embodiment of impedance (Z) profile monitoring of electrodes as may be implemented within battery casings and/or sheaths for use in battery monitoring and characterization in accordance with the present invention.

FIG. 54 is a schematic block diagram of an embodiment 5400 of impedance (Z) profile monitoring of electrodes as may be implemented within battery casings and/or sheaths for use in battery monitoring and characterization in accordance with the present invention. This this diagram shows monitoring of the impedance of a number of electrodes (e.g., shown as for electrodes in this diagram providing an impedance (Z) profile) at different respective times and identifying whether or not a problem exists based on various considerations. Such electrodes may include to some of the respective electrodes as may be implemented within a battery casing or sheath that is used to facilitate monitoring of the battery as described herein.

Examples of such considerations used to determine whether or not a problem exists with battery may include any one or more of a trajectory by which the Z profile is changing, a rate at which the Z profile is changing (e.g., change of the Z profile as a function of time), whether or not the Z profile compares favorably with the tolerable range, whether or not one or more of the impedances of the respective electrodes included within the Z profile compare favorably the tolerable range, etc.

On the left-hand side of the diagram, at or during time 1, a Z profile 1 corresponds to the respective impedances of the electrodes being monitored at or during time 1. For example, considering uniformly spaced electrodes, the impedance of the respective electrodes may be the same or approximately or substantially the same (e.g., the same value, or within a certain percentage of being same as one another, such as within 1%, 2%, 5%, or some other value). In some examples, a baseline Z profile is determined based on the initial impedances of the electrodes included within the Z profile. Such initial impedance may correspond to a mode of operation in which no adverse effects of the battery exists (e.g., no gassing, no expansion of the battery casing surface, no expansion of a sheath affixed to at least a portion of the battery casing, no overcharging of the battery, etc.).

Then, monitoring of one or more characteristics associated with the Z profile is performed. In addition, note that a tolerable range for one or more, or all, of the respective impedances of the electrodes included within the Z profile may be defined, and when all, or some acceptable number, of the electrodes included within the Z profile have impedance values within this tolerable range, then no problem is determined to exist. For example, consider a tolerable range extending from a certain percentage greater and less than certain percentage less than the baseline/initial impedances of electrodes included within the Z profile. In one example, consider an upper limit of the tolerable range to be X % greater than the baseline/initial impedances of electrodes included within the Z profile and a lower limit of the tolerable range to be Y % less than the baseline/initial impedances of electrodes included within the Z profile. Consider an example in which consider an upper limit of the tolerable range to be 5% greater than the baseline/initial impedances of electrodes included within the Z profile and a lower limit of the tolerable range to be 8% less than the baseline/initial impedances of electrodes included within the Z profile, then the tolerable range would extend from 0.92 to 1.05 of the baseline/initial impedances of electrodes included within the Z profile. Consider an example in which consider an upper limit of the tolerable range to be 10% greater than the baseline/initial impedances of electrodes included within the Z profile and a lower limit of the tolerable range to be 10% less than the baseline/initial impedances of electrodes included within the Z profile, then the tolerable range would extend from 0.9 to 1.1 of the baseline/initial impedances of electrodes included within the Z profile. Other values may alternatively be identified for upper and lower limits of the tolerable range in other examples and implementations based on any number of considerations. Examples of such considerations may be historical or past upper and lower values associated with safe or acceptable operation of the battery without presenting any problem, manufacturer provided data associated with expected expansion or contraction of battery casing during normal operation, etc.

In an example of operation and implementation, one or more processing modules is configured to keep track of and monitor the Z profile as a function of time. In addition, the one or more processing modules may be implemented to consider one or more other operational conditions associated with a battery or a device in which the batteries implemented during the tracking and monitoring of the Z profile as a function of time. For example, one or more processing modules may also be implemented to monitor the operational status of the battery consider during the tracking and monitoring of the Z profile (e.g., such as whether the battery is undergoing charging, discharging, load servicing, standby, etc.). In other examples, the one or more processing modules may also be implemented to monitor one or more environmental conditions of an environment in which the battery or a device in which the battery is implemented during the tracking and monitoring of the Z profile (e.g., such as the temperature, pressure, humidity, etc. of the environment in which the battery or a device in which the battery is implemented).

Moving to the right in the diagram, consider an example at or during time 2 at which the Z profile has modified (e.g., consider Z profile 2 at or during time 2 in comparison to Z profile 1 at or during time 1), then a Z profile change a (delta a) may be viewed as a difference between the Z profile 2 at or during time 2 in comparison to Z profile 1 at or during time 1. For example, consider a situation in which the distance between electrodes is increasing (e.g., such as in response to gassing within the battery), then a reduction in impedance (e.g., capacitance) of the respective electrodes may be seen. This may be indicative of the electrodes spreading apart (e.g., because of gassing). Considering the Z profile 2 at or during time 2, although the respective impedances of the electrodes included within the Z profile are included within the tolerable range at or during time 2, note that they are moving in the direction that, if continued, will be approaching the lower limit of the tolerable range and possibly expand outside of the tolerable range. This may be indicative of possible problems such as gas buildup/expansion in the battery.

This process of monitoring may be continued, such as at or during different respective times. On the right hand side of the diagram, consider an example at or during some other time, time n, at which the Z profile has modified even further from a prior time (e.g., consider Z profile n at or during time n in comparison to Z profile 1 at or during time 1 or in comparison to Z profile 2 at or during time 2), then a Z profile change b (delta b) may be viewed as a difference between the Z profile 2 at or during time 2 or the Z profile 1 at or during time 1. With respect to the example of this diagram, know that each of the respective impedances of the electrodes included within the Z profile are outside of the tolerable range at or during time n. This may be indicative of an actual problems such as gas buildup/expansion in the battery. Based on the determination of the existence of a problem based on the respective impedances of the electrodes included within the Z profile being outside of the tolerable range at or during time n, any one or more appropriate actions may be taken including those described elsewhere. For example, based on the detection of such a problem, charging may be ceased when the battery is undergoing charging, an error signal may be provided to indicate to a user the existence of the problem to facilitate action to remedy or mitigate the problem, a change of environmental condition may be made, one or more processes or operations of a device in which the battery is implemented may be stopped or modified such as into a lower power or power savings mode, etc.).

Generally speaking, such Z profile monitoring (e.g., based on the impedance (Z) (e.g., capacitance) of the respective electrodes included within the Z profile and be monitored to determine any changes as a function of time. Any one or more determinations may be made based on the rate of change, the trajectory of change, the direction of change, etc. of the Z profile and/or one or more individual impedances of electrodes within the Z profile to facilitate the determination of the status, health, operational condition, etc. of the battery and/or a device in which the battery is implemented. Examples of such determinations may include one or more of identifying failing charging conditions, overcharging, end-of-life of the battery, gas buildup, etc. Note that such determinations may also be made based on comparison of one or more characteristics associated with the Z profile in comparison to variation from expected/historical performance of the battery and/or a device in which the battery is implemented.

Figure 55:
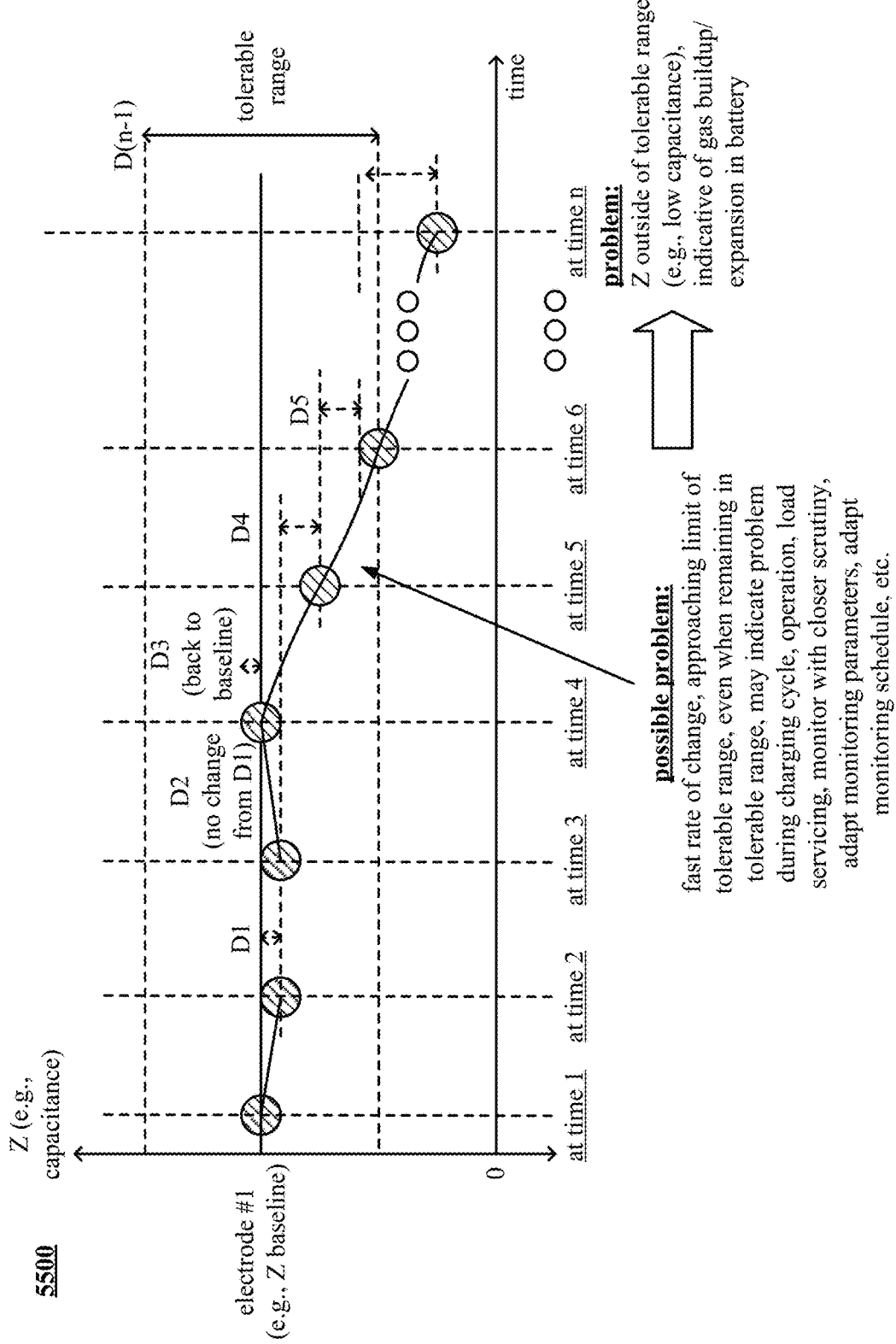
FIG. 55 is a schematic block diagram of an embodiment of impedance (Z) monitoring of a singular electrode as may be implemented within battery casings and/or sheaths for use in battery monitoring and characterization and characterization in accordance with the present invention.

FIG. 55 is a schematic block diagram of an embodiment 5500 of impedance (Z) monitoring of a singular electrode as may be implemented within battery casings and/or sheaths for use in battery monitoring and characterization and characterization in accordance with the present invention. This diagram has some similarities to the previous telegram with at least one difference being that this diagram corresponds to monitoring the impedance of a single electrode. This diagram shows an example of tracking and monitoring the impedance of electrode 1.

At or during a time 1, the impedance of electrode 1 is shown as being centered within a tolerable range. This impedance may be a baseline impedance of electrode 1 (e.g., an initial impedance such as corresponding to a mode of operation in which no adverse effects of the battery exists (e.g., no gassing, no expansion of the battery casing surface, no expansion of a sheath affixed to at least a portion of the battery casing, no overcharging of the battery, etc.).

At or during a time 2, the impedance of electrode 1 is shown as still being centered within the tolerable range, but with a slightly decreased impedance (e.g., capacitance), decreased by an amount D1 being the difference between the baseline impedance of electrode 1 at or during a time 1 and its impedance at or during time 2. This may correspond to an increase of the distance between electrode 1 and at least one other electrode, such as may be associated with gassing within the battery. At this point, while there may be some gassing within the battery, it is still within acceptable limits that facilitate proper operation of the battery.

At or during a time 3, the impedance of electrode 1 is shown as still being centered within the tolerable range, with very little if any impedance change from its impedance at or during time 2.

At or during a time 4, the impedance of electrode 1 is shown as also being centered within the tolerable range, and with a slightly increased impedance (e.g., capacitance), increased by an amount D2 being similar to the difference D1 such that the impedance of the electrode 1 has returned to the baseline impedance of electrode 1. This may correspond to an decrease of the distance between electrode 1 and at least one other electrode, such as may be associated with gassing being absorbed back into the electrolyte within the battery (e.g., such as a potentially problematic condition subsiding).

At or during a times 5 and 6, the impedance of electrode 1 is shown as being within the tolerable range, or at the bottom end of the tolerable range, with a relatively steep trajectory or fast rate of change. This approaching the limit of the tolerable range, even though remaining in the tolerable range, may indicate a problem with the battery. This may indicate a problem during the charging cycle, operation, load servicing, etc. One or more actions may be taken by the system, such as directed by one or more processing modules. Examples of such actions may include one or more of monitoring the battery with closer scrutiny (e.g., determining the impedance of electrode 1 at different respective times that are separated by smaller time intervals than previously performed, adapting the monitoring schedule, adapting the monitoring parameters, modifying operation of a device in which the battery is implemented, etc.).

At or during a time n, the impedance of electrode 1 is shown as being outside of the tolerable range, such as may be associated with gassing within the battery. At this point, a determination may be made that there is gassing within the battery, and it is outside of the acceptable limits that facilitate proper operation of the battery.

Once a determination is made regarding a problem or a potential problem (e.g., such as associated with swelling, bulging, gas build up, etc.), one or more processing modules is configured to take one or more actions including any of those described above such as based on determination of a problem with the battery during charging, cease charging of the battery; alternatively, based on determination of a problem with the battery during non-charging, provide an error signal to facilitate the user taking action to remedy or mitigate the problem; shut down one or more processes or operations of a device in which the battery is implemented; etc.

Figure 56:
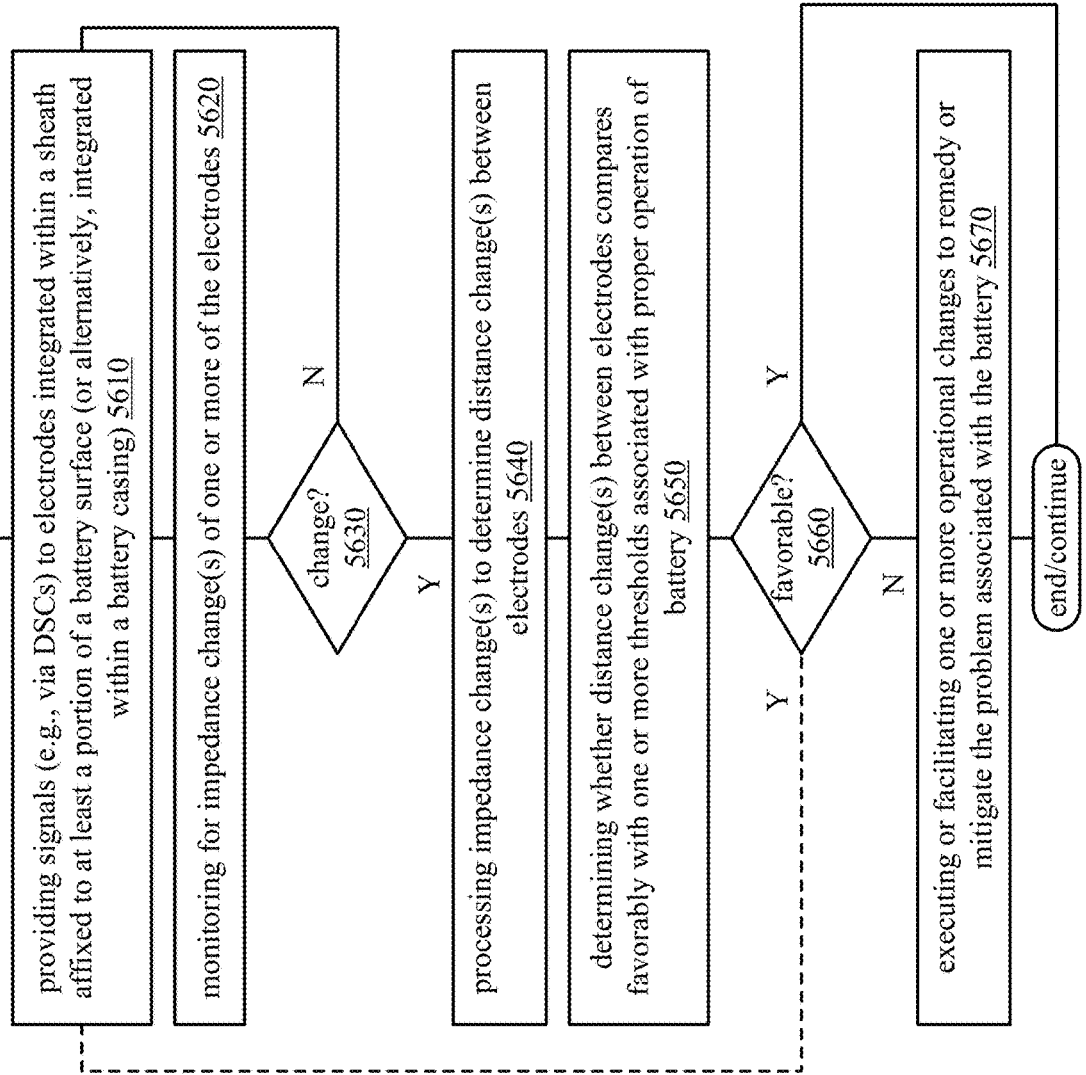
FIG. 56 is a schematic block diagram of another embodiment of a method for execution by one or more devices in accordance with the present invention.

FIG. 56 is a schematic block diagram of another embodiment of a method 5600 for execution by one or more devices in accordance with the present invention. The method 5600 operates in step S610 by providing signals (e.g., via DSCs) to electrodes integrated within a sheath affixed to at least a portion of a battery surface. In some alternative variants of the method 5600, the method 5600 alternatively operates by providing signals (e.g., via DSCs) to electrodes integrated within a battery casing. As described herein, different implementations may be made of electrodes being implemented within a sheath operative to be affixed to at least a portion of a battery surface and/or electrodes being integrated within a battery casing. In some examples, note that different sets of electrodes are included within both a sheath operative to be affixed to at least a portion of a battery surface and electrodes integrated within a battery casing of the battery. In other examples, only one of a sheath operative to be affixed to at least a portion of a battery surface or electrodes integrated within a battery casing of the battery is implemented.

The method 5600 also operates in step S620 by monitoring for impedance change(s) of one or more of the electrodes. Such monitoring may be performed based on monitoring for a certain percentage change of the change of impedance of one or more of the electrodes (e.g., 1%, 2%, 5%, etc. or some other desired value in accordance with a particular application). Such monitoring may be performed based on monitoring of a change that affects or adversely affects the operation of the battery (e.g., such as based on a change associated with a distance change of the electrodes associated with gassing of the battery to at least a certain amount as to affect the battery operation adversely or unacceptably).

Based on no detection of impedance change(s) of the one or more of the electrodes in the step S630, the method 5600 loops back to the step S610. Alternatively, detection of impedance change(s) of the one or more of the electrodes in the step S630, the method 5600 operates in step S640 by processing impedance change(s) to determine distance change(s) between electrodes.

The method 5600 operates in step S650 by determining whether distance change(s) between electrodes compares favorably with one or more thresholds associated with proper operation of battery. For example, there may be some tolerance and amount of distance change(s) between electrodes that are still within an acceptable or tolerable range for proper operation of the battery. One or more thresholds may be used to facilitate determination of whether or not the amount of distance change(s) between electrodes that are still within an acceptable or tolerable range for proper operation of the battery (e.g., first range associated with acceptable or tolerable, second range associated with acceptable or tolerable but trending towards unacceptable or intolerable, third range associated with unacceptable or intolerable, etc.).

Based on a determination of favorable comparison such that distance change(s) between electrodes are still within an acceptable or tolerable range for proper operation of the battery in the step S660, the method ends. Alternatively, based on a determination of favorable comparison such that distance change(s) between electrodes are still within an acceptable or tolerable range for proper operation of the battery in the step S660, the method 5600 loops back to the step S610.

Based on a determination of unfavorable comparison such that distance change(s) between electrodes are still within an acceptable or tolerable range for proper operation of the battery in the step S660, the method 5670 operates by executing or facilitating one or more operational changes to remedy or mitigate the problem associated with the battery. Such one or more operational changes may be any of those as described herein (e.g., cease charging of the battery; alternatively, based on determination of a problem with the battery during non-charging, provide an error signal to facilitate the user taking action to remedy or mitigate the problem; shut down one or more processes or operations of a device in which the battery is implemented; etc., among others).

Figure 57:
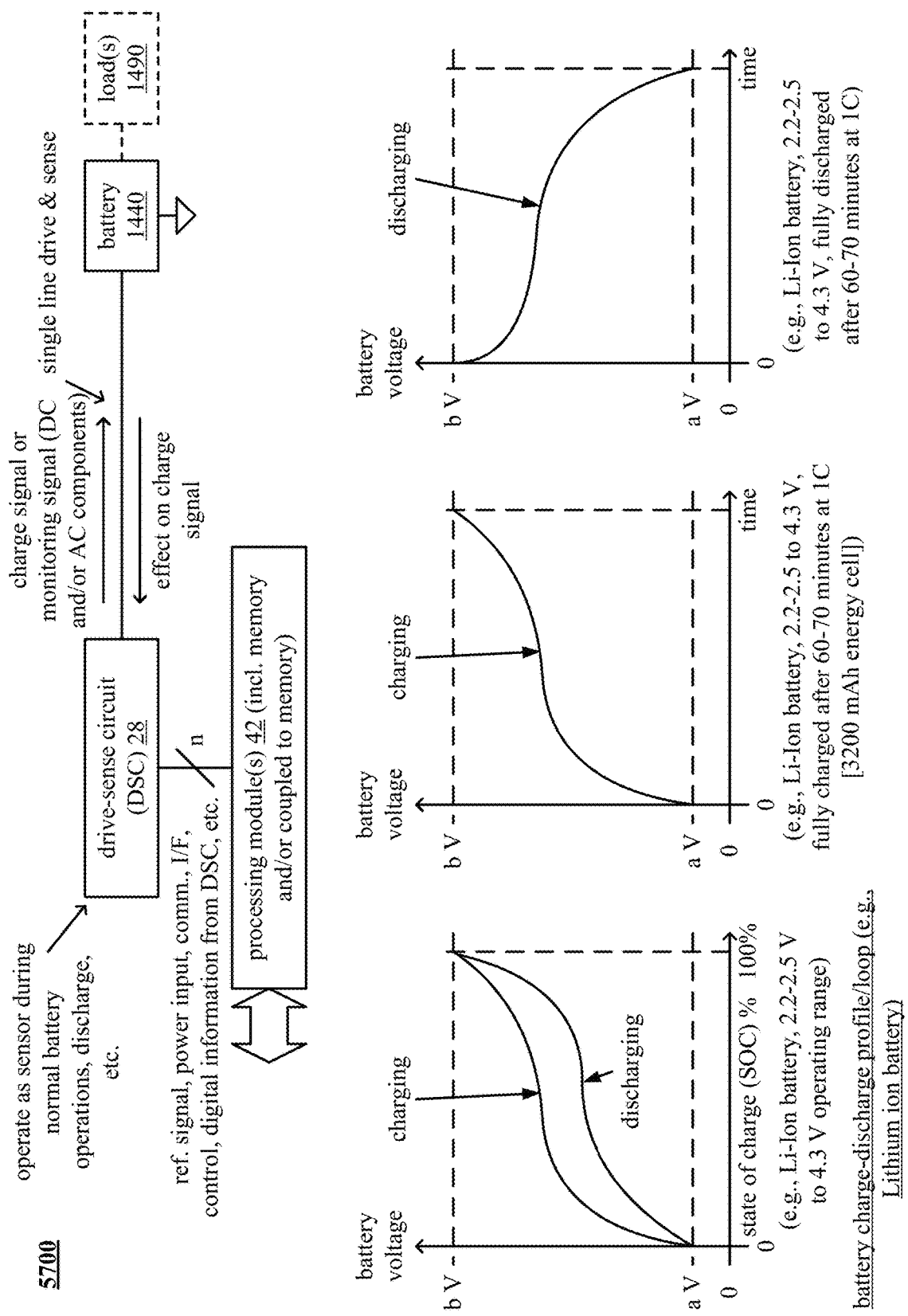
FIG. 57 is a schematic block diagram of another embodiment of a DSC that is interactive with a battery including showing a charge-discharge loop, a charge curve, and a discharge curve in accordance with the present invention.

FIG. 57 is a schematic block diagram of another embodiment 5700 of a DSC that is interactive with a battery including showing a charge-discharge loop, a charge curve, and a discharge curve in accordance with the present invention. At the top of this diagram is a similar implementation shown elsewhere herein (e.g., such as with respect to FIG. 14, FIG. 18, etc.

At the bottom left of this diagram is an example of a charge and discharge curves such as associated with the charging of a battery from a state of charge (SOC) of 0% to a full capacity of 100% and the associated variation of voltage of the battery during those processes. The bottom middle and the bottom right show examples of curves associated with charging and discharging of a battery as a function of time and the associated variation of voltage of the battery during those processes.

Generally speaking, the diagrams show an operating range between a lower voltage of b V and an upper voltage of a V. Consider an example of a Lithium-ion battery having an operating range between a lower voltage of approximately 2.2-2.5 V and an upper voltage of approximately 4.3 V (e.g., b V=approximately 4.3 V, and a V=approximately 2.2-2.5 V). For example, consider a Lithium-ion battery that is a 3200 mA hour energy cell, then such a battery may be fully charged by driving a current of 1 C (e.g., 3200 mA) for approximately one hour, or 60-70 minutes. Similarly, such a Lithium-ion battery having such a rated capacity will discharge in approximately one hour, or 60-70 min., when providing a current of 1 C (e.g., 3200 mA).

On the bottom left of the diagram, both the charging and discharging curves as a function of state of charge percentage are shown. As can be seen, during the charging process, the voltage initially increases rapidly as the state of charge percentage increases, then flattens, then gradually approaches the upper voltage limit as the state of charge percentage approaches 100%. However, during the discharging process, the voltage initially decreases rapidly as the state of charge percentage decreases, then flattens, then gradually approaches the lower voltage limit as the state of charge percentage approaches 0%. Note that the charging and discharging curves of the battery do not track one another perfectly.

At the bottom of the diagram is a charging curve as a function of time. As a function of time, the charging curve demonstrates a similar behavior to the charging curve that is as a function of time, in that, the voltage initially increases rapidly as a function of time at the beginning of the charging process, then flattens, then gradually approaches the upper voltage limit as a function of time.

At the bottom right of the diagram is a discharging curve is a function of time. Initially during discharging, the discharging curve shows that the voltage of the battery drops quickly from the upper voltage limit, then flattens, then as the capacity of the battery has been depleted and in no longer has the capacity to deliver the required current one or more loads, the voltage of the battery drops very quickly towards the lower voltage limit.

Note that these diagrams generally describe the charging and discharging characteristics of a battery. The particular trajectory of such charge-discharge loop as a function of state of charge percentage, charging curve as a function of time, and discharging curve is a function of time, will of course vary based on the type of battery, the reading of the battery, the capacity of the battery, etc.

In some examples, note that the one or more processing modules 42 is configured to monitor and track the charging and discharging curve of the battery as a function of time. In addition, in some examples, the one or more processing modules 42 is also configured to monitor and track one or more other operational conditions associated with the battery or a device in which the batteries implemented while monitoring and tracking the charging and discharging curve of the battery as a function of time.

Consider an example in which a load is being serviced by the battery over multiple charge and discharge cycles of the battery. In some examples, the one or more processing modules 42 is configured to monitor and track one or more characteristics of the charging curve is a function of time for the discharging curve as a function of time may be used to determine change in the status, operational condition, health, etc. of the battery. Consider an example in which, after a certain number of charge-discharge cycles, the battery no longer has the ability to service the load, or the voltage of the battery drops very quickly when the battery is implemented to service the load. Within such instances in which the load is non-dynamic or static, then a determination may be made regarding the status, operational condition, health, etc. of the battery such as impending failure of the battery, actual failure of the battery, loss of capacity of the battery, etc.

Figure 58:
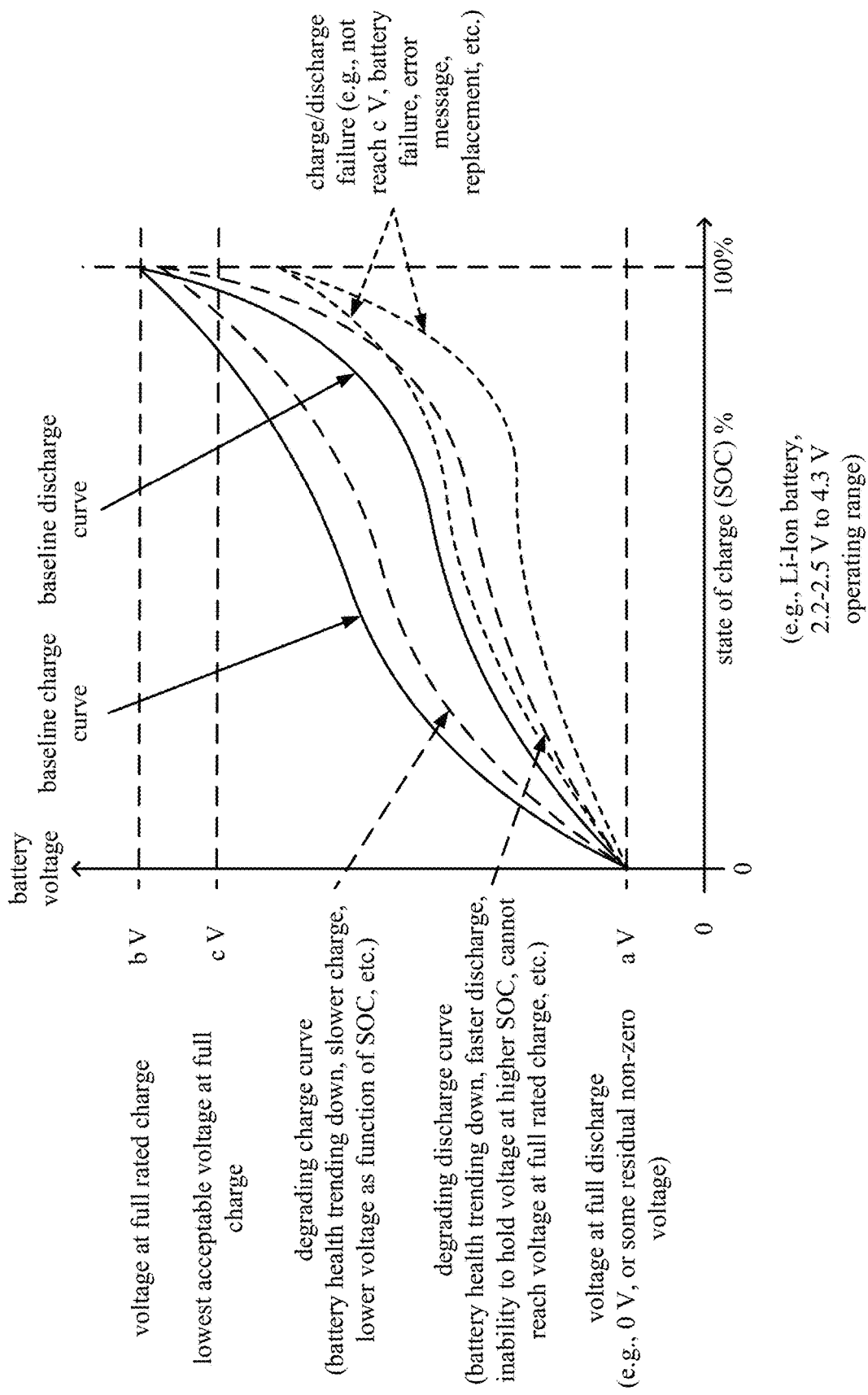
FIG. 58 is a schematic block diagram of an embodiment of charge-discharge loop and one or more indications of battery health degradation as may be used in accordance with battery monitoring and characterization and characterization in accordance with the present invention.

FIG. 58 is a schematic block diagram of an embodiment 5800 of charge-discharge loop and one or more indications of battery health degradation as may be used in accordance with battery monitoring and characterization and characterization in accordance with the present invention. This diagram shows how the charging and discharging curves as a function of state of charge (SOC) percentage will change based on a change in the status, operational condition, health, etc. of the battery.

Generally speaking, the diagrams show an operating range between a lower voltage of b V and an upper voltage of a V. For example, consider a Lithium-ion battery having an operating range of 2.2-2.5 V=b V, the voltage of full discharge (e.g., at which the battery is no longer fully operational and able to service one or more loads) to 4.3 V=a V, the voltage at full rated charge. In addition, there may be a lower acceptable voltage at full charge, c V, at which the battery is still operational and able to function properly and service one or more loads. Note also that the voltage of the battery at full discharge may be lower than the lower end of the operating range, such as even being 0 V. However, some batteries do retain some residual non-zero voltage even at a very low state of charge (SOC).

As can be seen in comparison to a baseline charge curve in a baseline discharge curve that formed the charge-discharge loop, as the battery health is trending downward, there is a slower increase in voltage of the battery as a function of increasing state of charge (SOC).

Consider a charge curve of a degrading battery, as a battery ages and degrades, its ability to build up and retain voltage degrades. Also, there may be instances in which the battery is unable to reach full charge, yet still reach the lower acceptable voltage at full charge, c V, at which the battery is still operational and able to function properly and service one or more loads.

Consider a discharge curve of a degrading battery, as a battery ages and degrades, its ability to service one or more loads degrades significantly as a function of state of charge (SOC). For example, for the same state of charge, the voltage of a degrading battery is less than that of a healthy and fully operational battery.

Figure 59:
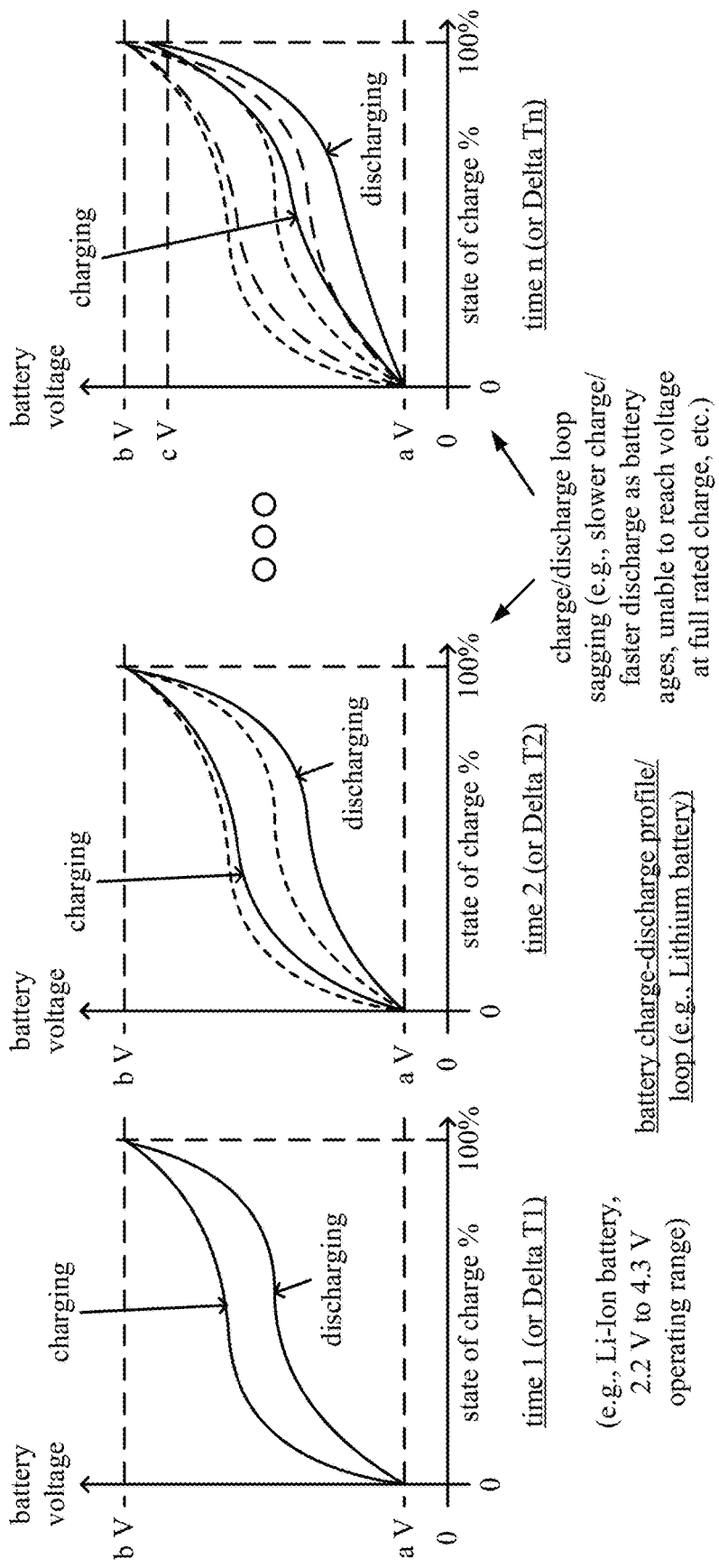
FIG. 59 is a schematic block diagram of an embodiment of charge-discharge loop monitoring for use in battery monitoring and characterization in accordance with the present invention.

FIG. 59 is a schematic block diagram of an embodiment 5900 of charge-discharge loop monitoring for use in battery monitoring and characterization in accordance with the present invention. By monitoring and tracking such information including the voltage level of the battery as a function of state of charge (SOC) during one or both of the charge curve or the discharge curve, determination may be made regarding the status, operational condition, health, etc. of the battery based on changes thereof. For example, at or during different times during the operational life of the battery, monitoring and tracking such information provides an indication of the usefulness, effectiveness, remaining life, etc. of the battery.

For example, battery life prediction, including remaining battery life prediction, can be made based on identifying, monitoring, and tracking, etc. changes to such one or both of the charge curve or the discharge curve during the operational life of the battery. For example, based on a trajectory of the change of one or both of the charge curve or the discharge curve as a function of time and as the battery is in operation including servicing one or more loads, estimation can be made of when the battery will no longer be acceptably operational and able to service one or more loads.

This diagram shows, based on characterization of one or both of the charge curve or the discharge curve of the battery, based on the battery charge-discharge profile loop, how the respective curves change as the battery degrades. On the left-hand side, at or during a time 1 (e.g., Delta T1), a baseline battery charge-discharge profile loop shows variation in voltage, lower value to an upper value. For example, consider the battery example described herein of an example of a Lithium-ion battery having an operating range between a lower voltage of approximately 2.2-2.5 V and an upper voltage of approximately 4.3 V (e.g., b V=approximately 4.3 V, and a V=approximately 2.2-2.5 V).

Moving from left to right at different respective times at or during which characterization of the battery charge-discharge profile loop is made, it can be seen that the voltage level as a function of state of charge (SOC) percentage degrades. Generally, the battery charge-discharge profile loop is sagging as a function of degradation of the battery. Some characteristics that may be identified correspond to one or more of a slower charge/festered discharge of the battery as it ages, and inability of the battery to reach full voltage at a full rated charge, the inability to service one or more loads effectively at a rated state of charge (SOC) percentage for the battery, etc.

Figure 60:
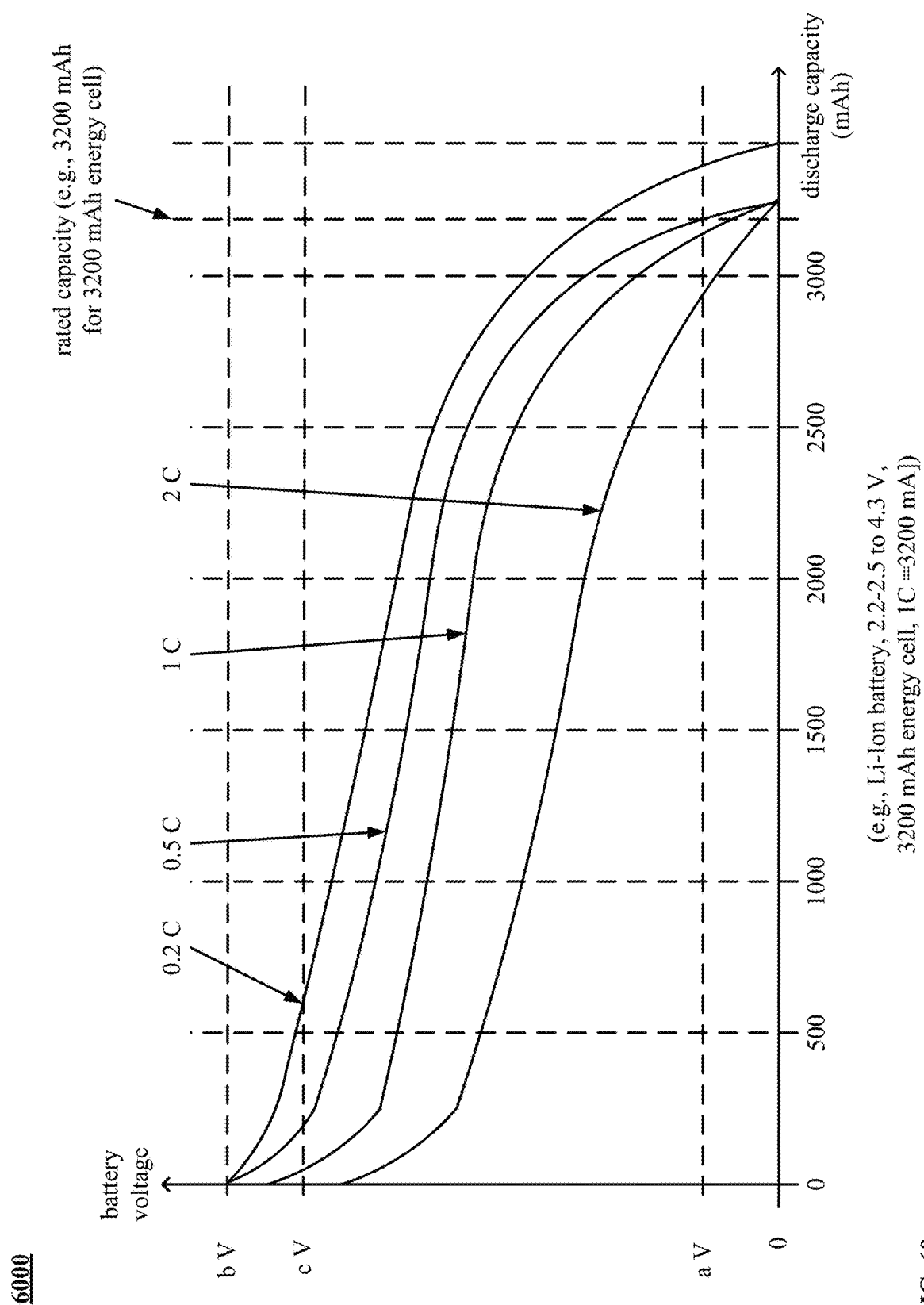
FIG. 60 is a schematic block diagram of an embodiment of battery discharge characteristics as may be used in accordance with battery monitoring and characterization and characterization in accordance with the present invention.

FIG. 60 is a schematic block diagram of an embodiment 6000 of battery discharge characteristics as may be used in accordance with battery monitoring and characterization and characterization in accordance with the present invention. This diagram uses a similar example as described herein of a Lithium-ion battery having an operating range between a lower voltage of approximately 2.2-2.5 V and an upper voltage of approximately 4.3 V (e.g., b V=approximately 4.3 V, and a V=approximately 2.2-2.5 V), a 3200 mA hour energy cell capable of becoming fully charged by driving a current of 1 C (e.g., 3200 mA) for approximately one hour, or 60-70 minutes and fully discharge in approximately the same amount of time when delivering that current.

Several different discharge capacity curves are shown when the battery is providing different respective currents to one or more loads such as when servicing one or more loads, 0.2 C (0.2×3200 mA=640 mA), 0.5 C (0.2×3200 mA=1600 mA), 1 C (3200 mA), and 0.2 C (2×3200 mA=6400 mA). As can be seen in the diagram, as the current level of the current team provided from the battery increases, the discharge capacity, in milliamp hours (mAh), consequently decreases.

In some examples, such battery discharge characteristics may be performed at or during different times, and baseline battery discharge characteristics may be determined (e.g., such as when the battery is new, healthy, and fully operational, etc.) to which reference can be made subsequently to determine deviation from such baseline battery discharge characteristics in an effort to determine a rate of change of such characteristics and, based on a trajectory of such changes, an estimate of when the battery is expected to fail and no longer be able to operate fully such as to service one or more loads.

Figure 61:
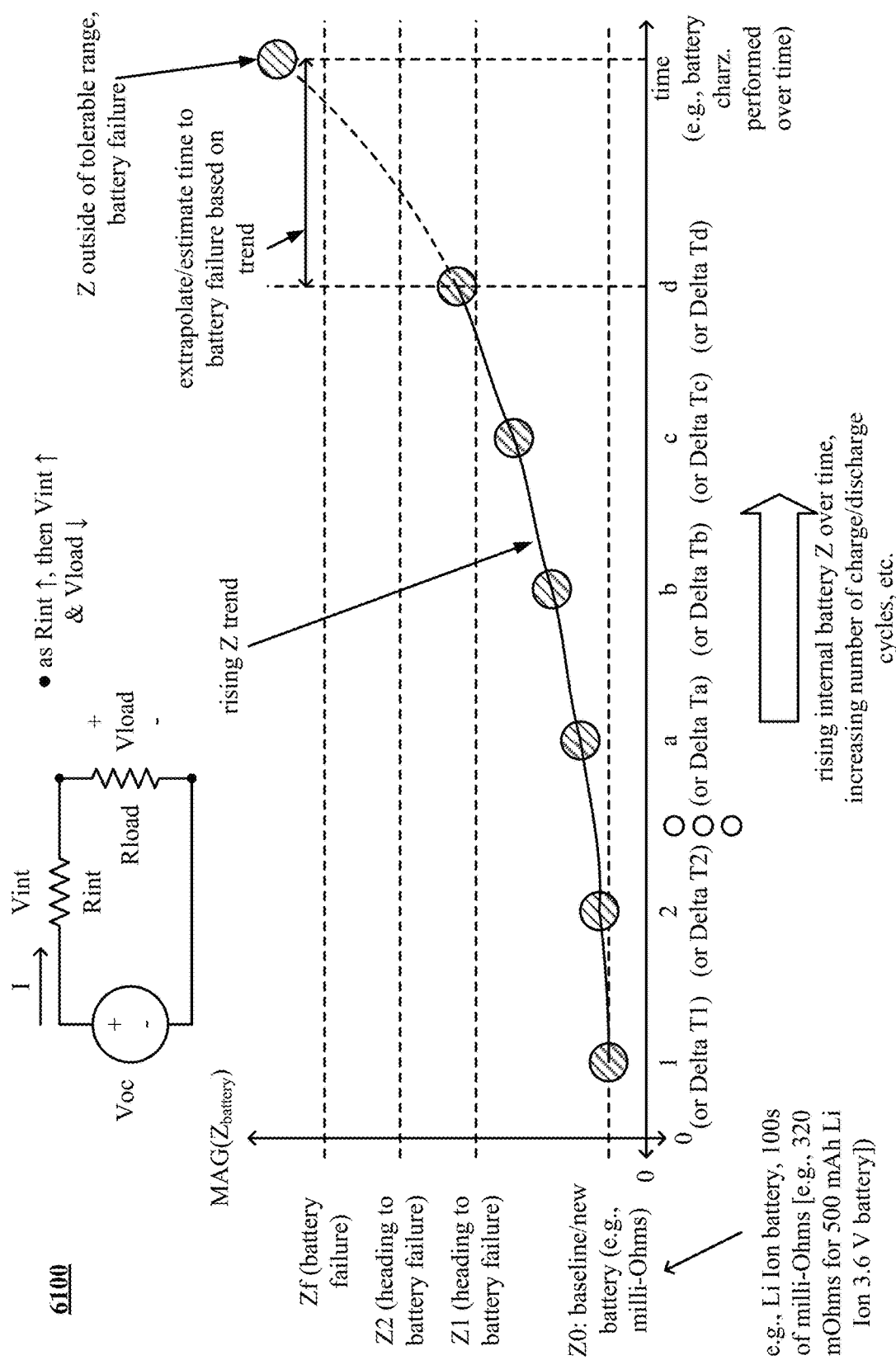
FIG. 61 is a schematic block diagram of an embodiment of impedance (Z) monitoring of a battery at a given frequency for use in battery monitoring and characterization and characterization in accordance with the present invention.

FIG. 61 is a schematic block diagram of an embodiment 6100 of impedance (Z) monitoring of a battery at a given frequency for use in battery monitoring and characterization and characterization in accordance with the present invention. In this diagram, monitoring and tracking the impedance of the battery itself may be used is yet another characteristic by which a determination may be made regarding the status, operational condition, health, etc. of the battery including based on changes thereof.

Generally speaking, a battery with a relatively lower internal impedance is operative to deliver a high current or a required current when required. However, as the battery degrades, ages, etc., an increased impedance therein inhibits the battery's ability effectively to deliver a high current or a required current on demand. In addition, as the impedance of the battery increases, the battery may exhibit other deleterious effects such as heating up during operation, suffering from rapid voltage drop, etc. and having an inability to service properly one or more loads. When a battery has a relatively lower internal impedance, it is able to deliver the current required by one or more loads and on demand while remaining relatively cool. However, as the internal impedance of the battery increases, while it still may be able to service the one or more loads, the current flow is restricted because of the increased impedance, there will be a decrease of the voltage delivered to the one or more loads, and the battery will typically heat up during operation. Note that the temperature of a battery is yet another characteristic that may be monitored and tracked to assist in making a determination regarding the status, operational condition, health, etc. of the battery including based on changes thereof.

Note the different types of batteries have different characteristics and abilities to deliver different levels of current on demand. Consider a lead acid battery having a very low internal resistance. Such a lead acid battery will respond well and quickly when required to deliver high amounts of current (based on the capacity of the lead acid battery) for relatively short periods of time. However, lead acid batteries are generally not able to provide high levels of current to service one or more loads during long periods of time.

Alternatively, consider a Lithium-ion battery. Such a Lithium-ion battery generally has a better ability to deliver a sustained and high amounts of current (based on the capacity of the Lithium-ion battery) for relatively longer periods of time.

As an example, consider a Lithium-ion 3.6 V battery having a capacity of 320 mA hour such that it is capable of becoming fully charged by driving a current of 1 C (e.g., 320 mA) for approximately one hour, or 60-70 minutes and fully discharge in approximately the same amount of time when delivering that current, the internal impedance of such a Lithium-ion battery will be in the range of hundreds of milli-Ohms (mΩ) (e.g., in the vicinity of 320 mΩ) when new, healthy, fully operational, etc.

Consider an initial impedance of a battery, Z0, as being the internal impedance of the battery when the battery is new, healthy, fully operational, etc. Over time, as shown in this diagram caressing from left to right, the battery impedance will generally rise over time for a variety of reasons including one or more of degradation of the battery, usage of the battery, an increasing number of charge-discharge cycles, exposure to certain environmental conditions that adversely affect the health of the battery such as heat, etc.

By monitoring the trend and trajectory of an increase in the impedance of the battery, such as at or during different times, an estimate may be made regarding when the battery will fail. For example, as the impedance of the battery increases to some particular amount (e.g., an impedance Zf associated with battery failure) above which it no longer can effectively provide current service one or more loads, then the battery may be deemed as failed. By monitoring and tracking the trend and change of the impedance of the battery, an estimate can be made regarding when this will happen. For example, in the diagram, increasing levels of impedances, shown in this diagram as to respective thresholds, Z1 and Z2, can provide indication of the battery heading to battery failure. As an actual measured impedance of the battery is about one or both of these thresholds, and estimation of battery failure may be made. Also, extrapolation of a trend line of change of the impedance of the battery as a function of time may be used to estimate the time to battery failure.

In an example of operation and implementation, consider the Lithium-ion 3.6 V battery having a capacity of 320 mA hour described above. The open circuit voltage, Voc, at the terminals of such a battery is 3.6 V, but when implemented to service one or more loads, there will be some voltage drop internal to the battery based on the internal impedance of the battery, such that some voltage drop will occur across the internal impedance of the battery, and the remainder across the one or more loads that the battery is servicing.

As a specific example, consider such a battery having an internal impedance of approximately Rint=320 mΩ. Based on implementation of such a battery to service a load having an impedance of 10Ω with a voltage of at least 3.3 V=Vload, and assuming both the internal impedance of the battery and the load are purely resistive in this example, then the current required to be delivered in the battery.

$Voc=3.6\ V$ $Vload=I \times R=I \times 10$, such that $3.3\ V=I \times 20\Omega$, so $I=165\ mA$ or approx. $0.516\ C$ When the internal impedance of the battery increases to a point that it can no longer provide an output voltage to the load of 3.3 V, such that more than a 0.3 V voltage drop exists internal to the battery, then the battery may be deemed to have failed.

For example, consider that a current of 165 mA is being delivered from the battery, then when the internal impedance of the battery is greater than or equal to $Vint=I \times Rint$, such that $0.3\ V=320\ mA \times Rint$, so $Rint=937.5\ m\Omega$ As such, generally speaking, in such a specific example, when the internal impedance of the battery increases from its baseline value of 320 mΩ to approximately 937.5 mΩ, or increases by a factor of approximately 2.93 or 3, then the battery would no longer be able to service the load in this specific example. In this instance, the battery would no longer be acceptable for operational for this application.

FIG. 62 is a schematic block diagram of an embodiment 6200 of impedance (Z) monitoring of a battery across a range of frequencies as may be implemented within battery casings and/or sheaths for use in battery monitoring and characterization in accordance with the present invention. As described herein, note that the impedance of battery may not be purely resistive in nature, but may have reactance components associated with one or more of a capacitive characteristics or an inductive characteristic, such as in accordance with the various equivalent circuit models of the battery described herein.

This diagram shows monitoring and tracking of an impedance, Z, profile the battery as a function of time while also considering the frequency dependence thereof. For example, on the left-hand side of the diagram, a Z profile 1 is shown including its variation as a function of frequency. At DC, the impedance of the battery may be viewed as being Rint, or purely resistive having no reactance component thereof. In this example, the magnitude of the impedance of the battery is shown as increasing as a function of frequency. Generally speaking, inductive reactance increases as a function of increasing frequency, and capacitive reactance decreases as a function of increasing frequency.

Monitoring and tracking of the Z profile of the battery as a function of frequency at different respective times, such as at or during a time 2, and so on up to at or during a time n provide yet another mechanism by which the status, operational condition, health, etc. of the battery may be determined including based on changes of the Z profile.

For example, any one or more of the impedance magnitude values within a Z profile, including specifically at any one or more of various desired frequencies (e.g., shown as f1, f2, f3, and f4 in this example, which may be any desired frequencies within any desired frequency range and based on any desired frequency step between them), may be used to identify the battery trending towards failure. For example, consider as the impedance of the battery increases to some particular amount (e.g., an impedance Zf associated with battery failure) above which it no longer can effectively provide current service one or more loads, then the battery may be deemed as failed.

Based on monitoring and tracking of the impedance of the battery over time, including its frequency variation in dependence thereof using the Z profiles as described herein, when the Z profile is outside of a tolerable range that is deemed acceptable for proper performance of the battery such as to service one or more loads, then a determination may be made that the battery has failed. Even in situations when the Z profile is within a tolerable range for acceptable operation, when the change of the Z profile is trending towards failure, such as trending towards being outside of that tolerable range for acceptable operation, then an estimate may be made regarding when the battery may be expected to fail. This may be performed based on the rate of change of the Z profile as a function of time and extrapolating when the battery may be expected to fail sometime in the future.

Note that any one or more of the various battery characteristics such as described herein may be monitored and tracked may be used to make estimate of the status, operational condition, health, etc. of a battery.

FIG. 63 is a schematic block diagram of another embodiment of a method 6300 for execution by one or more devices in accordance with the present invention.

The method 6300 operates in step 6310 by determining an electrical characteristic of a battery. In some examples, this is performed based on providing (e.g., from a DSC) a charge signal that includes an AC component and a DC component to a terminal of a battery via a single line and simultaneously sensing the charge signal via the single line, generating a digital signal, processing the digital signal, etc. in accordance with any example, embodiment, implementation, etc. as described herein. In other examples, this is performed based on providing (e.g., from a DSC) a monitoring signal that includes an AC component that includes an AC component to a terminal of a battery via a single line and simultaneously sensing the charge monitoring signal via the single line, generating a digital signal, processing the digital signal, etc. in accordance with any example, embodiment, implementation, etc. as described herein.

The method 6300 also operates in step 6320 by monitoring for change(s) of impedance ($Z_{battery}$) of battery. Based on detection of no change of the impedance ($Z_{battery}$) of battery in step 6330, the method 6300 loops back to the step 6320 or the step 6310.

Alternatively, based on detection of one or more changes of the impedance ($Z_{battery}$) of battery in step 6330, the method 6300 also operates in step 6340 by processing change(s) of impedance ($Z_{battery}$) of battery to determine whether trending towards battery failure. Note that such monitoring, detection, and processing of such change(s) of the impedance ($Z_{battery}$) of the battery may be performed at single frequency, based on a Z profile such as in accordance with more than one frequency such as across a frequency range, etc. in accordance with any example, embodiment, implementation, etc. as described herein.

Based on a determination that the battery is not trending towards failure, the method 6300 loops back to the step 6320 or the step 6310. Alternatively, based on a determination that the battery is trending towards failure, the method 6300 operates in step 6360 by executing or facilitating one or more operations based on determined trend towards battery failure. Various examples of such operations may include any one or more of error notification, making of one or more operational changes to the battery or associated device/system, facilitating battery replacement, etc. and/or any other such operations in accordance with any example, embodiment, implementation, etc. as described herein.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A battery characterization system, the system comprising:
   a battery;
   a configurable impedance circuit operably coupled to the battery;
   a drive-sense circuit (DSC) operably coupled to the configurable impedance circuit, wherein, when enabled, the DSC configured to:
      generate a charge signal that includes an AC (alternating current) component;
      provide the charge signal to the configurable impedance circuit via a single line and simultaneously to sense an effect on the charge signal via the single line that is based on an electrical characteristic of at least one of the configurable impedance circuit and the battery; and
      generate a digital signal representative of the electrical characteristic of the at least one of the configurable impedance circuit and the battery;
   memory that stores operational instructions; and
   one or more processing modules operably coupled to the DSC, the configurable impedance circuit, and the memory, wherein, when enabled, the one or more processing modules is configured to execute the operational instructions to select an impedance value within the configurable impedance circuit to facilitate charging of the battery by the charge signal that is provided from the DSC via the configurable impedance circuit to the battery based on the digital signal.

2. The system of claim 1, wherein, when enabled, the one or more processing modules further configured to execute the operational instructions to:
   process the digital signal to determine the electrical characteristic of the at least one of the configurable impedance circuit and the battery; and select the impedance value within the configurable impedance circuit to facilitate charging of the battery by the charge signal that is provided from the DSC via the configurable impedance circuit to the battery based on the electrical characteristic of the at least one of the configurable impedance circuit and the battery.

3. The system of claim 1, wherein, when enabled, the one or more processing modules further configured to execute the operational instructions to:
select the impedance value within the configurable impedance circuit to facilitate charging of the battery by the charge signal that is provided from the DSC via the configurable impedance circuit to the battery such that the impedance value matches an impedance of the battery.

4. The system of claim 3, wherein the impedance value within the configurable impedance circuit matching the impedance of the battery provides for at least one of maximizing power transfer from the DSC to the battery, minimizing reflection of the charge signal from the battery, reducing an amount of time required to charge the battery, and more fully or completely charging the battery.

5. The system of claim 1, wherein, when enabled, the DSC configured to generate the charge signal that includes the AC component based on a reference signal.

6. The system of claim 5, wherein, when enabled, the one or more processing modules further configured to execute the operational instructions to:
generate the reference signal; and
provide the reference signal to the DSC.

7. The system of claim 1, wherein, when enabled, the one or more processing modules further configured to execute the operational instructions to:
process the digital signal to determine a first value of the electrical characteristic of the at least one of the configurable impedance circuit and the battery at a first time; and
process the digital signal to determine a second value of the electrical characteristic of the at least one of the configurable impedance circuit and the battery at a second time based on change of impedance of the battery over time.

8. The system of claim 7, wherein, when enabled, the one or more processing modules further configured to execute the operational instructions to:
select the impedance value within the configurable impedance circuit to facilitate charging of the battery by the charge signal that is provided from the DSC via the configurable impedance circuit to the battery based on the first value of the electrical characteristic of the at least one of the configurable impedance circuit and the battery; and
select another impedance value within the configurable impedance circuit to facilitate charging of the battery by the charge signal that is provided from the DSC via the configurable impedance circuit to the battery based on the second value of the electrical characteristic of the at least one of the configurable impedance circuit and the battery.

9. The system of claim 7, wherein:
when enabled, the DSC configured to generate the charge signal that includes the AC component based on a reference signal;
when enabled, the one or more processing modules further configured to execute the operational instructions to:
generate the reference signal and provide the reference signal to the DSC based on the first value of the electrical characteristic of the at least one of the configurable impedance circuit and the battery; and
generate another reference signal and provide the reference signal to the DSC based on the second value of the electrical characteristic of the at least one of the configurable impedance circuit and the battery, wherein the DSC is configured to modify the charge signal based on the another reference signal.

10. The system of claim 1, wherein the configurable impedance circuit further comprising:
a plurality of impedances such that any impedance of the plurality of impedances is selectable by the one or more processing modules.

11. The system of claim 10, wherein at least one of the plurality of impedances includes at least one of:
a resistor;
a capacitor;
an inductor;
a resistor in series with a capacitor;
a resistor in series with an inductor;
an inductor in series with a capacitor;
a resistor in parallel with a capacitor;
a resistor in parallel with an inductor; or
an inductor in parallel with a capacitor.

12. The system of claim 1, wherein the electrical characteristic of the at least one of the configurable impedance circuit and the battery changes in response to charging of the battery by the charge signal.

13. The battery characterization system of claim 1, wherein the DSC further comprising:
a comparator configured to:
receive a reference signal at a first comparator input and to provide the charge signal from a second comparator input to the configurable impedance circuit via the single line; and
generate an output comparator signal based on the reference signal and the charge signal;
a dependent current source operably coupled to source a current to the configurable impedance circuit via the single line based on control from the output comparator signal; and
an analog to digital converter (ADC) operably coupled to an output of the comparator, wherein, when enabled, the ADC configured to process the output comparator signal to generate the digital signal representative of the electrical characteristic of the at least one of the configurable impedance circuit and the battery.

14. The battery characterization system of claim 1, wherein the DSC further comprises:
a power source circuit operably coupled to the configurable impedance circuit via the single line, wherein, when enabled, the power source circuit configured to provide the charge signal that includes the AC component via the single line to the configurable impedance circuit, and wherein the charge signal includes a DC (direct current) component and the AC component; and
a power source change detection circuit operably coupled to the power source circuit, wherein, when enabled, the power source change detection circuit is configured to:
sense the effect on the charge signal that is based on the electrical characteristic of at least one of the configurable impedance circuit and the battery; and
generate the digital signal representative of the electrical characteristic of the at least one of the configurable impedance circuit and the battery.

15. The battery characterization system of claim 14 further comprising:
the power source circuit including a power source to source at least one of a voltage or a current to the configurable impedance circuit via the single line; and
the power source change detection circuit including:
a power source reference circuit configured to provide at least one of a voltage reference or a current reference based on a reference signal; and
a comparator configured to compare the at least one of the voltage or the current provided to the configurable impedance circuit via the single line to the at least one of the voltage reference or the current reference in accordance with generating the charge signal.

16. A battery characterization system, the system comprising:
a battery;
a configurable impedance circuit operably coupled to the battery;
a drive-sense circuit (DSC) operably coupled to the configurable impedance circuit, wherein, when enabled, the DSC configured to:
generate a charge signal that includes an AC (alternating current) component;
provide the charge signal to the configurable impedance circuit via a single line and simultaneously to sense an effect on the charge signal via the single line that is based on an electrical characteristic of at least one of the configurable impedance circuit and the battery; and
generate a digital signal representative of the electrical characteristic of the at least one of the configurable impedance circuit and the battery;
memory that stores operational instructions; and
one or more processing modules operably coupled to the DSC, the configurable impedance circuit, and the memory, wherein, when enabled, the one or more processing modules is configured to execute the operational instructions to:
process the digital signal to determine a first value of the electrical characteristic of the at least one of the configurable impedance circuit and the battery at a first time; and
process the digital signal to determine a second value of the electrical characteristic of the at least one of the configurable impedance circuit and the battery at a second time based on change of impedance of the battery over time.

17. The system of claim 16, wherein the electrical characteristic of the at least one of the configurable impedance circuit and the battery changes in response to charging of the battery by the charge signal.

18. The battery characterization system of claim 16, wherein the DSC further comprising:
a comparator configured to:
receive a reference signal at a first comparator input and to provide the charge signal from a second comparator input to the configurable impedance circuit via the single line; and
generate an output comparator signal based on the reference signal and the charge signal;
a dependent current source operably coupled to source a current to the configurable impedance circuit via the single line based on control from the output comparator signal; and
an analog to digital converter (ADC) operably coupled to an output of the comparator, wherein, when enabled, the ADC configured to process the output comparator signal to generate the digital signal representative of the electrical characteristic of the at least one of the configurable impedance circuit and the battery.

19. The battery characterization system of claim 16, wherein the DSC further comprises:
a power source circuit operably coupled to the configurable impedance circuit via the single line, wherein, when enabled, the power source circuit configured to provide the charge signal that includes the AC component via the single line to the configurable impedance circuit, and wherein the charge signal includes a DC (direct current) component and the AC component; and
a power source change detection circuit operably coupled to the power source circuit, wherein, when enabled, the power source change detection circuit is configured to:
sense the effect on the charge signal that is based on the electrical characteristic of at least one of the configurable impedance circuit and the battery; and
generate the digital signal representative of the electrical characteristic of the at least one of the configurable impedance circuit and the battery.

20. The battery characterization system of claim 19 further comprising:
the power source circuit including a power source to source at least one of a voltage or a current to the configurable impedance circuit via the single line; and
the power source change detection circuit including:
a power source reference circuit configured to provide at least one of a voltage reference or a current reference based on a reference signal; and
a comparator configured to compare the at least one of the voltage or the current provided to the configurable impedance circuit via the single line to the at least one of the voltage reference or the current reference in accordance with generating the charge signal.

* * * * *